(12) United States Patent
Yamazaki et al.

(10) Patent No.: US 10,865,470 B2
(45) Date of Patent: Dec. 15, 2020

(54) METAL OXIDE FILM, SEMICONDUCTOR DEVICE, AND DISPLAY DEVICE

(71) Applicant: SEMICONDUCTOR ENERGY LABORATORY CO., LTD., Atsugi (JP)

(72) Inventors: Shunpei Yamazaki, Tokyo (JP);
Junichi Koezuka, Tochigi (JP);
Kenichi Okazaki, Tochigi (JP);
Masashi Tsubuku, Saitama (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 65 days.

(21) Appl. No.: 16/068,719

(22) PCT Filed: May 19, 2016

(86) PCT No.: PCT/IB2016/052929
§ 371 (c)(1),
(2) Date: Jul. 9, 2018

(87) PCT Pub. No.: WO2017/125796
PCT Pub. Date: Jul. 27, 2017

(65) Prior Publication Data
US 2019/0024227 A1    Jan. 24, 2019

(30) Foreign Application Priority Data

Jan. 18, 2016  (JP) .................. 2016-006812

(51) Int. Cl.
*H01L 29/10*  (2006.01)
*C23C 14/08*  (2006.01)
(Continued)

(52) U.S. Cl.
CPC .............. *C23C 14/08* (2013.01); *C23C 14/34* (2013.01); *C23C 14/3414* (2013.01);
(Continued)

(58) Field of Classification Search
CPC ..... C23C 14/08; C23C 14/3414; C23C 14/34; C30B 23/00; C30B 23/02; C30B 29/22;
(Continued)

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| CN | 103124805 A | 5/2013 |
| CN | 103238217 A | 8/2013 |

(Continued)

OTHER PUBLICATIONS

Chinese Office Action (Application No. 201680079190.8) dated Oct. 22, 2019.

(Continued)

*Primary Examiner* — Stephen M Bradley
*Assistant Examiner* — Wasiul Haider
(74) *Attorney, Agent, or Firm* — Fish & Richardson P.C.

(57) ABSTRACT

A metal oxide film containing a crystal part is provided. Alternatively, a metal oxide film with highly stable physical properties is provided. Alternatively, a metal oxide film with improved electrical characteristics is provided. Alternatively, a metal oxide film with which field-effect mobility can be increased is provided.

A metal oxide film including In, M (M is Al, Ga, Y, or Sn), and Zn includes a first crystal part and a second crystal part; the first crystal part has c-axis alignment; the second crystal part has no c-axis alignment; and the existing proportion of the second crystal part is higher than the existing proportion of the first crystal part.

29 Claims, 90 Drawing Sheets

US 10,865,470 B2

Page 2

(51) Int. Cl.
*C30B 23/00* (2006.01)
*H01L 27/12* (2006.01)
*H01L 29/04* (2006.01)
*H01L 29/786* (2006.01)
*C23C 14/34* (2006.01)
*C30B 23/02* (2006.01)
*C30B 29/22* (2006.01)

(52) U.S. Cl.
CPC .............. *C30B 23/00* (2013.01); *C30B 23/02* (2013.01); *C30B 29/22* (2013.01); *H01L 27/1207* (2013.01); *H01L 27/1225* (2013.01); *H01L 29/045* (2013.01); *H01L 29/7869* (2013.01); *H01L 29/78696* (2013.01)

(58) Field of Classification Search
CPC ............... H01L 27/1207; H01L 29/045; H01L 29/78696; H01L 27/1225; H01L 29/7869
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,889,477 B2 | 11/2014 | Yamazaki et al. |
| 9,087,726 B2 | 7/2015 | Sato et al. |
| 9,184,298 B2 | 11/2015 | Morita et al. |
| 9,219,165 B2 | 12/2015 | Sato et al. |
| 9,231,111 B2 | 1/2016 | Yamazaki et al. |
| 9,287,411 B2 | 3/2016 | Koezuka et al. |
| 9,382,611 B2 | 7/2016 | Yamazaki et al. |
| 9,449,819 B2 | 9/2016 | Sato et al. |
| 9,496,330 B2 | 11/2016 | Yamazaki et al. |
| 9,496,408 B2 | 11/2016 | Yamazaki et al. |
| 9,496,412 B2 | 11/2016 | Koezuka et al. |
| 9,812,583 B2 | 11/2017 | Sato et al. |
| 9,837,512 B2 | 12/2017 | Koezuka et al. |
| 10,096,684 B2 | 10/2018 | Hosaka et al. |
| 10,164,075 B2 | 12/2018 | Koezuka et al. |
| 10,361,318 B2 | 7/2019 | Sato et al. |
| 10,388,520 B2 | 8/2019 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0312681 A1 | 12/2012 | Yamazaki et al. |
| 2012/0325650 A1 | 12/2012 | Yamazaki et al. |
| 2013/0248858 A1 | 9/2013 | Morita et al. |
| 2014/0084287 A1 | 3/2014 | Yamazaki |
| 2014/0151687 A1 | 6/2014 | Yamazaki |
| 2014/0209896 A1* | 7/2014 | Yamazaki ......... H01L 29/66969 257/43 |
| 2014/0225104 A1* | 8/2014 | Yamazaki ........... H01L 29/7869 257/43 |
| 2015/0014680 A1* | 1/2015 | Yamazaki ........... H01L 27/1288 257/43 |
| 2015/0034475 A1 | 2/2015 | Yamazaki |
| 2015/0034947 A1 | 2/2015 | Yamazaki et al. |
| 2015/0144948 A1 | 5/2015 | Kurokawa |
| 2015/0187575 A1 | 7/2015 | Yamazaki et al. |
| 2015/0270404 A1 | 9/2015 | Sato et al. |
| 2015/0318171 A1 | 11/2015 | Yamazaki |
| 2016/0349557 A1 | 12/2016 | Shishido et al. |

(56) References Cited

U.S. PATENT DOCUMENTS

| | | | |
|---|---|---|---|
| 2017/0016108 | A1 | 1/2017 | Yamazaki et al. |
| 2018/0053856 | A1 | 2/2018 | Sato et al. |

FOREIGN PATENT DOCUMENTS

| | | | |
|---|---|---|---|
| CN | 103824886 | A | 5/2014 |
| EP | 1737044 | A | 12/2006 |
| EP | 2226847 | A | 9/2010 |
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2012-231114 | A | 11/2012 |
| JP | 2013-145864 | A | 7/2013 |
| JP | 2014-007399 | A | 1/2014 |
| JP | 2015-046594 | A | 3/2015 |
| JP | 2015-046595 | A | 3/2015 |
| JP | 2015-143396 | A | 8/2015 |
| JP | 2015-216377 | A | 12/2015 |
| KR | 2014-0102151 | A | 8/2014 |
| TW | 201410904 | | 3/2014 |
| TW | 201427014 | | 7/2014 |
| TW | 201529876 | | 8/2015 |
| TW | 201603286 | | 1/2016 |
| WO | WO-2004/114391 | | 12/2004 |
| WO | WO-2012/169449 | | 12/2012 |
| WO | WO-2014/021334 | | 2/2014 |
| WO | WO-2015/097588 | | 7/2015 |
| WO | WO-2016/009310 | | 1/2016 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:AL and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", Am-Fpd '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", Am-Fpd '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—Bo

(56) References Cited

OTHER PUBLICATIONS

Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by Dc Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", Am-Fpd '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", Am-Fpd '09 Digest of Technical Papers, Jul. 1, 2009, pp. 33-36.

Park.J et al., "Amorphous Indium-Gallium-Zinc Oxide TFTs and Their Application for Large Size AMOLED", Am-Fpd '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW'08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

(56) References Cited

OTHER PUBLICATIONS

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Tsubuku.M et al., "CAAC-Oxide Semiconductor Material and its Applications", IDW '15 : Proceedings of the 22nd International Display Workshops, Dec. 10, 2015, vol. 22, pp. 179-182.
Chung.C et al., "High mobility, dual layer, c-axis aligned crystalline/amorphous IGZO thin film transistor", Appl. Phys. Lett. (Applied Physics Letters), Nov. 2, 2015, vol. 107, No. 18, pp. 183503-1-183503-5.
International Search Report (Application No. PCT/IB2016/052929) dated Sep. 20, 2016.
Written Opinion (Application No. PCT/IB2016/052929) dated Sep. 20, 2016.

\* cited by examiner

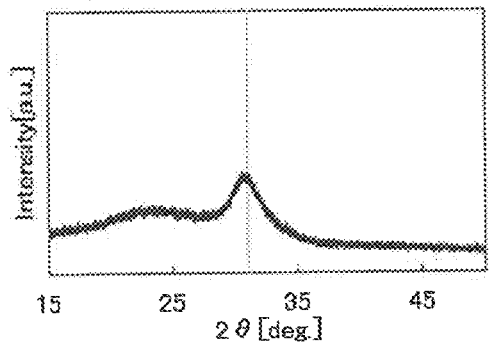
FIG. 7A Sample A1: 170°C, O₂=30%
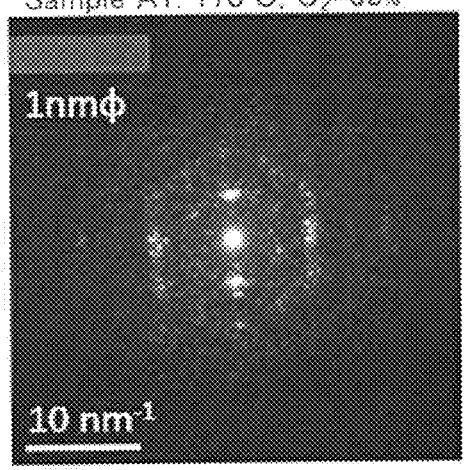
FIG. 7B Sample A1: 170°C, O₂=30%
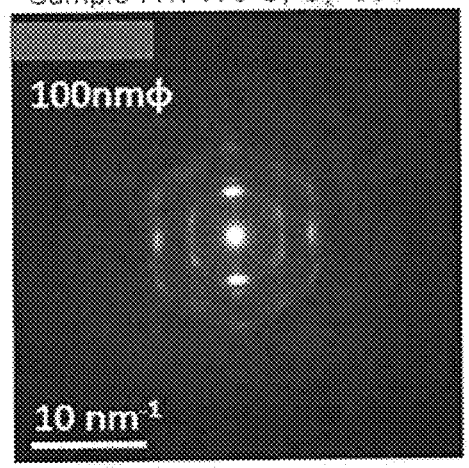
FIG. 7C Sample A1: 170°C, O₂=30%

FIG. 9A Sample A3: 130°C, O₂=10%
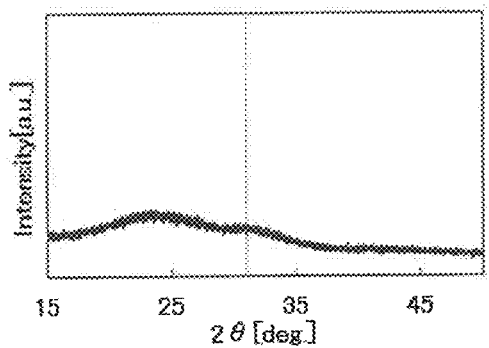
FIG. 9B Sample A3: 130°C, O₂=10%
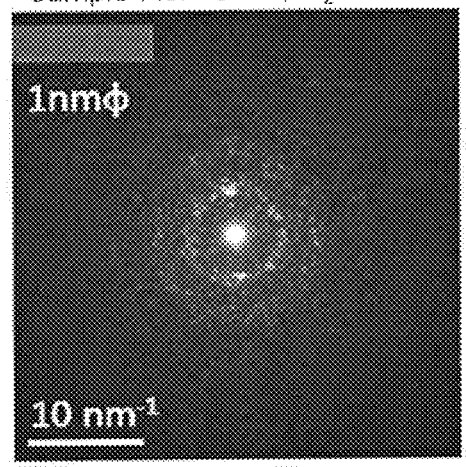
FIG. 9C Sample A3: 130°C, O₂=10%
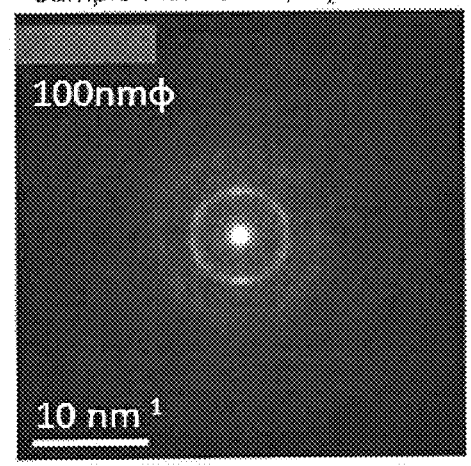

FIG. 15

| | Line Profile | | $R = \dfrac{A - A'}{B - B', C - C'}$ | FWHM |
|---|---|---|---|---|
| | A–A' | B–B', C–C' | | |
| Single crystal | Luminance peaks at (00$\bar{l}$) and (00$l$) vs Position | Single peak vs Position | $R \gg 1$ | small |
| only CAAC | Luminance peaks at (00$\bar{l}$) and (00$l$) vs Position | Single peak vs Position | $R \gg 1$ | relatively small |
| CAAC + Nanocrystal | Luminance peaks at (00$\bar{l}$) and (00$l$) vs Position | Peak with nc side peaks vs Position | $R > 1$ | medium |
| Nanocrystal | Luminance peak with nc side peaks vs Position | Peak with nc side peaks vs Position | $R = 1$ | relatively large |
| Amorphous | Luminance peak with halo vs Position | Luminance peak with halo vs Position | $R = 1$ or low intensity | large |

FIG. 16A1
Sample A1: 170°C, O₂=30%
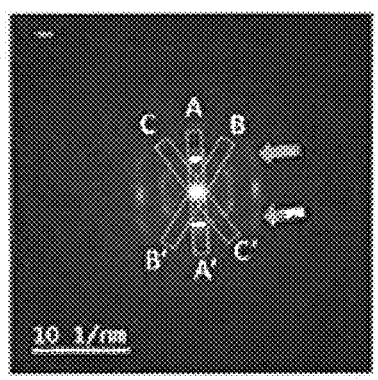
FIG. 16A2
Sample A1: 170°C, O₂=30%
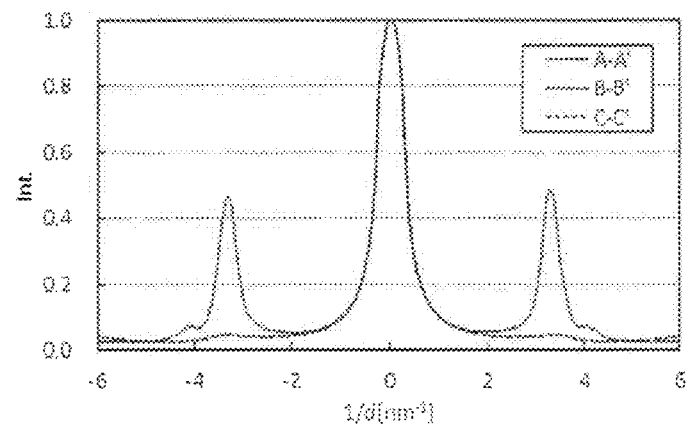
FIG. 16B1
Sample A2: 170°C, O₂=10%
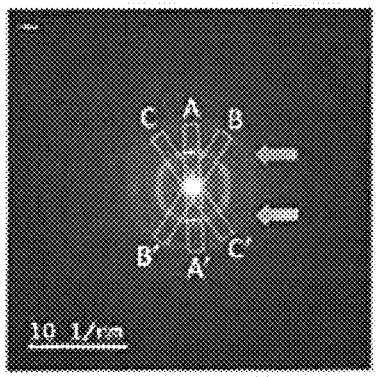
FIG. 16B2
Sample A2: 170°C, O₂=10%
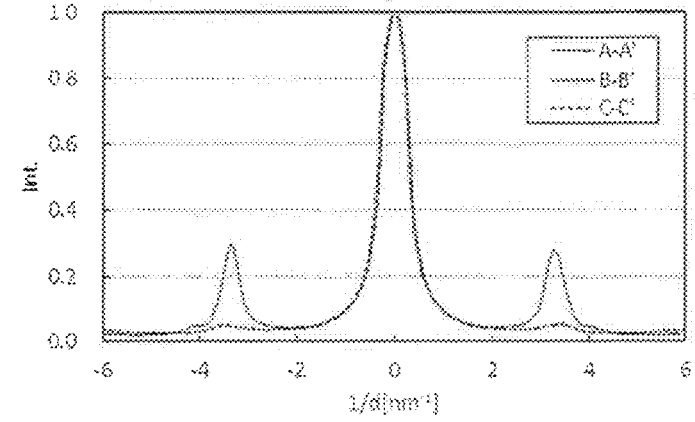

FIG. 17A1
Sample A3: 130°C, O₂=10%
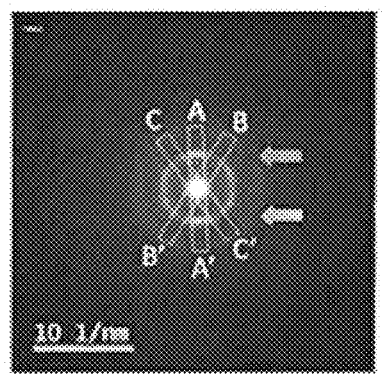
FIG. 17A2
Sample A3: 130°C, O₂=10%
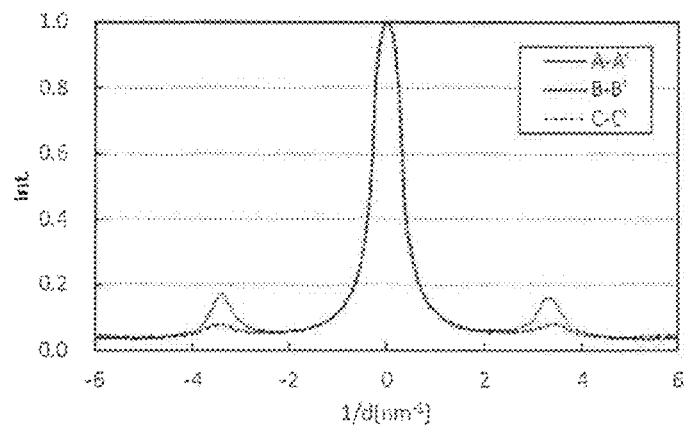
FIG. 17B1
Sample A4: 100°C, O₂=10%
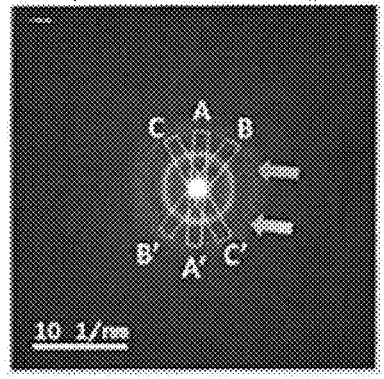
FIG. 17B2
Sample A4: 100°C, O₂=10%
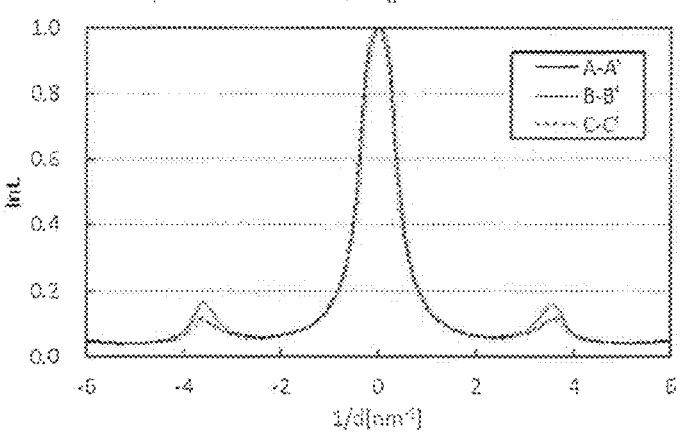

FIG. 18A1
Sample A5: 70°C, O₂=10%
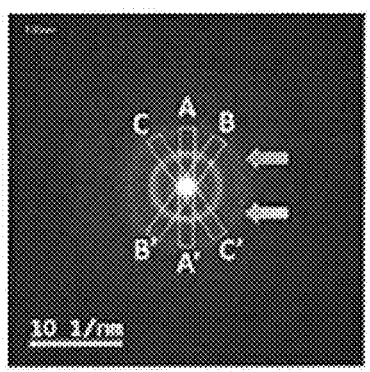
FIG. 18A2
Sample A5: 70°C, O₂=10%
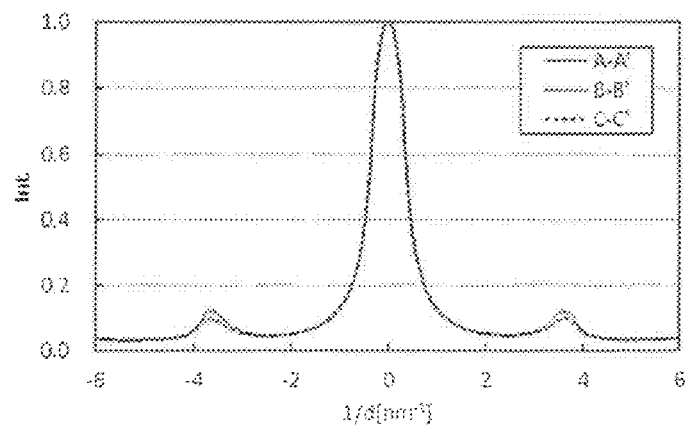
FIG. 18B1
Sample A6: R.T., O₂=10%
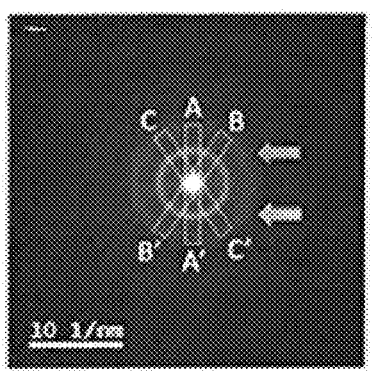
FIG. 18B2
Sample A6: R.T., O₂=10%
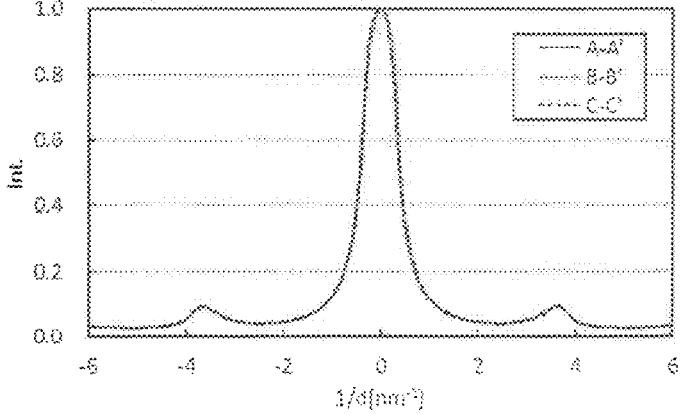

Sample D2

Urbach tail: 64.46 [meV]
Absorption by defect states: 1.36E-3 [cm⁻¹]

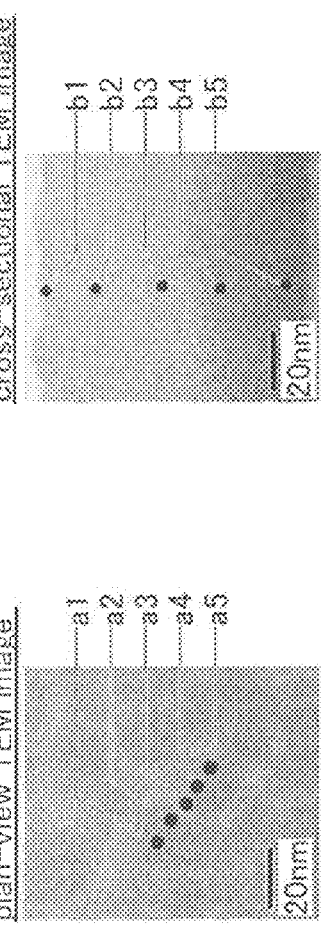
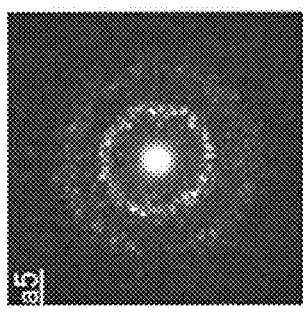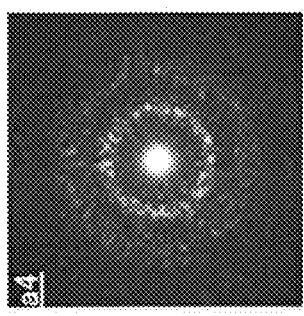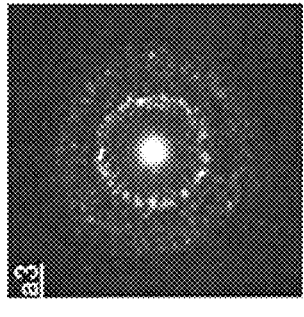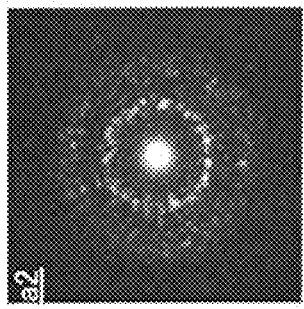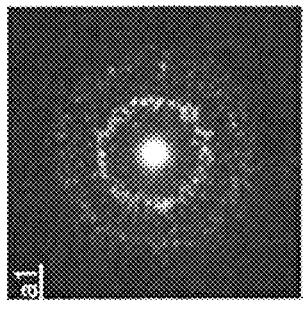
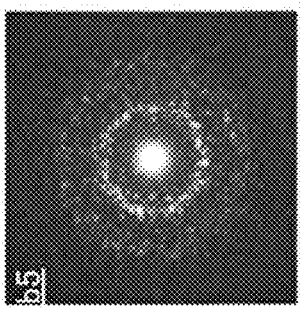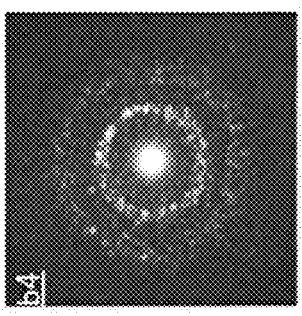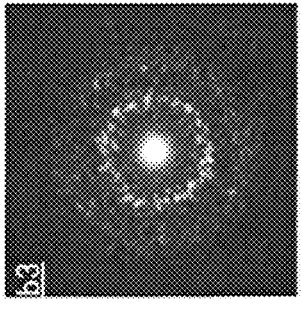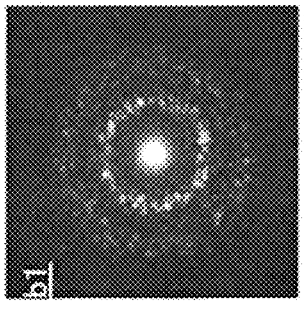
FIG. 89A plan-view TEM image
FIG. 89B cross-sectional TEM image
FIG. 89C, FIG. 89D, FIG. 89E, FIG. 89F, FIG. 89G
FIG. 89H, FIG. 89I, FIG. 89J, FIG. 89K, FIG. 89L

METAL OXIDE FILM, SEMICONDUCTOR DEVICE, AND DISPLAY DEVICE

CROSS REFERENCE TO RELATED APPLICATIONS

This application is a U.S. National Phase Application under 35 U.S.C. § 371 of International Application PCT/IB2016/052929, filed on May 19, 2016, which claims the benefit of a foreign priority application filed in Japan as Application No. 2016-006812 on Jan. 18, 2016, both of which are incorporated by reference.

TECHNICAL FIELD

One embodiment of the present invention relates to a metal oxide film and a forming method thereof. In addition, one embodiment of the present invention relates to a semiconductor device including the metal oxide film. In addition, one embodiment of the present invention relates to a display device including the metal oxide film or the semiconductor device.

Note that in this specification or the like, a semiconductor device means all types of devices that can function by utilizing semiconductor characteristics, and a transistor, a semiconductor circuit, and the like are embodiments of semiconductor devices. In addition, an arithmetic device, a memory device, an imaging device, an electro-optical device, a power generation device (including a thin film solar cell, an organic thin film solar cell, and the like), and an electronic device may include a semiconductor device.

BACKGROUND ART

As a semiconductor material applicable to a transistor, an oxide semiconductor has been attracting attention. For example, Patent Document 1 discloses a semiconductor device whose field-effect mobility (in some cases, simply referred to as a mobility or $\mu_{FE}$) is improved by stacking a plurality of oxide semiconductor layers, among which the oxide semiconductor layer serving as a channel contains indium and gallium where the proportion of indium is higher than the proportion of gallium.

In addition, Non-Patent Document 1 discloses that an oxide semiconductor including indium, gallium, and zinc has a homologous series represented by $In_{1-x}Ga_{1+x}O_3(ZnO)_m$ (x is a number which satisfies $-1 \leq x \leq 1$, and m is a natural number). Furthermore, Non-Patent Document 1 discloses a solid solution range (solid solution range) of a homologous series. For example, in the solid solution range of the homologous series in the case where m=1, x ranges from −0.33 to 0.08, and in the solid solution range of the homologous series in the case where m=2, x ranges from −0.68 to 0.32.

PRIOR ART DOCUMENTS

Patent Document

[Patent Document 1] Japanese Published Patent Application No. 2014-7399

Non-Patent Document

[Non-Patent Document 1] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315.

DISCLOSURE OF INVENTION

Problems to be Solved by Invention

One object of one embodiment of the present invention is to provide a metal oxide film containing a crystal part. Another object is to provide a metal oxide film with highly stable physical properties. Another object is to provide a metal oxide film with improved electrical characteristics. Another object is to provide a metal oxide film with which field-effect mobility can be increased. Another object is to provide a novel metal oxide film. Another object is to provide a highly reliable semiconductor device including a metal oxide film.

Another object of one embodiment of the present invention is to provide a metal oxide film which can be formed at a low temperature and has highly stable physical properties. Another object is to provide a highly reliable semiconductor device which can be formed at a low temperature.

Another object of one embodiment of the present invention is to provide a flexible device including a metal oxide film.

Note that the descriptions of these objects do not disturb the existence of other objects. In one embodiment of the present invention, there is no need to achieve all the objects. Other objects can be derived from the description of the specification, the drawings, the claims, and the like.

Means to Solve Problems

One embodiment of the present invention is a metal oxide film including In, M (M is Al, Ga, Y, or Sn), and Zn; the metal oxide film includes a first crystal part and a second crystal part; the first crystal part has c-axis alignment; and the second crystal part has no c-axis alignment.

In addition, another embodiment of the present invention is a metal oxide film including In, M (M is Al, Ga, Y, or Sn), and Zn; the metal oxide film includes a first crystal part and a second crystal part; the first crystal part has c-axis alignment; the second crystal part has no c-axis alignment; and the existing proportion of the second crystal part is higher than the existing proportion of the first crystal part.

In addition, another embodiment of the present invention is a metal oxide film including In, M (M is Al, Ga, Y, or Sn), and Zn; the metal oxide film includes a first crystal part and a second crystal part; the first crystal part has c-axis alignment; the second crystal part has no c-axis alignment; in the case where an electron diffraction pattern of the metal oxide film is observed by performing electron diffraction measurement on a cross section, the electron diffraction pattern includes a first region including a diffraction spot derived from the first crystal part and a second region including a diffraction spot derived from the second crystal part; and the integrated intensity of luminance in the first region is higher than the integrated intensity of luminance in the second region.

In the above embodiment, the integrated intensity of luminance in the first region is preferably more than one time and less than or equal to 40 times, more preferably more than one time and less than or equal to 10 times, further preferably more than one time and less than or equal to 3 times the integrated intensity of luminance in the second region.

In addition, in the above embodiment, the metal oxide film preferably includes a region where the peak value of the density of shallow defect states is less than $5\times10^{12}$ cm$^{-2}$ eV$^{-1}$.

In addition, in the above embodiment, it is preferable that the atomic ratio of In to M and Zn in the metal oxide film be in a neighborhood of In:M:Zn=4:2:3, and in the case where the ratio of the number of In atoms to the total number of In, M, and Zn atoms is 4, the ratio of the number of M atoms be greater than or equal to 1.5 and less than or equal to 2.5 and the ratio of the number of Zn atoms be greater than or equal to 2 and less than or equal to 4.

In addition, another embodiment of the present invention is a semiconductor device including a semiconductor film, a gate insulating film, and a gate electrode, and the semiconductor film includes the above metal oxide film.

In addition, another embodiment of the present invention is a display device including the metal oxide film according to any one of the above embodiments or the semiconductor device in the above embodiment.

Effect of Invention

According to one embodiment of the present invention, a metal oxide film containing a crystal part can be provided. Alternatively, a metal oxide film with highly stable physical properties can be provided. Alternatively, a novel metal oxide film can be provided. Alternatively, a highly reliable semiconductor device including a metal oxide film can be provided.

In addition, according to one embodiment of the present invention, a metal oxide film which can be formed at a low temperature and has highly stable physical properties can be provided. Alternatively, a highly reliable semiconductor device which can be formed at a low temperature can be provided.

Alternatively, according to one embodiment of the present invention, a flexible device including a metal oxide film can be provided.

BRIEF DESCRIPTION OF DRAWINGS

FIGS. 7A to 7C show XRD measurement results and electron diffraction patterns of a metal oxide film.

FIGS. 9A to 9C show XRD measurement results and electron diffraction patterns of a metal oxide film.

FIG. 15 shows schematic diagrams illustrating line profiles of electron diffraction patterns, relative luminances R of the line profiles, and full width at half maximum of spectra.

FIGS. 16A1, 16A2, 16B1, and 16B2 show electron diffraction patterns and luminance profiles.

FIGS. 17A1, 17A2, 17B1, and 17B2 show electron diffraction patterns and luminance profiles.

FIGS. 18A1, 18A2, 18B1, and 18B2 show electron diffraction patterns and luminance profiles.

FIGS. 89A to 89L show TEM images and electron diffraction patterns of a sample.

MODE FOR CARRYING OUT THE INVENTION

Figure 1A:
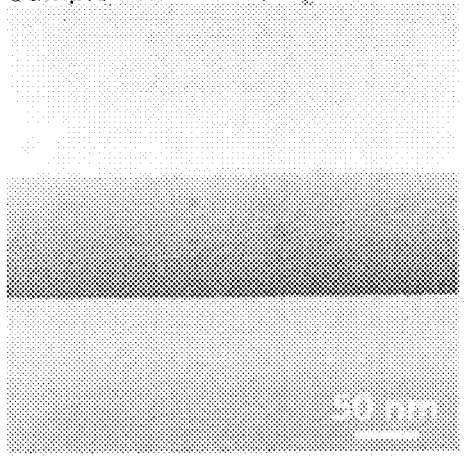
FIGS. 1A to 1C show cross-sectional TEM images and a cross-sectional HR-TEM image of a metal oxide film.
Figure 1B:
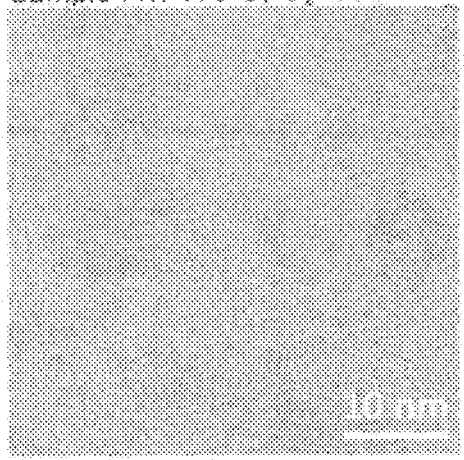

Embodiments will be hereinafter described with reference to drawings. Note that the embodiments can be implemented with many different modes. It will be readily appreciated by those skilled in the art that modes and details can be changed in various ways without departing from the spirit and scope of the present invention. Therefore, the present invention should not be interpreted as being limited to the description in the following embodiments.

In addition, in the drawings, the size, the layer thickness, or the region is exaggerated for clarity in some cases. Therefore, embodiments of the present invention are not necessarily limited to such a scale. Note that the drawings are schematic views showing ideal examples, and embodiments of the present invention are not limited to shapes or values shown in the drawings.

In addition, it is to be noted that ordinal numbers such as "first", "second", and "third" in this specification are used in order to avoid confusion among components, and the terms do not limit the components numerically.

In addition, in this specification, terms for describing arrangement, such as "over" and "under", are used for convenience for describing the positional relationship between components with reference to drawings. Furthermore, the positional relationship between components is changed as appropriate in accordance with a direction in which each component is described. Thus, the positional relationship is not limited to that described with a term used in this specification and can be explained with another term as appropriate depending on the situation.

In addition, in this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain, the channel region, and the source. Note that in this specification and the like, a channel region refers to a region through which current mainly flows.

In addition, functions of a source and a drain are sometimes replaced with each other when a transistor of opposite polarity is used or when the direction of current flow is changed in circuit operation, for example. Therefore, the terms of the source and the drain can be replaced with each other in this specification and the like.

In addition, in this specification and the like, the term "electrically connected" includes the case of being connected through an object having any electric function. There is no particular limitation on an "object having any electric function" as long as electric signals can be transmitted and received between components that are connected through the object. Examples of an "object having any electric function" include a switching element such as a transistor, a resistor, an inductor, a capacitor, and an element with a variety of functions, as well as an electrode and a wiring.

In addition, in this specification and the like, "parallel" indicates a state where two straight lines are positioned at an angle of greater than or equal to −10° and less than or equal to 10°, and accordingly also includes the case where it is greater than or equal to −5° and less than or equal to 5°. In addition, "perpendicular" indicates a state where two straight lines are positioned at an angle of greater than or equal to 80° and less than or equal to 100°, and accordingly also includes the case where it is greater than or equal to 85° and less than or equal to 95°.

In addition, in this specification and the like, the term "film" and the term "layer" can be interchanged with each other. For example, the term "conductive layer" can be changed into the term "conductive film" in some cases. Alternatively, for example, the term "insulating film" can be changed into the term "insulating layer" in some cases.

In addition, unless otherwise specified, the off-state current in this specification and the like refers to a drain current of a transistor in the off state (also referred to as non-conduction state and cutoff state). Unless otherwise specified, the off state of an n-channel transistor means a state where the voltage Vgs between its gate and source is lower than the threshold voltage Vth, and the off state of a p-channel transistor means a state where the voltage Vgs between its gate and source is higher than the threshold voltage Vth. For example, the off-state current of an n-channel transistor sometimes refers to a drain current that flows when the voltage Vgs between its gate and source is lower than the threshold voltage Vth.

The off-state current of a transistor depends on Vgs in some cases. Thus, "the off-state current of a transistor being lower than or equal to I" may mean there is a value of Vgs at which the off-state current of the transistor is lower than or equal to I. The off-state current of a transistor may refer to an off-state current in an off state at given Vgs, an off state at Vgs in a given range, an off state at Vgs at which sufficiently low off-state current is obtained, or the like.

As an example, the assumption is made of an n-channel transistor where the threshold voltage Vth is 0.5 V and the drain current is $1\times10^{-9}$ A at Vgs of 0.5 V, $1\times10^{-13}$ A at Vgs of 0.1 V, $1\times10^{-19}$ A at Vgs of −0.5 V, and $1\times10^{-22}$ A at Vgs of −0.8 V. The drain current of the transistor is $1\times10^{-19}$ A or lower at Vgs of −0.5 V or at Vgs in the range of −0.8 V to −0.5 V; therefore, it can be said that the off-state current of the transistor is $1\times10^{-19}$ A or lower. Since there is Vgs at which the drain current of the transistor is $1\times10^{-22}$ A or lower, it may be said that the off-state current of the transistor is $1\times10^{-22}$ A or lower.

In addition, in this specification and the like, the off-state current of a transistor with a channel width W is sometimes represented by a current value per channel width W. In addition, it is sometimes represented by a current value per given channel width (e.g., 1 μm). In the latter case, the off-state current may be expressed in the unit with the dimension of current/length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like including the transistor is used (e.g., a temperature in the range of 5° C. to 35° C.). The off-state current of a transistor being lower than or equal to I may mean there is a value of Vgs at which the off-state current of the transistor at room temperature, 60° C., 85° C., 95° C., 125° C., a temperature at which the reliability of a semiconductor device or the like including the transistor is ensured, or a temperature at which the semiconductor device or the like including the transistor is used (e.g., a temperature in the range of 5° C. to 35° C.) is lower than or equal to I.

The off-state current of a transistor depends on voltage Vds between its drain and source in some cases. Unless otherwise specified, the off-state current in this specification may be an off-state current at Vds of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at Vds at which the reliability of a semiconductor device or the like including the transistor is ensured or Vds used in the semiconductor device or the like including the transistor. The off-state current of a transistor being lower than or equal to I may mean there is a value of Vgs at which the off-state current of the transistor at Vds of 0.1 V, 0.8 V, 1 V, 1.2 V, 1.8 V, 2.5 V, 3 V, 3.3 V, 10 V, 12 V, 16 V, or 20 V, at Vds at which the reliability of a semiconductor device including the transistor is ensured, or at Vds used in the semiconductor device or the like including the transistor is lower than or equal to I.

In the above description of off-state current, a drain may be replaced with a source. That is, the off-state current sometimes refers to a current that flows through a source of a transistor in the off state.

In addition, in this specification and the like, leakage current sometimes expresses the same meaning as off-state current. Furthermore, in this specification and the like, the off-state current sometimes refers to a current that flows between a source and a drain when a transistor is off, for example.

In addition, in this specification and the like, the threshold voltage of a transistor refers to a gate voltage (Vg) at which a channel is formed in the transistor. Specifically, the threshold voltage of a transistor may refer to a gate voltage (Vg) at the intersection of a straight line obtained by extrapolating a tangent line having the highest inclination with the square root of drain current (Id) of 0 (Id of 0 A) in a curve where the gate voltage (Vg) is plotted on the horizontal axis and the square root of drain current (Id) on the vertical axis (Vg–√Id characteristics). Alternatively, the threshold voltage of a transistor may refer to a gate voltage (Vg) at which the value of Id [A]×L [μm]/W [μm] is $1\times10^{-9}$ [A] where L is channel length and W is channel width.

In addition, in this specification and the like, a "semiconductor" includes characteristics of an "insulator" in some cases when the conductivity is sufficiently low, for example. Furthermore, a "semiconductor" and an "insulator" cannot be strictly distinguished from each other in some cases because the border is not clear. Accordingly, a "semiconductor" in this specification and the like can also be called an "insulator" in some cases. Similarly, an "insulator" in this specification and the like can also be called a "semiconductor" in some cases. Alternatively, an "insulator" in this specification and the like can also be called a "semi-insulator" in some cases.

In addition, in this specification and the like, a "semiconductor" includes characteristics of a "conductor" in some cases when the conductivity is sufficiently high, for example. Furthermore, a "semiconductor" and a "conductor" cannot be strictly distinguished from each other in some cases because the border is not clear. Accordingly, a "semiconductor" in this specification and the like can also be called a "conductor" in some cases. Similarly, a "conductor" in this specification and the like can also be called a "semiconductor" in some cases.

In addition, in this specification and the like, an impurity in a semiconductor refers to an element other than the main components of a semiconductor film. For example, an element with a concentration of lower than 0.1 atomic % is an impurity. When an impurity is contained, the DOS (Density of States) may be formed in a semiconductor, the carrier mobility may be decreased, or the crystallinity may be decreased. In the case where the semiconductor includes an oxide semiconductor, examples of an impurity which changes the characteristics of the semiconductor include Group 1 elements, Group 2 elements, Group 13 elements, Group 14 elements, Group 15 elements, and transition metals other than the main components, specifically, hydrogen (also contained in water), lithium, sodium, silicon, boron, phosphorus, carbon, nitrogen, and the like. In the case of an oxide semiconductor, for example, oxygen vacancies may be formed by entry of impurities such as hydrogen. Furthermore, when the semiconductor includes silicon, examples of an impurity which changes the characteristics of the semiconductor include oxygen, Group 1 elements except hydrogen, Group 2 elements, Group 13 elements, Group 15 elements, and the like.

Embodiment 1

<1-1. Structure of Metal Oxide Film>

One embodiment of the present invention is a metal oxide film containing two types of crystal parts. One of the crystal parts (also referred to as a first crystal part) is a crystal part having alignment in the film thickness direction (also referred to as a direction perpendicular to a film-plane direction, a surface on which a film is formed, or a surface of a film), i.e., having c-axis alignment. The other of the crystal parts (also referred to as a second crystal part) is a crystal part having no c-axis alignment and having orientations in various directions. In the metal oxide film of one embodiment of the present invention, such two types of crystal parts are mixed.

Note that the crystal part having c-axis alignment and the crystal part having no c-axis alignment are distinguishably described below as the first crystal part and the second crystal part, respectively, for easy description; however, they cannot be distinguished from each other in some cases because there is no difference in crystallinity, crystal size, or the like. That is, the metal oxide film of one embodiment of the present invention can be expressed without a distinction between them.

For example, the metal oxide film of one embodiment of the present invention includes a plurality of crystal parts, and it is acceptable as long as at least one crystal part of the crystal parts existing in the film has c-axis alignment. In addition, the existing proportion of the crystal part having no c-axis alignment among the crystal parts existing in the film may be higher than the existing proportion of the crystal part having c-axis alignment. In one example, there is a case where a plurality of crystal parts are observed in an image observed with a transmission electron microscope in a cross section in the thickness direction of the metal oxide film of one embodiment of the present invention, and more second crystal parts having no c-axis alignment than first crystal parts having c-axis alignment are observed among the plurality of crystal parts. In other words, the existing proportion of the second crystal part having no c-axis alignment is high in the metal oxide film of one embodiment of the present invention.

The high existing proportion of the second crystal part having no c-axis alignment in the metal oxide film provides the following excellent effects.

In the case where there is a sufficient oxygen supply source near the metal oxide film, the second crystal part having no c-axis alignment can serve as an oxygen diffusion path. Thus, in the case where there is a sufficient oxygen supply source near the metal oxide film, oxygen can be supplied to the first crystal part having c-axis alignment through the second crystal part having no c-axis alignment. Accordingly, the amount of oxygen vacancy in the metal oxide film can be reduced. With the use of such a metal oxide film as a semiconductor film of a transistor, high reliability and high field-effect mobility can be obtained.

In addition, in the first crystal part, a specific crystal plane has alignment in the film thickness direction. Therefore, when X-ray diffraction (XRD: X-ray Diffraction) measurement in a direction substantially perpendicular to a film upper surface is performed on the metal oxide film containing the first crystal part, a diffraction peak originating from the first crystal part is observed at a predetermined diffraction angle ($2\theta$). On the other hand, even when the metal oxide film includes the first crystal part, the diffraction peak is sometimes not sufficiently observed because of X-ray scattering or increased background due to a support substrate. Note that the height (intensity) of the diffraction peak increases with the existing proportion of the first crystal part in the metal oxide film and can serve as an indicator for inferring the crystallinity of the metal oxide film.

In addition, electron diffraction can be given as a method for evaluating the crystallinity of a metal oxide film. For example, in the case where an electron diffraction pattern of the metal oxide film of one embodiment of the present invention is observed by performing electron diffraction measurement on a cross section, a first region including a diffraction spot derived from the first crystal part and a second region including a diffraction spot derived from the second crystal part are observed.

The first region including a diffraction spot derived from the first crystal part originates from the crystal part having c-axis alignment. On the other hand, the second region including a diffraction spot derived from the second crystal part originates from crystal parts having no alignment or crystal parts having random orientations in all directions. Therefore, different patterns may be observed depending on the diameter of an electron beam used for the electron diffraction, i.e., the area of a region to be observed. Note that in this specification and the like, electron diffraction measured with an electron beam diameter of greater than or equal to 1 nmΦ and less than or equal to 100 nmΦ is referred to as nanobeam electron diffraction (NBED: Nano Beam Electron Diffraction).

Note that the crystallinity of the metal oxide film of one embodiment of the present invention may be evaluated by a method different from NBED. Electron diffraction, X-ray diffraction, neutron diffraction, and the like can be given as examples of methods for evaluating the crystallinity of the metal oxide film. Besides NBED mentioned above, among electron diffractions, transmission electron microscopy (TEM: Transmission Electron Microscopy), scanning electron microscopy (SEM: Scanning Electron Microscopy), convergent beam electron diffraction (CBED: Convergent Beam Electron Diffraction), selected area electron diffraction (SAED: Selected Area Electron Diffraction), and the like can be favorably used.

In addition, in NBED, a ring-like pattern is observed in a nanobeam electron diffraction pattern under conditions where the diameter of an electron beam is large (e.g., greater than or equal to 25 nmΦ and less than or equal to 100 nmΦ, or greater than or equal to 50 nmΦ and less than or equal to 100 nmΦ). Furthermore, in some cases, the ring-like pattern has a luminance distribution in a radial direction. On the other hand, in NBED, a plurality of spots distributed in a circumferential direction (also referred to as θ direction) are sometimes observed at the position of the ring-like pattern in an electron diffraction pattern under conditions where the diameter of an electron beam is sufficiently small (e.g., greater than or equal to 1 nmΦ and less than or equal to 10 nmΦ). That is, the ring-like pattern observed under the conditions where the diameter of an electron beam is large is formed by an aggregate of the plurality of spots.

<1-2. Evaluation of Crystallinity of Metal Oxide Film>

Below, six samples (samples A1 to A6) in which metal oxide films were formed under different conditions were fabricated to evaluate crystallinity. First, methods for fabricating the samples A1 to A6 are described below.

[Sample A1]

The sample A1 is a sample in which a metal oxide film with a thickness of approximately 100 nm is formed over a glass substrate. The metal oxide film includes indium, gallium, and zinc. As conditions for forming the metal oxide film of the sample A1, the substrate was heated to 170° C., an argon gas at a flow rate of 140 sccm and an oxygen gas at a flow rate of 60 sccm were introduced into a chamber of a sputtering apparatus, the pressure was 0.6 Pa, and an alternating-current power of 2.5 kW was applied to a metal oxide target including indium, gallium, and zinc (In:Ga:Zn=4:2:4.1 [atomic ratio]). The proportion of the flow rate of oxygen to the flow rate of the entire gas is sometimes referred to as oxygen flow rate percentage. Note that the oxygen flow rate percentage under the conditions for fabricating the sample A1 is 30%.

[Sample A2]

The sample A2 is a sample in which a metal oxide film with a thickness of approximately 100 nm is formed over a glass substrate. As conditions for forming the metal oxide film of the sample A2, the substrate was heated to 170° C., and an argon gas at a flow rate of 180 sccm and an oxygen gas at a flow rate of 20 sccm were introduced into a chamber of a sputtering apparatus. The oxygen flow rate percentage under the conditions for fabricating the sample A2 is 10%. Note that conditions other than the oxygen flow rate percentage were similar to those for the sample A1 described above.

[Sample A3]

The sample A3 is a sample in which a metal oxide film with a thickness of approximately 100 nm is formed over a glass substrate. As conditions for forming the metal oxide film of the sample A3, the substrate was heated to 130° C., and an argon gas at a flow rate of 180 sccm and an oxygen gas at a flow rate of 20 sccm were introduced into a chamber of a sputtering apparatus. The oxygen flow rate percentage under the conditions for fabricating the sample A3 is 10%. Note that conditions other than the substrate temperature and the oxygen flow rate percentage were similar to those for the sample A1 described above.

[Sample A4]

The sample A4 is a sample in which a metal oxide film with a thickness of approximately 100 nm is formed over a glass substrate. As conditions for forming the metal oxide film of the sample A4, the substrate was heated to 100° C., and an argon gas at a flow rate of 180 sccm and an oxygen gas at a flow rate of 20 sccm were introduced into a chamber of a sputtering apparatus. The oxygen flow rate percentage under the conditions for fabricating the sample A4 is 10%. Note that conditions other than the substrate temperature and the oxygen flow rate percentage were similar to those for the sample A1 described above.

[Sample A5]

The sample A5 is a sample in which a metal oxide film with a thickness of approximately 100 nm is formed over a glass substrate. As conditions for forming the metal oxide film of the sample A5, the substrate was heated to 70° C., and an argon gas at a flow rate of 180 sccm and an oxygen gas at a flow rate of 20 sccm were introduced into a chamber of a sputtering apparatus. The oxygen flow rate percentage under the conditions for fabricating the sample A5 is 10%. Note that conditions other than the substrate temperature and the oxygen flow rate percentage were similar to those for the sample A1 described above.

[Sample A6]

The sample A6 is a sample in which a metal oxide film with a thickness of approximately 100 nm is formed over a glass substrate. As conditions for forming the metal oxide film of the sample A6, the substrate was at room temperature (e.g., higher than or equal to 20° C. and lower than or equal to 30° C., and note that room temperature is denoted by R.T. in Table 1), and an argon gas at a flow rate of 180 sccm and an oxygen gas at a flow rate of 20 sccm were introduced into a chamber of a sputtering apparatus. The oxygen flow rate percentage under the conditions for fabricating the sample A6 is 10%. Note that conditions other than the substrate temperature and the oxygen flow rate percentage were similar to those for the sample A1 described above.

Table 1 shows the conditions for fabricating the samples A1 to A6.

TABLE 1

| | Target [atomic ratio] | Substrate temperature [° C.] | Pressure [Pa] | Oxygen flow rate percentage [%] |
|---|---|---|---|---|
| Sample A1 | In:Ga:Zn = 4:2:4.1 | 170 | 0.6 | 30 |
| Sample A2 | In:Ga:Zn = 4:2:4.1 | 170 | 0.6 | 10 |
| Sample A3 | In:Ga:Zn = 4:2:4.1 | 130 | 0.6 | 10 |
| Sample A4 | In:Ga:Zn = 4:2:4.1 | 100 | 0.6 | 10 |
| Sample A5 | In:Ga:Zn = 4:2:4.1 | 70 | 0.6 | 10 |
| Sample A6 | In:Ga:Zn = 4:2:4.1 | R.T. | 0.6 | 10 |

Next, crystallinity evaluation of the above-fabricated samples A1 to A6 was performed. In this embodiment, cross-sectional TEM observation, XRD measurement, and electron diffraction were performed as crystallinity evaluation.

[Cross-Sectional TEM Observation]

FIGS. 1A to 6C show cross-sectional TEM observation results of the samples A1 to A6. Note that FIGS. 1A and 1B are cross-sectional TEM images of the sample A1; FIGS. 2A and 2B are cross-sectional TEM images of the sample A2; FIGS. 3A and 3B are cross-sectional TEM images of the sample A3; FIGS. 4A and 4B are cross-sectional TEM images of the sample A4; FIGS. 5A and 5B are cross-sectional TEM images of the sample A5; and FIGS. 6A and 6B are cross-sectional TEM images of the sample A6.

Figure 1C:
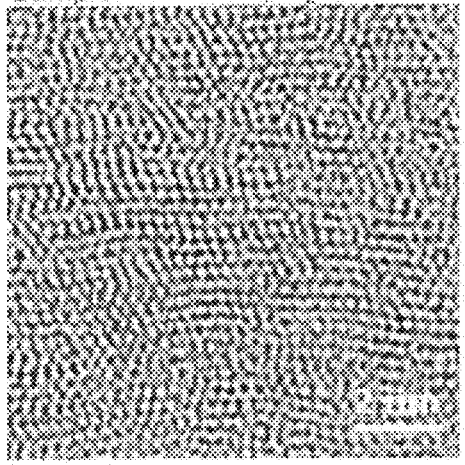
Figure 2A:
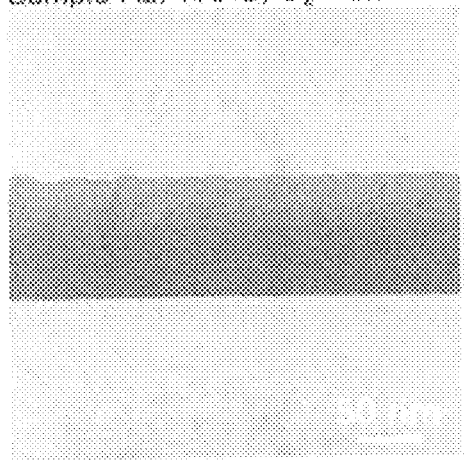
FIGS. 2A to 2C show cross-sectional TEM images and a cross-sectional HR-TEM image of a metal oxide film.
Figure 2B:
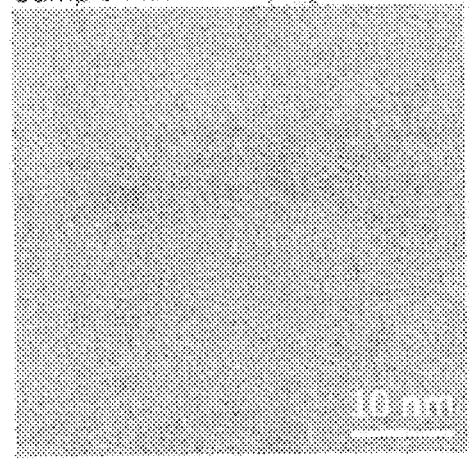
Figure 2C:
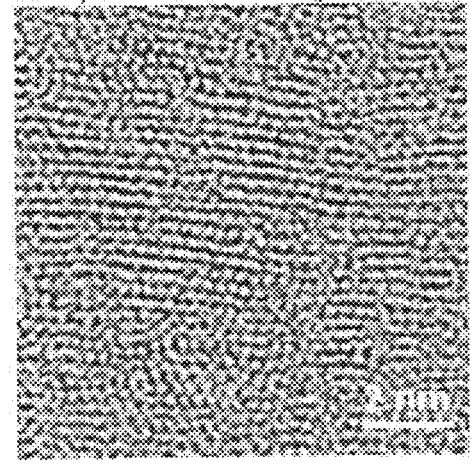
Figure 3A:
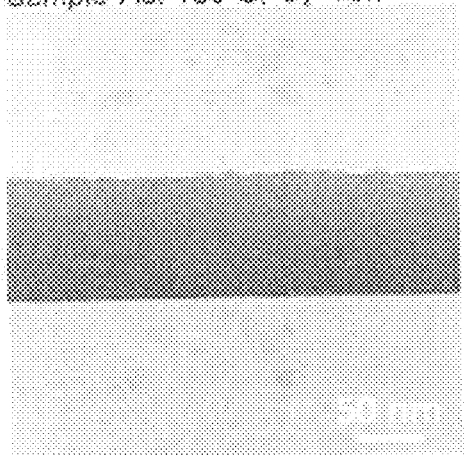
FIGS. 3A to 3C show cross-sectional TEM images and a cross-sectional HR-TEM image of a metal oxide film.
Figure 3B:
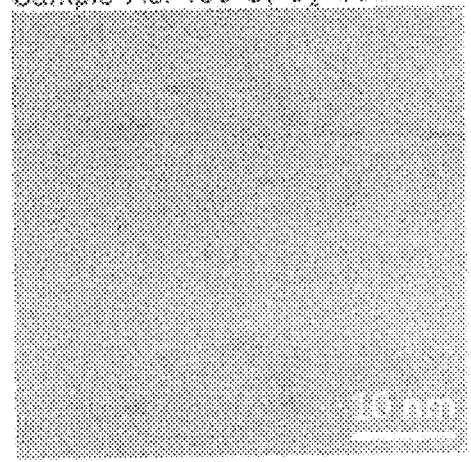
Figure 3C:
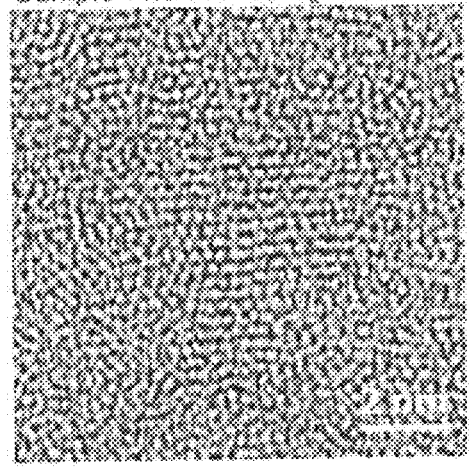
Figure 4A:
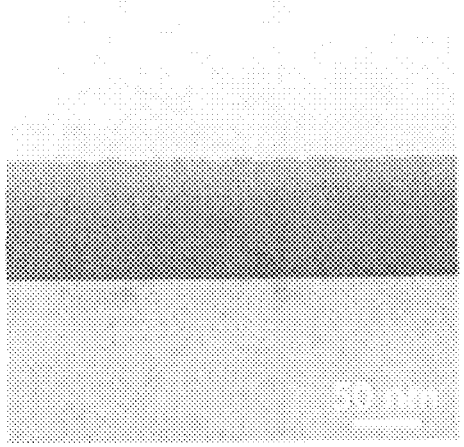
FIGS. 4A to 4C show cross-sectional TEM images and a cross-sectional HR-TEM image of a metal oxide film.
Figure 4B:
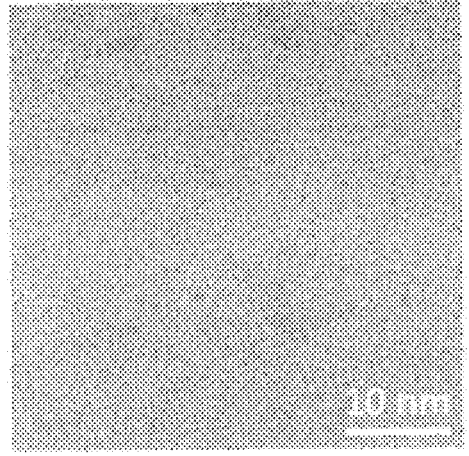
Figure 4C:
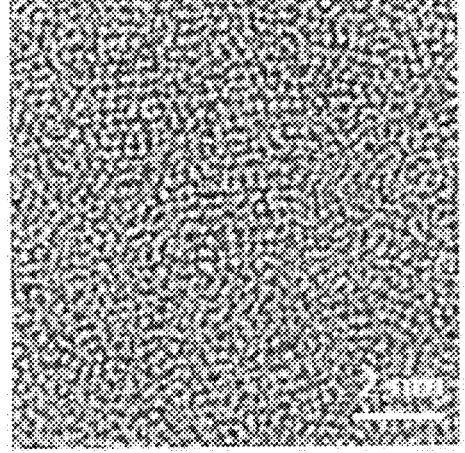
Figure 5A:
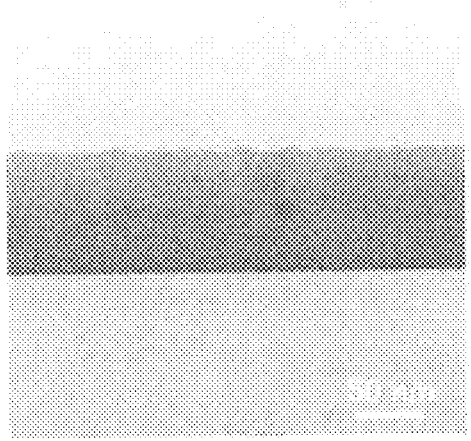
FIGS. 5A to 5C show cross-sectional TEM images and a cross-sectional HR-TEM image of a metal oxide film.
Figure 5B:
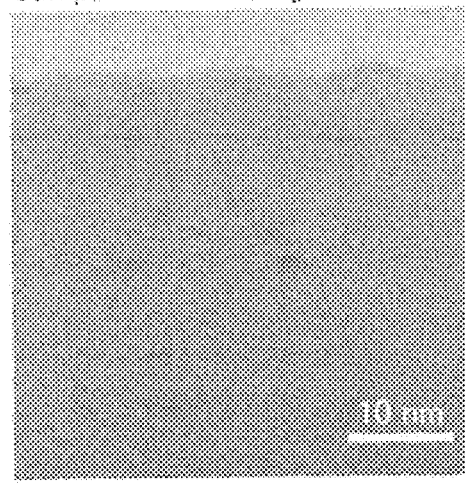
Figure 5C:
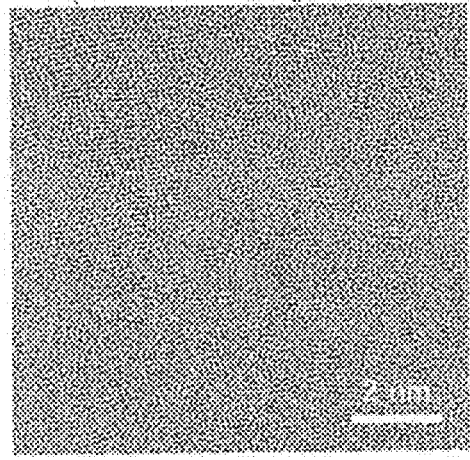
Figure 6A:
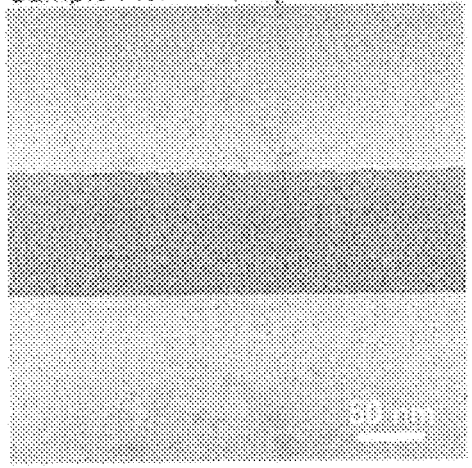
FIGS. 6A to 6C show cross-sectional TEM images and a cross-sectional HR-TEM image of a metal oxide film.
Figure 6B:
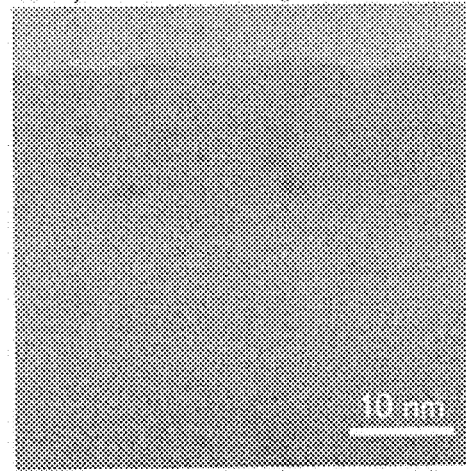
Figure 6C:
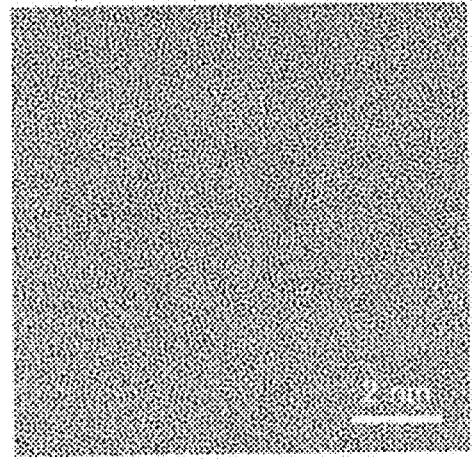
Figure 8A:
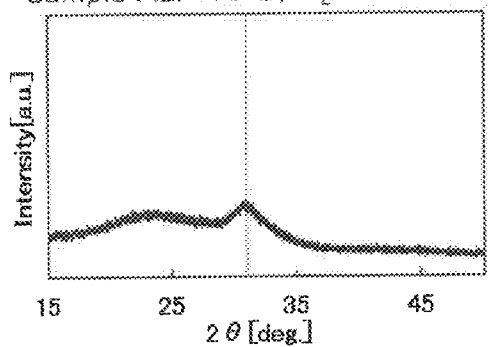
FIGS. 8A to 8C show XRD measurement results and electron diffraction patterns of a metal oxide film.
Figure 8B:
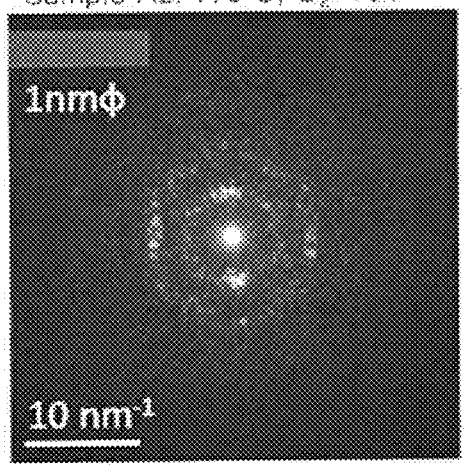
Figure 8C:
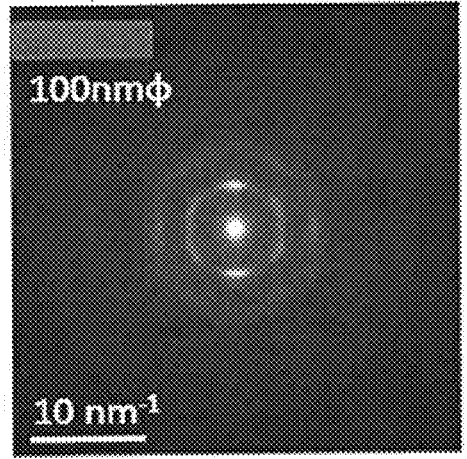
Figure 10A:
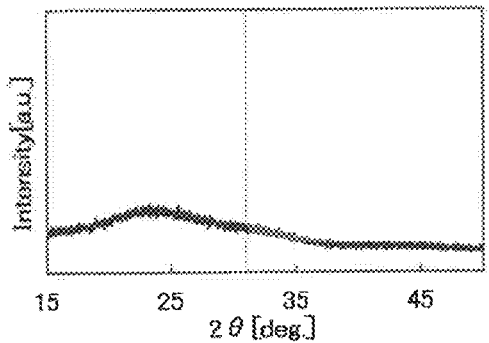
FIGS. 10A to 10C show XRD measurement results and electron diffraction patterns of a metal oxide film.
Figure 10B:
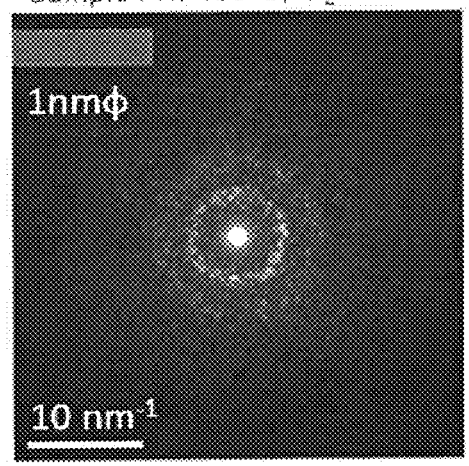
Figure 10C:
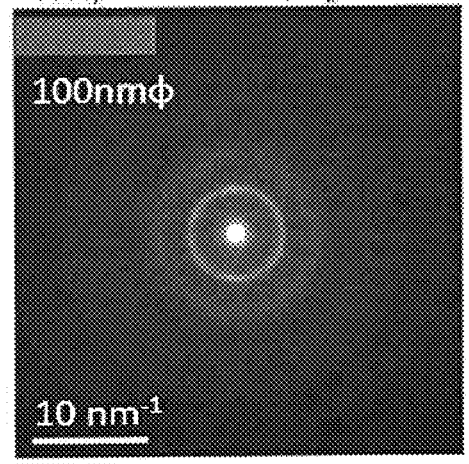
Figure 11A:
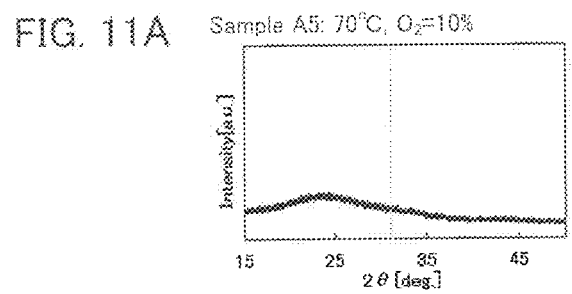
FIGS. 11A to 11C show XRD measurement results and electron diffraction patterns of a metal oxide film.
Figure 11B:
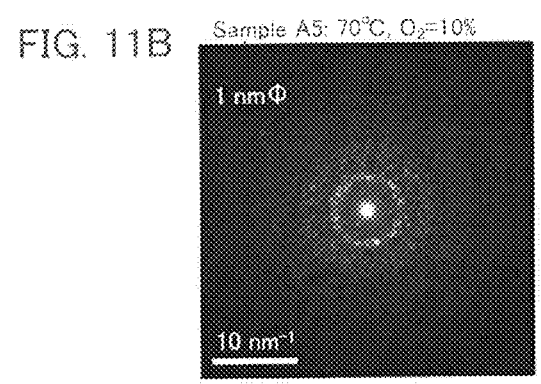
Figure 11C:
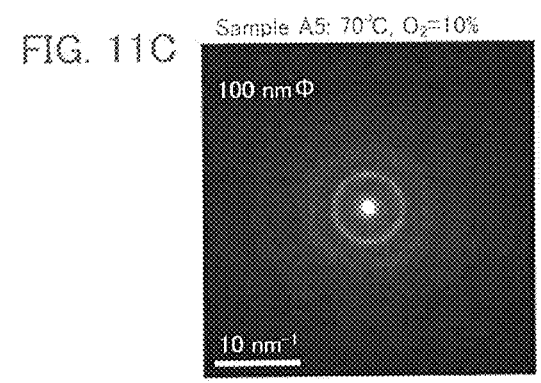

In addition, FIG. 1C is a cross-sectional high-resolution transmission electron microscopy (HR-TEM: High Resolution TEM) image of the sample A1; FIG. 2C is a cross-sectional HR-TEM image of the sample A2; FIG. 3C is a cross-sectional HR-TEM image of the sample A3; FIG. 4C is a cross-sectional HR-TEM image of the sample A4; FIG. 5C is a cross-sectional HR-TEM image of the sample A5; and FIG. 6C is a cross-sectional HR-TEM image of the sample A6. Note that a spherical aberration corrector function may be used for observation of the cross-sectional HR-TEM images. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd. or the like.

As shown in FIGS. 1A to 5C, crystal parts in which atoms are arranged in a layered manner in the thickness direction are observed in the samples A1 to A5. Crystal parts in which atoms are arranged in a layered manner are easily observed particularly in the HR-TEM images. In addition, as shown in FIGS. 6A to 6C, the state in which atoms are arranged in a layered manner in the thickness direction is unlikely to be confirmed in the sample A6. Note that it appears that the proportion of the region where atoms are arranged in a layered manner in the thickness direction is the highest in the sample A1 and the proportion of the region where atoms are arranged in a layered manner in the thickness direction decreases in the order of the sample A2, the sample A3, the sample A4, and the sample A5.

[XRD Measurement]

Next, XRD measurement results of each sample are described.

FIG. 7A, FIG. 8A, FIG. 9A, FIG. 10A, FIG. 11A, and FIG. 12A show XRD measurement results of the sample A1, XRD measurement results of the sample A2, XRD measurement results of the sample A3, XRD measurement results of the sample A4, XRD measurement results of the sample A5, and XRD measurement results of the sample A6, respectively.

In the XRD measurement, a powder method (also referred to as a θ-2θ method), which is a kind of out-of-plane method, was used. A θ-2θ method is a method in which X-ray diffraction intensity is measured while an incident angle of an X-ray is changed and the angle of a detector provided to face an X-ray source is equal to the incident angle. Note that a GIXRD (Grazing-Incidence XRD) method (also referred to as a thin film method or a Seemann-Bohlin method), which is a kind of out-of-plane method in which X-ray diffraction intensity is measured while an X-ray is incident from an angle of approximately 0.40° to a film surface and the angle of a detector is changed, may be used. In FIG. 7A, FIG. 8A, FIG. 9A, FIG. 10A, FIG. 11A, and FIG. 12A, the vertical axis represents diffraction intensity in arbitrary unit, and the horizontal axis represents the angle 2θ.

Figure 12A:
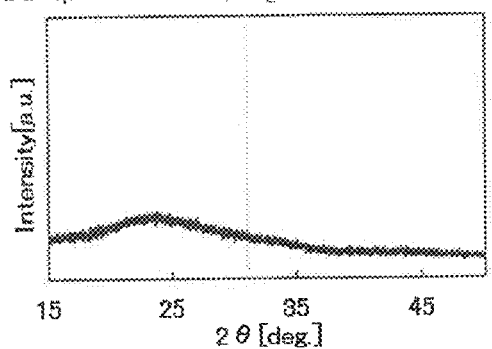
FIGS. 12A to 12C show XRD measurement results and electron diffraction patterns of a metal oxide film.
Figure 12B:
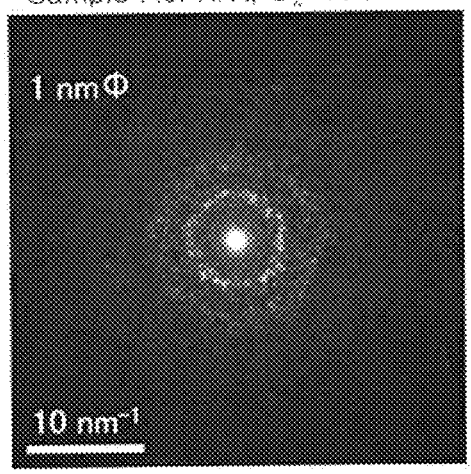
Figure 12C:
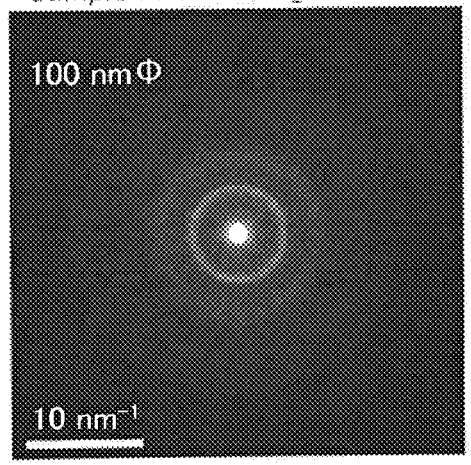

As shown in FIG. 7A, FIG. 8A, FIG. 9A, and FIG. 10A, a peak of diffraction intensity is clearly observed at around 2θ=31° in the samples A1 to A4. On the other hand, as shown in FIG. 1A and FIG. 12A, the peak of diffraction intensity at around 2θ=31° is unlikely to be observed, the peak of diffraction intensity at around 2θ=31° is extremely low, or there is no peak of diffraction intensity at around 2θ=31 in the samples A5 and A6.

Note that the diffraction angle at which the peak of diffraction intensity is seen (around 2θ=31°) corresponds to the diffraction angle at the (009) plane in a structural model of single-crystal $InGaZnO_4$. Therefore, the above-described peak is observed in the samples A1 to A4; thus, it can be confirmed that crystal parts whose c-axes are aligned in the thickness direction (hereinafter also referred to as crystal parts having c-axis alignment or first crystal parts) are contained. In addition, a comparison of intensities shows that the existing proportion of the crystal parts having c-axis alignment is the highest in the sample A1 and decreases in the order of the sample A2, the sample A3, and the sample A4. Note that it is difficult to determine, by XRD measurement, whether the sample A5 and the sample A6 contain the crystal parts having c-axis alignment.

The results indicate that the existing proportion of the crystal parts having c-axis alignment tends to increase as the substrate temperature at the time of film formation increases or as the oxygen flow rate percentage at the time of film formation increases.

[Electron Diffraction]

Next, results of performing electron diffraction measurement of the samples A1 to A6 are described. In electron diffraction measurement, an electron diffraction pattern with an electron beam incident perpendicularly on a cross section of each sample is obtained. In addition, two electron beam diameters of 1 nmΦ and 100 nmΦ were set.

Note that in the electron diffraction, as the thickness of the sample as well as the size of the incident electron beam diameter increases, more information on the depth direction appears in an electron diffraction pattern. Therefore, information on a more local region can be obtained by decreasing the thickness of the sample in the depth direction as well as decreasing the electron beam diameter. On the other hand, in the case where the thickness of the sample in the depth direction is too small (e.g., in the case where the thickness of the sample in the depth direction is 5 nm or less), only information on a minute region is obtained. Therefore, in the case where a crystal exists in a minute region, an obtained electron diffraction pattern may be similar to an electron diffraction pattern of single crystal. In the case where analysis of a minute region is not the purpose, the thickness of the sample in the depth direction is preferably, for example, greater than or equal to 10 nm and less than or equal to 100 nm, typically greater than or equal to 10 nm and less than or equal to 50 nm.

FIGS. 7B and 7C, FIGS. 8B and 8C, FIGS. 9B and 9C, FIGS. 10B and 10C, FIGS. 11B and 11C, and FIGS. 12B and 12C show electron diffraction patterns of the sample A1, electron diffraction patterns of the sample A2, electron diffraction patterns of the sample A3, electron diffraction patterns of the sample A4, electron diffraction patterns of the sample A5, and electron diffraction patterns of the sample A6, respectively.

Note that the electron diffraction patterns shown in FIGS. 7B and 7C, FIGS. 8B and 8C, FIGS. 9B and 9C, FIGS. 10B and 10C, FIGS. 11B and 11C, and FIGS. 12B and 12C are image data whose contrasts are adjusted so that the electron diffraction patterns become clear. In addition, in FIGS. 7B and 7C, FIGS. 8B and 8C, FIGS. 9B and 9C, FIGS. 10B and 10C, FIGS. 11B and 11C, and FIGS. 12B and 12C, the brightest point in the middle is due to the incident electron beam and is the center (also referred to as a direct spot or a transmitted wave) of the electron diffraction pattern.

In addition, in the case where the incident electron beam diameter is 1 nmΦ, a plurality of spots distributed circumferentially as shown in FIG. 7B are observed, which suggests that a plurality of minute crystal parts whose plane orientations are arranged in all directions are mixed in the metal oxide film of the sample A1. Furthermore, in the case where the incident electron beam diameter is 100 nmΦ, it can be confirmed as shown in FIG. 7C that diffraction spots from the plurality of crystal parts are connected and become a ring-like diffraction pattern with an averaged luminance. Furthermore, in FIG. 7C, two ring-like diffraction patters with different radii can be observed. Here, they are referred to as a first ring and a second ring in ascending order of radius of diffraction pattern. It can be confirmed that the first ring has a higher luminance than the second ring. In addition, two spots with high luminance (first regions) are observed at positions overlapping with the first ring.

The distance in a radial direction from the center of the first ring is substantially equal to the distance in a radial direction from the center of diffraction spots on the (009) plane in a structural model of single crystal InGaZnO$_4$. In addition, the first region is a diffraction spot derived from c-axis alignment.

In addition, since the ring-like diffraction pattern is seen as shown in FIG. 7C, it can be said that crystal parts arranged in all directions (hereinafter also referred to as crystal parts having no c-axis alignment or second crystal parts) exist in the metal oxide film of the sample A1.

In addition, the two first regions are positioned symmetrically about the central point of the electron diffraction pattern, have substantially the same luminance, and are therefore presumed to have two-fold symmetry. Furthermore, since the two first regions are diffraction spots derived from c-axis alignment as described above, the direction of a straight line connecting the two first regions and the center corresponds to the direction of the c-axis of the crystal part. In FIG. 7C, the vertical direction is the thickness direction; thus, crystal parts whose c-axes are aligned in the thickness direction are found to exist in the metal oxide film of the sample A1.

Thus, the metal oxide film of the sample A1 can be confirmed to be a film in which crystal parts having c-axis alignment and crystal parts having no c-axis alignment are mixed.

The electron diffraction patterns shown in FIGS. 8B and 8C, FIGS. 9B and 9C, FIGS. 10B and 10C, FIGS. 11B and 11C, and FIGS. 12B and 12C exhibit substantially the same results as the electron diffraction patterns shown in FIGS. 7B and 7C. Note that it is indicated that the luminance of the two spots (first regions) derived from c-axis alignment is the highest in the sample A1 and decreases in the order of the sample A2, the sample A3, the sample A4, the sample A5, and the sample A6, and the existing proportion of the crystal parts having c-axis alignment is the highest in the sample A1 and decreases in the order of the sample A2, the sample A3, the sample A4, the sample A5, and the sample A6.

[Method for Quantifying Crystallinity of Metal Oxide Film]

Next, an example of a method for quantifying the crystallinity of the metal oxide film is described with reference to FIGS. 13A to 15.

Figure 13A:
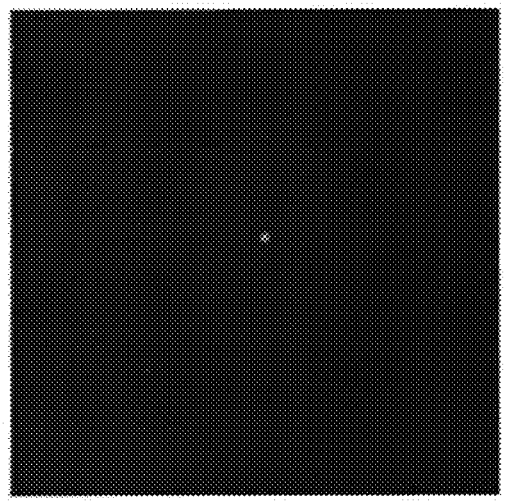
FIGS. 13A and 13B show electron diffraction patterns.

First, an electron diffraction pattern is prepared (see FIG. 13A).

Figure 13B:
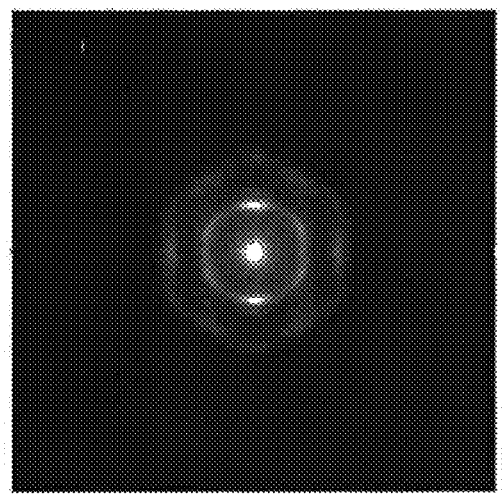

Note that FIG. 13A is an electron diffraction pattern of a 100-nm-thick metal oxide film measured with a beam diameter of 100 nm, and FIG. 13B is an electron diffraction pattern obtained by adjusting the contrast of the electron diffraction pattern shown in FIG. 13A.

In FIG. 13B, two clear spots (first regions) are observed above and below a direct spot. These two spots (first regions) are derived from diffraction spots corresponding to the (001) plane in a structural model of InGaZnO$_4$, i.e., the crystal parts having c-axis alignment. On the other hand, besides the first regions, a low-luminance, ring-like pattern (second region) which roughly concentrically overlaps with the first region is seen. The electron beam diameter of 100 nm causes spots derived from the structure of the crystal part having no c-axis alignment (second crystal part) to be averaged and become ring-like.

Here, in the electron diffraction pattern, the first region having diffraction spots derived from the crystal parts having c-axis alignment and the second region having diffraction spots derived from the second crystal parts are observed to overlap with each other. Thus, the crystallinity of the metal oxide film can be quantified by obtaining and comparing a line profile including the first region and a line profile including the second region.

First, the line profile including the first region and the line profile including the second region are described with reference to FIG. 14.

Figure 14:
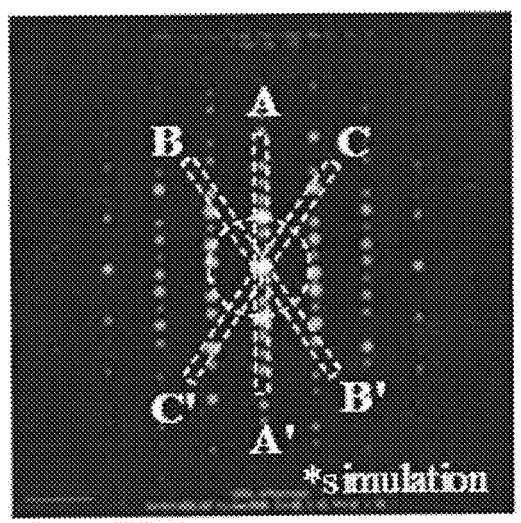
FIG. 14 illustrates a line profile of an electron diffraction pattern.

FIG. 14 is a diagram in which a simulation pattern of electron diffraction obtained by irradiating the (100) plane of a structural model of InGaZnO$_4$ with an electron beam is provided with auxiliary lines for a region A-A', a region B-B', and a region C-C'.

The region A-A' shown in FIG. 14 includes a straight line through two diffraction spots derived from the first crystal parts having c-axis alignment and a direct spot. In addition, the region B-B' and the region C-C' shown in FIG. 14 each include a straight line through a region where the diffraction spots derived from the first crystal parts having c-axis alignment are not observed and the direct spot. Note that the angle between the region A-A' and the region B-B' or the region C-C' is approximately 34°, specifically, greater than or equal to 30° and less than or equal to 38°, preferably greater than or equal to 32° and less than or equal to 36°, further preferably greater than or equal to 33° and less than or equal to 35°.

Note that the line profile has such a tendency as shown in FIG. 15 depending on the structure of the metal oxide film. FIG. 15 shows a diagram illustrating an image diagram of the line profile, the relative luminance R, and the full width at half maximum (FWHM: Full Width at Half Maximum) of a spectrum derived from c-axis alignment obtained from an electron diffraction pattern with respect to each structure.

Note that the relative luminance R shown in FIG. 15 is a value obtained by dividing the integrated intensity of luminance in the region A-A' by the integrated intensity of luminance in the region B-B' or the integrated intensity of luminance in the region C-C'. Note that the integrated intensities of luminance in the region A-A', the region B-B', and the region C-C' are the ones from which the direct spot which appears in the center position and the background which is derived from the direct spot are removed.

The intensity of c-axis alignment can be quantitatively defined by calculating the relative luminance R. For example, as shown in FIG. 15, a single crystal metal oxide film has a high peak intensity of diffraction spots derived from the first crystal parts having c-axis alignment in the region A-A' and shows no diffraction spots derived from the first crystal parts having c-axis alignment in the region B-B' and the region C-C'; therefore, the relative luminance R exceeds 1 and is extremely high. In addition, the relative luminance R is the highest for the single crystal metal oxide film and decreases in the order of only CAAC (the details of CAAC are described later), CAAC+nanocrystal, nanocrystal, and amorphous metal oxide films. In particular, the relative luminance R is 1 for the nanocrystal and amorphous metal oxide films having no specific alignment.

In addition, a structure with higher crystal periodicity has a higher intensity of the spectrum derived from the first crystal parts having c-axis alignment, and the spectrum has a smaller full width at half maximum. Therefore, the full width at half maximum of the single crystal metal oxide film is the smallest, the full width at half maximum increases in the order of the only CAAC, CAAC+nanocrystal, and nanocrystal metal oxide films, and the amorphous metal oxide film has a very large full width at half maximum and shows a profile referred to as a halo.

[Analysis Using Line Profile]

The intensity ratio of the integrated intensity of luminance in the first region to the integrated intensity of luminance in the second region is important information in estimating the existing proportion of crystal parts having alignment.

Thus, the above-given electron diffraction patterns of the samples A1 to A6 were analyzed using line profiles.

Results of analysis using the line profile of the sample A1, results of analysis using the line profile of the sample A2, results of analysis using the line profile of the sample A3, results of analysis using the line profile of the sample A4, results of analysis using the line profile of the sample A5, and results of analysis using the line profile of the sample A6 are shown in FIGS. 16A1 and 16A2, FIGS. 16B1 and 16B2, FIGS. 17A1 and 17A2, FIGS. 17B1 and 17B2, FIGS. 18A1 and 18A2, and FIGS. 18B1 and 18B2, respectively.

Note that FIG. 16A1 is an electron diffraction pattern in which the region A-A', the region B-B', and the region C-C' are described in the electron diffraction pattern shown in FIG. 7C. FIG. 16B1 is an electron diffraction pattern in which the region A-A', the region B-B', and the region C-C' are described in the electron diffraction pattern shown in FIG. 8C. FIG. 17A1 is an electron diffraction pattern in which the region A-A', the region B-B', and the region C-C' are described in the electron diffraction pattern shown in FIG. 9C. FIG. 17B1 is an electron diffraction pattern in which the region A-A', the region B-B', and the region C-C' are described in the electron diffraction pattern shown in FIG. 10C. FIG. 18A1 is an electron diffraction pattern in which the region A-A', the region B-B', and the region C-C' are described in the electron diffraction pattern shown in FIG. 11C. FIG. 18B1 is an electron diffraction pattern in which the region A-A', the region B-B', and the region C-C' are described in the electron diffraction pattern shown in FIG. 12C.

In addition, the region A-A', the region B-B', and the region C-C' can be obtained by normalization with the luminance of the direct spot which appears in the center position of an electron diffraction pattern. Accordingly, a relative comparison between the samples can be performed.

In addition, a more accurate comparison can be performed when a luminance component derived from inelastic scattering or the like from the sample is deducted as the background in calculating a luminance profile. Here, the luminance component derived from inelastic scattering shows an extremely broad profile in a radial direction; thus, the luminance of the background may be calculated by linear approximation. For example, a region located on a low luminance side with respect to a straight line drawn along the tails on both sides of a target peak can be deducted as the background.

Here, the integrated intensities of luminance in the region A-A', the region B-B', and the region C-C' were calculated from data from which the background is deducted by the above-described method. In addition, a value obtained by dividing the integrated intensity of luminance in the region A-A' by the integrated intensity of luminance in the region B-B' or the integrated intensity of luminance in the region C-C' was calculated as the relative luminance R.

Figure 19:
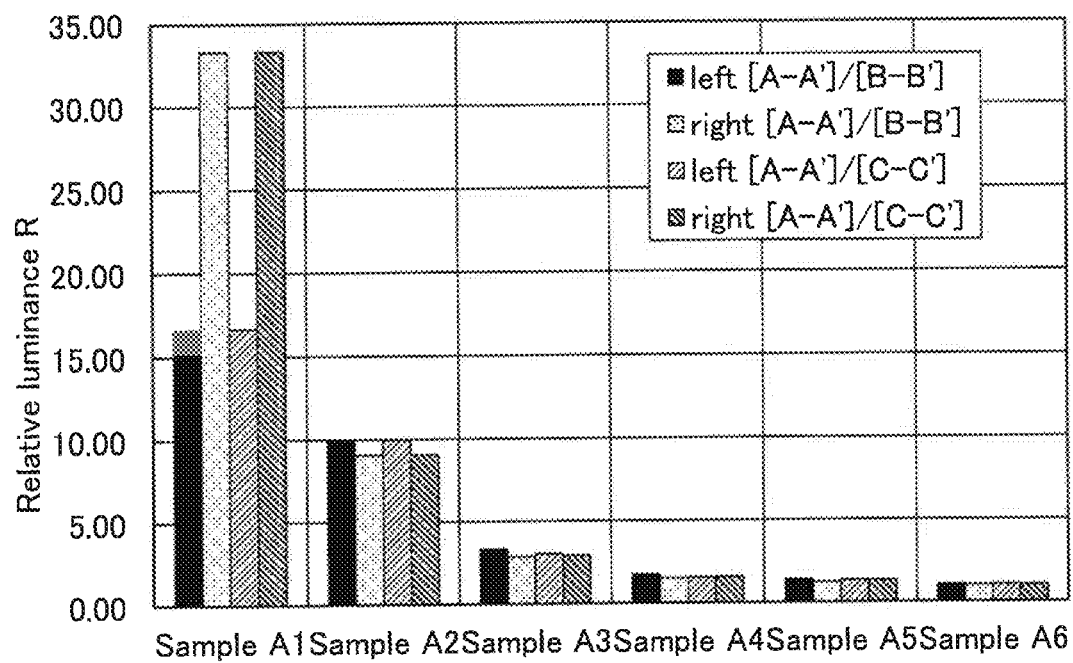
FIG. 19 shows relative luminances estimated from electron diffraction patterns of metal oxide films.

FIG. 19 shows the relative luminances R of the samples A1 to A6. Note that in FIG. 19, a value obtained by dividing the integrated intensity of luminance in the region A-A' by the integrated intensity of luminance in the region B-B' and a value obtained by dividing the integrated intensity of luminance in the region A-A' by the integrated intensity of luminance in the region C-C' at a peak located on the left and right sides of the direct spot in the luminance profile shown in each of FIGS. 16A2 and 16B2, FIGS. 17A2 and 17B2, and FIGS. 18A2 and 18B2 were calculated.

As shown in FIG. 19, the relative luminances R of the samples A1 to A6 are as follows.

Relative luminance R of sample A1=25.00
Relative luminance R of sample A2=9.55
Relative luminance R of sample A3=3.04
Relative luminance R of sample A4=1.60
Relative luminance R of sample A5=1.32
Relative luminance R of sample A6=1.05

Note that each of the above-described relative luminances R is the average of values at four positions. In this manner, the relative luminance R is the highest for the sample A1 and decreases in the order of the sample A2, the sample A3, the sample A4, the sample A5, and the sample A6.

In the case where the metal oxide film of one embodiment of the present invention is used as a semiconductor film in which a channel of a transistor is formed, it is favorable to use a metal oxide film whose relative luminance R is greater than 1 and less than or equal to 40, preferably greater than 1 and less than or equal to 10, further preferably greater than 1 and less than or equal to 3. With the use of such a metal oxide film as the semiconductor film, both high stability of electrical characteristics and high field-effect mobility in a low gate voltage region can be achieved.

<1-3. Existing Proportion of Crystal Parts>

The existing proportion of crystal parts in a metal oxide film can be estimated by analyzing a cross-sectional TEM image.

First, a method for image analysis is described. As a method for image analysis, a TEM image taken at high resolution is subjected to two-dimensional fast Fourier transform (FFT: Fast Fourier Transform), and thus an FFT image is obtained. The obtained FFT image is subjected to mask processing for leaving an area having periodicity and removing the rest. Then, the mask-processed FFT image is subjected to two-dimensional inverse fast Fourier transform (IFFT: Inverse Fast Fourier Transform), so that an FFT filtering image is obtained.

Accordingly, a real-space image in which only crystal parts are extracted can be obtained. Then, the existing proportion of the crystal parts can be estimated from the proportion of the area of the remaining image. In addition, the existing proportion of portions other than the crystal parts can be estimated by subtracting the area of the remaining image from the area of the region used for calculation (also referred to as the area of an original image).

Figure 20A:
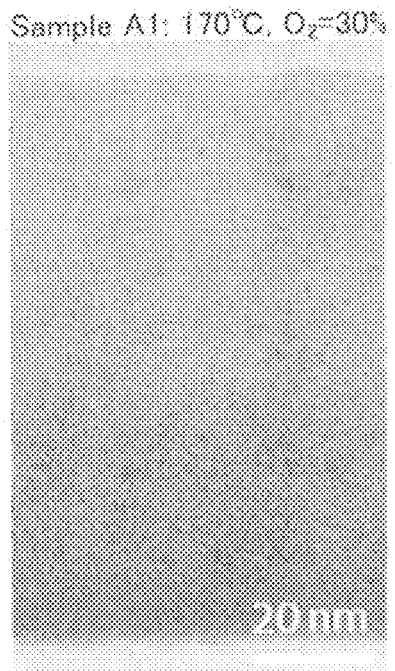
FIGS. 20A and 20B show a cross-sectional TEM image and an image-analyzed cross-sectional TEM image of a metal oxide film.
Figure 20B:
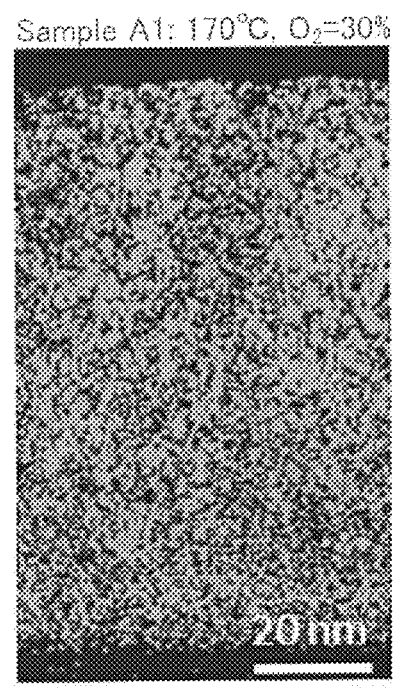
Figure 21A:
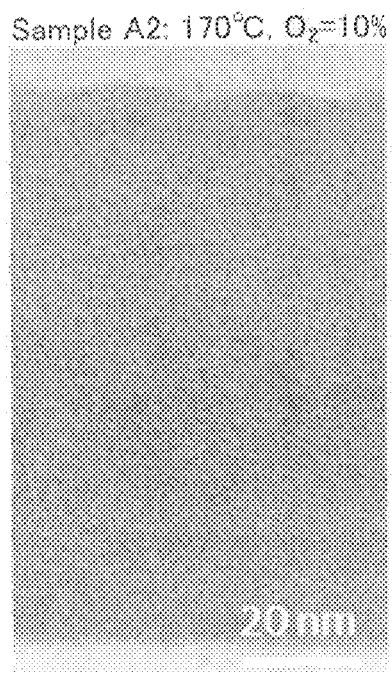
FIGS. 21A and 21B show a cross-sectional TEM image and an image-analyzed cross-sectional TEM image of a metal oxide film.
Figure 21B:
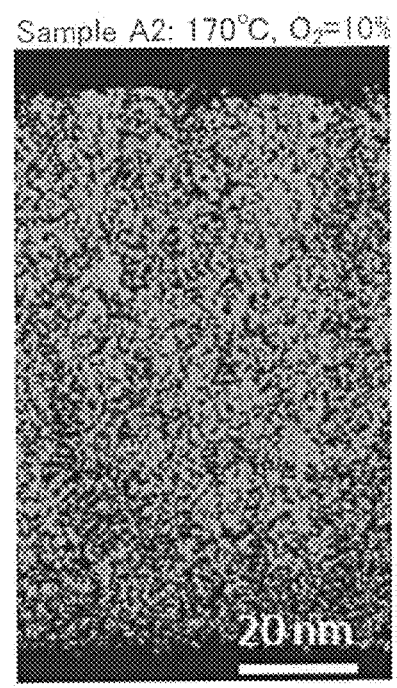
Figure 22A:
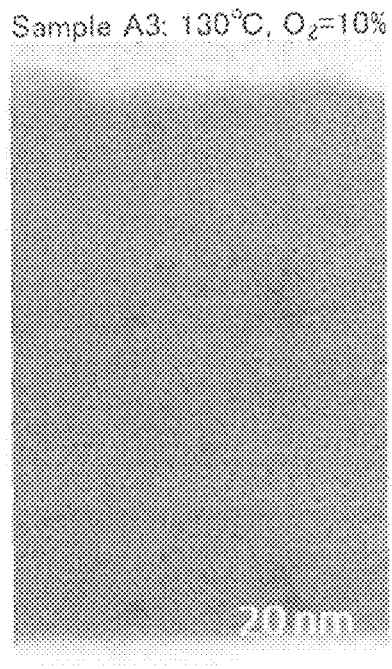
FIGS. 22A and 22B show a cross-sectional TEM image and an image-analyzed cross-sectional TEM image of a metal oxide film.
Figure 22B:
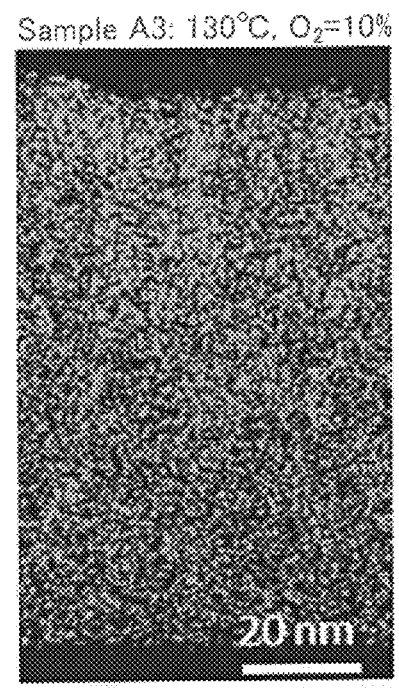
Figure 23A:
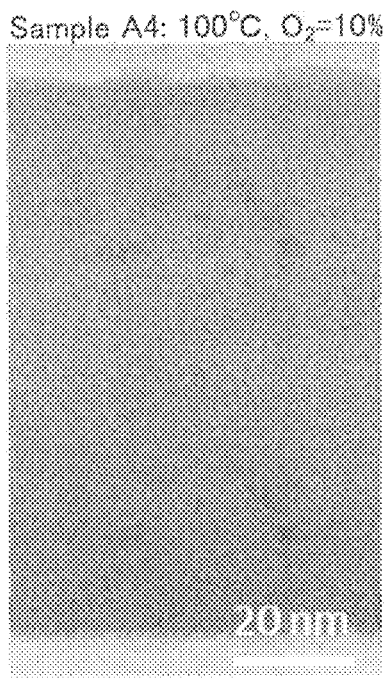
FIGS. 23A and 23B show a cross-sectional TEM image and an image-analyzed cross-sectional TEM image of a metal oxide film.
Figure 23B:
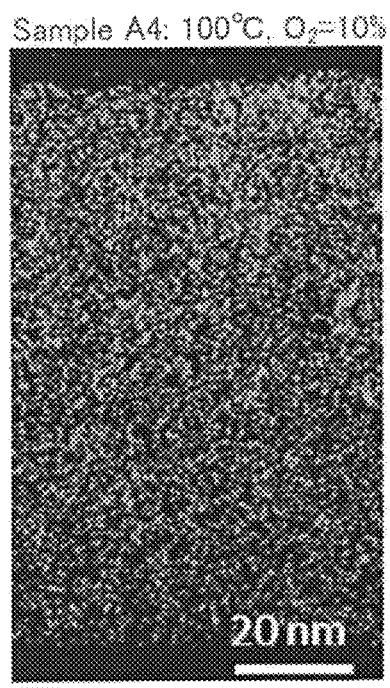
Figure 24A:
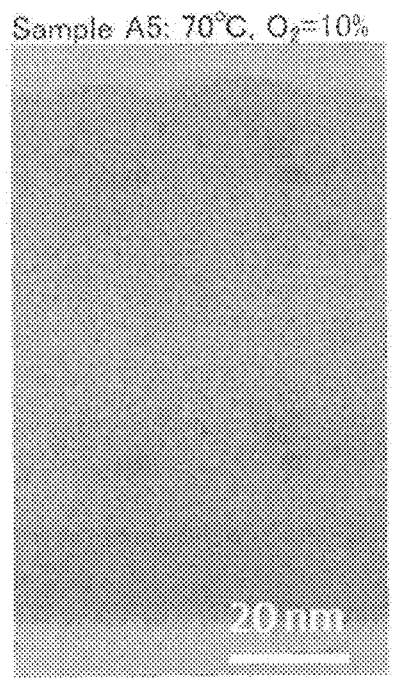
FIGS. 24A and 24B show a cross-sectional TEM image and an image-analyzed cross-sectional TEM image of a metal oxide film.
Figure 24B:
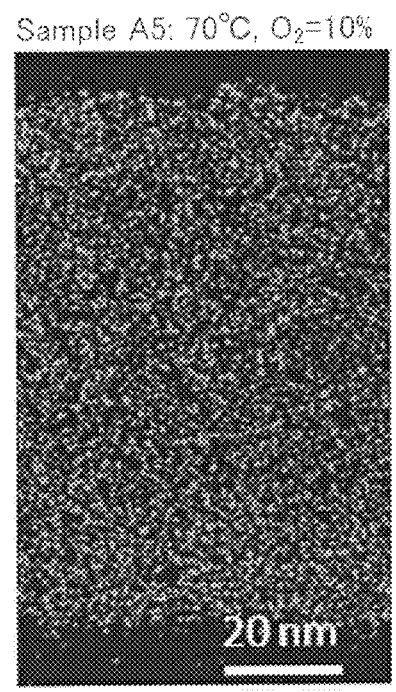
Figure 25A:
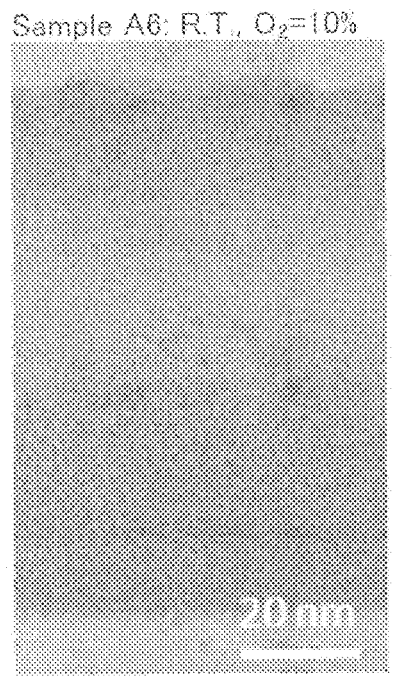
FIGS. 25A and 25B show a cross-sectional TEM image and an image-analyzed cross-sectional TEM image of a metal oxide film.
Figure 25B:
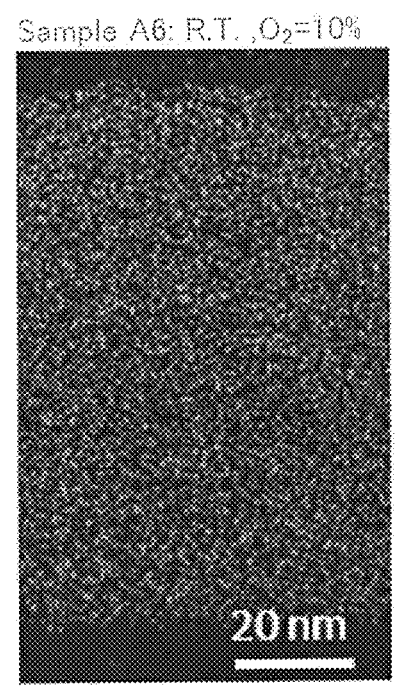

FIG. 20A and FIG. 20B show a cross-sectional TEM image of the sample A1 and an image obtained after image analysis of the cross-sectional TEM image of the sample A1, respectively. In addition, FIG. 21A and FIG. 21B show a cross-sectional TEM image of the sample A2 and an image obtained after image analysis of the cross-sectional TEM image of the sample A2, respectively. In addition, FIG. 22A and FIG. 22B show a cross-sectional TEM image of the sample A3 and an image obtained after image analysis of the cross-sectional TEM image of the sample A3, respectively. In addition, FIG. 23A and FIG. 23B show a cross-sectional TEM image of the sample A4 and an image obtained after image analysis of the cross-sectional TEM image of the sample A4, respectively. In addition, FIG. 24A and FIG. 24B show a cross-sectional TEM image of the sample A5 and an image obtained after image analysis of the cross-sectional TEM image of the sample A5, respectively. In addition, FIG. 25A and FIG. 25B show a cross-sectional TEM image of the sample A6 and an image obtained after image analysis of the cross-sectional TEM image of the sample A6, respectively.

In the images obtained after image analysis, regions shown in white in the metal oxide film correspond to regions containing crystal parts having alignment, and regions shown in black correspond to regions containing crystal parts having no alignment or crystal parts having alignment in various directions.

According to the results shown in FIG. 20B, the proportion of the portion excluding the region containing the crystal parts having alignment in the sample A1 was approximately 43.1%. In addition, according to the results shown in FIG. 21B, the proportion of the portion excluding the region containing the crystal parts having alignment in the sample A2 was approximately 47.1%. In addition, according to the results shown in FIG. 22B, the proportion of the portion excluding the region containing the crystal parts having alignment in the sample A3 was approximately 61.7%. In addition, according to the results shown in FIG. 23B, the proportion of the portion excluding the region containing the crystal part having alignment in the sample A4 was approximately 76.5%. In addition, according to the results shown in FIG. 24B, the proportion of the portion excluding the region containing the crystal parts having alignment in the sample A5 was approximately 82.0%. In addition, according to the results shown in FIG. 25B, the proportion of the portion excluding the region containing the crystal parts having alignment in the sample A6 was approximately 89.5%.

In the case where the thus estimated proportion of the portion excluding the crystal parts having alignment in the metal oxide film is more than or equal to 5% and less than 40%, the metal oxide film is preferable because it is a film having extremely high crystallinity, is unlikely to produce oxygen vacancies, and has very stable electrical characteristics. In contrast, in the case where the proportion of the portion excluding the crystal parts having alignment in the metal oxide film is more than or equal to 40% and less than 100%, preferably more than or equal to 60% and less than or equal to 90%, the crystal parts having alignment and the crystal parts having no alignment are mixed at an adequate proportion in the metal oxide film, and both stability of electrical characteristics and high mobility can be achieved.

Here, a region excluding crystal parts which can be clearly confirmed in a cross-sectional TEM image or by image analysis or the like of a cross-sectional TEM image can also be referred to as Lateral Growth Buffer Region (LGBR).

<1-4. Oxygen Diffusion into Metal Oxide Film>

Results of evaluating oxygen diffusibility into metal oxide films are described below.

Here, the following three samples (samples B1 to B3) were fabricated.

[Sample B1]

First, a metal oxide film with a thickness of approximately 50 nm was formed over a glass substrate by a method similar to that for the sample A1 described above. Next, a silicon oxynitride film with a thickness of approximately 30 nm, a silicon oxynitride film with a thickness of approximately 100 nm, and a silicon oxynitride film with a thickness of approximately 20 nm were formed as a stack of layers over the metal oxide film by a plasma CVD method. Note that the metal oxide film and the silicon oxynitride film may be denoted by OS and GI, respectively, in the following description.

Next, heat treatment at 350° C. for 1 hour was performed under a nitrogen atmosphere.

Then, an In—Sn—Si oxide film with a thickness of 5 nm was formed by a sputtering method.

Then, oxygen addition treatment was performed on the silicon oxynitride film. As conditions for the oxygen addition, an ashing apparatus was used, the substrate temperature was 40° C., an oxygen gas ($^{16}$O) at a flow rate of 150 sccm and an oxygen gas ($^{18}$O) at a flow rate of 100 sccm were introduced into a chamber, the pressure was 15 Pa, and an RF power of 4500 W was supplied for 600 sec. between parallel-plate electrodes provided in the ashing apparatus so that a bias would be applied to the substrate side. Note that an oxygen gas ($^{18}$O) was used to exactly measure oxygen added by the oxygen addition treatment because the silicon oxynitride film contains an oxygen gas ($^{16}$O) at a main component level.

Then, a silicon nitride film with a thickness of approximately 100 nm was formed by a plasma CVD method.

[Sample B2]

The sample B2 is a sample fabricated under different conditions for forming a metal oxide film from those of the sample B1. For the sample B2, a metal oxide film with a thickness of approximately 50 nm was formed by a method similar to that for the sample A3 described above.

[Sample B3]

The sample B3 is a sample fabricated under different conditions for forming a metal oxide film from those of the sample B1. For the sample B3, a metal oxide film with a thickness of approximately 50 nm was formed by a method similar to that for the sample A6 described above.

Through the above steps, the samples B1 to B3 were fabricated.

[SIMS Analysis]

The concentrations of $^{18}$O in the samples B1 to B3 were measured by SIMS (Secondary Ion mass Spectrometry) analysis. Note that three conditions were set for the SIMS analysis: a condition where the samples B1 to B3 fabricated as described above were not subjected to heat treatment, a condition where the samples B1 to B3 were subjected to heat treatment at 350° C. for 1 hour under a nitrogen atmosphere, and a condition where the samples B1 to B3 were subjected to heat treatment at 450° C. for 1 hour under a nitrogen atmosphere.

Figure 26A:
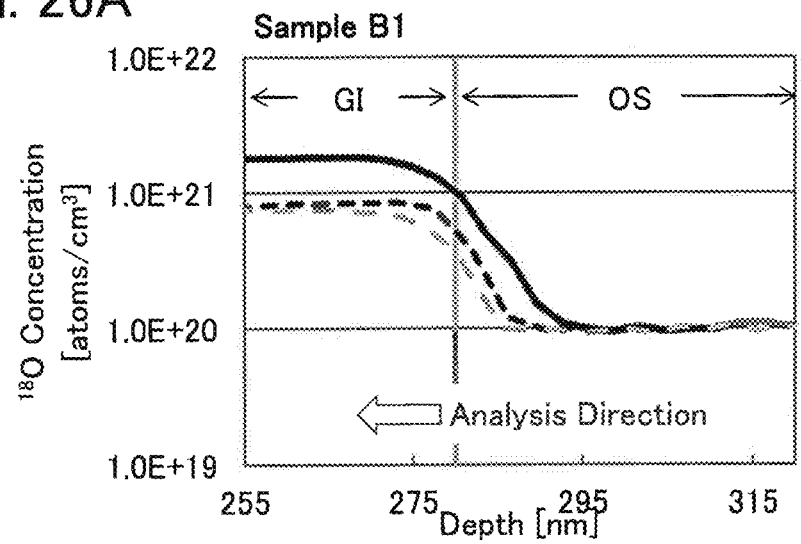
FIGS. 26A to 26C show SIMS measurement results of metal oxide films.
Figure 26B:
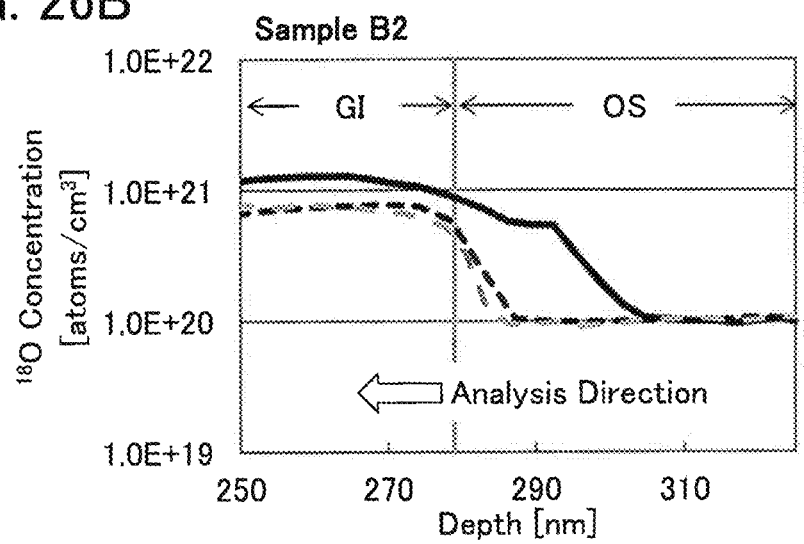
Figure 26C:
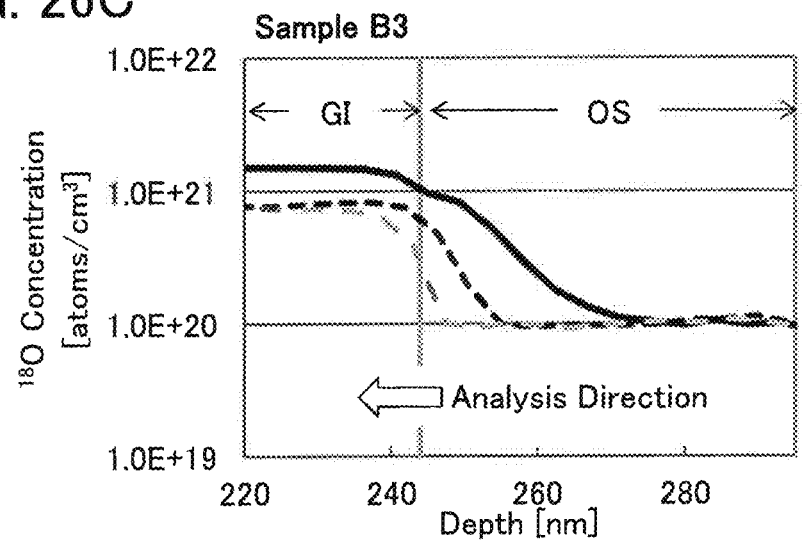

FIGS. 26A to 26C show SIMS measurement results. FIGS. 26A to 26C show analysis results of regions including GI and OS. Note that FIGS. 26A to 26C show results of analysis from the substrate side (also referred to as SSDP (Substrate Side Depth Profile)-SIMS).

In addition, in FIGS. 26A to 26C, gray broken lines are profiles under conditions where heat treatment was not performed, black broken lines are profiles under conditions where heat treatment at 350° C. was performed, and black solid lines are profiles under conditions where heat treatment at 450° C. was performed.

In each of the samples B1 to B3, it can be confirmed that $^{18}$O diffuses into GI and that $^{18}$O diffuses into OS. It can also be confirmed that $^{18}$O diffuses to the deepest position in the sample B3 and that $^{18}$O diffuses to shallower positions in the order of the sample B2 and the sample B1. It can also be confirmed that $^{18}$O diffuses to deeper positions by heat treatment at 350° C. and 450° C.

From the above results, it can be confirmed that a metal oxide film in which crystal parts having alignment and crystal parts having no alignment are mixed and the existing proportion of the crystal parts having alignment is low is a film through which oxygen easily permeates, in other words, a film through which oxygen are diffusible. It can also be confirmed that oxygen in the GI film diffuses into OS by heat treatment at 350° C. or 450° C.

The above results show that as the existing proportion (density) of the crystal parts having alignment increases, oxygen is less diffusible in the thickness direction and as the density decreases, oxygen is more diffusible in the thickness direction. The diffusibility of oxygen in a metal oxide film can be considered as follows.

In a metal oxide film in which crystal parts having alignment and minute crystal parts having no alignment are mixed, a region (LGBR) other than a crystal part which can be clearly observed in a cross-sectional observation image can serve as a region through which oxygen is diffusible, i.e., an oxygen diffusion path. Therefore, in the case where there is a sufficient oxygen supply source near the metal oxide film, oxygen is more easily supplied to the crystal parts having alignment through LGBR; thus, it can be considered that the amount of oxygen vacancy in the film can be reduced.

For example, by providing an oxide film which easily releases oxygen in contact with the metal oxide film and performing heat treatment, oxygen released from the oxide film diffuses in the metal oxide film in the thickness direction through LGBR. In addition, via LGBR, oxygen can be supplied laterally to the crystal parts having alignment. Accordingly, oxygen sufficiently spread to the crystal parts having alignment and the other region in the metal oxide film, and oxygen vacancies in the film can be effectively reduced.

For example, if a hydrogen atom which is not bonded to a metal atom exists in the metal oxide film, this might be immobilized by being bonded to an oxygen atom to form OH. Thus, a certain amount (e.g., approximately $1 \times 10^{17}$ cm$^{-3}$) of states (referred to as $V_OH$) where hydrogen atoms are trapped in oxygen vacancies ($V_O$) in the metal oxide film are formed by low-temperature film formation to suppress OH formation. In addition, $V_OH$ generates carriers and therefore causes a state where a certain amount of carriers exist in the metal oxide film. Accordingly, the metal oxide film with an increased carrier density can be formed. In addition, although oxygen vacancies are also formed at the same time as film formation, the oxygen vacancies can be reduced by introducing oxygen through LGBR as described above. By such a method, a metal oxide film with a relatively high carrier density and with sufficiently reduced oxygen vacancies can be formed.

In addition, since regions other than the crystal parts having alignment constitute minute crystal parts having no alignment at the time of film formation, a clear grain boundary is not observed in the metal oxide film. Furthermore, the minute crystal parts are located among a plurality of crystal parts having alignment. The minute crystal part is bonded to an adjacent crystal part having alignment by growing laterally with heat at the time of film formation.

Moreover, the minute crystal part also functions as a region which generates carriers. Thus, it can be considered that when used in a transistor, a metal oxide film having such a structure can significantly improve its field-effect mobility.

In addition, it is preferable to perform plasma treatment in an oxygen atmosphere after the metal oxide film is formed and an oxide insulating film such as a silicon oxide film is formed thereover. Such treatment can decrease the concentration of hydrogen as well as supplying oxygen to the film. For example, in some cases, the metal oxide film may be doped with fluorine remaining in a chamber at the same time as the plasma treatment. Fluorine exists as a negatively charged fluorine atom and is bonded to a positively charged hydrogen atom by Coulomb force, thereby generating HF. HF is released to the outside of the metal oxide film during the plasma treatment; as a result, the concentration of hydrogen in the metal oxide film can be decreased. In addition, in the plasma treatment, an oxygen atom and hydrogen may be bonded to each other and released as $H_2O$ to the outside of the film.

In addition, a structure in which a silicon oxide film (or a silicon oxynitride film) is stacked over a metal oxide film will be considered. Fluorine in the silicon oxide film can exist as electrically neutral HF by being bonded to hydrogen in the film and therefore does not affect the electrical characteristics of the metal oxide film. Note that a Si—F bond might be generated, but this is also electrically neutral. It can also be considered that HF in the silicon oxide film does not affect oxygen diffusion.

It can be considered that oxygen vacancies in the metal oxide film are reduced and hydrogen which is not bonded to a metal atom in the film is reduced through such a mechanism, whereby reliability can be improved. In addition, it can be considered that electrical characteristics can be improved when the carrier concentration of the metal oxide film is higher than or equal to a certain level.

<1-5. Electrical Characteristics of Transistors>

Results of fabricating transistors including the metal oxide films of the sample A1, the sample A3, and the sample A6 described above and measuring electrical characteristics thereof are described below.

Figure 44A:
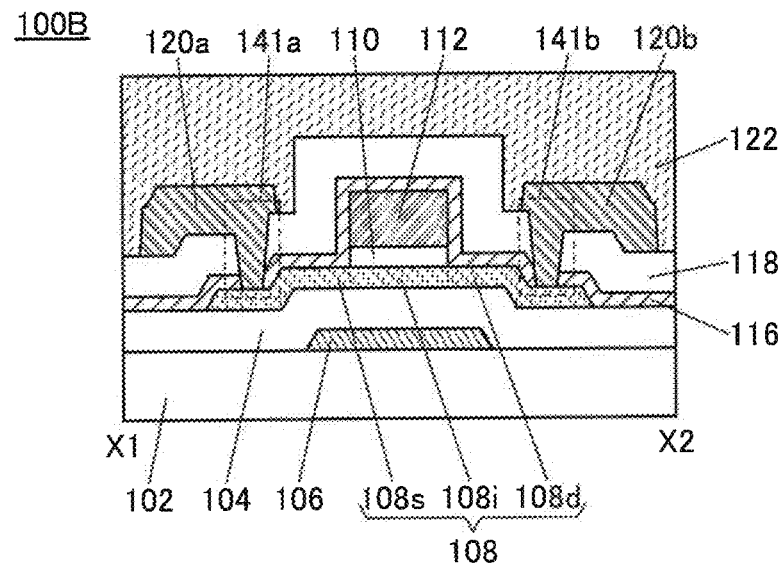
FIGS. 44A and 44B are cross-sectional views illustrating a semiconductor device.
Figure 44B:
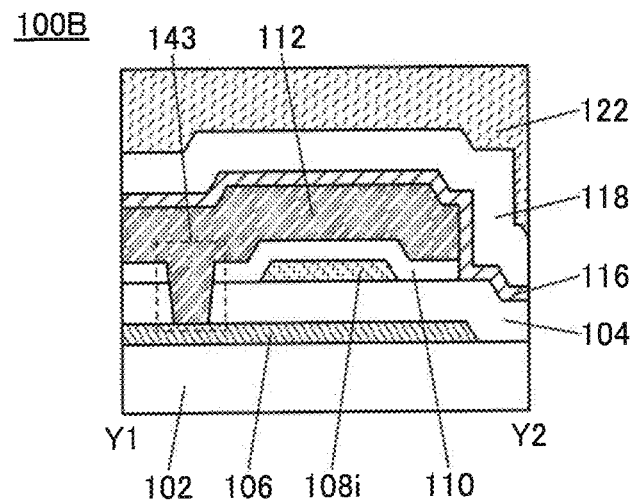

As the structure of the transistors, a structure given as an example in Embodiment 2 and illustrated in FIGS. 44A and 44B was used. Here, samples C1 to C3 whose semiconductor films were formed under different conditions were fabricated.

Note that each of the samples C1 to C3 is a sample in which a total of five types of transistors with different sizes, a transistor with a channel length L of 2 µm and a channel width W of 3 µm, a transistor with a channel length L of 2 µm and a channel width W of 20 µm, a transistor with a channel length L of 3 µm and a channel width W of 50 µm, a transistor with a channel length L of 3 µm and a channel width W of 3 µm, and a transistor with a channel length L of 6 µm and a channel width W of 50 µm, were formed.

[Fabrication of Transistors]

First, a titanium film with a thickness of 10 nm and a copper film with a thickness of 100 nm were formed over a glass substrate with a sputtering apparatus. Then, these conductive films were processed by a photolithography method.

Next, insulating films were formed as a stack of four layers over the substrate and the conductive films. The insulating films were successively formed in a vacuum with a plasma-enhanced chemical vapor deposition (PECVD) apparatus. As the insulating films, a silicon nitride film with a thickness of 50 nm, a silicon nitride film with a thickness of 300 nm, a silicon nitride film with a thickness of 50 nm, and a silicon oxynitride film with a thickness of 50 nm were used in this order from the bottom.

Next, an oxide semiconductor film was formed over the insulating films, and the oxide semiconductor film was processed into an island shape, so that a semiconductor layer was formed. As the oxide semiconductor film, an oxide semiconductor film with a thickness of 40 nm was formed.

Conditions for forming a metal oxide film used as the oxide semiconductor film in the sample C1 are similar to those for the sample A1. That is, the substrate temperature was 170° C., an argon gas at a flow rate of 140 sccm and an oxygen gas at a flow rate of 60 sccm were introduced into a chamber of a sputtering apparatus, the pressure was 0.6 Pa, and an alternating-current power of 2.5 kW was applied to a metal oxide target including indium, gallium, and zinc (In:Ga:Zn=4:2:4.1 [atomic ratio]). Note that the oxygen flow rate percentage is 30%. The thickness was approximately 40 nm.

Conditions for forming a metal oxide film used as the oxide semiconductor film in the sample C2 are similar to those for the sample A3. That is, the substrate temperature was 130° C., an argon gas at a flow rate of 180 sccm and an oxygen gas at a flow rate of 20 sccm were introduced into a chamber of a sputtering apparatus, the pressure was 0.6 Pa, and an alternating-current power of 2.5 kW was applied to a metal oxide target including indium, gallium, and zinc (In:Ga:Zn=4:2:4.1 [atomic ratio]). Note that the oxygen flow rate percentage is 10%. The thickness was approximately 40 nm.

Conditions for forming a metal oxide film used as the oxide semiconductor film in the sample C3 are similar to those for the sample A6. That is, the substrate temperature was room temperature (R.T.), an argon gas at a flow rate of 180 sccm and an oxygen gas at a flow rate of 20 sccm were introduced into a chamber of a sputtering apparatus, the pressure was 0.6 Pa, and an alternating-current power of 2.5 kW was applied to a metal oxide target including indium, gallium, and zinc (In:Ga:Zn=4:2:4.1 [atomic ratio]). Note that the oxygen flow rate percentage is 10%. The thickness was approximately 40 nm.

Next, an insulating film was formed over the insulating films and the semiconductor layer. As the insulating film, a silicon oxynitride film with a thickness of 150 nm was formed with a PECVD apparatus.

Next, heat treatment was performed. The heat treatment was heat treatment at 350° C. for 1 hour under a mixed gas atmosphere of nitrogen and oxygen.

Next, an opening was formed in a desired region of the insulating film. As a method for forming the opening, a dry etching method was used.

Next, an oxide semiconductor film with a thickness of 100 nm was formed over the insulating film so as to cover the opening, and the oxide semiconductor film was processed into an island shape, so that a conductive film was formed. In addition, after the conductive film was formed, the insulating film in contact with the lower side of the conductive film was successively processed, so that an insulating film was formed.

As the conductive film, an oxide semiconductor film with a thickness of 10 nm, a titanium nitride film with a thickness of 50 nm, and a copper film with a thickness of 100 nm were sequentially formed. Note that as conditions for forming the oxide semiconductor film, the substrate temperature was 170° C., an oxygen gas at a flow rate of 200 sccm was introduced to a chamber of a sputtering apparatus, the pressure was 0.6 Pa, and an alternating-current power of 2.5 kW was applied to a metal oxide target including indium, gallium, and zinc (In:Ga:Zn=4:2:4.1 [atomic ratio]). In addition, the titanium nitride film and the copper film were formed with a sputtering apparatus.

Next, plasma treatment was performed from above the oxide semiconductor film, the insulating film, and the conductive film. The plasma treatment was performed with a PECVD apparatus at a substrate temperature of 220° C. under a mixed gas atmosphere of an argon gas and a nitrogen gas.

Next, insulating films were formed over the oxide semiconductor film, the insulating film, and the conductive film. As the insulating films, a silicon nitride film with a thickness of 100 nm and a silicon oxynitride film with a thickness of 300 nm were formed as a stack of layers with a PECVD apparatus.

Next, a mask was formed over the formed insulating films, and openings were formed in the insulating films with the mask.

Next, a conductive film was formed so as to fill the openings, and the conductive film was processed into an island shape, so that conductive films serving a source electrode and a drain electrode were formed. As the conductive film, a titanium film with a thickness of 10 nm and a copper film with a thickness of 100 nm were formed with a sputtering apparatus.

Next, an insulating film was formed over the insulating film and the conductive films. As the insulating film, a photosensitive acrylic resin film with a thickness of 1.5 μm was used.

As described above, the samples C1 to C3 were fabricated.

[Id-Vg Characteristics of Transistors]

Next, Id-Vg characteristics of the transistors of the samples C1 to C3 fabricated as described above were measured. For Id-Vg characteristics, the transistors with a channel length L of 2 μm and a channel width W of 3 μm were measured.

Note that as conditions for measuring the Id-Vg characteristics of the transistors, a voltage applied to the conductive film that functions as a first gate electrode (hereinafter also referred to as gate voltage (Vg)) and a voltage applied to the conductive film that functions as a second gate electrode (also referred to as Vbg) were each changed from −10 V to +10 V in increments of 0.25 V. In addition, a voltage applied to the conductive film that functions as a source electrode (hereinafter also referred to as source voltage (Vs)) was 0 V (comm), and a voltage applied to the conductive film that functions as a drain electrode (hereinafter also referred to as drain voltage (Vd)) was 0.1 V or 20 V.

Figure 27A:
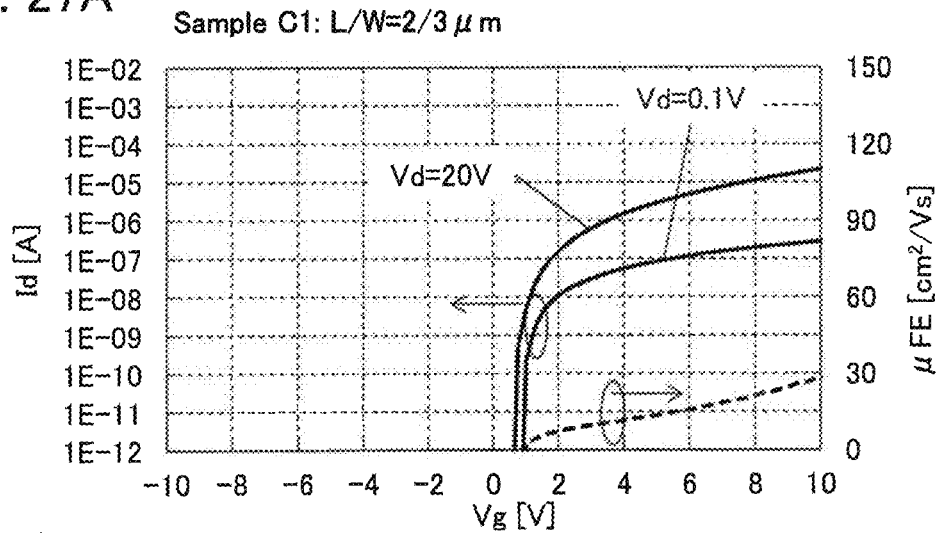
FIGS. 27A to 27C show Id-Vg characteristics of transistors.
Figure 27B:
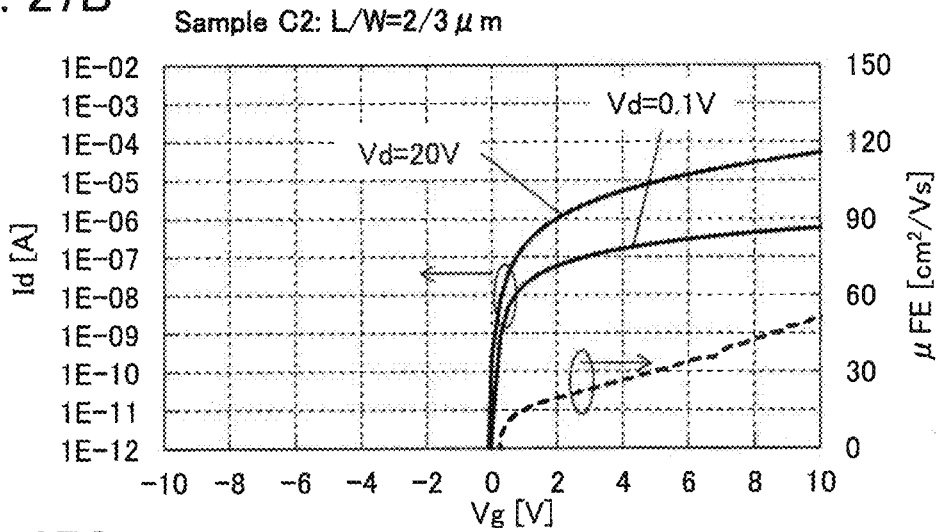
Figure 27C:
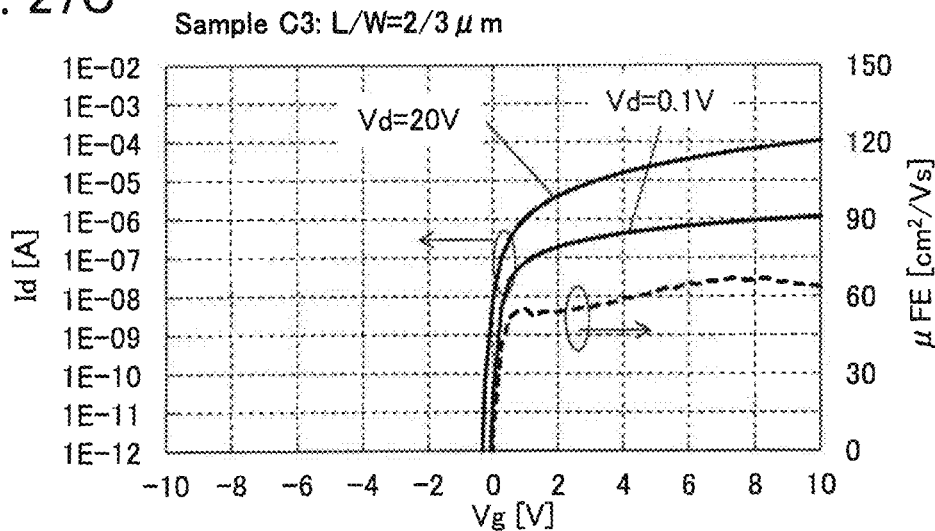

FIGS. 27A, 27B, and 27C show results of Id-Vg characteristics of the sample C1, the sample C2, and the sample C3, respectively. Note that in each of FIGS. 27A to 27C, the first vertical axis represents Id (A), the second vertical axis represents field-effect mobility ($\mu_{FE}$ ($cm^2$/Vs)), and the horizontal axis represents Vg (V).

As shown in FIGS. 27A to 27C, the samples C1 to C3 each have favorable electrical characteristics. In addition, the field-effect mobility is the highest for the sample C3 and decreases in the order of the sample C2 and the sample C1, and the tendency is particularly significant in the sample C3 in a low-Vg (e.g., Vg of 5 V or less) range.

That is, a transistor using a metal oxide film of one embodiment of the present invention, in which crystal parts having alignment and crystal parts having no alignment are mixed, as a semiconductor layer in which a channel is formed has been confirmed to show high field-effect mobility. It has been confirmed to show particularly high field-effect mobility and high drain current under conditions with low gate voltages.

[On-State Current and S-Value of Transistors]

Next, the on-state currents and S-values of the transistors with a channel length L of 2 μm and a channel width W of 20 μm which were formed in the samples C1 to C3 were compared. Note that the S-value is a gate voltage necessary for increasing a current (subthreshold current) between a source electrode and a drain electrode by one order of magnitude, and the smaller the S-value is, the steeper the slope of the subthreshold current with respect to the gate voltage is and the more excellent the switching characteristics are.

Figure 28A:
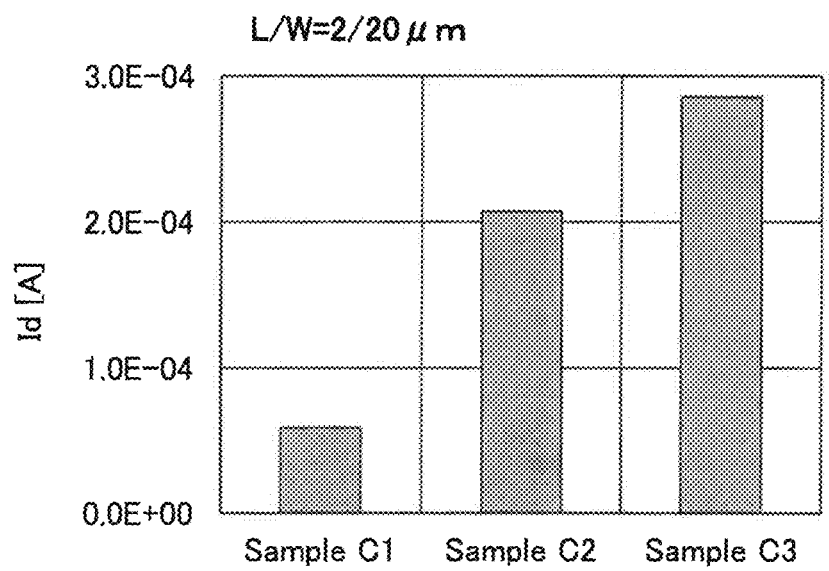
FIGS. 28A and 28B show on-state currents and S-values of transistors.
Figure 28B:
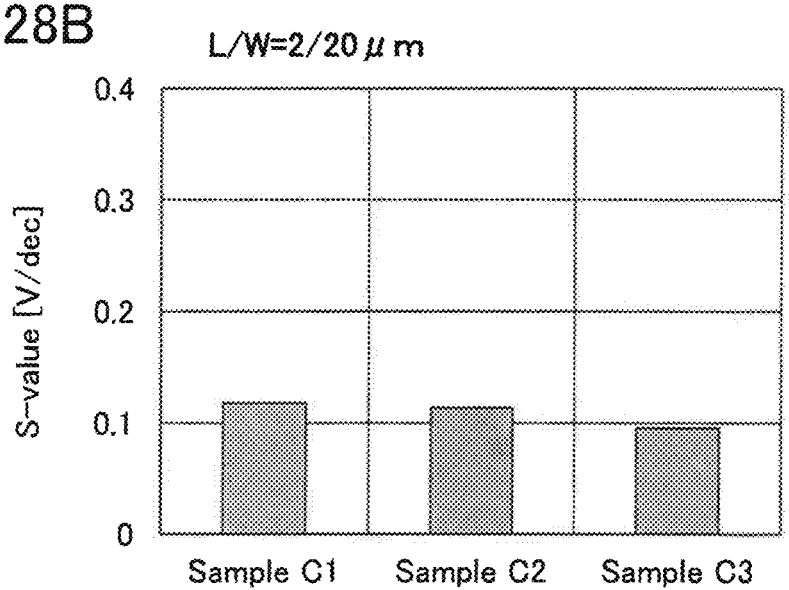

FIG. 28A shows measurement results of on-state currents of the transistor in the samples. Here, the drain currents were measured with the gate voltage Vg set at 10 V and the drain voltage Vd at 5 V. In addition, FIG. 28B shows measurement results of S-values of the transistors in the samples.

As shown in FIG. 28A, the on-state current is the highest for the sample C3 and decreases in the order of the sample C2 and the sample C1. In addition, as shown in FIG. 28B, the S-value is the smallest for the sample C3 and increases in the order of the sample C2 and the sample C1.

It can be seen from the above results that, when the metal oxide film is formed under conditions at low temperature with low oxygen flow rate, the oxygen permeability improves and the amount of oxygen diffusion during the process of fabricating a transistor increases; thus, defects such as oxygen vacancies in the metal oxide film and at the interface between the metal oxide film and the insulating film decrease. In addition, it is suggested that the density of defect states is decreased by such an effect, and as a result, the on-state current of the transistor significantly increases.

A transistor with such an increased on-state current can be favorably used as a switch with which a capacitor can be charged and discharged at high speed. Typically, it can be favorably used for a demultiplexer circuit or the like.

The demultiplexer circuit is a circuit which outputs two or more signals by dividing one input signal. When a demultiplexer circuit using such a transistor is positioned between a signal line driver circuit and a signal line in a display device, it is possible to reduce the number of terminals of the signal line driver circuit mounted in the form of an IC, and it is possible to achieve a display device which can operate at higher speed and has a narrow bezel.

<1-6. Gate Bias-Temperature Stress Test (GBT Test)>

Next, reliabilities of the samples C1 to C3 fabricated as described above were evaluated. As the reliability evaluation, GBT tests were used.

As conditions for the GBT tests in this embodiment, the gate voltage (Vg) was ±30 V, the drain voltage (Vd) and the source voltage (Vs) were 0 V (COMMON), the stress temperature was 60° C.; the time for stress application was 1 hour, and two measurement environments, a dark environment and an illuminated environment (illuminated by light having approximately 10000 lx with a white LED), were employed. In other words, the source electrode and the drain electrode of the transistor were set at the same potential, and a potential different from that of the source electrode and drain electrode was applied to the gate electrode for a certain time (1 hour, here).

In addition, a case where the potential applied to the gate electrode is higher than the potential of the source electrode and drain electrode is called positive stress, and a case where the potential applied to the gate electrode is lower than the potential of the source electrode and drain electrode is called negative stress. Thus, the reliability evaluation was performed under four conditions in total, i.e., positive GBT (dark), negative GBT (dark), positive GBT (illuminated), and negative GBT (illuminated). Note that positive GBT (dark) is hereinafter referred to as PBTS (Positive Bias Temperature Stress), negative GBT (dark) as NBTS (Negative Bias Temperature Stress), positive GBT (illuminated) as PBITS (Positive Bias Illumination Temperature Stress), and negative GBT (illuminated) as NBITS (Negative Bias Illumination Temperature Stress).

Figure 29:
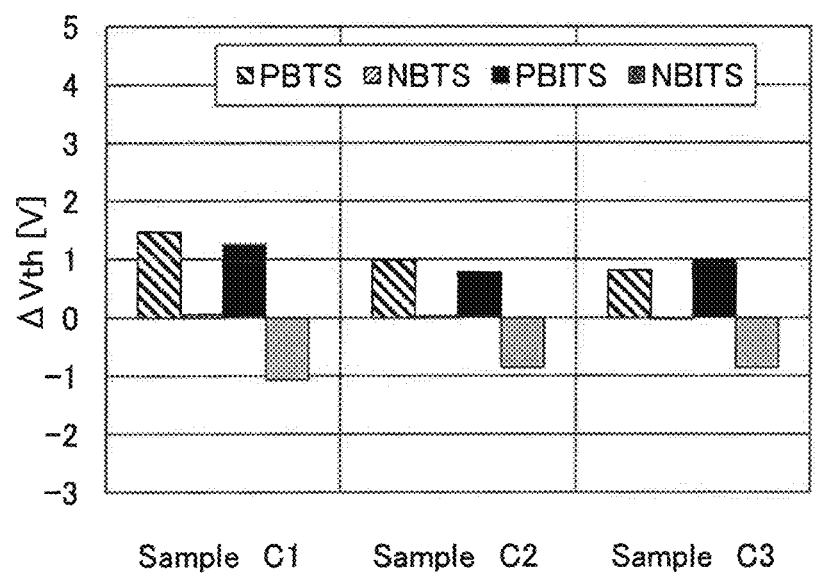
FIG. 29 shows GBT test results of transistors.

FIG. 29 shows GBT test results of the samples C1 to C3. In addition, in FIG. 29, the vertical axis shows the amount of change in threshold voltage (ΔVth) of the transistors, and the horizontal axis shows the sample names.

According to the results in FIG. 29, the amount of change in threshold voltage (ΔVth) of the transistors included in the samples C1 to C3 in the GBT tests was within ±2 V. Thus, it can be seen that the transistors included in the samples C1 to C3 have high reliability.

<1-7. Saturability of Id-Vd Characteristics>

Next, saturability of Id-Vd characteristics of the samples C1 to C3 is described.

Figure 30A:
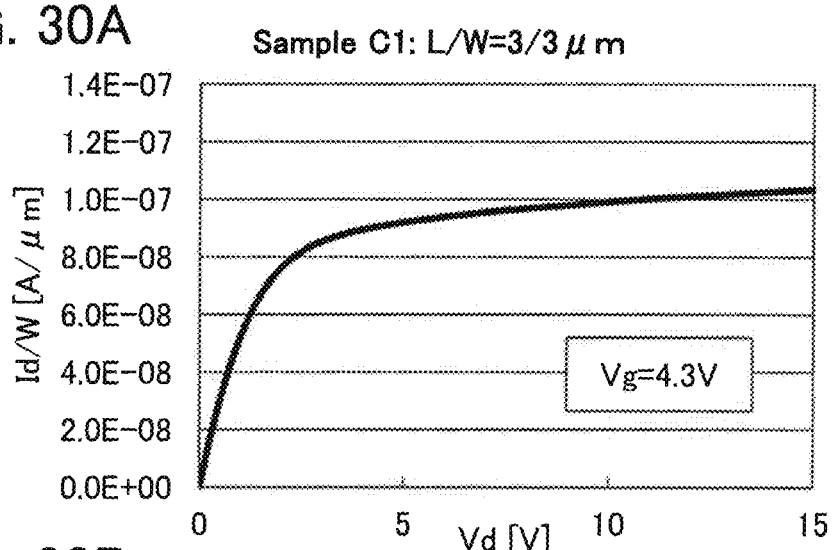
FIGS. 30A to 30C show Id-Vd characteristics of transistors.
Figure 30B:
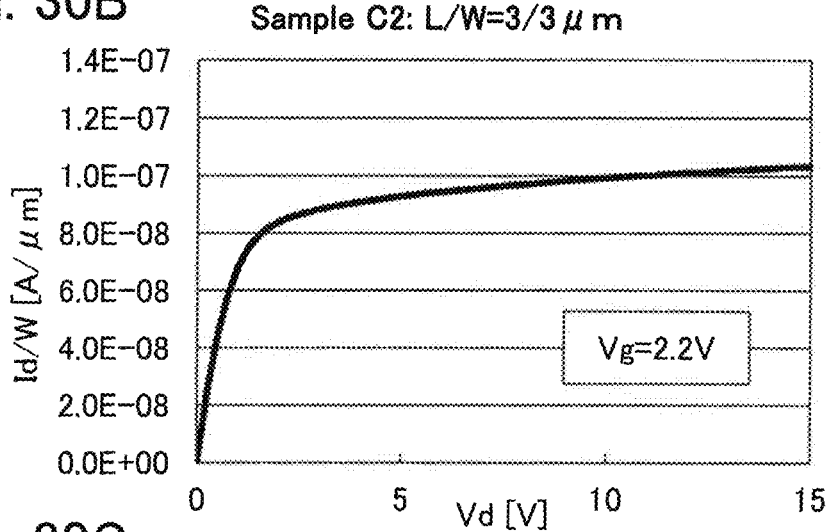
Figure 30C:
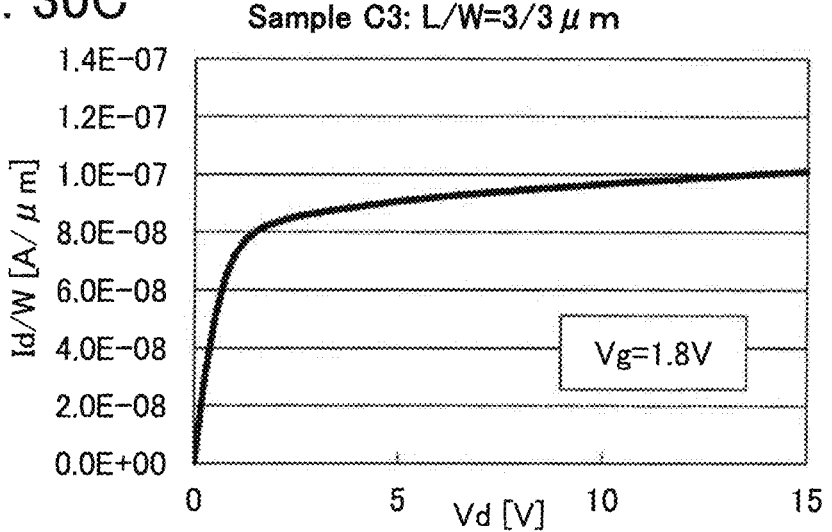

FIG. 30A, FIG. 30B, and FIG. 30C show Id-Vd characteristics of the sample C1, Id-Vd characteristics of the sample C2, and Id-Vd characteristics of the sample C3, respectively. Note that the transistors with a channel length L of 3 μm and a channel width W of 3 μm which were formed in the samples C1 to C3 were used for Id-Vd characteristics evaluation.

As shown in FIGS. 30A to 30C, it can be seen that the Id-Vd characteristics of the samples C1 to C3 have high saturability. The improvement in saturability of the Id-Vd characteristics enables favorable use as a driving transistor or the like of a display device including an organic EL element, for example.

<1-8. Evaluation of Shallow Defect States Using Transistor Characteristics>

Shallow defect states (hereinafter also referred to as sDOS) of a metal oxide can also be estimated from electrical characteristics of a transistor using a metal oxide film as a semiconductor film. A method for evaluating the density of interface states of a transistor and predicting subthreshold leakage current in consideration of the number $N_{trap}$ of electrons trapped by interface states as well as the density of interface states is described below.

The number $N_{trap}$ of electrons trapped by interface states can be evaluated by, for example, comparing an actually measured value of drain current-gate voltage (Id-Vg) characteristics and a calculated value of drain current-gate voltage (Id-Vg) characteristics of a transistor.

Figure 31:
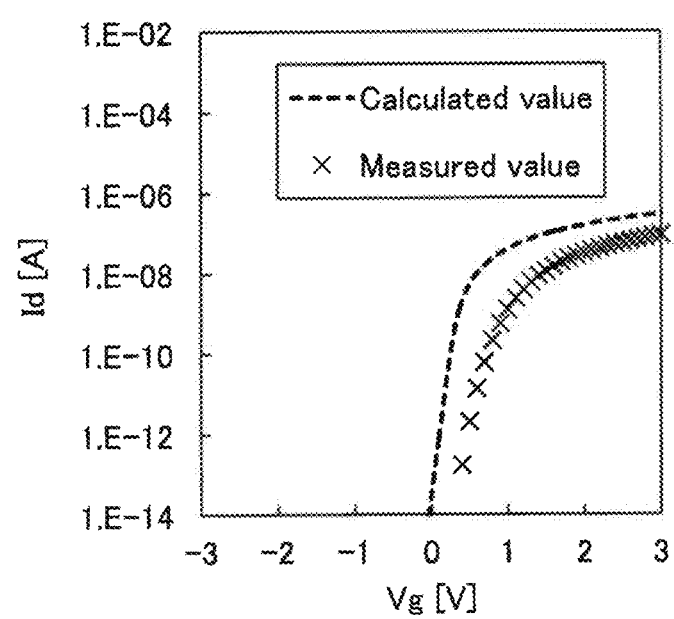
FIG. 31 shows Id-Vg characteristics.

FIG. 31 shows ideal Id-Vg characteristics obtained by calculation and actually measured Id-Vg characteristics at a source voltage of Vs=0 V and a drain voltage of Vd=0.1 V. Note that out of the measurement results of the transistor, only values greater than or equal to $1 \times 10^{-13}$ A at which the drain current Id can be easily measured were plotted.

Compared with the ideal Id-Vg characteristics obtained by calculation, the actually measured Id-Vg characteristics show a gentle change in the drain current Id with respect to the gate voltage Vg. This is probably because an electron is trapped by a shallow interface state positioned near an energy at the conduction band minimum (represented as Ec). Here, the density $N_{it}$ of interface states can be more exactly estimated by using the Fermi distribution function and taking into consideration the number $N_{trap}$ of electrons (per unit area and unit energy) trapped by shallow interface states.

Figure 32:
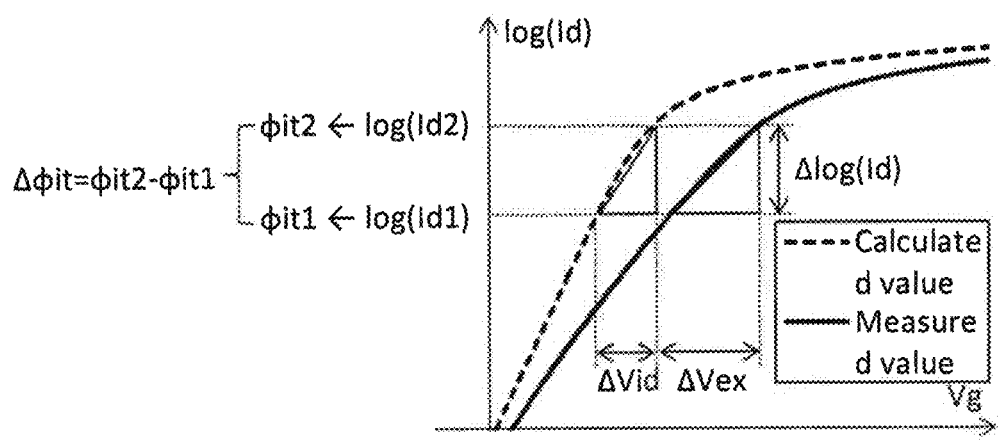
FIG. 32 shows Id-Vg characteristics.

First, a method for evaluating the number N, of electrons trapped by interface trap states is described by using schematic Id-Vg characteristics shown in FIG. 32. A broken line shows ideal Id-Vg characteristics obtained by calculation and free from trap states. In addition, a change in the gate voltage Vg when the drain current changes from Id1 to Id2 on the broken line is represented by $\Delta V_{id}$. In addition, a solid line shows actually measured Id-Vg characteristics. A change in the gate voltage Vg when the drain current changes from Id1 to Id2 on the solid line is represented by $\Delta V_{ex}$. The potentials at focused interfaces at drain currents of Id1 and Id2 are represented by $\phi_{it1}$ and $\phi_{it2}$, respectively, and the amount of the change is represented by $\Delta\phi_{it}$.

The slope of the actually measured values is smaller than that of the calculated values in FIG. 32, which indicates that $\Delta V_{ex}$ is always larger than $\Delta V_{id}$. At this time, a difference between $\Delta V_{ex}$ and $\Delta V_{id}$ represents a potential difference that is needed for trapping of an electron by a shallow interface state. Thus, $\Delta Q_{trap}$ which is the amount of change in charge due to trapped electrons can be represented by the following formula (1).

[Formula 1]

$$\Delta Q_{trap} = -C_{tg}(\Delta V_{ex} - \Delta V_{id}) \quad (1)$$

$C_{tg}$ is the combined capacitance of an insulator and a semiconductor per unit area. $\Delta Q_{trap}$ can also be represented by a formula (2) using the number $N_{trap}$ of trapped electrons (per unit area and unit energy). Note that q represents an elementary charge.

[Formula 2]

$$\Delta Q_{trap} = -q N_{trap} \Delta\phi_{it} \quad (2)$$

Simultaneously solving the formula (1) and the formula (2) gives a formula (3).

[Formula 3]

$$-C_{tg}(\Delta V_{ex} - \Delta V_{id}) = -q N_{trap} \Delta\phi_{it} \quad (3)$$

Next, taking the limit $\Delta\phi_{it} \to 0$ of the formula (3) gives a formula (4).

[Formula 4]

$$N_{trap} = \frac{C_{tg}}{q} \lim_{\Delta\phi_{it} \to 0} \left( \frac{\Delta V_{ex}}{\Delta\phi_{it}} - \frac{\Delta V_{id}}{\Delta\phi_{it}} \right) = C_{tg}\left( \frac{\partial V_{ex}}{\partial \phi_{it}} - \frac{\partial V_{id}}{\partial \phi_{it}} \right) \quad (4)$$

That is, the number $N_{trap}$ of electrons trapped at the interface can be estimated using the ideal Id-Vg characteristics, the actually measured Id-Vg characteristics, and the formula (4). Note that the relationship between the drain current and the potential at the interface can be obtained by the above-described calculation.

In addition, the number $N_{trap}$ of electrons per unit area and unit energy and the density $N_{it}$ of interface states satisfy such a relationship as in a formula (5).

[Formula 5]

$$N_{trap} = \frac{\partial}{\partial \phi_{it}} \int_{-\infty}^{\infty} N_{it}(E) f(E) dE \quad (5)$$

Here, f(E) is the Fermi distribution function. $N_{it}$ is determined by fitting $N_{trap}$ obtained from the formula (4) using the formula (5). By calculation using a device simulator in which this $N_{it}$ is set, transfer characteristics including Id<0.1 pA can be obtained.

Figure 33:
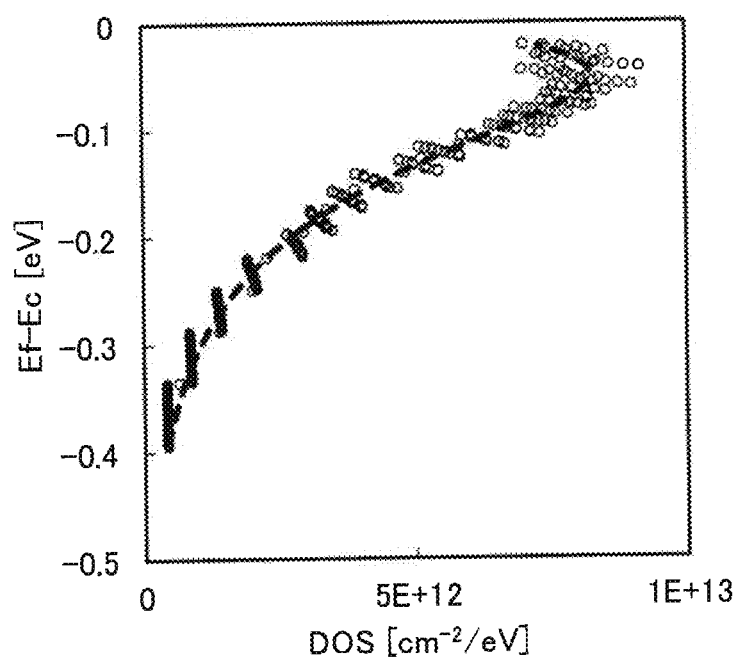
FIG. 33 shows calculation results of densities of interface states.

Next, results of extracting $N_{trap}$ by applying the formula (4) to the actually measured Id-Vg characteristics shown in FIG. 31 are shown in FIG. 33 with white circle marks. Here, the vertical axis in FIG. 33 represents Fermi energy Ef from the conduction band minimum Ec of a semiconductor. A broken line shows a maximum at a position right below Ec. Assuming a tail distribution of a formula (6) as $N_{it}$ of the formula (5), $N_{trap}$ can be fitted very well as indicated by the broken line of FIG. 33, and a conduction band edge trap density of $N_{ta}=1.67\times10^{13}$ cm$^{-2}$/eV and a characteristic decay energy of $W_{ta}=0.105$ eV were obtained as fitting parameters.

[Formula 6]

$$N_{it}(E) = N_{ta} \exp\left[ \frac{E - E_c}{W_{ta}} \right] \quad (6)$$

Figure 34A:
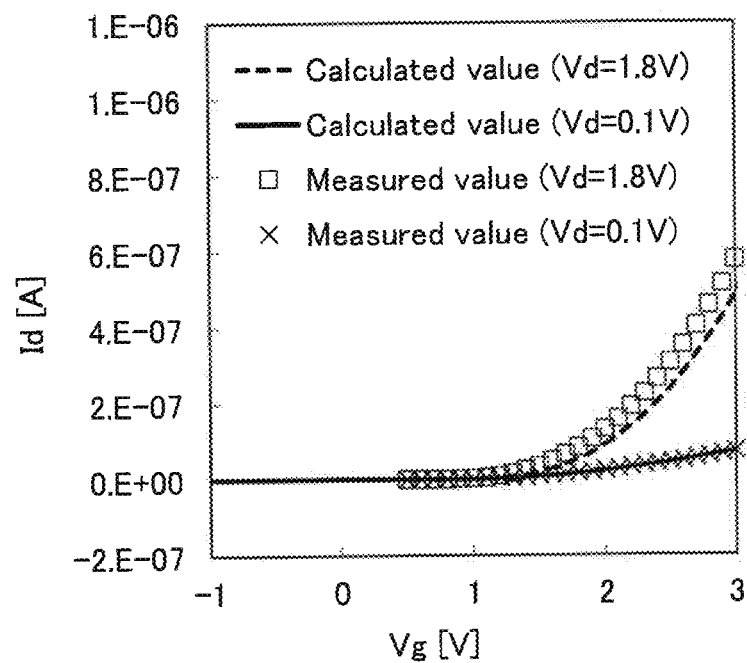
FIGS. 34A and 34B show Id-Vg characteristics.
Figure 34B:
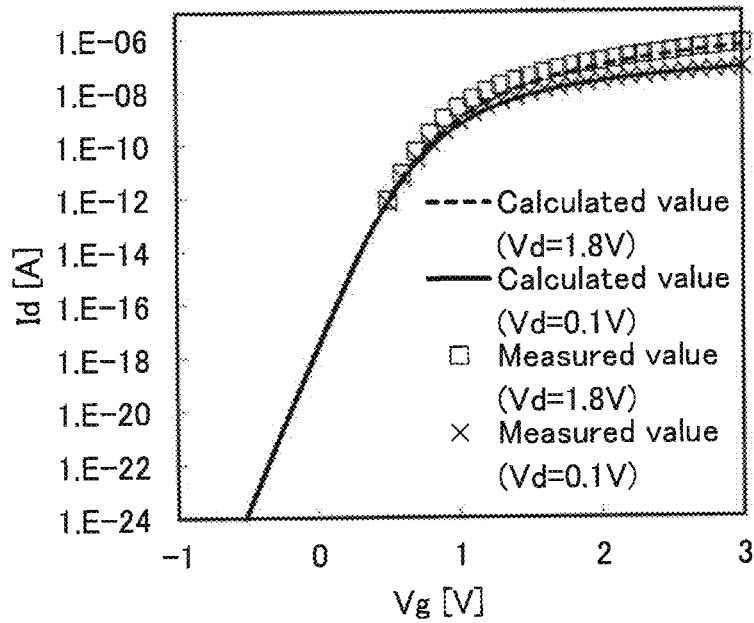

Next, results of back-calculating Id-Vg characteristics by feeding back the fitting curve of the obtained interface states to the calculation using the device simulator are shown in FIGS. 34A and 34B. FIG. 34A shows Id-Vg characteristics obtained by calculations in the case of drain voltages Vd of 0.1 V and 1.8 V and actually measured Id-Vg characteristics of a transistor in the case of drain voltages Vd of 0.1 V and 1.8 V. In addition, FIG. 34B is a graph in which the drain current Id of FIG. 34A is logarithmic.

The curves obtained by the calculations and plots of the actually measured values are substantially identical, showing that the calculated values and the measured values are highly reproducible. Accordingly, it can be seen that the above method is quite appropriate as a method for calculating the density of shallow defect states.

[Evaluation Results of Density of Shallow Defect States]

Next, the densities of shallow defect states of the above-fabricated samples C1 to C3 were measured by comparing the measured electrical characteristics and ideal calculated values according to the above method. For the measurement of the densities of shallow defect states, the transistors with a channel length L of 6 μm and a channel width W of 50 μm which were formed in the samples C1 to C3 were used.

Figure 35:
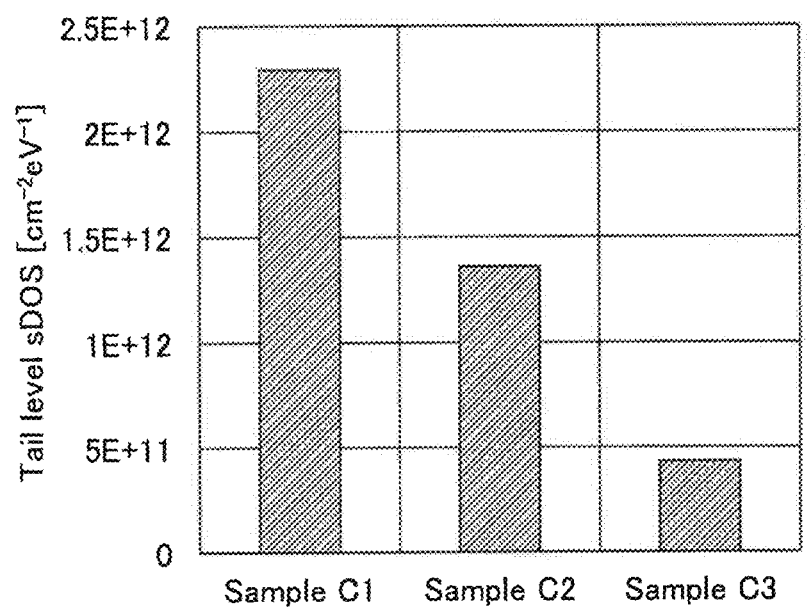
FIG. 35 shows calculation results of densities of defect states.

FIG. 35 shows results of calculation of the densities of shallow defect states of the samples C1 to C3. It can be seen that each of the samples C1 to C3, in which a peak value of the density of shallow defect states is less than $5\times10^{12}$ cm$^{-2}$eV$^{-1}$, is a sample with an extremely low density of shallow defect states. Note that a peak value of the density of shallow defect states in a metal oxide film is preferably less than $5\times10^{12}$ cm$^{-2}$eV$^{-1}$, further preferably less than $2.5\times10^{12}$ cm$^{-2}$eV$^{-1}$, still further preferably less than $1.5\times10^{12}$ cm$^{-2}$eV$^{-1}$.

Thus, it can be seen that a metal oxide film with a low density of defect states is formed in the transistors in the samples C1 to C3. It is suggested that this is because when the metal oxide film is formed under conditions at low temperature with low oxygen flow rate, the oxygen permeability improves and the amount of oxygen diffusion during the process of fabricating a transistor increases, and thus, defects such as oxygen vacancies in the metal oxide film and at the interface between the metal oxide film and the insulating film decrease.

<1-9. Evaluation of Deep Defect States in Metal Oxide Film by CPM>

Deep defect states (hereinafter also referred to as dDOS) in a metal oxide film were evaluated below by a constant photocurrent method (CPM: Constant Photocurrent Method).

In CPM measurement, the amount of light with which a surface of a sample between terminals is irradiated is adjusted so that a photocurrent value is kept constant in the state where voltage is applied between two electrodes provided in the sample, and then an absorption coefficient is derived from the amount of the irradiation light in each wavelength. In the CPM measurement, when the sample has a defect, the absorption coefficient due to the energy which corresponds to a level at which the defect exists (converted from the wavelength) is increased. The increase in the absorption coefficient is multiplied by a constant, whereby the dDOS of the sample can be derived.

A part of the absorption coefficient which is referred to as an Urbach tail due to the band tail is removed from a curve of the absorption coefficient obtained by the CPM measurement, whereby the absorption coefficient due to the defect states can be calculated from the following formula. Note that α(E) represents the absorption coefficient at each energy and au represents the absorption coefficient due to the Urbach tail.

[Formula 7]

$$\int \frac{\alpha(E) - \alpha_a}{E} dE$$

[Fabrication of Sample for CPM Evaluation]

Below, three samples (samples D1 to D3) were fabricated and subjected to CPM evaluation.

First, a metal oxide film was formed over a glass substrate. In the sample D1, a metal oxide film with a thickness of approximately 100 nm was formed by a method similar to that for the sample A1 described above. In the sample D2, a metal oxide film with a thickness of approximately 100 nm was formed by a method similar to that for the sample A3 described above. In the sample D3, a metal oxide film with a thickness of approximately 100 nm was formed by a method similar to that for the sample A6 described above.

Then, a silicon oxynitride film with a thickness of approximately 30 nm, a silicon oxynitride film with a thickness of approximately 100 nm, and a silicon oxynitride film with a thickness of approximately 20 nm were formed as a stack of layers over the metal oxide film by a plasma CVD method.

Next, heat treatment at 350° C. for 1 hour was performed under a nitrogen atmosphere.

Then, an oxide semiconductor film with a thickness of 100 nm was formed. Note that the oxide semiconductor film has a two-layer stacked structure. A first oxide semiconductor film was formed to have a thickness of 10 nm under conditions where the substrate temperature was 170° C., an oxygen gas at a flow rate of 200 sccm was introduced into a chamber of a sputtering apparatus, the pressure was 0.6 Pa, and an alternating-current power of 2.5 kW was applied to a metal oxide target including indium, gallium, and zinc (In:Ga:Zn=4:2:4.1 [atomic ratio]). A second oxide semiconductor film was formed to have a thickness of 90 nm under conditions where the substrate temperature was 170° C., an argon gas at a flow rate of 180 sccm and an oxygen gas at a flow rate of 20 sccm were introduced into a chamber of a sputtering apparatus, the pressure was 0.6 Pa, and an alternating-current power of 2.5 kW was applied to a metal oxide target including indium, gallium, and zinc (In:Ga:Zn=4:2:4.1 [atomic ratio]).

After that, heat treatment at 350° C. for 1 hour was performed under a mixed gas atmosphere of nitrogen and oxygen.

After that, the oxide semiconductor film was removed by etching by a wet etching method.

Then, a silicon oxynitride film was formed. The silicon oxynitride film was formed by a plasma CVD method under conditions where a mixed gas of $SiH_4$ at a flow rate of 160 sccm and $N_2O$ at a flow rate of 4000 sccm was used as a deposition gas, the pressure was 200 Pa, the power was 1500 W, and the substrate temperature was 220° C. The thickness of the silicon oxynitride film is approximately 400 nm.

Then, an opening was formed in the silicon oxynitride film by a photolithography method.

Then, a stacked film of a Ti film with a thickness of approximately 50 nm, an Al film with a thickness of approximately 400 nm, and a Ti film with a thickness of approximately 100 nm was formed by a sputtering method. After that, an electrode was formed by processing by a photolithography method.

After that, heat treatment at 250° C. for 1 hour was performed under a nitrogen atmosphere.

Through the above steps, the samples D1 to D3 were fabricated.

[CPM Evaluation Results]

Figure 36:
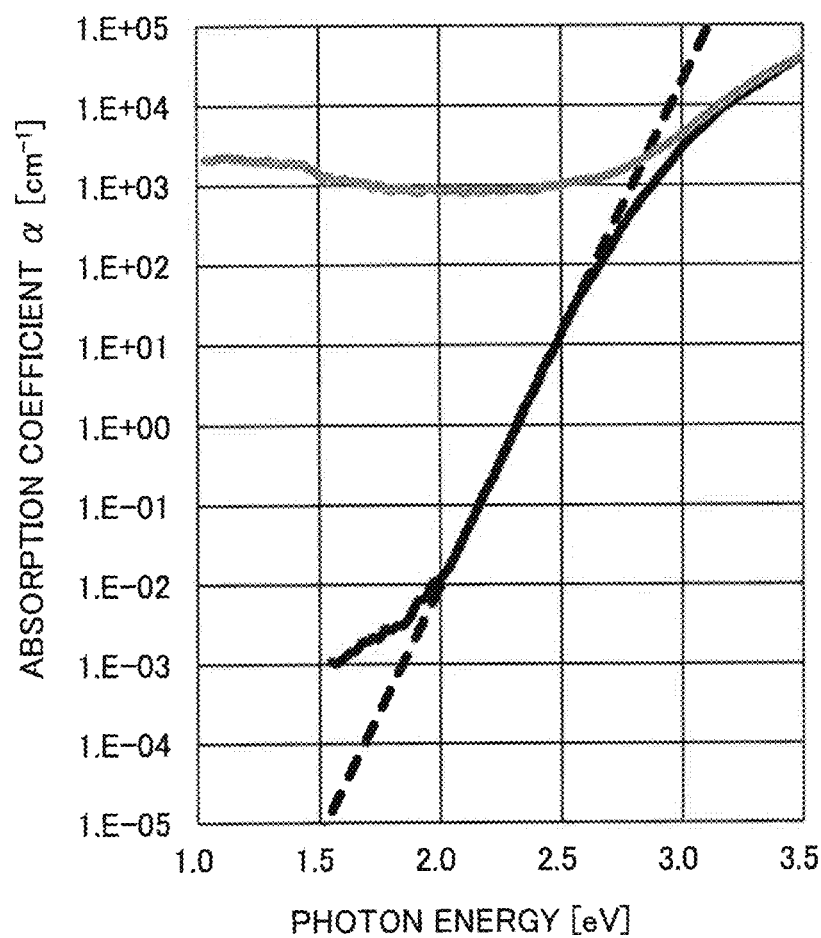
FIG. 36 shows results of CPM measurement.
Figure 37:
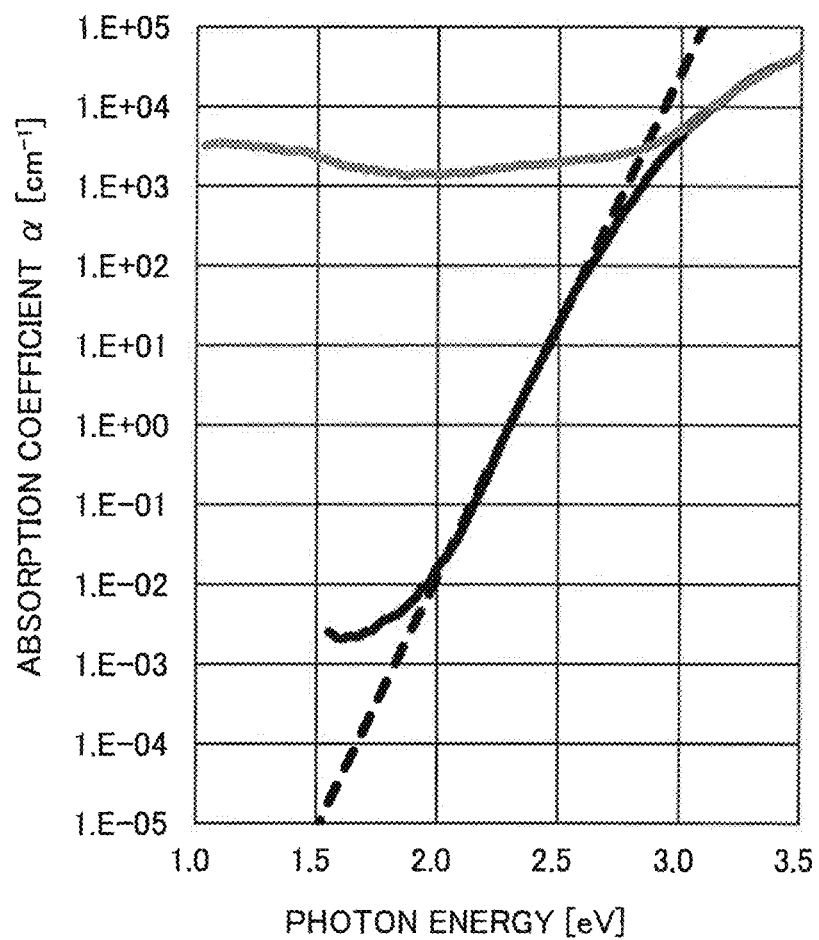
FIG. 37 shows results of CPM measurement.
Figure 38:
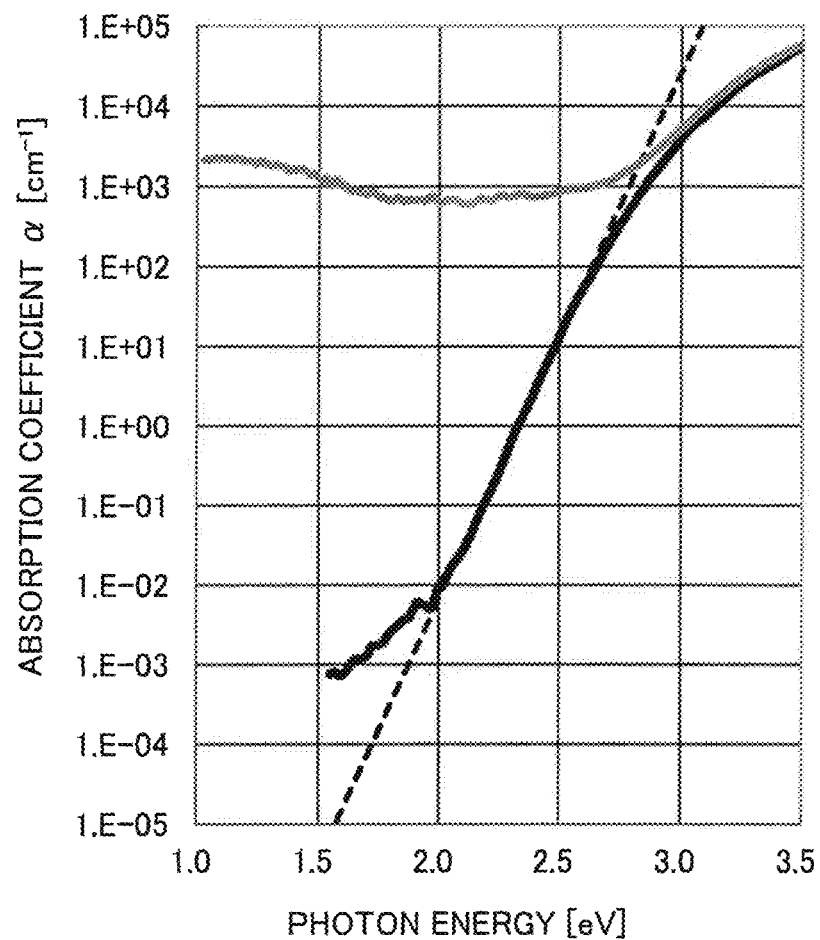
FIG. 38 shows results of CPM measurement.

FIG. 36, FIG. 37, and FIG. 38 show CPM measurement results of the sample D1, CPM measurement results of the sample D2, and CPM measurement results of the sample D3, respectively. In FIG. 36, FIG. 37, and FIG. 38, the vertical axis represents absorption coefficient, and the horizontal axis represents light energy. In addition, a black solid line in FIG. 36, FIG. 37, and FIG. 38 shows an absorption coefficient curve of each sample, a dotted line shows a tangent line, and a gray solid line shows an optically measured absorption coefficient.

The value of an Urbach tail of the sample D1 which was estimated from FIG. 36 was 68.70 meV, and the value of an absorption coefficient obtained by removing an absorption coefficient due to the Urbach tail from the absorption coefficient curve, i.e., the value of an absorption coefficient due to deep defect states, was $1.21 \times 10^{-3}$ cm$^{-1}$. In addition, the value of an Urbach tail of the sample D2 which was estimated from FIG. 37 was 64.46 meV, and the value of an absorption coefficient due to deep defect states was $1.36 \times 10^{-3}$ cm$^{-1}$. In addition, the value of an Urbach tail of the sample D3 which was estimated from FIG. 38 was 65.83 meV, and the value of an absorption coefficient due to deep defect states was $1.04 \times 10^{-3}$ cm$^{-1}$.

The above results show that there are not clear differences in deep defect states between the metal oxide films used in the samples D1 to D3. It is suggested that a cause of no differences in deep defect states between the samples D1 to D3 is that oxygen vacancies in the metal oxide film are filled because an oxide insulating film was formed in contact with the metal oxide film and sufficient oxygen was supplied from the oxide insulating film to the metal oxide film.

<1-10. Method for Forming Metal Oxide Film>

A method for forming a metal oxide film of one embodiment of the present invention is described below.

The metal oxide film of one embodiment of the present invention can be formed by a sputtering method under an atmosphere containing oxygen.

The substrate temperature at the time of film formation is preferably higher than or equal to room temperature and lower than or equal to 150° C., further preferably higher than or equal to 50° C. and lower than or equal to 150° C., still further preferably higher than or equal to 100° C. and lower than or equal to 150° C., typically a temperature of 130° C. When the substrate temperature is in the above-described range, the existing proportions of crystal parts having alignment and crystal parts having no alignment can be controlled.

In addition, the oxygen flow rate percentage (oxygen partial pressure) at the time of film formation is preferably higher than or equal to 1% and less than 33%, further preferably higher than or equal to 5% and less than or equal to 30%, still further preferably higher than or equal to 5% and less than or equal to 20%, yet still further preferably higher than or equal to 5% and less than or equal to 15%, typically 10%. A decrease in oxygen flow rate allows the film to contain more crystal parts having no alignment.

Accordingly, when the substrate temperature at the time of film formation and the oxygen flow rate at the time of film formation are in the above-described ranges, a metal oxide film in which crystal parts having alignment and crystal parts having no alignment are mixed can be obtained. In addition, when the substrate temperature and the oxygen flow rate are in the above-described ranges, the existing proportions of the crystal parts having alignment and the crystal parts having no alignment can be controlled.

An oxide target that can be used for forming the metal oxide film is not limited to an In—Ga—Zn-based oxide; for example, an In-M-Zn-based oxide (M is Al, Ga, Y, or Sn) can be used.

In addition, when a metal oxide film containing crystal parts is formed using a sputtering target containing a polycrystalline oxide containing a plurality of crystal grains, the metal oxide film having crystallinity is obtained more easily than in the case of using a sputtering target not containing a polycrystalline oxide.

A consideration of a formation mechanism of the metal oxide film is described below. In the case where a sputtering target includes a plurality of crystal grains, the crystal grains have a layered structure, and there are interfaces that are likely to cause cleavage between the crystal grains, the crystal grains are cleaved when ions collide with the sputtering target, whereby flat-plate-like or pellet-like sputtered particles can be obtained in some cases. It can be considered that the obtained flat-plate-like or pellet-like sputtered particles are deposited on a substrate, and accordingly, a metal oxide film containing nanocrystals is formed. It can also be considered that bonding or rearrangement of the nanocrystals advances at the substrate surface by heating the substrate, and accordingly, a metal oxide film containing crystal parts having alignment is easily formed.

Note that it is particularly preferable to form a metal oxide film using a sputtering method as described in this embodiment because crystallinity control is easy. However, a method for forming a metal oxide film of one embodiment of the present invention is not limited thereto, and for example, a pulsed laser deposition (PLD) method, a plasma-enhanced chemical vapor deposition (PECVD) method, a thermal CVD (Chemical Vapor Deposition) method, an ALD (Atomic Layer Deposition) method, a vacuum evaporation method, or the like may be used. As an example of a thermal CVD method, an MOCVD (Metal Organic Chemical Vapor Deposition) method can be given.

<1-11. Composition and Structure of Metal Oxide Film>

The metal oxide film of one embodiment of the present invention can be used for a semiconductor device such as a transistor. A metal oxide film having semiconductor characteristics (hereinafter referred to as an oxide semiconductor film) is particularly described below.

First, the composition of an oxide semiconductor film is described.

The oxide semiconductor film includes indium (In), M (M represents Al, Ga, Y, or Sn), and Zn (zinc) as described above.

Note that the element M is aluminum, gallium, yttrium, or tin; however, other than the above, boron, silicon, titanium, iron, nickel, germanium, zirconium, molybdenum, lanthanum, cerium, neodymium, hafnium, tantalum, tungsten, magnesium, or the like may be used as an element that can be used as the element M. Furthermore, a plurality of the above elements may be used in combination as the element M.

Next, preferred ranges of atomic ratios of indium to the element M and zinc included in the oxide semiconductor film according to one embodiment of the present invention will be described with reference to FIGS. 39A to 39C. Note that the proportion of oxygen atoms is not illustrated in FIGS. 39A to 39C. In addition, the terms of the atomic ratio of indium to the element M and zinc included in the oxide semiconductor film are denoted by [In], [M], and [Zn], respectively.

Figure 39A:
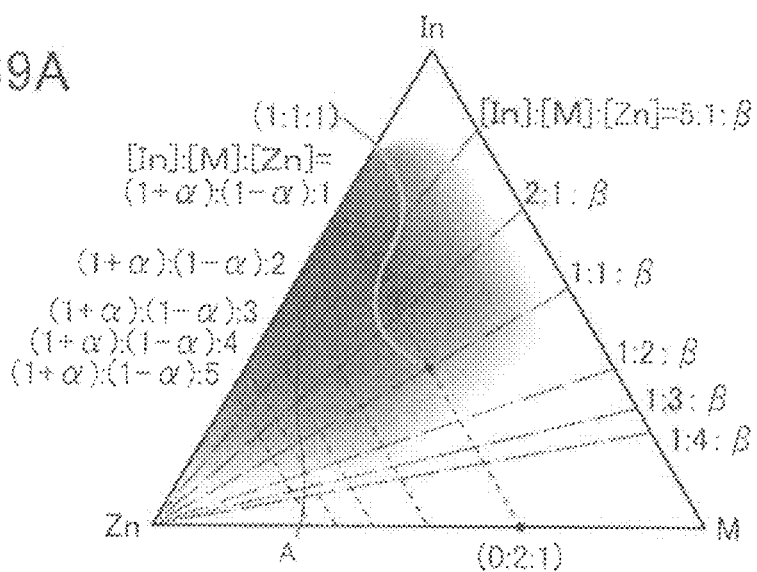
FIGS. 39A to 39C each illustrate the range of atomic ratios of an oxide semiconductor film.
Figure 39B:
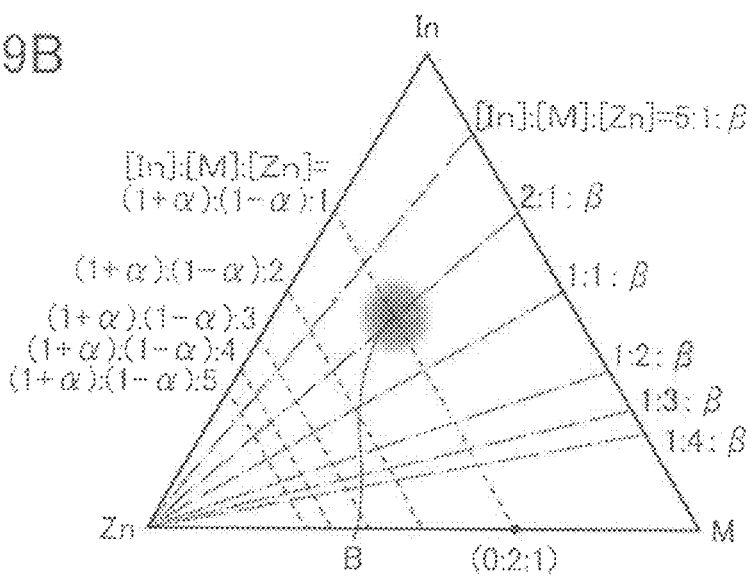
Figure 39C:
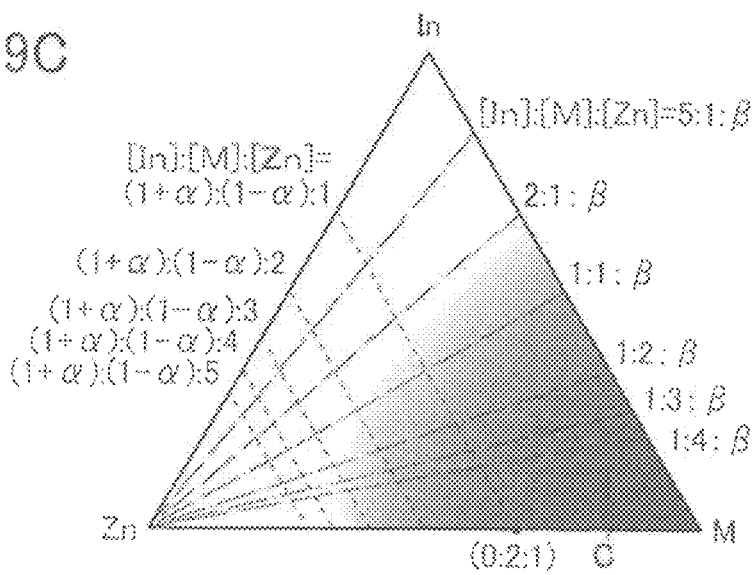

In FIGS. 39A to 39C, dashed lines indicate a line representing the atomic ratio of $[In]:[M]:[Zn]=(1+\alpha):(1-\alpha):1$ ($-1 \leq \alpha \leq 1$), a line representing the atomic ratio of $[In]:[M]:[Zn]=(1+\alpha):(1-\alpha):2$, a line representing the atomic ratio of $[In]:[M]:[Zn]=(1+\alpha):(1-\alpha):3$, a line representing the atomic ratio of $[In]:[M]:[Zn]=(1+\alpha):(1-\alpha):4$, and a line representing the atomic ratio of $[In]:[M]:[Zn]=(1+\alpha):(1-\alpha):5$.

In addition, dashed-dotted lines indicate a line representing the atomic ratio of $[In]:[M]:[Zn]=1:1:\beta$ ($\beta \geq 0$), a line representing the atomic ratio of $[In]:[M]:[Zn]=1:2:\beta$, a line representing the atomic ratio of $[In]:[M]:[Zn]=1:3:\beta$, a line representing the atomic ratio of $[In]:[M]:[Zn]=1:4:\beta$, a line representing the atomic ratio of $[In]:[M]:[Zn]=2:1:\beta$, and a line representing the atomic ratio of $[In]:[M]:[Zn]=5:1:\beta$.

In addition, an oxide semiconductor film having the atomic ratio of $[In]:[M]:[Zn]=0:2:1$ or a value in the neighborhood thereof in FIGS. 39A to 39C tends to have a spinel crystal structure.

FIGS. 39A and 39B illustrate examples of the preferred ranges of the atomic ratios of indium to the element M and zinc included in the oxide semiconductor film in one embodiment of the present invention.

Figure 40:
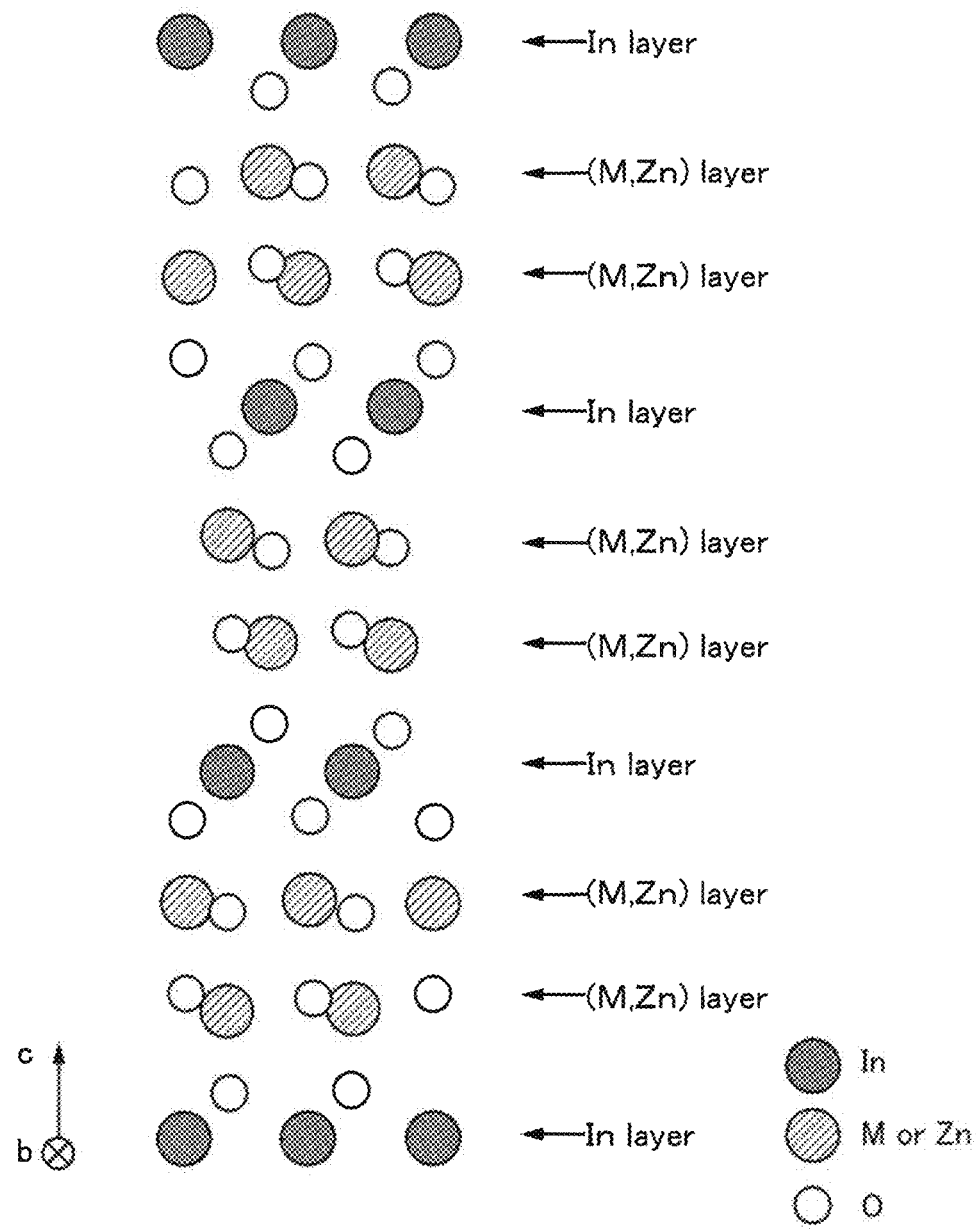
FIG. 40 illustrates a crystal of InMZnO$_4$.

FIG. 40 illustrates an example of the crystal structure of $InMZnO_4$ where $[In]:[M]:[Zn]=1:1:1$. In addition, FIG. 40 is the crystal structure of $InMZnO_4$ observed from a direction parallel to a b-axis. Note that a metal element in a layer that includes M, Zn, and oxygen (hereinafter, an (M,Zn) layer) illustrated in FIG. 40 represents the element M or zinc. In that case, the proportion of the element M is the same as that of zinc. The element M and zinc can be replaced with each other, and their arrangement is random.

In addition, indium and the element M can be replaced with each other. Therefore, the (M,Zn) layer whose element M is replaced by indium can also be referred to as an (In,M,Zn) layer. In that case, a layered structure that includes one In layer with respect to two (In,M,Zn) layers is obtained.

In addition, indium and the element M can be replaced with each other. Therefore, an $MZnO_2$ layer whose element M is replaced by indium can also be referred to as an $In_\alpha M_{1-\alpha}ZnO_2$ layer ($0<\alpha\leq1$). In that case, a layered structure that includes one $InO_2$ layer with respect to two $In_\alpha M_{1-\alpha}ZnO_2$ layers is obtained. In addition, an $InO_2$ layer whose indium is replaced by the element M can also be referred to as an $In_{1-\alpha}M_\alpha O_2$ layer ($0<\alpha\leq1$). In that case, a layered structure that includes one $In_{1-\alpha}M_\alpha O_2$ layer with respect to two $MZnO_2$ layers is obtained.

An oxide with an atomic ratio of [In]:[M]:[Zn]=1:1:2 has a layered structure that includes one In layer with respect to three (M,Zn) layers. In other words, if [Zn] is larger than [In] and [M], the proportion of (M,Zn) layers to In layers becomes higher when the oxide is crystallized.

Note that in the case where (M,Zn) layers with respect to one In layer are not an integer in the oxide, the oxide might have a plurality of kinds of layered structures where the (M,Zn) layers with respect to one In layer are an integer. For example, in the case of [In]:[M]:[Zn]=1:1:1.5, a layered structure in which a layered structure that includes one In layer with respect to two (M,Zn) layers and a layered structure that includes one In layer with respect to three (M,Zn) layers are mixed is obtained in some cases.

For example, in the case where the oxide semiconductor film is formed with a sputtering apparatus, the film having an atomic ratio deviated from the atomic ratio of a target is formed. In particular, [Zn] in the film might be smaller than [Zn] in the target depending on the substrate temperature at the time of film formation.

In addition, in some cases, a plurality of phases coexist in the oxide semiconductor film (two-phase coexistence, three-phase coexistence, or the like). For example, with an atomic ratio of [In]:[M]:[Zn]=0:2:1 and atomic ratios having values in the neighborhood thereof, two phases, i.e., a spinel crystal structure and a layered crystal structure, tend to coexist. In addition, with an atomic ratio indicating [In]:[M]:[Zn]=1:0:0 and atomic ratios having values in the neighborhood thereof, two phases, i.e., a bixbyite crystal structure and a layered crystal structure, tend to coexist. In the case where a plurality of phases coexist in an oxide semiconductor film, a grain boundary (also referred to as a grain boundary) might be formed between different crystal structures.

In addition, when the indium content is increased, the carrier mobility (electron mobility) of the oxide semiconductor film can be increased. This is because in an oxide semiconductor film including indium, the element M, and zinc, the s orbital of heavy metal mainly contributes to carrier transfer, and when the indium content is increased, overlaps of the s orbitals are increased; therefore, an oxide semiconductor film having a high content of indium has higher carrier mobility than an oxide semiconductor film having a low content of indium.

In contrast, when the indium and zinc contents in an oxide semiconductor film become lower, carrier mobility becomes lower. Thus, with an atomic ratio indicating [In]:[M]:[Zn]=0:1:0 and atomic ratios having values in the neighborhood thereof (e.g., a region C illustrated in FIG. 39C), insulation performance becomes better.

Accordingly, an oxide semiconductor film in one embodiment of the present invention preferably has an atomic ratio represented by a region A in FIG. 39A, with which a layered structure with high carrier mobility and a few grain boundaries is easily obtained.

In addition, a region B illustrated in FIG. 39B represents values from [In]:[M]:[Zn]=4:2:3 to 4.1 and in the neighborhood thereof. The values in the neighborhood include an atomic ratio of [In]:[M]:[Zn]=5:3:4. An oxide semiconductor film with an atomic ratio represented by the region B is an excellent oxide semiconductor film that has particularly high crystallinity and high carrier mobility.

Note that conditions where an oxide semiconductor film forms a layered structure are not uniquely determined by the atomic ratio. Difficulty in forming a layered structure varies depending on the atomic ratio. On the other hand, even with the same atomic ratio, a layered structure is obtained in some cases, but a layered structure is not obtained in others, depending on formation conditions. Therefore, the illustrated regions are regions showing atomic ratios with which an oxide semiconductor film has a layered structure; boundaries of the regions A to C are not clear.

<1-12. Structures of Metal Oxide Films>

Next, structures of metal oxide films (hereinafter referred to as oxide semiconductors) are described.

Oxide semiconductors can be classified into a single crystal oxide semiconductor and non-single-crystal oxide semiconductors. The non-single-crystal oxide semiconductors include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), an amorphous oxide semiconductor, and the like.

From another perspective, oxide semiconductors can be classified into an amorphous oxide semiconductor and crystalline oxide semiconductors. The crystalline oxide semiconductors include a single crystal oxide semiconductor, a CAAC-OS, a polycrystalline oxide semiconductor, an nc-OS, and the like.

An amorphous structure is generally thought to be isotropic and have no non-uniform structure, to be metastable and have no fixed atomic arrangement, to have a flexible bond angle, and to have a short-range order but have no long-range order, for example.

In other words, a stable oxide semiconductor cannot be referred to as a completely amorphous oxide semiconductor. Moreover, an oxide semiconductor that is not isotropic (e.g., that has a periodic structure in a microscopic region) cannot be referred to as a completely amorphous oxide semiconductor. In contrast, an a-like OS, which is not isotropic, has an unstable structure that includes a void (also referred to as a void). Because of its instability, an a-like OS has physical properties similar to those of an amorphous oxide semiconductor.

[CAAC-OS]

First, the CAAC-OS is described.

The CAAC-OS is one kind of oxide semiconductor having a plurality of c-axis-aligned crystal parts (also referred to as pellets).

The CAAC-OS is an oxide semiconductor with high crystallinity. Entry of impurities, formation of defects, or the like might decrease the crystallinity of an oxide semiconductor; therefore, it can be said that the CAAC-OS is an oxide semiconductor having few impurities and defects (e.g., oxygen vacancies).

Note that an impurity is an element other than the main components of an oxide semiconductor, such as hydrogen, carbon, silicon, or a transition metal element. For example, an element, e.g., silicon, having stronger bonding force to oxygen than a metal element of an oxide semiconductor extracts oxygen from the oxide semiconductor, which results in a disordered atomic arrangement and reduced crystallinity of the oxide semiconductor. In addition, a heavy metal such as iron or nickel, argon, carbon dioxide, or the like has a large atomic radius (or molecular radius), which results in a disordered atomic arrangement and a reduced crystallinity of the oxide semiconductor.

[nc-OS]

Next, the nc-OS is described.

The case where the nc-OS was analyzed by XRD will be described. For example, when the structure of the nc-OS is analyzed by an out-of-plane method, a peak indicating orientation does not appear. That is, a crystal of the nc-OS does not have orientation.

The nc-OS is an oxide semiconductor that has higher regularity than an amorphous oxide semiconductor. Therefore, the nc-OS has a lower density of defect states than the a-like OS and the amorphous oxide semiconductor. Note that there is not a regularity of crystal orientation between different pellets in the nc-OS. Therefore, the nc-OS has a higher density of defect states than the CAAC-OS in some cases.

[a-Like OS]

The a-like OS is an oxide semiconductor having a structure intermediate between those of the nc-OS and the amorphous oxide semiconductor.

The a-like OS has a void or a low-density region. The a-like OS has an unstable structure because it includes a void.

In addition, the a-like OS has a structure with a lower density than the nc-OS and the CAAC-OS because it includes a void. Specifically, the density of the a-like OS is higher than or equal to 78.6% and lower than 92.3% of the density of a single crystal having the same composition. In addition, the density of the nc-OS and the density of the CAAC-OS are higher than or equal to 92.3% and lower than 100% of the density of the single crystal having the same composition. It is difficult to deposit an oxide semiconductor having a density lower than 78% of the density of the single crystal.

For example, with regard to an oxide semiconductor satisfying In:Ga:Zn=1:1:1 [atomic ratio], the density of single crystal InGaZnO$_4$ with a rhombohedral crystal structure is 6.357 g/cm$^3$. Accordingly, with regard to the oxide semiconductor satisfying In:Ga:Zn=1:1:1 [atomic ratio], the density of the a-like OS is higher than or equal to 5.0 g/cm$^3$ and lower than 5.9 g/cm$^3$, for example. In addition, with regard to the oxide semiconductor satisfying In:Ga:Zn=1:1:1 [atomic ratio], the density of the nc-OS and the density of the CAAC-OS are higher than or equal to 5.9 g/cm$^3$ and lower than 6.3 g/cm$^3$, for example.

Note that in the case where single crystals having the same composition do not exist, single crystals with different compositions are combined at an adequate ratio, which makes it possible to estimate a density equivalent to that of a single crystal with the desired composition. The density equivalent to that of a single crystal with the desired composition may be estimated using a weighted average with respect to the combination ratio of the single crystals with different compositions. Note that it is preferable to combine as few kinds of single crystals as possible to estimate the density.

As described above, oxide semiconductors have various structures and various properties. Note that an oxide semiconductor may be a stacked film including two or more kinds from an amorphous oxide semiconductor, an a-like OS, an nc-OS, and a CAAC-OS, for example.

<1-13. Structure in which Metal Oxide Film is Used in Transistor>

Then, a structure in which a metal oxide film (hereinafter referred to as an oxide semiconductor film) is used in a transistor is described.

Note that when the oxide semiconductor film is used in a transistor, a transistor with a higher field-effect mobility than, for example, a transistor using polycrystalline silicon as a channel region can be achieved because carrier scattering or the like at grain boundaries can be reduced. In addition, a transistor with high reliability can be achieved.

The oxide semiconductor film of one embodiment of the present invention is a film in which crystal parts having alignment and crystal parts having no alignment are mixed. With the use of such an oxide semiconductor film having crystallinity, a transistor with both high field-effect mobility and high reliability can be achieved.

<1-14. Carrier Density of Metal Oxide Film>

The carrier density of a metal oxide film (hereinafter, an oxide semiconductor film) is described below.

As a factor affecting the carrier density of an oxide semiconductor film, oxygen vacancy ($V_O$) in the oxide semiconductor film, impurities in the oxide semiconductor film, or the like can be given.

As oxygen vacancy in the oxide semiconductor film increases, the density of defect states increases when hydrogen is bonded to the oxygen vacancy (this state is also referred to as $V_O H$). Alternatively, as impurities in the oxide semiconductor film increase, the density of defect states increases due to the impurities. Hence, the carrier density of an oxide semiconductor film can be controlled by controlling the density of defect states in the oxide semiconductor film.

A transistor using the oxide semiconductor film in a channel region is considered here.

The carrier density of the oxide semiconductor film is preferably reduced in the case of aiming to inhibit the negative shift of the threshold voltage of the transistor or reduce the off-state current of the transistor. In the case of reducing the carrier density of the oxide semiconductor film, the impurity concentration in the oxide semiconductor film is reduced so that the density of defect states can be reduced. In this specification and the like, having a low impurity concentration and a low density of defect states is referred to as being highly purified intrinsic or substantially highly purified intrinsic. The carrier density of a highly purified intrinsic oxide semiconductor film is lower than $8\times10^{15}$ cm$^{-3}$, preferably lower than $1\times10^{11}$ cm$^{-3}$, and further preferably lower than $1\times10^{10}$ cm$^{-3}$ and is higher than or equal to $1\times10^{-9}$ cm$^{-3}$.

In contrast, the carrier density of the oxide semiconductor film is preferably increased in the case of aiming to improve the on-state current of the transistor or improve the field-effect mobility of the transistor. In the case of increasing the carrier density of the oxide semiconductor film, the impurity concentration of the oxide semiconductor film is slightly increased, or the density of defect states in the oxide semiconductor film is slightly increased. Alternatively, the bandgap of the oxide semiconductor film is preferably narrowed. For example, an oxide semiconductor film that has a slightly high impurity concentration or a slightly high density of defect states in the range where a favorable on/off ratio is obtained in the Id-Vg characteristics of the transistor can be regarded as substantially intrinsic. Furthermore, an oxide semiconductor film that has a high electron affinity and thus has a narrow bandgap so as to increase the density of thermally excited electrons (carriers) can be regarded as substantially intrinsic. Note that in the case of using an oxide semiconductor film with higher electron affinity, a transistor has lower threshold voltage.

The aforementioned oxide semiconductor film with an increased carrier density has somewhat n-type conductivity. Thus, the oxide semiconductor film with the increased carrier density can be referred to as being "Slightly-n".

The carrier density of a substantially intrinsic oxide semiconductor film is preferably higher than or equal to $1\times10^5$ cm$^{-3}$ and lower than $1\times10^{18}$ cm$^{-3}$, further preferably higher than or equal to $1\times10^7$ cm$^{-3}$ and lower than or equal to $1\times10^{17}$ cm$^{-3}$, still further preferably higher than or equal to $1\times10^9$ cm$^{-3}$ and lower than or equal to $5\times10^{16}$ cm$^{-3}$, yet further preferably higher than or equal to $1\times10^{10}$ cm$^{-3}$ and lower than or equal to $1\times10^{16}$ cm$^3$, and yet still preferably higher than or equal to $1\times10^{11}$ cm$^{-3}$ and lower than or equal to $1\times10^{15}$ cm$^{-3}$.

Figure 41:
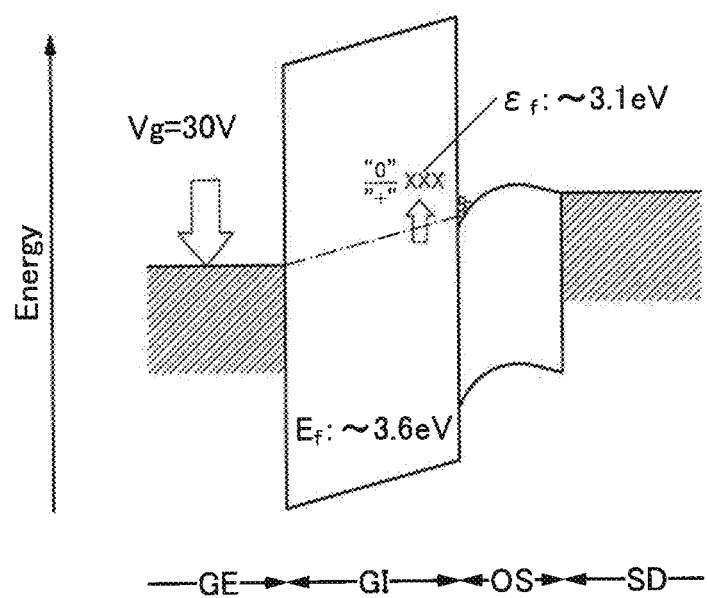
FIG. 41 illustrates an energy band in a transistor in which an oxide semiconductor film is used in its channel region.

In addition, the use of the aforementioned substantially intrinsic oxide semiconductor film may improve the reliability of a transistor. Here, the reason for the improvement in the reliability of a transistor in which the oxide semiconductor film is used in its channel region is described with reference to FIG. 41. FIG. 41 is a diagram illustrating an energy band of the transistor in which the oxide semiconductor film is used in its channel region.

In FIG. 41, GE, GI, OS, and SD refer to a gate electrode, a gate insulating film, an oxide semiconductor film, and a source electrode or a drain electrode, respectively. In other words, FIG. 41 shows an example of energy bands of the gate electrode, the gate insulating film, the oxide semiconductor film, and the source electrode or the drain electrode in contact with the oxide semiconductor film.

In addition, a structure in which a silicon oxide film is used as the gate insulating film and an In—Ga—Zn oxide is used as the oxide semiconductor film is in FIG. 41. In addition, the transition level ($\varepsilon f$) of a defect that might be formed in the silicon oxide film is assumed to be formed at a position 3.1 eV away from the conduction band of the gate insulating film, and the Fermi level (Ef) of the silicon oxide film at the interface between the oxide semiconductor film and the silicon oxide film when the gate voltage (Vg) is 30 V is assumed to be 3.6 eV from the conduction band of the gate insulating film. Note that the Fermi level of the silicon oxide film changes depending on the gate voltage. For example, the Fermi level (Ef) of the silicon oxide film at the interface between the oxide semiconductor film and the silicon oxide film is lowered as the gate voltage is increased. In addition, a white circle in FIG. 41 represents an electron (carrier), and X in FIG. 41 represents a defect state in the silicon oxide film.

As shown in FIG. 41, when thermal excitation of carriers, for example, occurs during the application of a gate voltage, the carriers are trapped by the defect states (X in the diagram) and the charge state of the defect states is changed from positive ("+") to neutral ("0"). In other words, in the case where the value obtained by adding the thermal excitation energy to the Fermi level (Ef) of the silicon oxide film becomes greater than the transition level ($\varepsilon f$) of the defect, the charge state of the defect states in the silicon oxide film is changed from the positive state to neutral, so that the threshold voltage of the transistor shifts in the positive direction.

In addition, when an oxide semiconductor film with a different electron affinity is used, the depth of formation of the Fermi level of the interface between the gate insulating film and the oxide semiconductor film might be changed. When an oxide semiconductor film with a higher electron affinity is used, the conduction band of the gate insulating film moves upward in the vicinity of the interface between the gate insulating film and the oxide semiconductor. In that case, the defect states (X in FIG. 41) which might be formed in the gate insulating film also move upward, so that the energy difference in the Fermi level at the interface between the gate insulating film and the oxide semiconductor film is increased. The increase in the energy difference results in less charge trapped in the gate insulating film. For example, a change in the charge states of the defect states that can be formed in the silicon oxide film is smaller; thus, a change in the threshold voltage of the transistor due to gate bias temperature (Gate Bias Temperature: GBT) stress can be smaller.

In addition, charges trapped by the defect states in the oxide semiconductor film take a long time to be lost and may behave like fixed charges. Thus, the transistor whose channel region is formed in the oxide semiconductor film having a high density of defect states has unstable electrical characteristics in some cases.

Therefore, in order to obtain stable electrical characteristics of a transistor, it is effective to reduce the concentration of impurities in the oxide semiconductor film. In addition, in order to reduce the concentration of impurities in the oxide semiconductor film, it is preferable to reduce the concentration of impurities in an adjacent film. As the impurities, hydrogen, nitrogen, alkali metal, alkaline earth metal, iron, nickel, silicon, and the like are given.

The influence of the impurities in the oxide semiconductor film is described here.

When silicon or carbon that is one of Group 14 elements is contained in the oxide semiconductor film, defect states are formed in the oxide semiconductor film. Thus, the concentration of silicon or carbon in the oxide semiconductor film and the concentration of silicon or carbon in the vicinity of an interface with the oxide semiconductor film (the concentrations obtained by secondary ion mass spectrometry (SIMS: Secondary ion Mass Spectrometry)) are set to lower than or equal to $2\times10^{18}$ atoms/cm$^3$, preferably lower than or equal to $2\times10^{17}$ atoms/cm$^3$.

In addition, when an alkali metal or an alkaline earth metal is contained in the oxide semiconductor film, defect states may be formed and carriers may be generated. Thus, a transistor including an oxide semiconductor film that contains an alkali metal or an alkaline earth metal is likely to be normally on. Therefore, it is preferable to reduce the concentration of an alkali metal or an alkaline earth metal in the oxide semiconductor film. Specifically, the concentration of an alkali metal or an alkaline earth metal in the oxide semiconductor film, which is obtained by SIMS, is set to lower than or equal to $1\times10^{18}$ atoms/cm$^3$, preferably lower than or equal to $2\times10^{16}$ atoms/cm$^3$.

Furthermore, when containing nitrogen, the oxide semiconductor film easily becomes n-type by generation of electrons serving as carriers and an increase of carrier density. Thus, a transistor using an oxide semiconductor film that contains nitrogen as a semiconductor is likely to be normally on. For this reason, nitrogen in the oxide semiconductor film is preferably reduced as much as possible; the nitrogen concentration in the oxide semiconductor film which is obtained by SIMS is set to, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

In addition, hydrogen contained in the oxide semiconductor film reacts with oxygen bonded to a metal atom to form water, and thus, an oxygen vacancy may be formed. Due to entry of hydrogen into the oxygen vacancy, an electron serving as a carrier is generated in some cases. Furthermore, in some cases, bonding of part of hydrogen to oxygen bonded to a metal atom may cause generation of an electron serving as a carrier. Thus, a transistor in which an oxide semiconductor film which contains hydrogen is used is likely to be normally on. Accordingly, it is preferable that hydrogen in the oxide semiconductor film be reduced as much as possible. Specifically, in the oxide semiconductor film, the hydrogen concentration obtained by SIMS is set to lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

By using an oxide semiconductor film in which impurities are sufficiently reduced for a channel formation region in a transistor, the transistor can have stable electrical characteristics.

In addition, the energy gap of the oxide semiconductor film is preferably 2 eV or more, or 2.5 eV or more.

In addition, the thickness of the oxide semiconductor film is greater than or equal to 3 nm and less than or equal to 200 nm, preferably greater than or equal to 3 nm and less than or equal to 100 nm, further preferably greater than or equal to 3 nm and less than or equal to 60 nm.

In addition, in the case where the oxide semiconductor film is an In-M-Zn oxide, it is preferable that the atomic ratio of metal elements of a sputtering target used for forming a film of the In-M-Zn oxide be In:M:Zn=1:1:0.5, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, In:M:Zn=4:2:4.1, In:M:Zn=5:1:7, or the like.

At least part of this embodiment can be implemented in combination with the other embodiments described in this specification as appropriate.

Embodiment 2

<Composition of CAC>

Described below is the composition of a CAC (Cloud Aligned Complementary)-OS that can be used in one embodiment of the present invention.

The CAC is, for example, a material composition in which elements included in an oxide semiconductor are unevenly distributed in a size of greater than or equal to 0.5 nm and less than or equal to 10 nm, preferably greater than or equal to 1 nm and less than or equal to 2 nm, or a neighborhood thereof. Note that in the following description of an oxide semiconductor, a state in which one or more metal elements are unevenly distributed and regions including the metal element(s) are mixed in a size of greater than or equal to 0.5 nm and less than or equal to 10 nm, preferably greater than or equal to 1 nm and less than or equal to 2 nm, or a neighborhood thereof is referred to as a mosaic pattern or a patch-like pattern.

For example, of In—Ga—Zn oxides (hereinafter also referred to as IGZOs), a CAC-IGZO has a composition (hereinafter also referred to as a cloud-like composition) in which materials are separated into indium oxide (hereinafter, $InO_{X1}$ (X1 is a real number greater than 0)) or indium zinc oxide (hereinafter, $In_{X2}Zn_{Y2}O_{Z2}$ (X2, Y2, and Z2 are real numbers greater than 0)), and gallium oxide (hereinafter, $GaO_{X3}$ (X3 is a real number greater than 0)), gallium zinc oxide (hereinafter, $Ga_{X4}Zn_{Y4}O_{Z4}$ (X4, Y4, and Z4 are real numbers greater than 0)), or the like, and a mosaic pattern is formed, and then, $InO_{X1}$ or $In_{X2}Zn_{Y2}O_{Z2}$ forming the mosaic pattern is evenly distributed in the film.

That is, the CAC-IGZO is a composite oxide semiconductor with a composition in which a region containing $GaO_{X3}$ as a main component and a region containing $In_{X2}Zn_{Y2}O_{Z2}$ or $InO_{X1}$ as a main component are mixed. Note that in this specification, for example, when the atomic ratio of In to an element M in a first region is greater than the atomic ratio of In to the element M in a second region, the first region has higher In concentration than the second region.

Note that the IGZO is a common name and refers to one compound including In, Ga, Zn, and O in some cases. As a typical example, a crystalline compound represented by $InGaO_3(ZnO)_{m1}$ (m1 is a natural number) or $In_{(1+x0)}Ga_{(1-x0)}O_3(ZnO)_{m0}$ ($-1 \leq x0 \leq 1$; m0 is a given number) can be given.

The above crystalline compounds have a single crystal structure, a polycrystalline structure, or a CAAC structure. Note that the CAAC structure is a crystal structure in which a plurality of IGZO nanocrystals have c-axis alignment and are connected on the a-b plane without alignment.

On the other hand, the CAC relates to a material composition. Of material compositions containing In, Ga, Zn, and O, the CAC refers to a composition in which regions which contain Ga as a main component and are partly observed as nanoparticles and regions which contain In as a main component and are partly observed as nanoparticles are randomly dispersed to form a mosaic pattern. Therefore, the crystal structure is a secondary element for the CAC.

Note that in the CAC, a stacked-layer structure of two or more kinds of films with different compositions is not included. For example, a two-layer structure of a film containing In as a main component and a film containing Ga as a main component is not included.

Note that in some cases, a clear boundary is not observed between the region containing $GaO_{X3}$ as a main component and the region containing $In_{X2}Zn_{Y2}O_{Z2}$ or $InO_{X1}$ as a main component.

<Analysis of CAC-IGZO>

Then, measurement results of an oxide semiconductor formed over a substrate by a variety of measurement methods are described.

<<Structure and Fabrication Method of Samples>>

Nine samples according to one embodiment of the present invention are described below. The samples are fabricated under different conditions of substrate temperatures and oxygen gas flow rate percentages in film formation of the oxide semiconductor. Note that the samples have a structure including a substrate and an oxide semiconductor over the substrate.

A method for fabricating each sample is described.

First, a glass substrate is used as the substrate. Then, over the glass substrate, an In—Ga—Zn oxide with a thickness of 100 nm is formed as the oxide semiconductor with a sputtering apparatus. As the film formation conditions, the pressure in a chamber is 0.6 Pa, and an oxide target (In:Ga:Zn=4:2:4.1 [atomic ratio]) is used as a target. In addition, the oxide target provided in the sputtering apparatus is supplied with an AC power of 2500 W.

Note that as the conditions for the film formation of the oxide, the substrate temperature was set to a temperature at which intentional heating is not performed (hereinafter also referred to as R.T.), 130° C., or 170° C. In addition, the flow rate percentage of an oxygen gas (hereinafter also referred to as an oxygen gas flow rate percentage) to a mixed gas of Ar and oxygen was set to 10%, 30%, or 100% to fabricate the nine samples.

<<Analysis by X-Ray Diffraction>>

In this section, results of X-ray diffraction (XRD: X-ray diffraction) measurement performed on the nine samples are described. Note that as an XRD apparatus, D8 ADVANCE manufactured by Bruker was used. In addition, as the conditions for θ/2θ scanning by an Out-of-plane method, the scanning range was 15 deg. to 50 deg., the step width was 0.02 deg., and the scanning speed was 3.0 deg./min.

Figure 88:
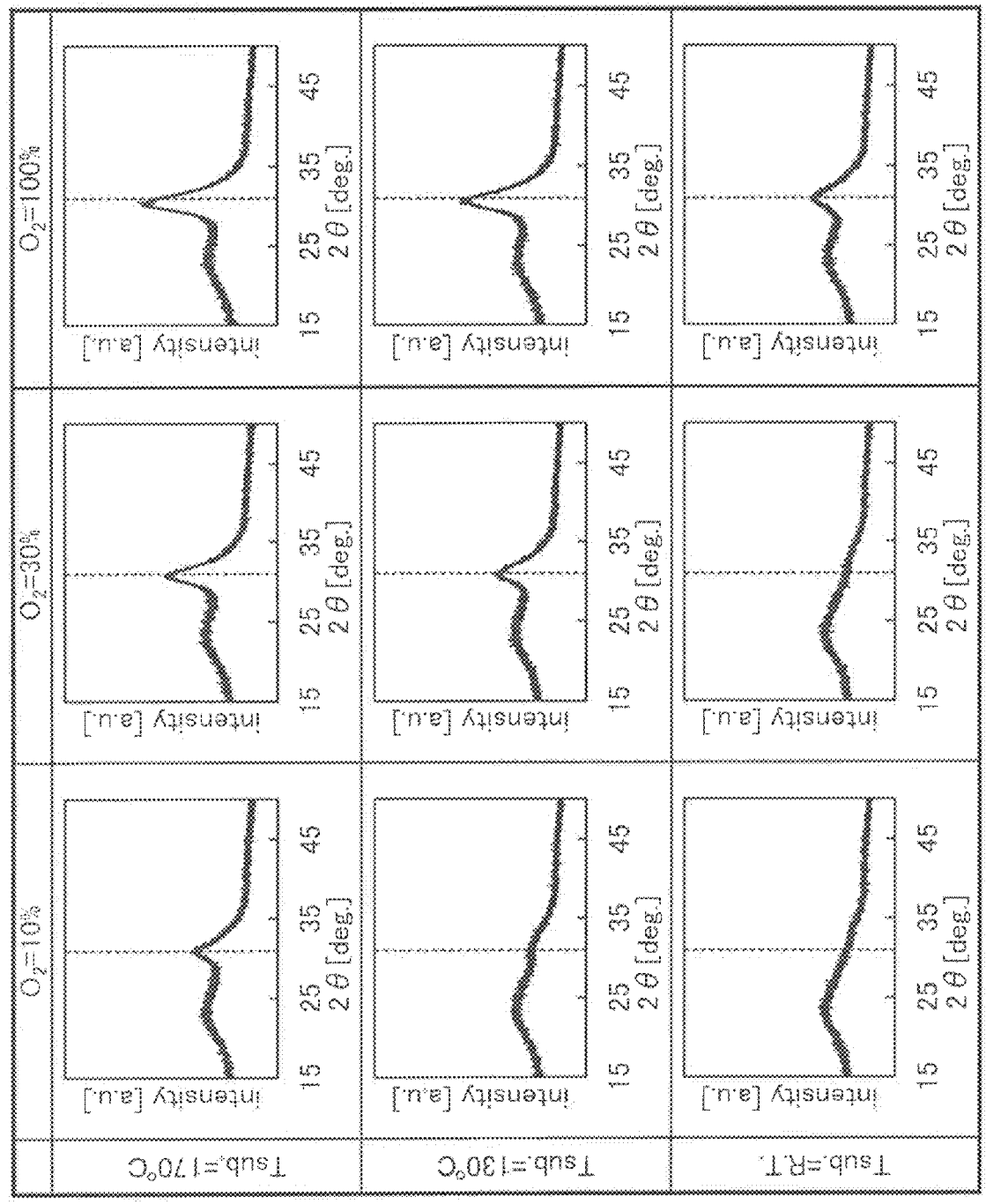
FIG. 88 shows results of measuring XRD spectra of samples.

FIG. 88 shows results of measuring XRD spectra by an Out-of-plane method. Note that in FIG. 88, the top row shows the measurement results of the samples for which the substrate temperature condition at the time of film formation was 170° C.; the middle row shows the measurement results of the samples for which the substrate temperature condition at the time of film formation was 130° C.; the bottom row shows the measurement results of the samples for which the substrate temperature condition at the time of film formation was R.T. In addition, the left column shows the measurement results of the samples for which the oxygen gas flow rate percentage condition was 10%; the middle column shows the measurement results of the samples for which the oxygen gas flow rate percentage condition was 30%; the right column shows the measurement results of the samples for which the oxygen gas flow rate percentage condition was 100%.

In the XRD spectra shown in FIG. 88, the higher the substrate temperature at the time of film formation is or the higher the oxygen gas flow rate percentage at the time of film formation is, the higher the intensity of the peak at around 2θ=31 is. Note that it is found that the peak at around 2θ=31° is derived from a crystalline IGZO compound whose c-axes are aligned in a direction substantially perpendicular to a formation surface or a top surface (also referred to as CAAC (c-axis aligned crystalline)-IGZO).

In addition, as the substrate temperature at the time of film formation is lower or the oxygen gas flow rate percentage is lower, the XRD spectra shown in FIG. 88 show a less clear peak. Accordingly, it is found that no alignment in the a-b plane direction and c-axis direction are observed in the samples with a lower substrate temperature at the time of film formation or with a lower oxygen gas flow rate percentage.

<<Analysis with Electron Microscope>>

In this section, the observation and analysis results of the samples fabricated at a substrate temperature of R.T. at the time of film formation and with an oxygen gas flow rate percentage of 10% with an HAADF (High-Angle Annular Dark Field)-STEM (Scanning Transmission Electron Microscope) are described (hereinafter, an image obtained with a HAADF-STEM is also referred to as a TEM image).

Described are the results of image analysis of plan-view images (hereinafter also referred to as plan-view TEM images) and cross-sectional images (hereinafter also referred to as cross-sectional TEM images) obtained with a HAADF-STEM. Note that the TEM images were observed with a spherical aberration corrector function. Note that the HAADF-STEM images were taken using an atomic resolution analytical electron microscope JEM-ARM200F manufactured by JEOL Ltd. by irradiation with an electron beam with a beam diameter of approximately 0.1 nmφ at an acceleration voltage of 200 kV.

FIG. 89A is a plan-view TEM image of the sample fabricated at a substrate temperature of R.T. at the time of film formation and with an oxygen gas flow rate percentage of 10%. FIG. 89B is a cross-sectional TEM image of the sample fabricated at a substrate temperature of R.T. at the time of film formation and with an oxygen gas flow rate percentage of 10%.

<<Analysis of Electron Diffraction Patterns>>

In this section, results of obtaining electron diffraction patterns by irradiation of the sample fabricated at a substrate temperature of R.T. at the time of film formation and an oxygen gas flow rate percentage of 10% with an electron beam with a probe diameter of 1 nm (also referred to as a nanobeam) are described.

Electron diffraction patterns indicated by a black dot a1, a black dot a2, a black dot a3, a black dot a4, and a black dot a5 in the plan-view TEM image in FIG. 89A of the sample fabricated at a substrate temperature of R.T. at the time of film formation and an oxygen gas flow rate percentage of 10% are observed. Note that the electron diffraction patterns are observed while electron beam irradiation is performed and moved at a constant rate from a position of 0 seconds to a position of 35 seconds. FIG. 89C shows the results of the black point a1; FIG. 89D shows the results of the black dot a2; FIG. 89E shows the results of the black dot a3; FIG. 89F shows the results of the black dot a4; FIG. 89G shows the results of the black dot a5.

In FIG. 89C, FIG. 89D, FIG. 89E, FIG. 89F, and FIG. 89G, regions with high luminance can be observed like a circle (in a ring-like pattern). Furthermore, a plurality of spots can be observed in the ring-like regions.

In addition, electron diffraction patterns indicated by a black dot b1, a black dot b2, a black dot b3, a black dot b4, and a black dot b5 in the cross-sectional TEM image in FIG. 89B of the sample fabricated at a substrate temperature of R.T. at the time of film formation and an oxygen gas flow rate percentage of 10% are observed. FIG. 89H shows the results of the black point b1; FIG. 89I shows the results of the black dot b2; FIG. 89J shows the results of the black dot b3; FIG. 89K shows the results of the black dot b4; FIG. 89L shows the results of the black dot b5.

In FIG. 89H, FIG. 89I, FIG. 89J, FIG. 89K, and FIG. 89L, regions with high luminance can be observed in a ring-like pattern. Furthermore, a plurality of spots can be observed in the ring-like regions.

Here, for example, when an electron beam with a probe diameter of 300 nm is incident on a CAAC-OS including an $InGaZnO_4$ crystal in a direction parallel to the sample surface, a diffraction pattern including a spot derived from the (009) plane of the $InGaZnO_4$ crystal is seen. That is, the CAAC-OS has c-axis alignment and the c-axes are aligned in the direction substantially perpendicular to the formation surface or the top surface. Meanwhile, a ring-like diffraction pattern is observed when an electron beam with a probe diameter of 300 nm is incident in a direction perpendicular to the sample surface of the same sample. That is, it is found that the CAAC-OS has neither a-axis nor b-axis alignment.

Furthermore, a diffraction pattern like a halo pattern is observed when an oxide semiconductor including a nanocrystal (a nano crystalline oxide semiconductor; hereinafter referred to as nc-OS) is subjected to electron diffraction using an electron beam with a large probe diameter (e.g., 50 nm or larger). Meanwhile, bright points (spots) are observed when the nc-OS is subjected to nanobeam electron diffraction using an electron beam with a small probe diameter (e.g., smaller than 50 nm). Furthermore, when the nc-OS is subjected to nanobeam electron diffraction, regions with high luminance are observed like a circle (in a ring-like pattern) in some cases. Moreover, a plurality of bright points are observed in the ring-like regions in some cases.

The electron diffraction pattern of the sample fabricated at a substrate temperature of R.T. at the time of film formation and with an oxygen gas flow rate percentage of 10% has regions with high luminance in a ring-like pattern, and the ring regions include a plurality of bright points. Accordingly, the sample fabricated at a substrate temperature of R.T. at the time of film formation and with an oxygen gas flow rate percentage of 10% exhibits an electron diffraction pattern that is the nc-OS and does not have alignment in the plane direction and the cross-sectional direction.

According to the above, an oxide semiconductor with a low substrate temperature at the time of film formation or with a low oxygen gas flow rate percentage can be presumed to have characteristics distinctly different from those of an oxide semiconductor film having an amorphous structure and an oxide semiconductor film having a single crystal structure.

<<Elementary Analysis>>

In this section, the analysis results of elements in the sample fabricated at a substrate temperature of R.T. at the time of film formation and with an oxygen gas flow rate percentage of 10% by obtaining and evaluating EDX mappings using energy dispersive X-ray spectroscopy (EDX: Energy Dispersive X-ray spectroscopy) are described. Note that an energy dispersive X-ray spectrometer JED-2300T manufactured by JEOL Ltd. is used as an elementary analysis apparatus in the EDX measurement. Note that a Si drift detector is used to detect an X-ray emitted from the sample.

In the EDX measurement, electron beam irradiation is performed on a point in an analysis target region of a sample, and the energy of characteristic X-ray of the sample generated by the irradiation and the generation frequency are measured, whereby an EDX spectrum corresponding to the point is obtained. In this embodiment, peaks of an EDX spectrum of the point are attributed to electron transition to the L shell in an In atom, electron transition to the K shell in a Ga atom, electron transition to the K shell in a Zn atom, and electron transition to the K shell in an O atom, and the proportions of the atoms in the point are calculated. Through this in an analysis target region of a sample, an EDX mapping indicating distributions of proportions of atoms can be obtained.

Figure 90A:
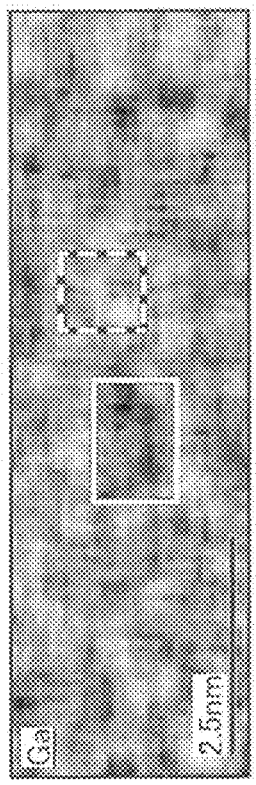
FIGS. 90A to 90C are diagrams showing EDX mappings of a sample.
Figure 90B:
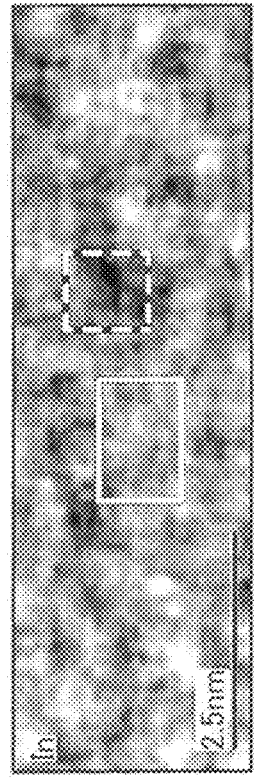
Figure 90C:
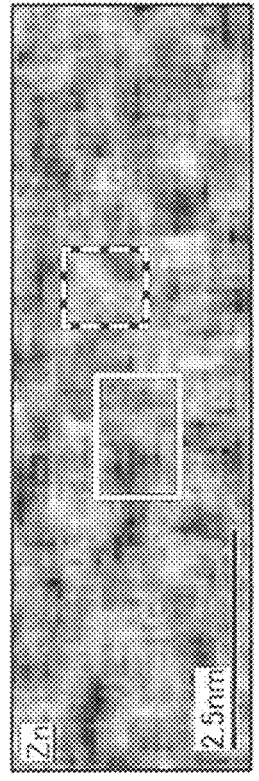

FIG. 90 shows EDX mappings in a cross section of the sample fabricated at a substrate temperature of R.T. at the time of film formation and with an oxygen gas flow rate percentage of 10%. FIG. 90A shows an EDX mapping of Ga atoms (the proportion of the Ga atoms in all the atoms is in the range of 1.18 to 18.64 [atomic %]). FIG. 90B shows an EDX mapping of In atoms (the proportion of the In atoms in all the atoms is in the range of 9.28 to 33.74 [atomic %]). FIG. 90C shows an EDX mapping of Zn atoms (the proportion of the Zn atoms in all the atoms is in the range of 6.69 to 24.99 [atomic %]). In addition, FIG. 90A, FIG. 90B, and FIG. 90C show the same region in the cross section of the sample fabricated at a substrate temperature of R.T. at the time of film formation and with an oxygen gas flow rate percentage of 10%. Note that in the EDX mappings, the proportion of an element is indicated by grayscale: the more the measured element is in a region, the brighter the region is; the less the measured element is in a region, the darker the region is. In addition, the magnification of the EDX mappings in FIG. 90 is 7200000 times.

The EDX mapping images in FIG. 90A, FIG. 90B, and FIG. 90C show relative distribution of brightness indicating that each element exists with a distribution in the sample fabricated at a substrate temperature of R.T. at the time of film formation and with an oxygen gas flow rate percentage of 10%. Here, areas surrounded by solid lines and areas surrounded by dashed lines in FIG. 90A, FIG. 90B, and FIG. 90C are focused on.

In FIG. 90A, the area surrounded by the solid line includes a large, relatively dark region, while the area surrounded by the dashed line includes a large, relatively bright region. In addition, in FIG. 90B, the area surrounded by the solid line includes a large, relatively bright region, while the area surrounded by the dashed line includes a large, relatively dark region.

That is, the areas surrounded by the solid lines are regions including relatively many In atoms and the areas surrounded by the dashed lines are regions including relatively few In atoms. Here, in FIG. 90C, the right portion of the area surrounded by the solid line is a relatively bright region and the left portion thereof is a relatively dark region. Thus, the area surrounded by the solid line is a region containing $In_{X2}Zn_{Y2}O_{Z2}$, $InO_{X1}$, or the like as a main component.

In addition, the area surrounded by the solid line is a region including relatively few Ga atoms and the area surrounded by the dashed line is a region including relatively many Ga atoms. In FIG. 90C, the upper left region of the area surrounded by the dashed line is a relatively bright region and the lower right region thereof is a dark region. Thus, the area surrounded by the dashed line is a region containing $GaO_{X3}$, $Ga_{X4}Zn_{Y4}O_{Z4}$, or the like as a main component.

Furthermore, in FIG. 90A, FIG. 90B, and FIG. 90C, the In atoms are relatively more uniformly distributed than the Ga atoms, and regions containing $InO_{X1}$ as a main component are seemingly formed to be joined to each other through a region containing $In_{X2}Zn_{Y2}O_{Z2}$ as a main component. Thus, the regions containing $In_{X2}Zn_{Y2}O_{Z2}$ or $InO_{X1}$ as a main component are formed to extend like a cloud.

An In—Ga—Zn oxide having a structure in which the regions containing $GaO_{X3}$ as a main component and the regions containing $In_{X2}Zn_{Y2}O_{Z2}$ or $InO_{X1}$ as a main component are unevenly distributed and mixed can be referred to as a CAC-IGZO.

In addition, the crystal structure of the CAC includes an nc structure. In an electron diffraction pattern, the nc structure included in the CAC has several or more bright points (spots) in addition to bright points (sports) derived from IGZO including a single crystal, polycrystal, or CAAC structure. Alternatively, the crystal structure is defined as having high luminance regions appearing in a ring-like pattern in addition to the several or more bright points (spots).

In addition, in FIG. 90A, FIG. 90B, and FIG. 90C, the size of the regions containing $GaO_{X3}$ as a main component and the regions containing $In_{X2}Zn_{Y2}O_{Z2}$ or $InO_{X1}$ as a main component is observed to be greater than or equal to 0.5 nm and less than or equal to 10 nm, or greater than or equal to 1 nm and less than or equal to 3 nm. Note that it is preferable that the diameter of a region containing each metal element as a main component be greater than or equal to 1 nm and less than or equal to 2 nm in the EDX mappings.

According to the above, the CAC-IGZO has a structure different from that of an IGZO compound in which metal elements are evenly distributed, and has properties different from those of the IGZO compound. That is, the CAC-IGZO has a structure in which regions containing $GaO_{X3}$ or the like as a main component and regions containing $In_{X2}Zn_{Y2}O_{Z2}$ or $InO_{X1}$ as a main component are separated from each other and the regions containing each element as a main component form a mosaic pattern. Accordingly, in the case where a CAC-IGZO is used for a semiconductor element, the property derived from $GaO_{X3}$ or the like and the property derived from $In_{X2}Zn_{Y2}O_{Z2}$ or $InO_{X1}$ serve to complement each other, whereby high on-state current ($I_{on}$) and high field-effect mobility (μ) can be achieved.

In addition, a semiconductor element using a CAC-IGZO has high reliability. Thus, the CAC-IGZO is most suitable for a variety of semiconductor devices typified by a display.

At least part of this embodiment can be implemented in combination with the other embodiments or the other examples described in this specification as appropriate.

Embodiment 3

In this embodiment, transistors that can be used for a semiconductor device of one embodiment of the present invention will be described in detail.

Note that transistors with a top-gate structure are described in this embodiment with reference to FIGS. 42A to 53C.

<3-1. Structural Example 1 of Transistor>

Figure 42A:
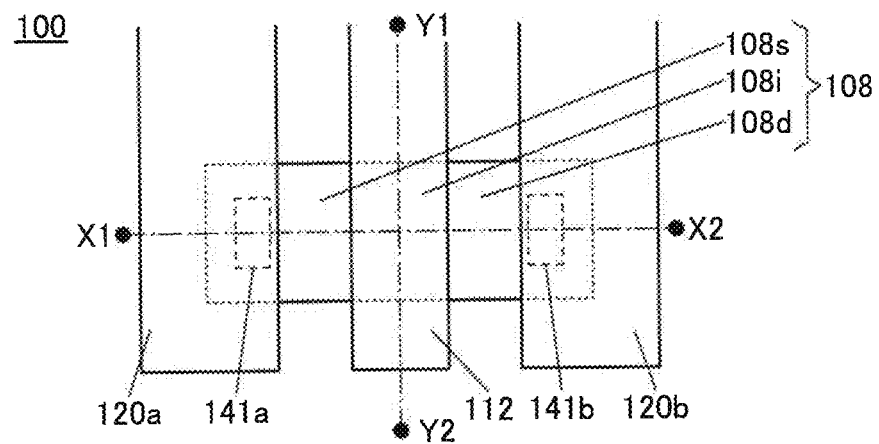
FIGS. 42A to 42C are a top view and cross-sectional views illustrating a semiconductor device.
Figure 42B:
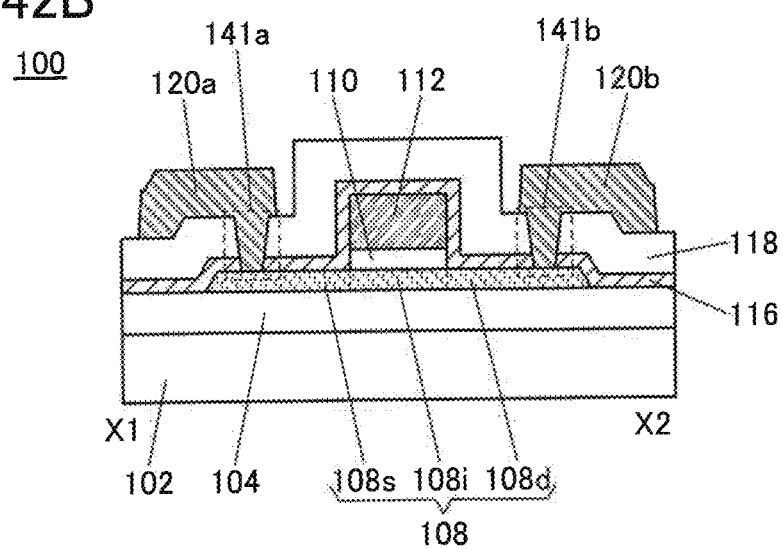
Figure 42C:
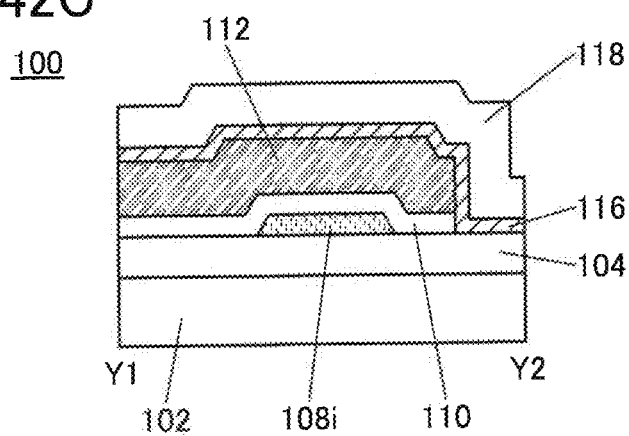

FIG. 42A is a top view of a transistor 100; FIG. 42B is a cross-sectional view along dashed-dotted line X1-X2 in FIG. 42A; FIG. 42C is a cross-sectional view along dashed-dotted line Y1-Y2 in FIG. 42A. Note that in FIG. 42A, some components such as an insulating film 110 are not illustrated for clarity. Note that some components are sometimes not illustrated in subsequent top views of transistors as in FIG. 42A. In addition, in some cases, the direction of the dashed-dotted line X1-X2 is referred to as a channel length (L) direction and the direction of the dashed-dotted line Y1-Y2 is referred to as a channel width (W) direction.

The transistor 100 shown in FIGS. 42A to 42C includes an insulating film 104 over a substrate 102, an oxide semiconductor film 108 over the insulating film 104, the insulating film 110 over the oxide semiconductor film 108, a conductive film 112 over the insulating film 110, and an insulating film 116 over the insulating film 104, the oxide semiconductor film 108, and the conductive film 112. Note that the oxide semiconductor film 108 has a channel region 108i overlapping with the conductive film 112, a source region 108s in contact with the insulating film 116, and a drain region 108d in contact with the insulating film 116.

In addition, the insulating film 116 includes nitrogen or hydrogen. Since the insulating film 116 is in contact with the source region 108s and the drain region 108d, nitrogen or hydrogen in the insulating film 116 is added to the source region 108s and the drain region 108d. The carrier densities in the source region 108s and the drain region 108d are increased by addition of nitrogen or hydrogen.

The transistor 100 may further include an insulating film 118 over the insulating film 116, a conductive film 120a electrically connected to the source region 108s through an opening 141a provided in the insulating films 116 and 118, and a conductive film 120b electrically connected to the drain region 108d through an opening 141b provided in the insulating films 116 and 118.

Note that in this specification and the like, the insulating film 104, the insulating film 110, the insulating film 116, and the insulating film 118 are referred to as a first insulating film, a second insulating film, a third insulating film, and a fourth insulating film, respectively, in some cases. In addition, the conductive film 112 functions as a gate electrode, the conductive film 120a functions as a source electrode, and the conductive film 120b functions as a drain electrode.

In addition, the insulating film 110 functions as a gate insulating film. In addition, the insulating film 110 includes an excess-oxygen region. When the insulating film 110 includes an excess-oxygen region, excess oxygen can be supplied to the channel region 108i of the oxide semiconductor film 108. Thus, oxygen vacancies that can be formed in the channel region 108i can be filled with excess oxygen, so that a highly reliable semiconductor device can be provided.

Note that in order to supply excess oxygen into the oxide semiconductor film 108, the insulating film 104, which is formed under the oxide semiconductor film 108, may include excess oxygen. In this case, excess oxygen contained in the insulating film 104 is also possibly supplied to the source region 108s and the drain region 108d of the oxide semiconductor film 108. If excess oxygen is supplied into the source region 108s and the drain region 108d, the resistance of the source region 108s and the drain region 108d might be increased.

In contrast, in the structure in which the insulating film 110 formed over the oxide semiconductor film 108 includes excess oxygen, excess oxygen can be selectively supplied to the channel region 108i. Alternatively, after excess oxygen is supplied to the channel region 108i, the source region 108s, and the drain region 108d, the carrier density in the source region 108s and the drain region 108d may be selectively increased, whereby the increase in the resistance of the source region 108s and the drain region 108d can be suppressed.

Furthermore, the source region 108s and the drain region 108d of the oxide semiconductor film 108 each preferably includes an element that forms an oxygen vacancy or an element that bonds to an oxygen vacancy. Typical examples of the element that forms an oxygen vacancy or the element that bonds to an oxygen vacancy are hydrogen, boron, carbon, nitrogen, fluorine, phosphorus, sulfur, chlorine, titanium, a rare gas element, and the like. Furthermore, typical examples of the rare gas element are helium, neon, argon, krypton, xenon, and the like. The element that forms an oxygen vacancy is contained in the insulating film 116 in some cases. In the case where the element that forms an oxygen vacancy is contained in the insulating film 116, the element that forms an oxygen vacancy diffuses from the insulating film 116 to the source region 108s and the drain region 108d. Alternatively, the element that forms an oxygen vacancy may be added to the source region 108s and the drain region 108d by impurity addition treatment.

When an impurity element is added to the oxide semiconductor film, a bond between a metal element and oxygen in the oxide semiconductor film is cut, so that an oxygen vacancy is formed. Alternatively, when an impurity element is added to the oxide semiconductor film, oxygen bonded to a metal element in the oxide semiconductor film is bonded to the impurity element and detached from the metal element, so that an oxygen vacancy is formed. As a result, the oxide semiconductor film has a higher carrier density, and thus, the conductivity thereof becomes higher.

Next, details of the components of the semiconductor device in FIGS. 42A to 42C will be described.

[Substrate]

A material having heat resistance high enough to withstand heat treatment in the manufacturing process can be used for the substrate 102.

Specifically, non-alkali glass, soda-lime glass, alkali glass, crystal glass, quartz, sapphire, or the like can be used. An inorganic insulating film may also be used. Examples of the inorganic insulating film include a silicon oxide film, a silicon nitride film, a silicon oxynitride film, an aluminum oxide film, and the like.

In addition, the non-alkali glass may have a thickness greater than or equal to 0.2 mm and less than or equal to 0.7 mm, for example. Alternatively, the non-alkali glass may be polished to the above thickness.

In addition, as the non-alkali glass, a glass substrate having a large area of the 6th generation (1500 mm×1850 mm), the 7th generation (1870 mm×2200 mm), the 8th generation (2200 mm×2400 mm), the 9th generation (2400 mm×2800 mm), the 10th generation (2950 mm×3400 mm), or the like can be used. Thus, a large-sized display device can be manufactured.

In addition, as the substrate 102, a single crystal semiconductor substrate or a polycrystalline semiconductor substrate made of silicon or silicon carbide, a compound semiconductor substrate of silicon germanium or the like, an SOI substrate, or the like may also be used.

An inorganic material such as a metal may also be used for the substrate 102. As the inorganic material such as a metal, stainless steel, aluminum, or the like can be given.

An organic material such as a resin, a resin film, or plastic may also be used for the substrate 102. As the resin film, polyester, polyolefin, polyamide (such as nylon or aramid), polyimide, polycarbonate, polyurethane, an acrylic resin, an epoxy resin, polyethylene terephthalate (PET), polyethylene naphthalate (PEN), polyether sulfone (PES), a resin having a siloxane bond, or the like can be given.

A composite material of a combination of an inorganic material and an organic material may also be used for the substrate 102. As the composite material, a material obtained by bonding a metal plate or a thin glass plate and a resin film, a material obtained by dispersing a fibrous metal, a particulate metal, a fibrous glass, or a particulate glass in a resin film, a material obtained by dispersing a fibrous resin or a particulate resin in an inorganic material, or the like can be given.

Note that the substrate 102 may be something that can at least support a film or a layer formed thereover or thereunder and may be any one or more of an insulating film, a semiconductor film, and a conductive film.

[First Insulating Film]

The insulating film 104 can be formed by using a sputtering method, a CVD method, an evaporation method, a pulsed laser deposition (PLD) method, a printing method, a coating method, or the like as appropriate. The insulating film 104 can also be formed with a single layer or a stacked layer of an oxide insulating film or a nitride insulating film, for example. Note that at least a region of the insulating film 104 which is in contact with the oxide semiconductor film 108 is preferably formed with an oxide insulating film, in order to improve characteristics of the interface with the oxide semiconductor film 108. In addition, when an oxide insulating film from which oxygen is released by heating is used as the insulating film 104, oxygen contained in the insulating film 104 can be moved to the oxide semiconductor film 108 by heat treatment.

The thickness of the insulating film 104 can be greater than or equal to 50 nm, greater than or equal to 100 nm and less than or equal to 3000 nm, or greater than or equal to 200 nm and less than or equal to 1000 nm. When the insulating film 104 is thick, the amount of oxygen released from the insulating film 104 can be increased, and the interface state at the interface between the insulating film 104 and the oxide semiconductor film 108 and oxygen vacancy included in the channel region 108i of the oxide semiconductor film 108 can be reduced.

The insulating film 104 can be provided with a single layer or a stacked layer using, for example, silicon oxide, silicon oxynitride, silicon nitride oxide, silicon nitride, aluminum oxide, hafnium oxide, gallium oxide, Ga—Zn oxide, or the like. In this embodiment, a stacked-layer structure of a silicon nitride film and a silicon oxynitride film is used as the insulating film 104. When the insulating film 104 has the stacked-layer structure in which the silicon nitride film is used as a lower layer and the silicon oxynitride film is used as an upper layer, oxygen can be efficiently introduced into the oxide semiconductor film 108.

[Oxide Semiconductor Film]

As the oxide semiconductor film 108, the metal oxide film described in Embodiment 1 can be used.

In addition, it is favorable to form the oxide semiconductor film 108 by a sputtering method because the film density can be increased. In the case where the oxide semiconductor film 108 is formed by a sputtering method, a rare gas (typically argon), oxygen, or a mixed gas of a rare gas and oxygen is used as a sputtering gas, as appropriate. In addition, increasing the purity of a sputtering gas is necessary. For example, an oxygen gas or an argon gas that is highly purified to have a dew point of −60° C. or lower, further preferably −100° C. or lower is used as a sputtering gas, whereby entry of moisture or the like into the oxide semiconductor film 108 can be minimized.

In addition, in the case where the oxide semiconductor film 108 is formed by a sputtering method, a chamber in a sputtering apparatus is preferably evacuated to be a high vacuum (to the degree of about $5\times10^{-7}$ Pa to $1\times10^{-4}$ Pa) with an adsorption vacuum evacuation pump such as a cryopump in order to remove water or the like, which serves as an impurity for the oxide semiconductor film 108, as much as possible. In particular, the partial pressure of gas molecules corresponding to $H_2O$ (gas molecules corresponding to m/z=18) in the chamber in the standby mode of the sputtering apparatus is preferably lower than or equal to $1\times10^{-4}$ Pa, further preferably lower than or equal to $5\times10^{-5}$ Pa.

[Second Insulating Film]

The insulating film 110 functions as a gate insulating film of the transistor 100. In addition, the insulating film 110 has a function of supplying oxygen to the oxide semiconductor film 108, particularly to the channel region 108i. The insulating film 110 can be formed with a single layer or a stacked layer of an oxide insulating film or a nitride insulating film, for example. Note that to improve the properties of the interface with the oxide semiconductor film 108, a region of the insulating film 110 which is in contact with the oxide semiconductor film 108 is preferably formed using at least an oxide insulating film. As the insulating film 110, silicon oxide, silicon oxynitride, silicon nitride oxide, silicon nitride, or the like may be used, for example.

In addition, the thickness of the insulating film 110 can be greater than or equal to 5 nm and less than or equal to 400 nm, greater than or equal to 5 nm and less than or equal to 300 nm, or greater than or equal to 10 nm and less than or equal to 250 nm.

In addition, it is preferable that the insulating film 110 have few defects and typically have few signals observed by electron spin resonance (ESR: Electron Spin Resonance). As an example of the signal, an E' center observed at a g-factor of 2.001 can be given. Note that the E' center is due to the dangling bond of silicon. As the insulating film 110, a silicon oxide film or a silicon oxynitride film whose spin density due to the E' center is $3\times10^{17}$ spins/cm$^3$ or less, preferably $5\times10^{16}$ spins/cm$^3$ or less may be used.

In addition to the above-described signal, a signal due to nitrogen dioxide ($NO_2$) might be observed from the insulating film 110 in some cases. The signal is divided into three signals according to the N nuclear spin, which are observed at a g-factor of greater than or equal to 2.037 and less than or equal to 2.039 (a first signal), at a g-factor of greater than or equal to 2.001 and less than or equal to 2.003 (a second signal), and at a g-factor of greater than or equal to 1.964 and less than or equal to 1.966 (a third signal).

It is favorable to use an insulating film whose spin density due to nitrogen dioxide ($NO_2$) is higher than or equal to $1\times10^{17}$ spins/cm$^3$ and lower than $1\times10^{18}$ spins/cm$^3$ as the insulating film 110, for example.

Note that nitrogen oxide ($NO_x$), including nitrogen dioxide ($NO_2$), forms a level in the insulating film 110. The level is positioned in the energy gap of the oxide semiconductor film 108. Thus, when nitrogen oxide (NOx) is diffused to the interface between the insulating film 110 and the oxide semiconductor film 108, an electron might be trapped by the level on the insulating film 110 side in some cases. As a result, the trapped electron remains in the vicinity of the interface between the insulating film 110 and the oxide semiconductor film 108, leading to a positive shift of the threshold voltage of the transistor. Accordingly, the use of a film with a low nitrogen oxide content as the insulating film 110 can reduce a shift of the threshold voltage of the transistor.

As an insulating film that releases a small amount of nitrogen oxide ($NO_x$), for example, a silicon oxynitride film can be used. The silicon oxynitride film is a film of which the amount of released ammonia is larger than the amount of released nitrogen oxide ($NO_x$) in thermal desorption spectroscopy (TDS: Thermal Desorption Spectroscopy); the typical amount of released ammonia is greater than or equal to $1\times10^{18}$/cm$^3$ and less than or equal to $5\times10^{19}$/cm$^3$. Note that the amount of released ammonia is the total amount at the time when the temperature of heat treatment in TDS is in a range of 50° C. to 650° C. or 50° C. to 550° C.

Since nitrogen oxide ($NO_x$) reacts with ammonia and oxygen in heat treatment, the use of an insulating film that releases a large amount of ammonia reduces nitrogen oxide ($NO_x$).

Note that in the case where the insulating film 110 is analyzed by SIMS, nitrogen concentration in the film is preferably lower than or equal to $6\times10^{20}$ atoms/cm$^3$.

In addition, as the insulating film 110, a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), or hafnium oxide may be used. The use of such a high-k material enables a reduction in gate leakage of a transistor.

[Third Insulating Film]

The insulating film 116 includes nitrogen or hydrogen. The insulating film 116 may also include fluorine. As the insulating film 116, for example, a nitride insulating film can be given. The nitride insulating film can be formed using silicon nitride, silicon nitride oxide, silicon oxynitride, silicon nitride fluoride, silicon fluoronitride, or the like. The hydrogen concentration in the insulating film 116 is preferably higher than or equal to $1\times10^{22}$ atoms/cm$^3$. Furthermore, the insulating film 116 is in contact with the source region 108s and the drain region 108d of the oxide semiconductor film 108. Thus, the concentration of an impurity (nitrogen or hydrogen) in the source region 108s and the drain region 108d in contact with the insulating film 116 is increased, leading to an increase in the carrier density of the source region 108s and the drain region 108d.

[Fourth Insulating Film]

As the insulating film 118, an oxide insulating film can be used. A stacked-layer film of an oxide insulating film and a nitride insulating film can also be used as the insulating film 118. As the insulating film 118, for example, silicon oxide, silicon oxynitride, silicon nitride oxide, aluminum oxide, hafnium oxide, gallium oxide, Ga—Zn oxide, or the like may be used.

Furthermore, the insulating film 118 is preferably a film functioning as a barrier film against hydrogen, water, and the like from the outside.

The thickness of the insulating film 118 can be greater than or equal to 30 nm and less than or equal to 500 nm, or greater than or equal to 100 nm and less than or equal to 400 nm.

[Conductive Film]

The conductive films 112, 120a, and 120b can be formed by a sputtering method, a vacuum evaporation method, a pulsed laser deposition (PLD) method, a thermal CVD method, or the like. In addition, as the conductive films 112, 120a, and 120b, a conductive metal film, a conductive film having a function of reflecting visible light, or a conductive film having a function of transmitting visible light may be used.

A material containing a metal element selected from aluminum, gold, platinum, silver, copper, chromium, tantalum, titanium, molybdenum, tungsten, nickel, iron, cobalt, palladium, and manganese can be used for the conductive metal film. Alternatively, an alloy containing the above-described metal element may be used.

Specifically, a two-layer structure in which a copper film is stacked over a titanium film, a two-layer structure in which a copper film is stacked over a titanium nitride film, a two-layer structure in which a copper film is stacked over a tantalum nitride film, a three-layer structure in which a copper film is stacked over a titanium film and another titanium film is formed thereover, or the like can be used for the above-described conductive metal film. It is particularly favorable to use a conductive film containing a copper element because the resistance can be reduced. In addition, as the conductive film containing a copper element, an alloy film containing copper and manganese can be given. The alloy film is favorable because it can be processed by a wet etching method.

Note that a tantalum nitride film is favorably used for the conductive films 112, 120a, and 120b. The tantalum nitride film has conductivity and a high barrier property against copper or hydrogen. In addition, because the tantalum nitride film releases little hydrogen from itself, it can be most favorably used as a metal film in contact with the oxide semiconductor film 108 or a metal film in the vicinity of the oxide semiconductor film 108.

For the above-described conductive film having conductivity, a conductive high molecule or a conductive polymer may also be used.

For the above-described conductive film having a function of reflecting visible light, a material containing a metal element selected from gold, silver, copper, and palladium can also be used. In particular, a conductive film containing a silver element is favorably used because reflectance of visible light can be improved.

For the above-described conductive film having a function of transmitting visible light, a material containing an element selected from indium, tin, zinc, gallium, and silicon can also be used. Specifically, an In oxide, a Zn oxide, an In—Sn oxide (also referred to as ITO), an In—Sn—Si oxide (also referred to as ITSO), an In—Zn oxide, an In—Ga—Zn oxide, or the like can be given.

As the above-described conductive film having a function of transmitting visible light, a film containing graphene or graphite may also be used. The film containing graphene can be formed by forming a film containing graphene oxide and reducing the film containing graphene oxide. As a reducing method, a method with application of heat, a method using a reducing agent, or the like can be given.

The conductive films 112, 120*a*, and 120*b* can also be formed by an electroless plating method. As a material that can be formed by the electroless plating method, for example, one or more selected from Cu, Ni, Al, Au, Sn, Co, Ag, and Pd can be used. It is particularly favorable to use Cu or Ag because the resistance of the conductive film can be reduced.

In addition, in the case where the conductive film is formed by the electroless plating method, a diffusion prevention film may be formed under the conductive film to prevent constituent elements of the conductive film from diffusing outward. In addition, a seed layer that can make the conductive film grow may be formed between the diffusion prevention film and the conductive film. The diffusion prevention film can be formed by a sputtering method, for example. As the diffusion prevention film, a tantalum nitride film or a titanium nitride film can also be used, for example. The seed layer can also be formed by the electroless plating method. For the seed layer, a material similar to the material for the conductive film that can be formed by the electroless plating method can also be used.

Note that an oxide semiconductor typified by an In—Ga—Zn oxide may be used for the conductive film 112. The oxide semiconductor can have a high carrier density when nitrogen or hydrogen is supplied from the insulating film 116. In other words, the oxide semiconductor functions as an oxide conductor (OC: Oxide Conductor). Accordingly, the oxide semiconductor can be used for a gate electrode.

As the conductive film 112, for example, a single-layer structure of an oxide conductor (OC), a single-layer structure of a metal film, a stacked-layer structure of an oxide conductor (OC) and a metal film, or the like can be given.

Note that it is favorable that a single-layer structure of a light-shielding metal film or a stacked-layer structure of an oxide conductor (OC) and a light-shielding metal film be used for the conductive film 112 because the channel region 108*i* formed under the conductive film 112 can be shielded from light. In addition, in the case where a stacked-layer structure of an oxide semiconductor or an oxide conductor (OC) and a light-shielding metal film is used for the conductive film 112, when a metal film (e.g., a titanium film or a tungsten film) is formed over the oxide semiconductor or the oxide conductor (OC), the resistance is reduced by the diffusion of the constituent element of the metal film to the oxide semiconductor or oxide conductor (OC) side, the resistance is reduced by damage (e.g., sputtering damage) during the formation of the metal film, or the resistance is reduced by the formation of oxygen vacancies by the diffusion of oxygen in the oxide semiconductor or the oxide conductor (OC) to the metal film.

The thicknesses of the conductive films 112, 120*a*, and 120*b* can be greater than or equal to 30 nm and less than or equal to 500 nm, or greater than or equal to 100 nm and less than or equal to 400 nm.

<3-2. Structural Example 2 of Transistor>

A structure different from that of the transistor shown in FIGS. 42A to 42C is described with reference to FIGS. 43A to 43C.

Figure 43A:
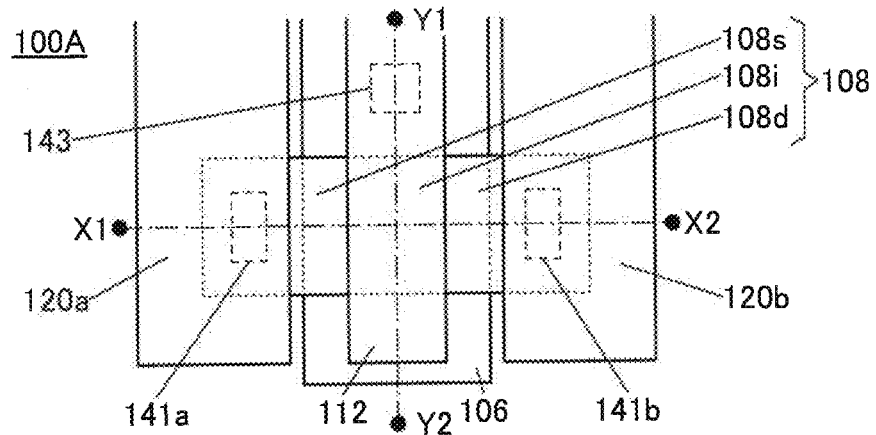
FIGS. 43A to 43C are a top view and cross-sectional views illustrating a semiconductor device.

FIG. 43A is a top view of a transistor 100A; FIG. 43B is a cross-sectional view along the dashed-dotted line X1-X2 in FIG. 43A; FIG. 43C is a cross-sectional view along the dashed-dotted line Y1-Y2 in FIG. 43A.

Figure 43B:
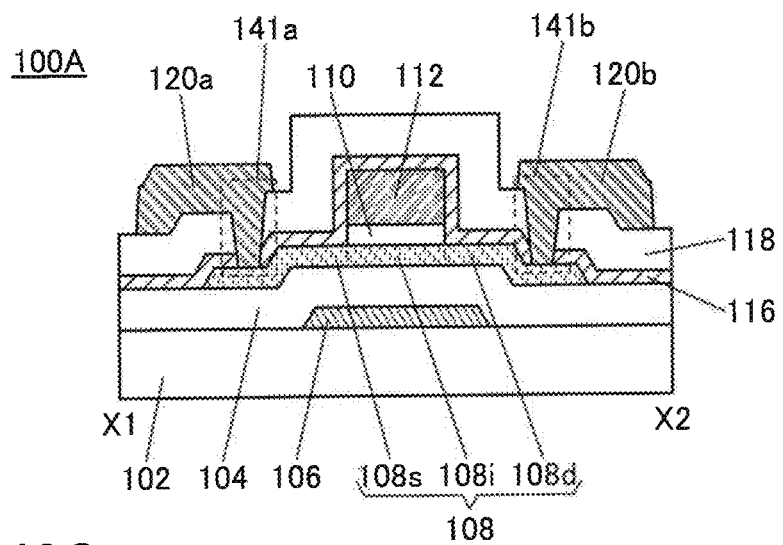
Figure 43C:
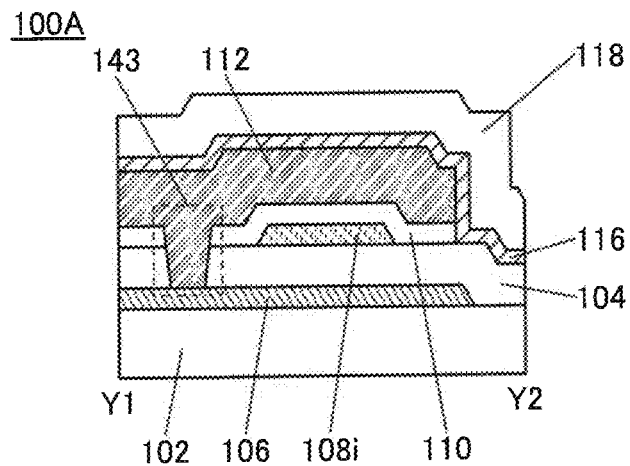

The transistor 100A shown in FIGS. 43A to 43C includes a conductive film 106 over the substrate 102, the insulating film 104 over the conductive film 106, the oxide semiconductor film 108 over the insulating film 104, the insulating film 110 over the oxide semiconductor film 108, the conductive film 112 over the insulating film 110, and the insulating film 116 over the insulating film 104, the oxide semiconductor film 108, and the conductive film 112. Note that the oxide semiconductor film 108 has the channel region 108*i* overlapping with the conductive film 112, the source region 108*s* in contact with the insulating film 116, and the drain region 108*d* in contact with the insulating film 116.

The transistor 100A includes the conductive film 106 and an opening 143 in addition to the components of the transistor 100 described above.

Note that the opening 143 is provided in the insulating films 104 and 110. In addition, the conductive film 106 is electrically connected to the conductive film 112 through the opening 143. Thus, the same potential is applied to the conductive film 106 and the conductive film 112. Note that different potentials may be applied to the conductive film 106 and the conductive film 112 without providing the opening 143. Alternatively, the conductive film 106 may be used as a light-shielding film without providing the opening 143. When the conductive film 106 is formed using a light-shielding material, for example, light irradiation of the channel region 108*i* from the bottom can be reduced.

In addition, in the case of the structure of the transistor 100A, the conductive film 106 functions as a first gate electrode (also referred to as a bottom-gate electrode), and the conductive film 112 functions as a second gate electrode (also referred to as a top-gate electrode). In addition, the insulating film 104 functions as a first gate insulating film, and the insulating film 110 functions as a second gate insulating film.

For the conductive film 106, a material similar to the above-described materials of the conductive films 112, 120*a*, and 120*b*. It is particularly favorable to form the conductive film 106 with a material containing copper because the resistance can be reduced. For example, it is favorable that the conductive film 106 have a stacked-layer structure in which a copper film is provided over a titanium nitride film, a tantalum nitride film, or a tungsten film, and that the conductive films 120*a* and 120*b* have a stacked-layer structure in which a copper film is provided over a titanium nitride film, a tantalum nitride film, or a tungsten film. In that case, when the transistor 100A is used as a pixel transistor and/or a driving transistor of a display device, parasitic capacitance generated between the conductive film 106 and the conductive film 120*a* and parasitic capacitance generated between the conductive film 106 and the conductive film 120*b* can be reduced. Thus, the conductive film 106, the conductive film 120*a*, and the conductive film 120*b* can be used not only as the first gate electrode, the source electrode, and the drain electrode of the transistor 100A, but also as power source supply wirings, signal supply wirings, connection wirings, or the like of the display device.

In this manner, unlike the transistor 100 described above, the transistor 100A shown in FIGS. 43A to 43C has a structure in which conductive films functioning as gate electrodes are included over and under the oxide semiconductor film 108. As in the transistor 100A, a semiconductor device of one embodiment of the present invention may be provided with a plurality of gate electrodes.

In addition, as illustrated in FIGS. 43B and 43C, the oxide semiconductor film 108 is positioned to face the conductive film 106 functioning as a first gate electrode and the conductive film 112 functioning as a second gate electrode and is sandwiched between the two conductive films functioning as the gate electrodes.

Furthermore, the length of the conductive film 112 in the channel width direction is larger than the length of the oxide semiconductor film 108 in the channel width direction, and in the channel width direction, the whole oxide semiconductor film 108 is covered with the conductive film 112 with the insulating film 110 sandwiched therebetween. Moreover, since the conductive film 112 and the conductive film 106 are connected to each other through the opening 143 provided in the insulating film 104 and the insulating film 110, one side surface of the oxide semiconductor film 108 in the channel width direction faces the conductive film 112 with the insulating film 110 sandwiched therebetween.

In other words, a structure is employed in which, in the channel width direction of the transistor 100A, the conductive film 106 and the conductive film 112 are connected through the opening 143 provided in the insulating film 104 and the insulating film 110 and surround the oxide semiconductor film 108 with the insulating film 104 and the insulating film 110 sandwiched therebetween.

Such a structure enables the oxide semiconductor film 108 included in the transistor 100A to be electrically surrounded by electric fields of the conductive film 106 functioning as a first gate electrode and the conductive film 112 functioning as a second gate electrode. A device structure of a transistor, like that of the transistor 100A, in which electric fields of a first gate electrode and a second gate electrode electrically surround the oxide semiconductor film 108 in which a channel region is formed can be referred to as a Surrounded channel (S-channel) structure.

Since the transistor 100A has the S-channel structure, an electric field for inducing a channel can be effectively applied to the oxide semiconductor film 108 by the conductive film 106 or the conductive film 112; thus, the current drive capability of the transistor 100A can be improved and high on-state current characteristics can be obtained. In addition, as a result of the high on-state current, it is possible to miniaturize the transistor 100A. Furthermore, since the oxide semiconductor film 108 has a structure surrounded by the conductive film 106 and the conductive film 112, the mechanical strength of the oxide semiconductor film 108 can be increased.

Note that in the channel width direction of the transistor 100A, an opening different from the opening 143 may be formed on the side of the oxide semiconductor film 108 on which the opening 143 is not formed.

Furthermore, in the case where a transistor has a pair of gate electrodes between which a semiconductor film is sandwiched as in the transistor 100A, one of the gate electrodes may be supplied with a signal A, and the other gate electrode may be supplied with a fixed potential Vb. Moreover, one of the gate electrodes may be supplied with the signal A, and the other gate electrode may be supplied with a signal B. Moreover, one of the gate electrodes may be supplied with a fixed potential Va, and the other gate electrode may be supplied with the fixed potential Vb.

The signal A is, for example, a signal for controlling the conductive state or non-conductive state. The signal A may be a digital signal with two kinds of potentials, a potential V1 and a potential V2 (V1>V2). For example, the potential V1 can be a high power supply potential, and the potential V2 can be a low power supply potential. The signal A may be an analog signal.

The fixed potential Vb is, for example, a potential for controlling a threshold voltage VthA of the transistor. The fixed potential Vb may be the potential V1 or the potential V2. In that case, a potential generator circuit for generating the fixed potential Vb does not need to be provided, which is preferable. The fixed potential Vb may be a potential different from the potential V1 or the potential V2. When the fixed potential Vb is low, the threshold voltage VthA can be high in some cases. As a result, the drain current at the time when the gate-source voltage Vgs is 0 V can be reduced, and leakage current in a circuit including the transistor can be reduced in some cases. The fixed potential Vb may be, for example, lower than the low power supply potential. Meanwhile, a high fixed potential Vb can lower the threshold voltage VthA in some cases. As a result, the drain current at the time when the gate-source voltage Vgs is a high power supply potential can be increased, and the operating speed of the circuit including the transistor can be increased in some cases. The fixed potential Vb may be, for example, higher than the low power supply potential.

The signal B is, for example, a signal for controlling the conductive state or non-conductive state. The signal B may be a digital signal with two kinds of potentials, a potential V3 and a potential V4 (V3>V4). For example, the potential V3 can be a high power supply potential, and the potential V4 can be a low power supply potential. The signal B may be an analog signal.

In the case where both the signal A and the signal B are digital signals, the signal B may be a signal having the same digital value as the signal A. In this case, it may be possible to increase the on-state current of the transistor and increase the operating speed of the circuit including the transistor. At this time, the potential V1 and the potential V2 of the signal A may be different from the potential V3 and the potential V4 of the signal B. For example, in the case where a gate insulating film corresponding to the gate to which the signal B is input is thicker than a gate insulating film corresponding to the gate to which the signal A is input, the potential amplitude of the signal B (V3−V4) may be larger than the potential amplitude of the signal A (V1−V2). In this manner, the influence of the signal A and the influence of the signal B on the conductive state or non-conductive state of the transistor can be substantially the same in some cases.

In the case where both the signal A and the signal B are digital signals, the signal B may be a signal having a digital value different from that of the signal A. In this case, the transistor can be controlled by the signal A and the signal B separately and thus can achieve high functionality in some cases. The transistor which is of, for example, n-channel type can function by itself as a NAND circuit, a NOR circuit, or the like in the case where it is turned on only in the case where the signal A has the potential V1 and the signal B has the potential V3, or in the case where it is turned off only in the case where the signal A has the potential V2 and the signal B has the potential V4. In addition, the signal B may be a signal for controlling the threshold voltage VthA. For example, the signal B may be a signal having different potentials in a period in which the circuit including the transistor operates and in a period in which the circuit does not operate. The signal B may a signal having a potential that varies depending on the operation mode of the circuit. In this case, the potential of the signal B is not changed as frequently as the potential of the signal A in some cases.

In the case where both the signal A and the signal B are analog signals, the signal B may be an analog signal having the same potential as the signal A, an analog signal which is a constant times the potential of the signal A, an analog signal which is higher or lower than the potential of the signal A by a constant, or the like. In this case, it may be possible to increase the on-state current of the transistor and the operating speed of the circuit including the transistor. The signal B may be an analog signal different from the signal A. In this case, the transistor can be controlled by the signal A and the signal B separately and thus can achieve high functionality in some cases.

The signal A may be a digital signal, and the signal B may be an analog signal. Alternatively, the signal A may be an analog signal, and the signal B may be a digital signal.

In the case where both of the gate electrodes of the transistor are supplied with the fixed potentials, the transistor can function as an element equivalent to a resistor in some cases. For example, in the case where the transistor is of n-channel type, the effective resistance of the transistor can be sometimes low (high) when the fixed potential Va or the fixed potential Vb is high (low). When both the fixed potential Va and the fixed potential Vb are high (low), an effective resistance that is lower (higher) than that of a transistor with only one gate may be obtained in some cases.

Note that the other components of the transistor 100A are similar to those of the transistor 100 described above and have similar effects.

In addition, another insulating layer may be formed over the transistor 100A. An example of such a case is illustrated in FIGS. 44A and 44B. FIGS. 44A and 44B are cross-sectional views of a transistor 100B. A top view of the transistor 100B is similar to that of the transistor 100A illustrated in FIG. 43A and thus are not described here.

The transistor 100B illustrated in FIGS. 44A and 44B includes an insulating film 122 over the conductive films 120a and 120b and the insulating film 118. The other components are similar to those of the transistor 100A and have similar effects.

The insulating film 122 has a function of covering unevenness and the like caused by the transistor or the like. The insulating film 122 has an insulating property and is formed using an inorganic material or an organic material. As the inorganic material, a silicon oxide film, a silicon oxynitride film, a silicon nitride oxide film, a silicon nitride film, an aluminum oxide film, an aluminum nitride film, or the like can be given. As an example of the organic material, a photosensitive resin material such as an acrylic resin or a polyimide resin can be given.

<3-3. Structural Example 3 of Transistor>

Next, structures different from the transistor illustrated in FIGS. 43A to 43C will be described with reference to FIGS. 45A to 47B.

Figure 45A:
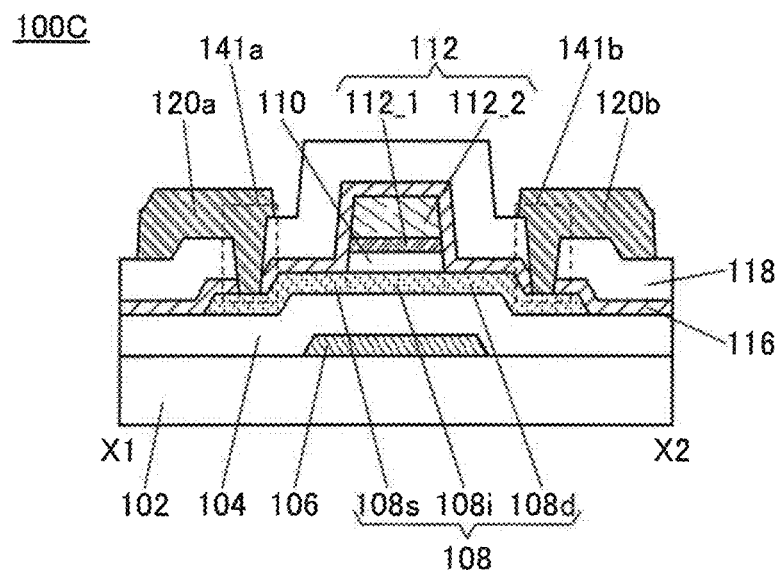
FIGS. 45A and 45B are cross-sectional views illustrating a semiconductor device.
Figure 45B:
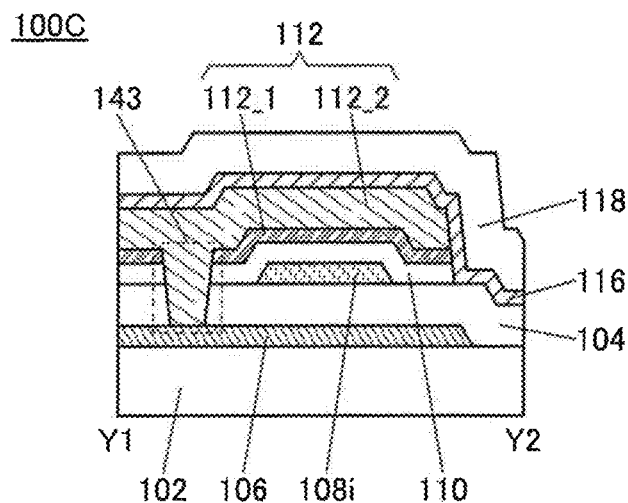
Figure 46A:
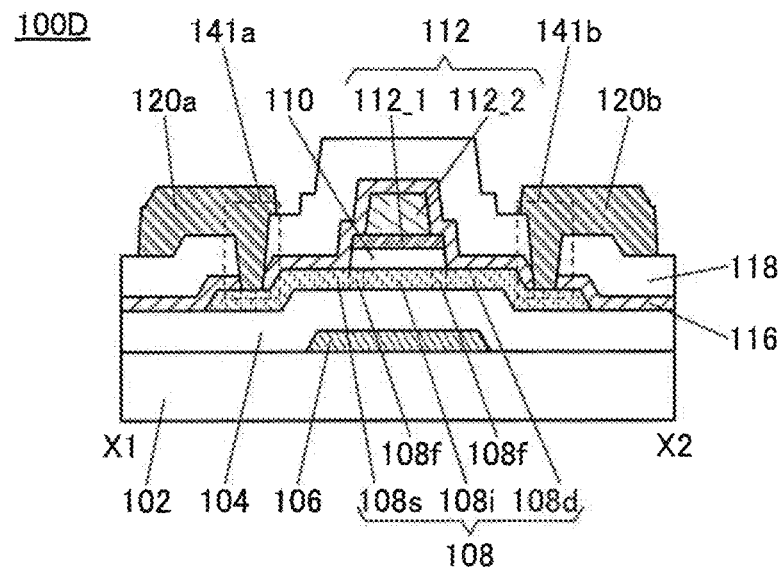
FIGS. 46A and 46B are cross-sectional views illustrating a semiconductor device.
Figure 46B:
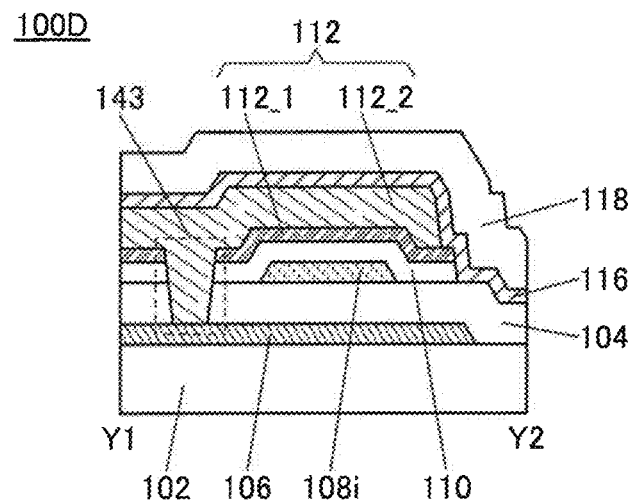
Figure 47A:
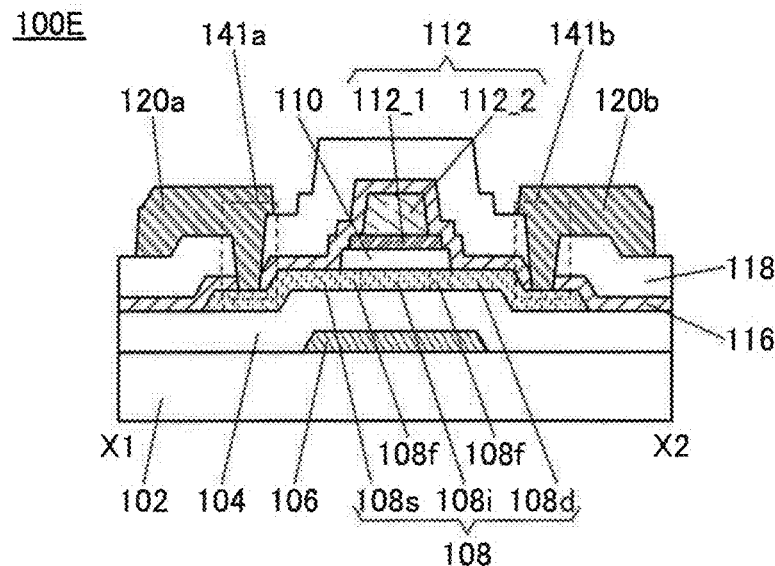
FIGS. 47A and 47B are cross-sectional views illustrating a semiconductor device.
Figure 47B:
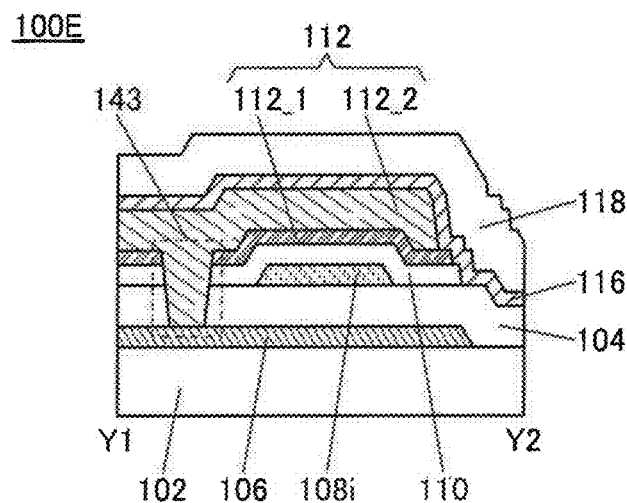

FIGS. 45A and 45B are cross-sectional views of a transistor 100C; FIGS. 46A and 46B are cross-sectional views of a transistor 100D; FIGS. 47A and 47B are cross-sectional views of a transistor 100E. Note that top views of the transistor 100C, the transistor 100D, and the transistor 100E are similar to that of the transistor 100A illustrated in FIG. 43A and thus are not described here.

The transistor 100C illustrated in FIGS. 45A and 45B is different from the transistor 100A in the stacked-layer structure of the conductive film 112, the shape of the conductive film 112, and the shape of the insulating film 110.

The conductive film 112 in the transistor 100C includes a conductive film 112_1 over the insulating film 110 and a conductive film 112_2 over the conductive film 112_1. For example, an oxide conductive film is used as the conductive film 112_1, so that excess oxygen can be added to the insulating film 110. The oxide conductive film can be formed by a sputtering method in an atmosphere containing an oxygen gas. In addition, as an example of the oxide conductive film, an oxide including indium and tin, an oxide including tungsten and indium, an oxide including tungsten, indium, and zinc, an oxide including titanium and indium, an oxide including titanium, indium, and tin, an oxide including indium and zinc, an oxide including silicon, indium, and tin, an oxide film including indium, gallium, and zinc, or the like can be given.

In addition, as illustrated in FIG. 45B, the conductive film 112_2 and the conductive film 106 are connected to each other through the opening 143. At the time of forming the opening 143, by forming the opening 143 after a conductive film to be the conductive film 112_1 is formed, the shape illustrated in FIG. 45B can be obtained. In the case where an oxide conductive film is used as the conductive film 112_1, the structure in which the conductive film 112_2 and the conductive film 106 are connected to each other can decrease the connection resistance between the conductive film 112 and the conductive film 106.

In addition, the conductive film 112 and the insulating film 110 in the transistor 100C have a tapered shape. More specifically, a lower edge portion of the conductive film 112 is formed outside an upper edge portion of the conductive film 112. In addition, a lower edge portion of the insulating film 110 is formed outside an upper edge portion of the insulating film 110. In addition, the lower edge portion of the conductive film 112 is formed in substantially the same position as that of the upper edge portion of the insulating film 110.

It is favorable that the conductive film 112 and the insulating film 110 of the transistor 100C have tapered shapes because the coverage with the insulating film 116 can be high as compared with the case of the transistor 100A in which the conductive film 112 and the insulating film 110 are rectangular.

Note that the other components of the transistor 100C are similar to those of the transistor 100A described above and have similar effects.

The transistor 100D illustrated in FIGS. 46A and 46B is different from the transistor 100A in the stacked-layer structure of the conductive film 112, the shape of the conductive film 112, and the shape of the insulating film 110.

The conductive film 112 in the transistor 100D includes the conductive film 112_1 over the insulating film 110 and the conductive film 112_2 over the conductive film 112_1. In addition, a lower edge portion of the conductive film 112_1 is formed outside an upper edge portion of the conductive film 112_2. For example, the above structure can be obtained by processing the conductive film 112_1, the conductive film 112_2, and the insulating film 110 with the same mask and by processing the conductive film 112_2 by a wet etching method and the conductive film 112_1 and the insulating film 110 by a dry etching method.

In addition, with the structure of the transistor 100D, regions 108f are formed in the oxide semiconductor film 108 in some cases. The regions 108f are formed between the channel region 108i and the source region 108s and between the channel region 108i and the drain region 108d.

The regions 108f function as either high-resistance regions or low-resistance regions. The high-resistance regions are regions that have the same level of resistance as the channel region 108i and do not overlap with the conductive film 112 functioning as a gate electrode. In the case where the regions 108f are high-resistance regions, the regions 108f function as offset regions. In the case where the regions 108f function as offset regions, the regions 108f may be 1 μm or less in the channel length (L) direction to suppress a decrease in the on-state current of the transistor 100D.

In addition, the low-resistance regions are regions that have a resistance lower than that of the channel region 108*i* and higher than that of the source region 108*s* and the drain region 108*d*. In the case where the regions 108*f* are low-resistance regions, the regions 108*f* function as so-called LDD (Lightly Doped Drain) regions. In the case where the regions 108*f* function as LDD regions, an electric field in the drain region can be relieved, whereby a change in the threshold voltage of the transistor due to the electric field in the drain region can be reduced.

Note that in the case where the regions 108*f* are LDD regions, for example, the regions 108*f* can be formed by supplying one or more of nitrogen, hydrogen, and fluorine from the insulating film 116 to the regions 108*f* or by adding an impurity element from above the conductive film 112_1 using the insulating film 110 and the conductive film 112_1 as a mask so that the impurity is added to the oxide semiconductor film 108 through the conductive film 112_1 and the insulating film 110.

In addition, as illustrated in FIG. 46B, the conductive film 112_2 and the conductive film 106 are connected to each other through the opening 143.

Note that the other components of the transistor 100D are similar to those of the transistor 100A described above and have similar effects.

The transistor 100E illustrated in FIGS. 47A and 47B is different from the transistor 100A in the stacked-layer structure of the conductive film 112, the shape of the conductive film 112, and the shape of the insulating film 110.

The conductive film 112 in the transistor 100E includes the conductive film 112_1 over the insulating film 110 and the conductive film 112_2 over the conductive film 112_1. In addition, a lower edge portion of the conductive film 112_1 is formed outside a lower edge portion of the conductive film 112_2. In addition, a lower edge portion of the insulating film 110 is formed outside the lower edge portion of the conductive film 112_1. For example, the above structure can be obtained by processing the conductive film 112_1, the conductive film 112_2, and the insulating film 110 with the same mask and by processing the conductive film 112_2 and the conductive film 112_1 by a wet etching method and the insulating film 110 by a dry etching method.

In addition, like the transistor 100D, regions 108*f* are formed in the oxide semiconductor film 108 in the transistor 100E, in some cases. The regions 108*f* are formed between the channel region 108*i* and the source region 108*s* and between the channel region 108*i* and the drain region 108*d*.

In addition, as illustrated in FIG. 47B, the conductive film 112_2 and the conductive film 106 are connected to each other through the opening 143.

Note that the other components of the transistor 100E are similar to those of the transistor 100A described above and have similar effects.

<3-4. Structural Example 4 of Transistor>

Next, structures different from the transistor 100A illustrated in FIGS. 43A to 43C will be described with reference to FIGS. 48A to 52B.

Figure 48A:
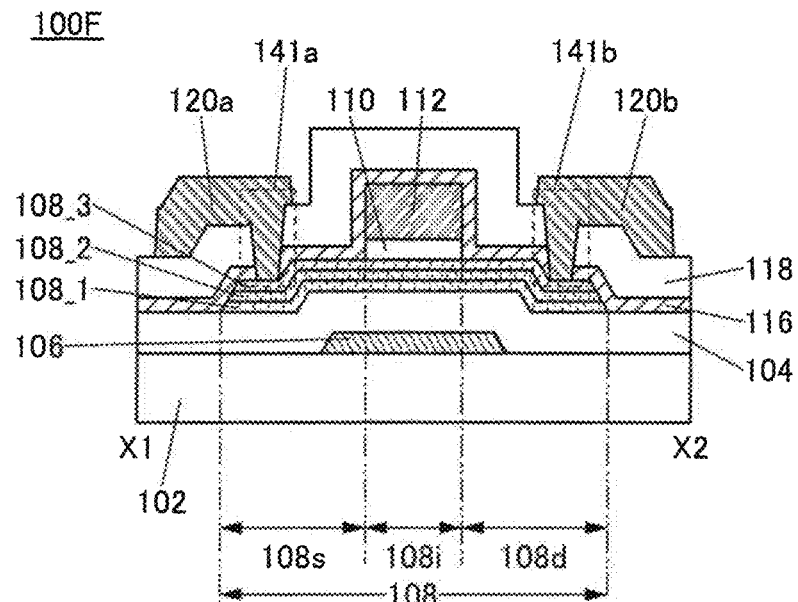
FIGS. 48A and 48B are cross-sectional views illustrating a semiconductor device.
Figure 48B:
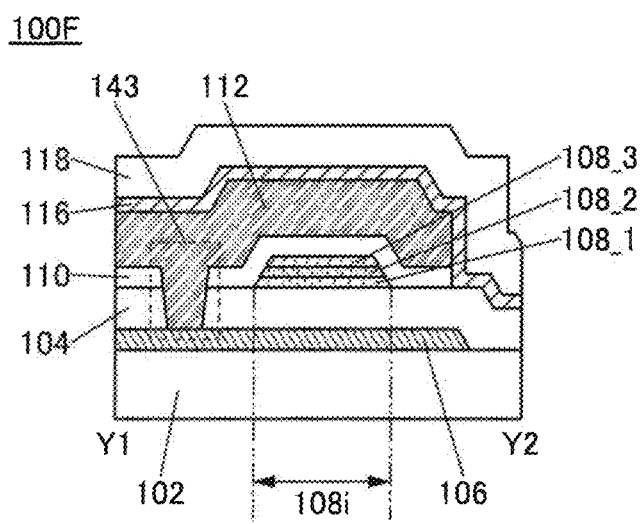
Figure 49A:
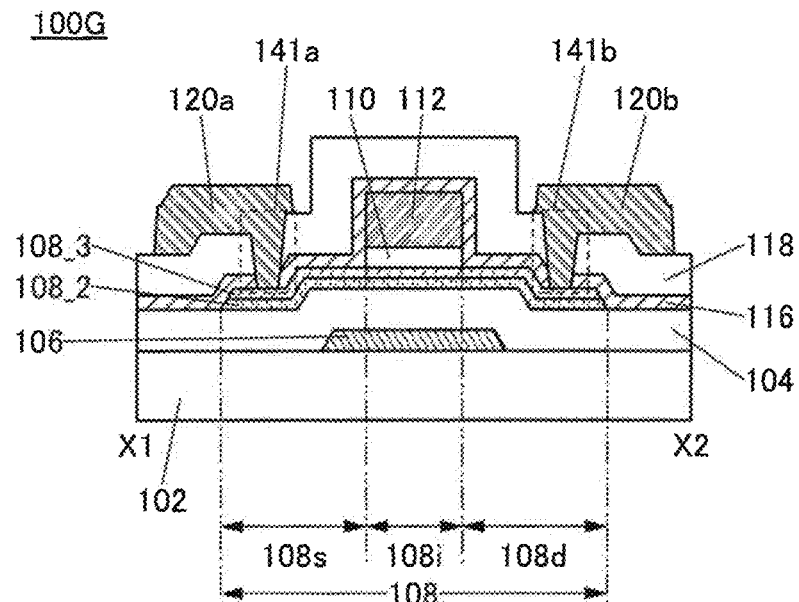
FIGS. 49A and 49B are cross-sectional views illustrating a semiconductor device.
Figure 49B:
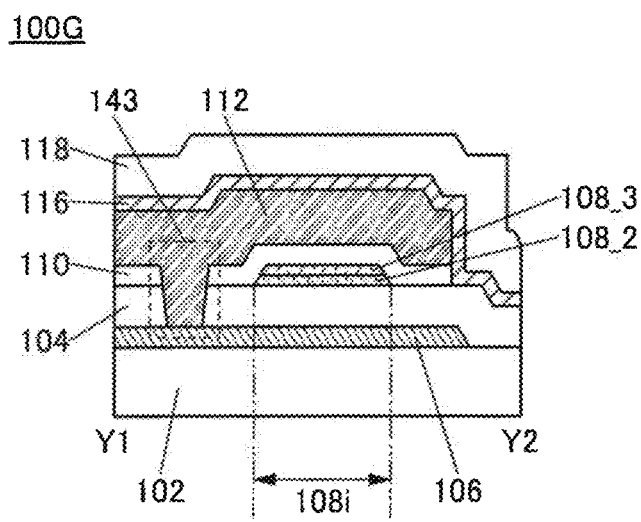
Figure 50A:
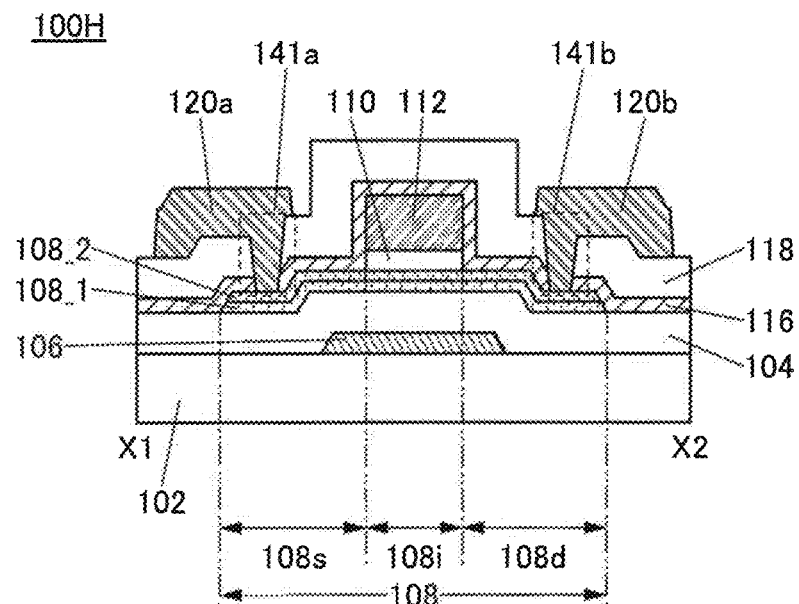
FIGS. 50A and 50B are cross-sectional views illustrating a semiconductor device.
Figure 50B:
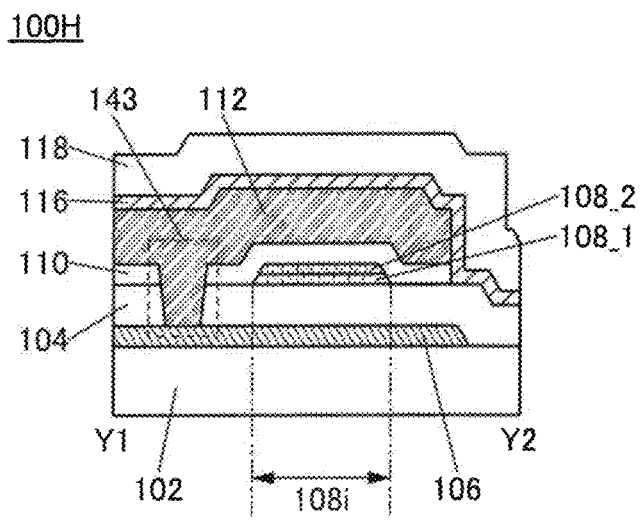
Figure 51A:
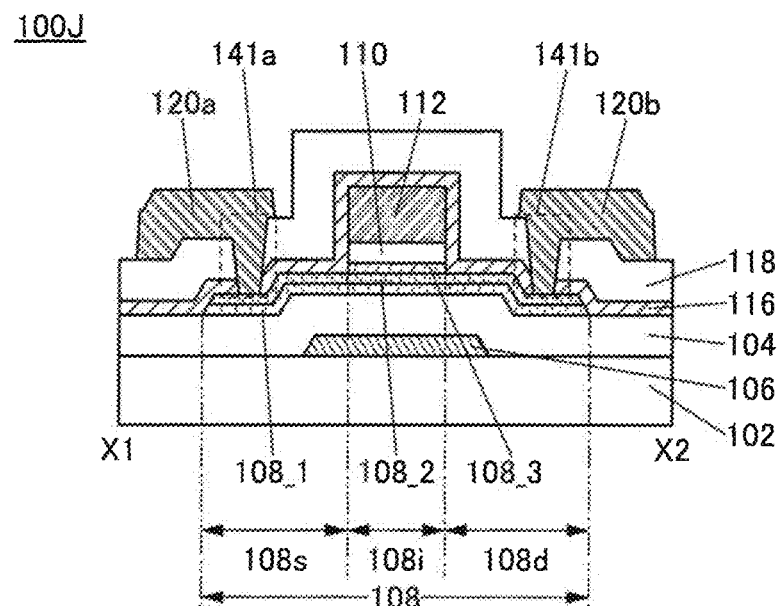
FIGS. 51A and 51B are cross-sectional views illustrating a semiconductor device.
Figure 51B:
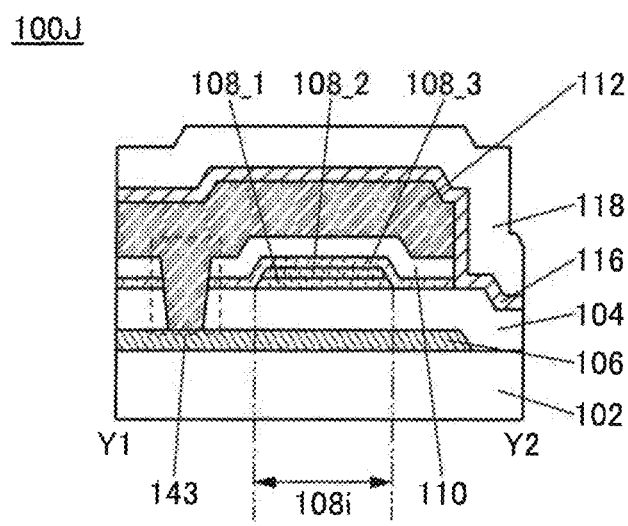
Figure 52A:
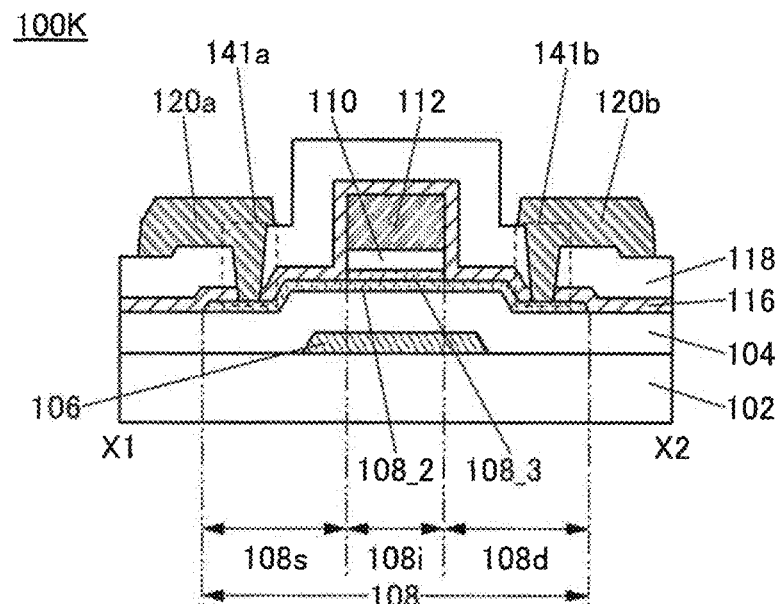
FIGS. 52A and 52B are cross-sectional views illustrating a semiconductor device.
Figure 52B:
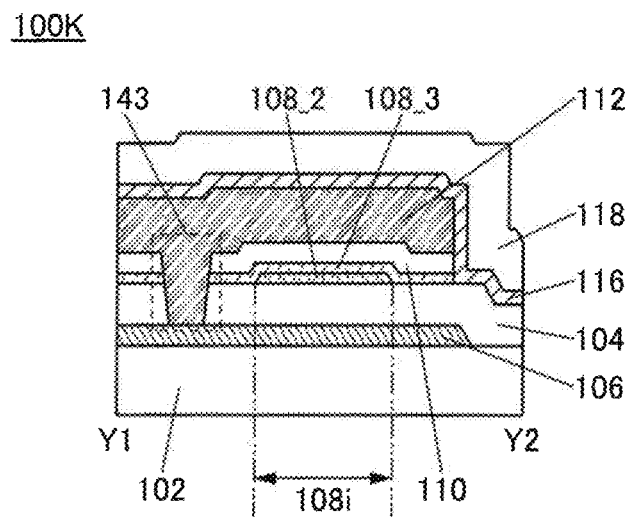

FIGS. 48A and 48B are cross-sectional views of a transistor 100F; FIGS. 49A and 49B are cross-sectional views of a transistor 100G. FIGS. 50A and 50B are cross-sectional views of a transistor 100H; FIGS. 51A and 51B are cross-sectional views of a transistor 100J; FIGS. 52A and 52B are cross-sectional views of a transistor 100K. Note that top views of the transistor 100F, the transistor 100G, the transistor 100H, the transistor 100J, and the transistor 100K are similar to that of the transistor 100A illustrated in FIG. 43A and thus are not described here.

The transistor 100F, the transistor 100G, the transistor 100H, the transistor 100J, and the transistor 100K are different from the transistor 100A described above in the structure of the oxide semiconductor film 108. The other components are similar components to those of the transistor 100A described above and have similar effects.

The oxide semiconductor film 108 of the transistor 100F illustrated in FIGS. 48A and 48B includes an oxide semiconductor film 108_1 over the insulating film 104, an oxide semiconductor film 108_2 over the oxide semiconductor film 108_1, and an oxide semiconductor film 108_3 over the oxide semiconductor film 108_2. In addition, the channel region 108*i*, the source region 108*s*, and the drain region 108*d* each have a stacked-layer structure of three layers, the oxide semiconductor film 108_1, the oxide semiconductor film 108_2, and the oxide semiconductor film 108_3.

The oxide semiconductor film 108 of the transistor 100G illustrated in FIGS. 49A and 49B includes the oxide semiconductor film 108_2 over the insulating film 104 and the oxide semiconductor film 108_3 over the oxide semiconductor film 108_2. In addition, the channel region 108*i*, the source region 108*s*, and the drain region 108*d* each have a stacked-layer structure of two layers, the oxide semiconductor film 108_2 and the oxide semiconductor film 108_3.

The oxide semiconductor film 108 of the transistor 100H illustrated in FIGS. 50A and 50B includes the oxide semiconductor film 108_1 over the insulating film 104 and the oxide semiconductor film 108_2 over the oxide semiconductor film 108_1. In addition, the channel region 108*i*, the source region 108*s*, and the drain region 108*d* each have a stacked-layer structure of two layers, the oxide semiconductor film 108_1 and the oxide semiconductor film 108_2.

The oxide semiconductor film 108 of the transistor 100J illustrated in FIGS. 51A and 51B includes the oxide semiconductor film 108_1 over the insulating film 104, the oxide semiconductor film 108_2 over the oxide semiconductor film 108_1, and the oxide semiconductor film 108_3 over the oxide semiconductor film 108_2. In addition, the channel region 108*i* has a stacked-layer structure of three layers, the oxide semiconductor film 108_1, the oxide semiconductor film 108_2, and the oxide semiconductor film 108_3, and the source region 108*s* and the drain region 108*d* each have a stacked-layer structure of two layers, the oxide semiconductor film 108_1 and the oxide semiconductor film 108_2. Note that in the cross section of the transistor 100J in the channel width (W) direction, the oxide semiconductor film 108_3 covers side surfaces of the oxide semiconductor film 108_1 and the oxide semiconductor film 108_2.

The oxide semiconductor film 108 of the transistor 100K illustrated in FIGS. 52A and 52B includes the oxide semiconductor film 108_2 over the insulating film 104 and the oxide semiconductor film 108_3 over the oxide semiconductor film 108_2. In addition, the channel region 108*i* has a stacked-layer structure of two layers, the oxide semiconductor film 108_2 and the oxide semiconductor film 108_3, and the source region 108*s* and the drain region 108*d* each have a single-layer structure of the oxide semiconductor film 108_2. Note that in the cross section of the transistor 100K in the channel width (W) direction, the oxide semiconductor film 108_3 covers side surfaces of the oxide semiconductor film 108_2.

A side surface of the channel region 108*i* in the channel width (W) direction or its vicinity is easily damaged by processing, resulting in a defect (e.g., oxygen vacancy), or easily contaminated by the attachment of an impurity. Therefore, even when the channel region 108*i* is substantially intrinsic, stress such as an electric field applied thereto activates the side surface of the channel region 108*i* in the channel width (W) direction or its vicinity and turns it into a low-resistance (n-type) region easily. Moreover, in the case where the side surface of the channel region 108*i* in the channel width (W) direction or its vicinity is an n-type region, a parasitic channel may be formed in some cases because the n-type region serves as a carrier path.

Thus, in the transistor 100J and the transistor 100K, a structure is employed in which the channel region 108*i* has a stacked-layer structure and side surfaces of the channel region 108*i* in the channel width (W) direction are covered with a layer of the stacked layers. With such a structure, defects on the side surfaces of the channel region 108*i* or in its vicinity can be reduced or attachment of an impurity to the side surfaces of the channel region 108*i* or its the vicinity can be suppressed.

[Band Structure]

Here, a band structure of the insulating film 104, the oxide semiconductor films 108_1, 108_2, and 108_3, and the insulating film 110, a band structure of the insulating film 104, the oxide semiconductor films 108_2 and 108_3, and the insulating film 110, and a band structure of the insulating film 104, the oxide semiconductor films 108_1 and 108_2, and the insulating film 110 will be described with reference to FIGS. 53A to 53C. Note that FIGS. 53A to 53C are band structures of the channel region 108*i*.

Figure 53A:
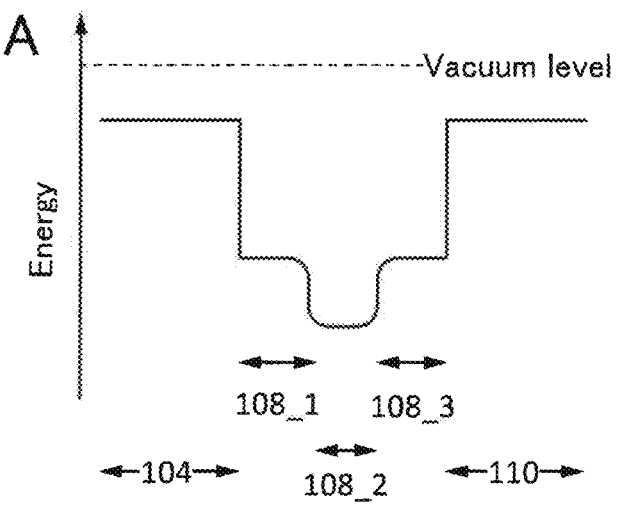
FIGS. 53A to 53C each illustrate a band structure.

FIG. 53A shows an example of a band structure in the thickness direction of a stacked-layer structure including the insulating film 104, the oxide semiconductor films 108_1, 108_2, and 108_3, and the insulating film 110. Furthermore, FIG. 53B shows an example of a band structure in the thickness direction of a stacked-layer structure including the insulating film 104, the oxide semiconductor films 108_2 and 108_3, and the insulating film 110. Moreover, FIG. 53C shows an example of a band structure in the thickness direction of a stacked-layer structure including the insulating film 104, the oxide semiconductor films 108_1 and 108_2, and the insulating film 110. Note that the band structures show the energy levels of the conduction band minima (Ec) of the insulating film 104, the oxide semiconductor films 108_1, 108_2, and 108_3, and the insulating film 110, for easy understanding.

In addition, FIG. 53A is a band diagram of a structure in which silicon oxide films are used as the insulating films 104 and 110, an oxide semiconductor film formed using a metal oxide target having an atomic ratio of metal elements, In:Ga:Zn=1:3:2, is used as the oxide semiconductor film 108_1, an oxide semiconductor film formed using a metal oxide target having an atomic ratio of metal elements, In:Ga:Zn=4:2:4.1, is used as the oxide semiconductor film 108_2, and an oxide semiconductor film formed using a metal oxide target having an atomic ratio of metal elements, In:Ga:Zn=1:3:2, is used as the oxide semiconductor film 108_3.

Figure 53B:
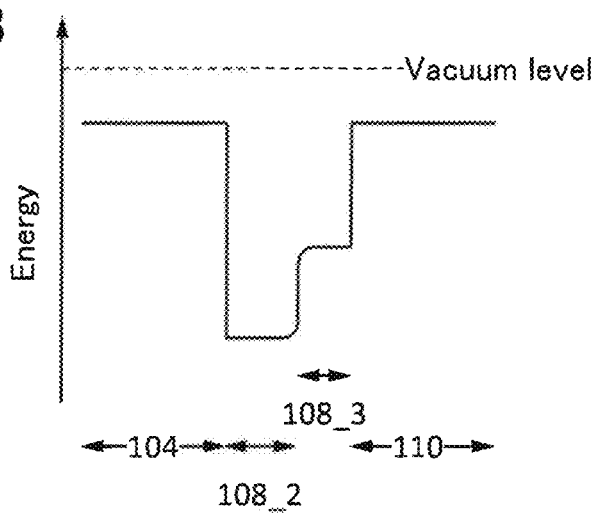
Figure 53C:
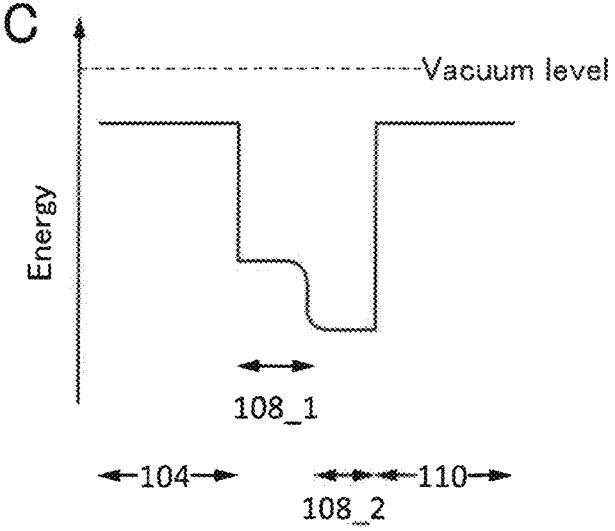

Furthermore, FIG. 53B is a band diagram of a structure in which silicon oxide films are used as the insulating films 104 and 110, an oxide semiconductor film formed using a metal oxide target having an atomic ratio of metal elements, In:Ga:Zn=4:2:4.1, is used as the oxide semiconductor film 108_2, and an oxide semiconductor film formed using a metal oxide target having an atomic ratio of metal elements, In:Ga:Zn=1:3:2, is used as the oxide semiconductor film 108_3.

Moreover, FIG. 53C is a band diagram of a structure in which silicon oxide films are used as the insulating films 104 and 110, an oxide semiconductor film formed using a metal oxide target having an atomic ratio of metal elements, In:Ga:Zn=1:3:2, is used as the oxide semiconductor film 108_1, and an oxide semiconductor film formed using a metal oxide target having an atomic ratio of metal elements, In:Ga:Zn=4:2:4.1, is used as the oxide semiconductor film 108_2.

As illustrated in FIG. 53A, the energy level of the conduction band minimum gradually changes in the oxide semiconductor films 108_1, 108_2, and 108_3. In addition, as illustrated in FIG. 53B, the energy level of the conduction band minimum gradually changes in the oxide semiconductor films 108_2 and 108_3. In addition, as illustrated in FIG. 53C, the energy level of the conduction band minimum gradually changes in the oxide semiconductor films 108_1 and 108_2. In other words, the energy level of the conduction band minimum is continuously changed or continuously connected. To obtain such a band structure, there exists no impurity, which forms a defect state such as a trap center or a recombination center, at the interface between the oxide semiconductor film 108_1 and the oxide semiconductor film 108_2 or at the interface between the oxide semiconductor film 108_2 and the oxide semiconductor film 108_3.

To form a continuous junction between the oxide semiconductor films 108_1, 108_2, and 108_3, it is necessary to stack the films successively without exposure to the air by using a multi-chamber film formation apparatus (sputtering apparatus) provided with a load lock chamber.

With the structure illustrated in FIGS. 53A to 53C, the oxide semiconductor film 108_2 serves as a well, and it can be seen that a channel region is formed in the oxide semiconductor film 108_2 in the transistor using the above stacked-layer structure.

Note that by providing the oxide semiconductor films 108_1 and 108_3, defect states that might be formed in the oxide semiconductor film 108_2 can be distanced away from the oxide semiconductor film 108_2.

In addition, the defect states might be more distant from the vacuum level than the energy level of the conduction band minimum (Ec) of the oxide semiconductor film 108_2 functioning as a channel region, so that electrons are likely to be accumulated in the defect states. The electrons accumulated in the defect states become negative fixed electric charge, so that the threshold voltage of the transistor is shifted in the positive direction. Therefore, a structure in which the defect states are closer to the vacuum level than the energy level of the conduction band minimum (Ec) of the oxide semiconductor film 108_2 is preferable. This inhibits accumulation of electrons in the defect states, and as a result, the on-state current pf the transistor can be increased and the field-effect mobility can be increased at the same time.

In addition, the energy levels of the conduction band minima of the oxide semiconductor films 108_1 and 108_3 are closer to the vacuum level than that of the oxide semiconductor film 108_2, and typically, a difference between the energy level of the conduction band minimum of the oxide semiconductor film 108_2 and the energy levels of the conduction band minima of the oxide semiconductor films 108_1 and 108_3 is more than or equal to 0.15 eV, more than or equal to 0.5 eV and less than or equal to 2 eV, or less than or equal to 1 eV. That is, a difference between the electron affinity of the oxide semiconductor films 108_1 and 108_3 and the electron affinity of the oxide semiconductor film 108_2 is more than or equal to 0.15 eV, more than or equal to 0.5 eV and less than or equal to 2 eV, or less than or equal to 1 eV.

With such a structure, the oxide semiconductor film 108_2 serves as a main path of current. That is, the oxide semiconductor film 108_2 functions as a channel region, and the oxide semiconductor films 108_1 and 108_3 function as oxide insulating films. In addition, as the oxide semiconductor films 108_1 and 108_3, oxide semiconductor films including one or more kinds of metal elements included in the oxide semiconductor film 108_2 in which a channel region is formed are preferably used. With such a structure, interface scattering is less likely to occur at the interface between the oxide semiconductor film 108_1 and the oxide semiconductor film 108_2 or at the interface between the oxide semiconductor film 108_2 and the oxide semiconductor film 108_3. Thus, the transistor can have high field-effect mobility because the movement of carriers is not hindered at the interface.

In addition, to prevent the oxide semiconductor films 108_1 and 108_3 from functioning as part of a channel region, a material having sufficiently low conductivity is used. Therefore, the oxide semiconductor films 108_1 and 108_3 can each be also referred to as oxide insulating films for their physical properties and/or functions. Alternatively, a material which has a smaller electron affinity (a difference between the vacuum level and the energy level of the conduction band minimum) than the oxide semiconductor film 108_2 and has a difference between the energy level of the conduction band minimum and the energy level of the conduction band minimum of the oxide semiconductor film 108_2 (band offset) is preferably used for the oxide semiconductor films 108_1 and 108_3. Furthermore, to inhibit generation of a difference in threshold voltage due to the level of the drain voltage, it is preferable to use a material with which the energy levels of the conduction band minima of the oxide semiconductor films 108_1 and 108_3 are closer to the vacuum level than the energy level of the conduction band minimum of the oxide semiconductor film 108_2. For example, the difference between the energy level of the conduction band minimum of the oxide semiconductor films 108_2 and the energy levels of the conduction band minima of the oxide semiconductor films 108_1 and 108_3 is preferably more than or equal to 0.2 eV, further preferably more than or equal to 0.5 eV.

In addition, it is preferable that the oxide semiconductor films 108_1 and 108_3 not include a spinel crystal structure. In the case where the oxide semiconductor films 108_1 and 108_3 have a spinel crystal structure, constituent elements of the conductive films 120a and 120b might be diffused to the oxide semiconductor film 108_2 at the interface between the spinel crystal structure and another region, in some cases. Note that the oxide semiconductor films 108_1 and 108_3 are preferably a CAAC-OS, in which case a higher blocking property against constituent elements of the conductive films 120a and 120b, for example, a copper element, is obtained.

Furthermore, the structure in which oxide semiconductor films formed using a metal oxide target having an atomic ratio of metal elements, In:Ga:Zn=1:3:2, are used as the oxide semiconductor films 108_1 and 108_3 is described as an example in this embodiment; however, this does not impose any limitation. For example, oxide semiconductor films formed using a metal oxide target of In:Ga:Zn=1:1:1 [atomic ratio], In:Ga:Zn=1:1:1.2 [atomic ratio], In:Ga:Zn=1:3:4 [atomic ratio], In:Ga:Zn=1:3:6 [atomic ratio], In:Ga:Zn=1:4:5 [atomic ratio], In:Ga:Zn=1:5:6 [atomic ratio], or In:Ga:Zn=1:10:1 [atomic ratio] may be used as the oxide semiconductor films 108_1 and 108_3. Alternatively, oxide semiconductor films formed using a metal oxide target having an atomic ratio of metal elements, Ga:Zn=10:1 may be used as the oxide semiconductor films 108_1 and 108_3. In this case, it is preferable that an oxide semiconductor film formed using a metal oxide target having an atomic ratio of metal elements, In:Ga:Zn=1:1:1, is used as the oxide semiconductor film 108_2 and oxide semiconductor films formed using a metal oxide target having an atomic ratio of metal elements, Ga:Zn=10:1, are used as the oxide semiconductor films 108_1 and 108_3 because the difference between the energy level of the conduction band minimum of the oxide semiconductor film 108_2 and the energy levels of the conduction band minima of the oxide semiconductor films 108_1 and 108_3 can be more than or equal to 0.6 eV.

Note that in the case where a metal oxide target of In:Ga:Zn=1:1:1 [atomic ratio] is used for the oxide semiconductor films 108_1 and 108_3, the oxide semiconductor films 108_1 and 108_3 may be In:Ga:Zn=1:$\beta$1 (0<$\beta$1≤2):$\beta$2 (0<$\beta$2≤2) in some cases. In addition, in the case where a metal oxide target of In:Ga:Zn=1:3:4 [atomic ratio] is used for the oxide semiconductor films 108_1 and 108_3, the oxide semiconductor films 108_1 and 108_3 may be In:Ga:Zn=1:$\beta$3 (1≤$\beta$3≤5):$\beta$4 (2≤$\beta$4≤6) in some cases. In addition, in the case where a metal oxide target of In:Ga:Zn=1:3:6 [atomic ratio] is used for the oxide semiconductor films 108_1 and 108_3, the oxide semiconductor films 108_1 and 108_3 may be In:Ga:Zn=1:$\beta$5 (1≤$\beta$5≤5):$\beta$6 (4≤$\beta$6≤8) in some cases.

At least part of this embodiment can be implemented in combination with the other embodiments described in this specification as appropriate.

Embodiment 4

In this embodiment, transistors that can be used for a semiconductor device of one embodiment of the present invention will be described in detail.

Note that transistors of bottom-gate type are described in this embodiment with reference to FIGS. 54A to 60C.

<4-1. Structural Example 1 of Transistor>

Figure 54A:
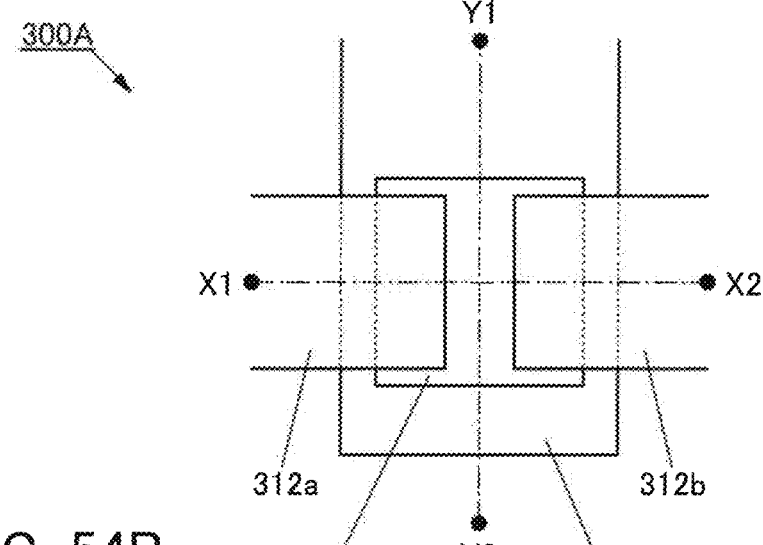
FIGS. 54A to 54C are a top view and cross-sectional views illustrating a semiconductor device.
Figure 54B:
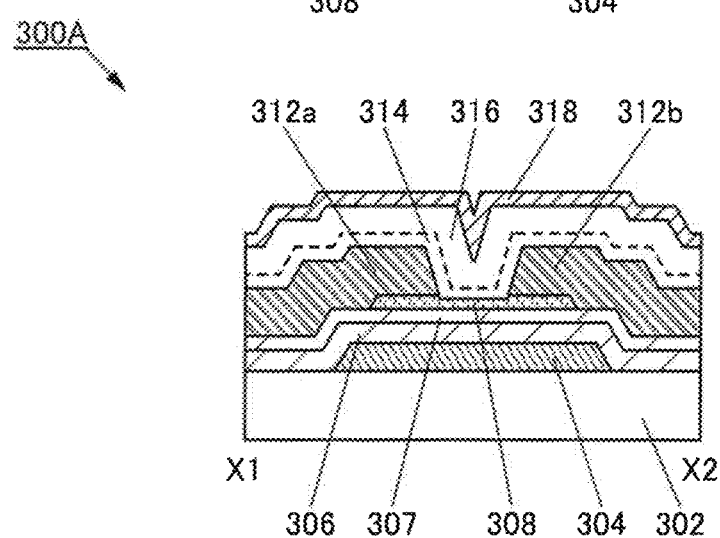
Figure 54C:
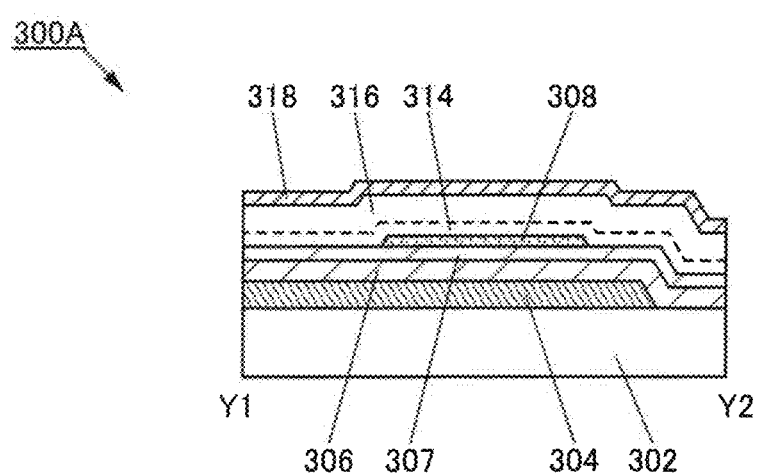

FIG. 54A is a top view of a transistor 300A; FIG. 54B corresponds to a cross-sectional view along dashed-dotted line X1-X2 in FIG. 54A; FIG. 54C corresponds to a cross-sectional view along dashed-dotted line Y1-Y2 in FIG. 54A. Note that in FIG. 54A, some components of the transistor 300A (e.g., an insulating film serving as a gate insulating film) are not illustrated to avoid complexity. In addition, in some cases, the direction of the dashed-dotted line X1-X2 is referred to as a channel length direction and the direction of the dashed-dotted line Y1-Y2 is referred to as a channel width direction. Note that some components are sometimes not illustrated in subsequent top views of transistors as in FIG. 54A.

The transistor 300A illustrated in FIGS. 54A to 54C includes a conductive film 304 over a substrate 302, an insulating film 306 over the substrate 302 and the conductive film 304, an insulating film 307 over the insulating film 306, an oxide semiconductor film 308 over the insulating film 307, a conductive film 312a over the oxide semiconductor film 308, and a conductive film 312b over the oxide semiconductor film 308. In addition, over the transistor 300A, specifically, over the conductive films 312a and 312b and the oxide semiconductor film 308, insulating films 314 and 316 and an insulating film 318 are provided.

Note that in the transistor 300A, the insulating films 306 and 307 function as a gate insulating film of the transistor 300A, and the insulating films 314, 316, and 318 function as a protective insulating film of the transistor 300A. In addition, in the transistor 300A, the conductive film 304 functions as a gate electrode, the conductive film 312*a* functions as a source electrode, and the conductive film 312*b* functions as a drain electrode.

Note that in this specification and the like, the insulating films 306 and 307, the insulating films 314 and 316, and the insulating film 318 are referred to as a first insulating film, a second insulating film, and a third insulating film, respectively, in some cases.

The transistor 300A illustrated in FIGS. 54A to 54C has a channel-etched structure. The oxide semiconductor film of one embodiment of the present invention can be used suitably for the channel-etched transistor.

<4-2. Structural Example 2 of Transistor>

Figure 55A:
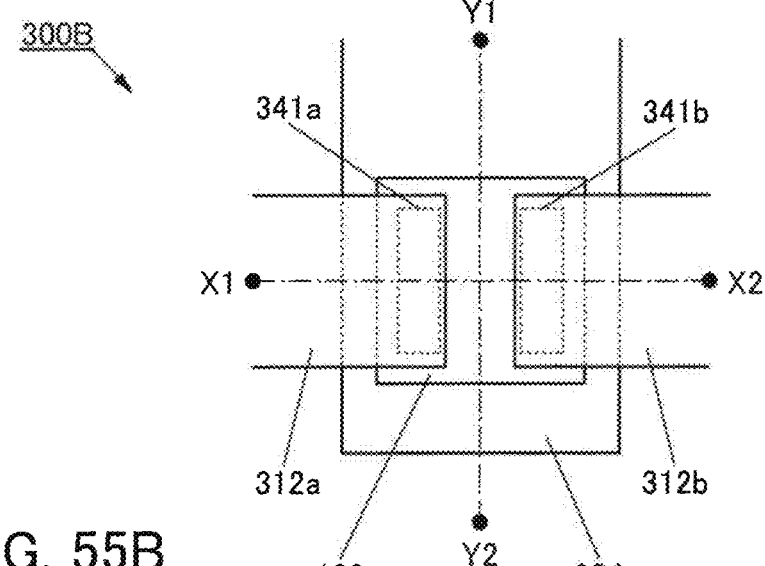
FIGS. 55A to 55C are a top view and cross-sectional views illustrating a semiconductor device.
Figure 55B:
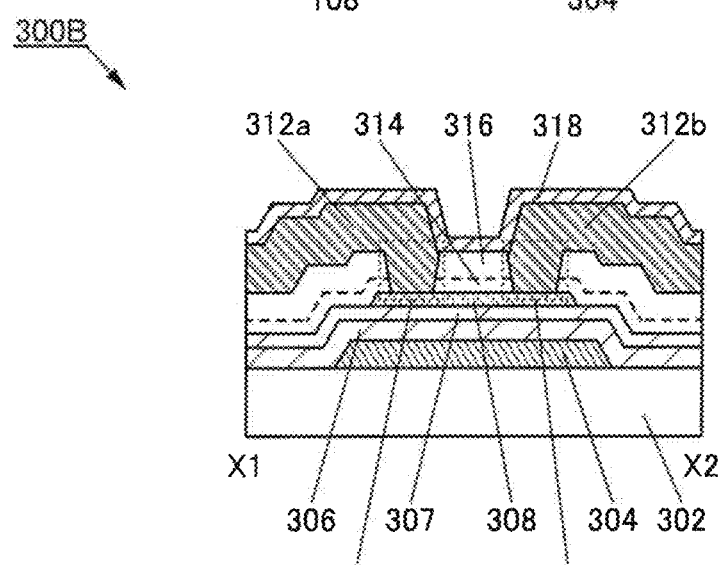
Figure 55C:
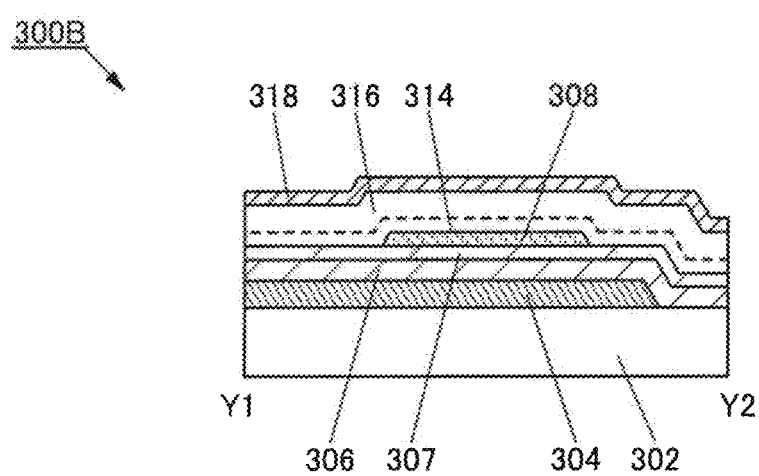

FIG. 55A is a top view of a transistor 300B; FIG. 55B corresponds to a cross-sectional view along dashed-dotted line X1-X2 in FIG. 55A; FIG. 55C corresponds to a cross-sectional view along dashed-dotted line Y1-Y2 in FIG. 55A.

The transistor 300B illustrated in FIGS. 55A to 55C includes the conductive film 304 over the substrate 302, the insulating film 306 over the substrate 302 and the conductive film 304, the insulating film 307 over the insulating film 306, the oxide semiconductor film 308 over the insulating film 307, the insulating film 314 over the oxide semiconductor film 308, the insulating film 316 over the insulating film 314, the conductive film 312*a* electrically connected to the oxide semiconductor film 308 through an opening 341*a* provided in the insulating film 314 and the insulating film 316, and the conductive film 312*b* electrically connected to the oxide semiconductor film 308 through an opening 341*b* provided in the insulating film 314 and the insulating film 316. In addition, over the transistor 300B, specifically, over the conductive films 312*a* and 312*b* and the insulating film 316, the insulating film 318 is provided.

Note that in the transistor 300B, the insulating films 306 and 307 function as a gate insulating film of the transistor 300B, the insulating films 314 and 316 function as a protective insulating film of the oxide semiconductor film 308, and the insulating film 318 functions as a protective insulating film of the transistor 300B. In addition, in the transistor 300B, the conductive film 304 functions as a gate electrode, the conductive film 312*a* functions as a source electrode, and the conductive film 312*b* functions as a drain electrode.

The transistor 300A illustrated in FIGS. 54A to 54C has a channel-etched structure, whereas the transistor 300B illustrated in FIGS. 55A to 55C has a channel-protective structure. The oxide semiconductor film of one embodiment of the present invention can be used suitably for the channel-protective transistor.

<4-3. Structural Example 3 of Transistor>

Figure 56A:
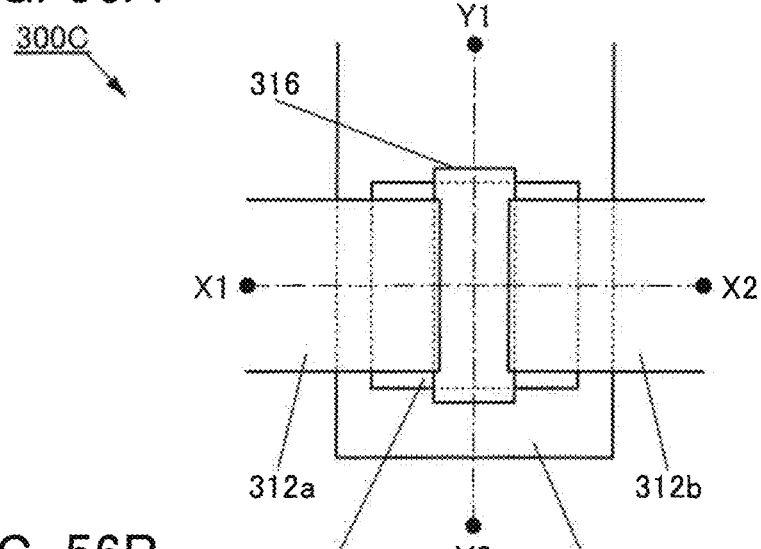
FIGS. 56A to 56C are a top view and cross-sectional views illustrating a semiconductor device.
Figure 56B:
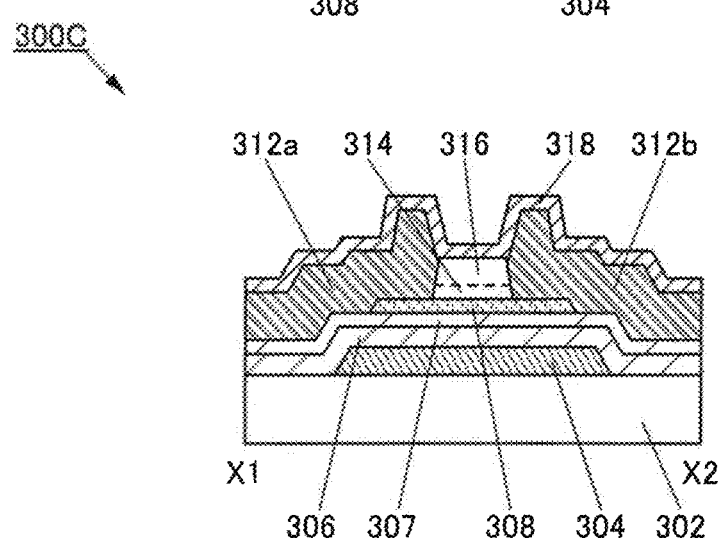
Figure 56C:
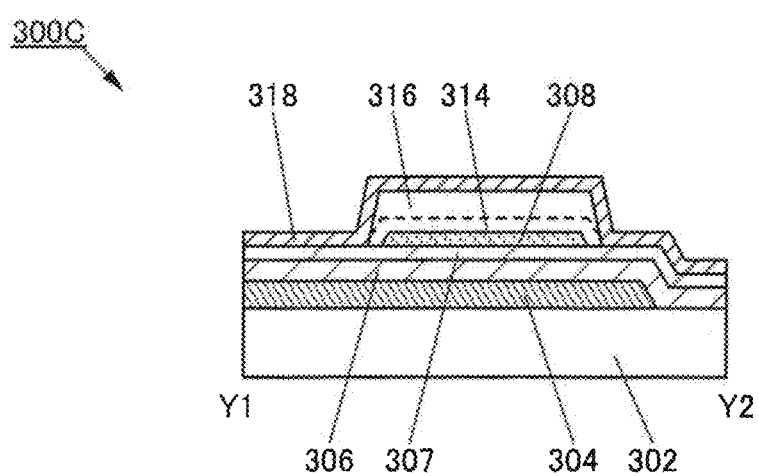

FIG. 56A is a top view of a transistor 300C; FIG. 56B corresponds to a cross-sectional view along dashed-dotted line X1-X2 in FIG. 56A; FIG. 56C corresponds to a cross-sectional view along dashed-dotted line Y1-Y2 in FIG. 56A.

The transistor 300C illustrated in FIGS. 56A to 56C is different from the transistor 300B illustrated in FIGS. 55A to 55C in the shapes of the insulating films 314 and 316. Specifically, the insulating films 314 and 316 of the transistor 300C have island shapes and are provided over a channel region of the oxide semiconductor film 308. Other components are similar to those of the transistor 300B.

<4-4. Structural Example 4 of Transistor>

Figure 57A:
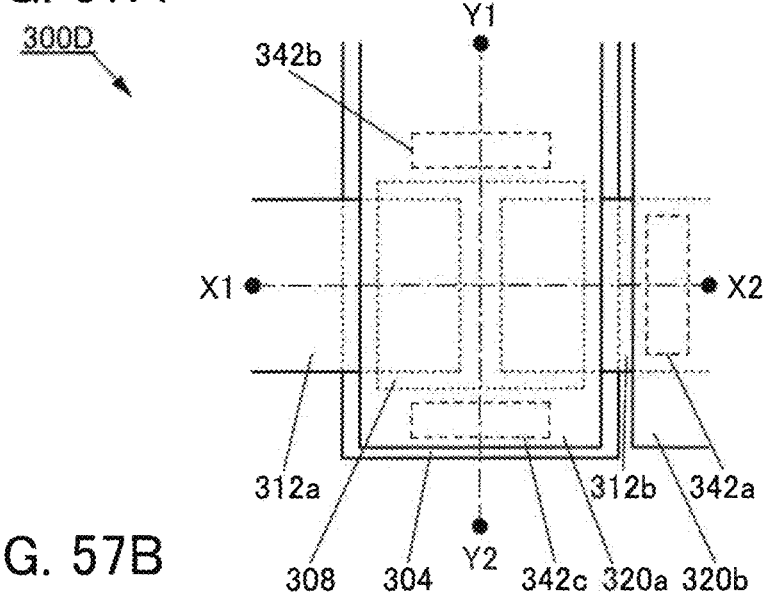
FIGS. 57A to 57C are a top view and cross-sectional views illustrating a semiconductor device.
Figure 57B:
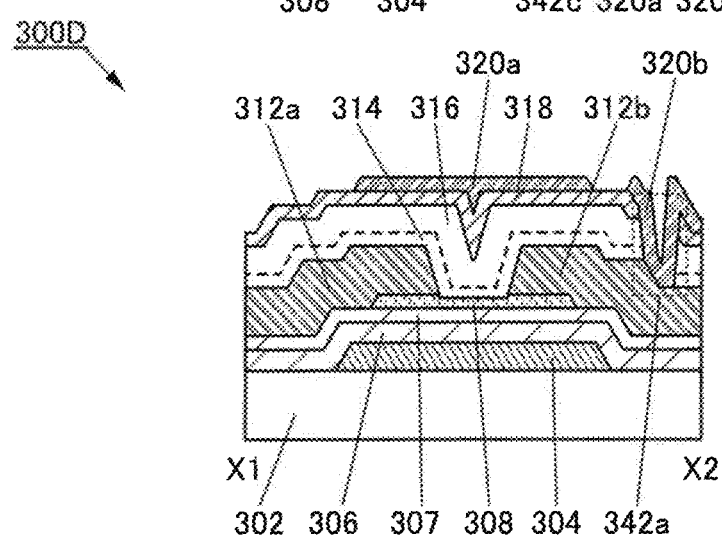
Figure 57C:
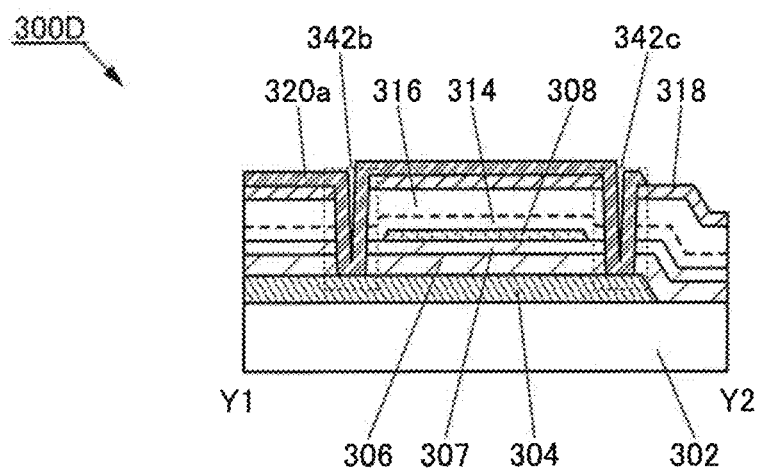

FIG. 57A is a top view of a transistor 300D; FIG. 57B corresponds to a cross-sectional view along dashed-dotted line X1-X2 in FIG. 57A; FIG. 57C corresponds to a cross-sectional view along dashed-dotted line Y1-Y2 in FIG. 57A.

The transistor 300D illustrated in FIGS. 57A to 57C includes the conductive film 304 over the substrate 302, the insulating film 306 over the substrate 302 and the conductive film 304, the insulating film 307 over the insulating film 306, the oxide semiconductor film 308 over the insulating film 307, the conductive film 312*a* over the oxide semiconductor film 308, the conductive film 312*b* over the oxide semiconductor film 308, the insulating film 314 over the oxide semiconductor film 308 and the conductive films 312*a* and 312*b*, the insulating film 316 over the insulating film 314, the insulating film 318 over the insulating film 316, and conductive films 320*a* and 320*b* over the insulating film 318.

Note that in the transistor 300D, the insulating films 306 and 307 function as a first gate insulating film of the transistor 300D, and the insulating films 314, 316, and 318 function as a second gate insulating film of the transistor 300D. In addition, in the transistor 300D, the conductive film 304 functions as a first gate electrode, the conductive film 320*a* functions as a second gate electrode, and the conductive film 320*b* functions as a pixel electrode used for a display device. In addition, the conductive film 312*a* functions as a source electrode, and the conductive film 312*b* functions as a drain electrode.

In addition, as illustrated in FIG. 57C, the conductive film 320*a* is connected to the conductive film 304 in openings 342*b* and 342*c* provided in the insulating films 306, 307, 314, 316, and 318. Therefore, the same potential is applied to the conductive film 320*a* and the conductive film 304.

Note that although the structure in which the openings 342*b* and 342*c* are provided in the transistor 300D so that the conductive film 320*a* and the conductive film 304 are connected is described as an example, this does not impose any limitation. For example, a structure in which only either the opening 342*b* or the opening 342*c* is formed so that the conductive film 320*a* and the conductive film 304 are connected, or a structure in which the opening 342*b* and the opening 342*c* are not provided and the conductive film 320*a* and the conductive film 304 are not connected may be employed. Note that in the case of the structure in which the conductive film 320*a* and the conductive film 304 are not connected to each other, it is possible to apply different potentials to the conductive film 320*a* and the conductive film 304.

In addition, the conductive film 320*b* is connected to the conductive film 312*b* through an opening 342*a* provided in the insulating films 314, 316, and 318.

Note that the transistor 300D has the S-channel structure described above.

<4-5. Structural Example 5 of Transistor>

The oxide semiconductor film 308 included in the transistor 300A illustrated in FIGS. 54A to 54C may also have a stacked-layer structure. FIGS. 58A and 58B and FIGS. 59A and 59B illustrate examples of such a case.

Figure 58A:
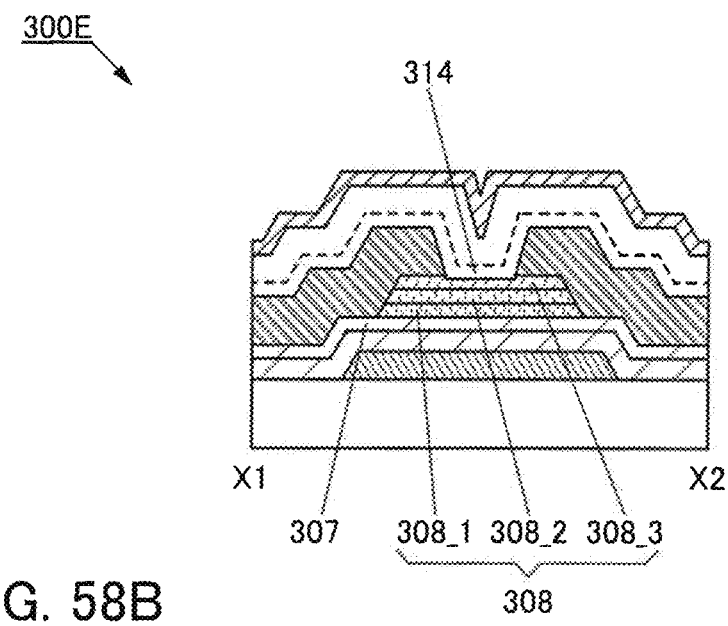
FIGS. 58A and 58B are cross-sectional views illustrating a semiconductor device.
Figure 58B:
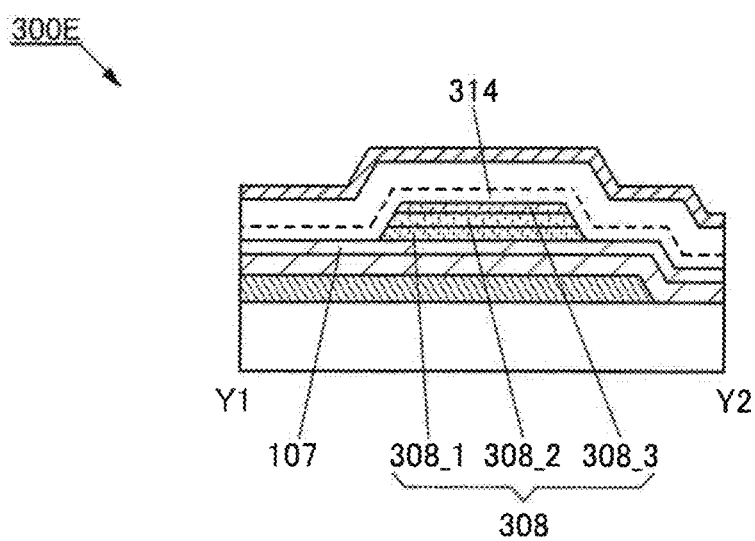
Figure 59A:
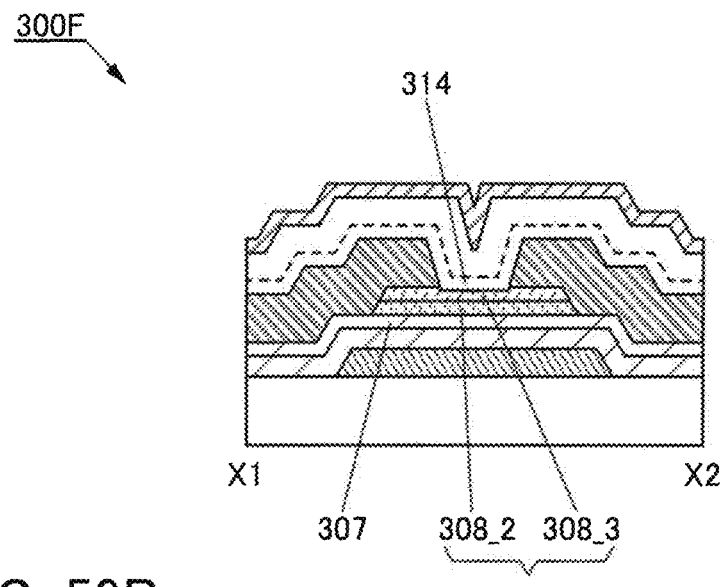
FIGS. 59A and 59B are cross-sectional views illustrating a semiconductor device.
Figure 59B:
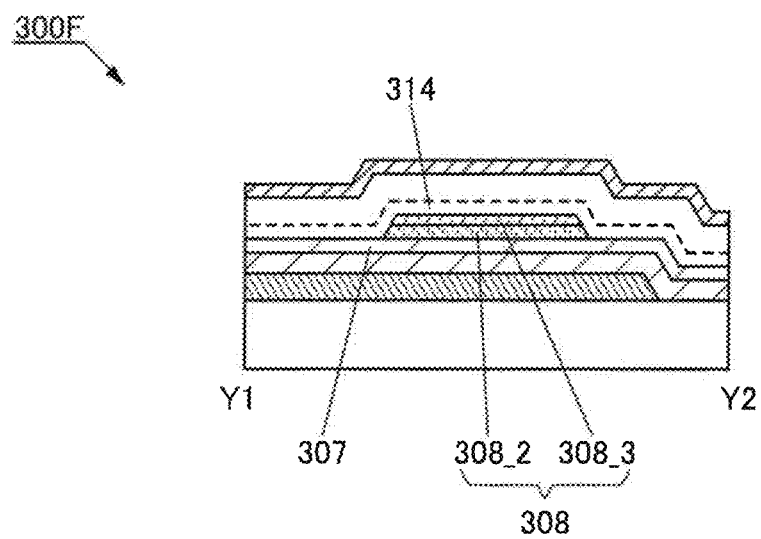

FIGS. 58A and 58B are cross-sectional views of a transistor 300E and FIGS. 59A and 59B are cross-sectional views of a transistor 300F. Note that the top views of the transistors 300E and 300F are similar to the top view of the transistor 300A illustrated in FIG. 54A.

The oxide semiconductor film 308 of the transistor 300E illustrated in FIGS. 58A and 58B includes an oxide semiconductor film 308_1, an oxide semiconductor film 308_2, and an oxide semiconductor film 308_3. In addition, the oxide semiconductor film 308 of the transistor 300F illustrated in FIGS. 59A and 59B includes the oxide semiconductor film 308_2 and the oxide semiconductor film 308_3.

Note that for the conductive film 304, the insulating film 306, the insulating film 307, the oxide semiconductor film 308, the oxide semiconductor film 308_1, the oxide semiconductor film 308_2, the oxide semiconductor film 308_3, the conductive films 312a and 312b, the insulating film 314, the insulating film 316, the insulating film 318, and the conductive films 320a and 320b, materials similar to those of the conductive film 106, the insulating film 116, the insulating film 114, the oxide semiconductor film 108, the oxide semiconductor film 108_1, the oxide semiconductor film 108_2, the oxide semiconductor film 108_3, the conductive films 120a and 120b, the insulating film 104, the insulating film 118, the insulating film 116, and the conductive film 112 can be used, respectively.

<4-6. Structural Example 6 of Transistor>

Figure 60A:
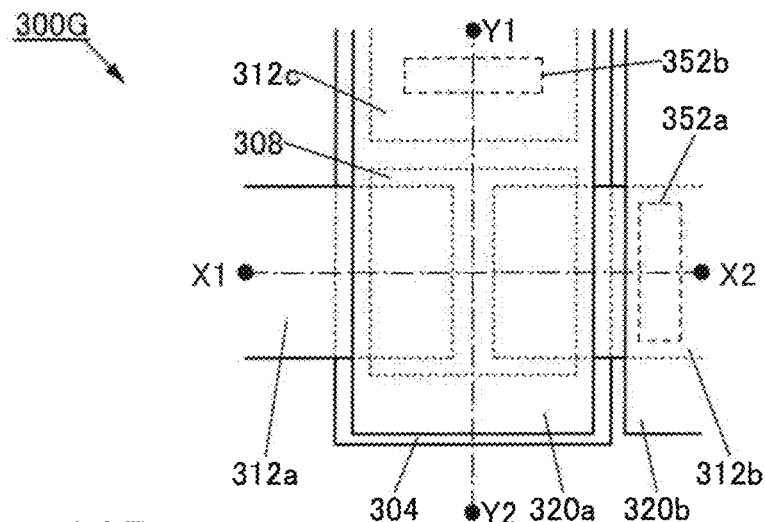
FIGS. 60A to 60C are a top view and cross-sectional views illustrating a semiconductor device.
Figure 60B:
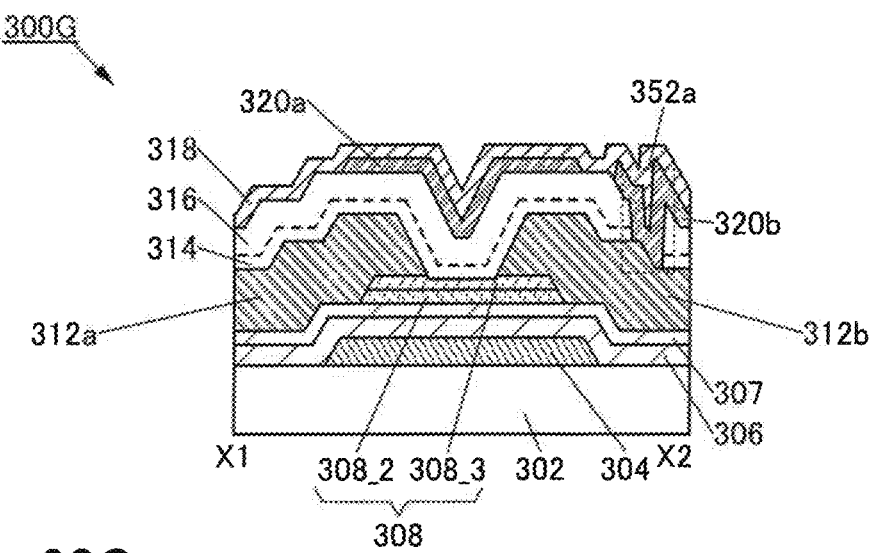
Figure 60C:
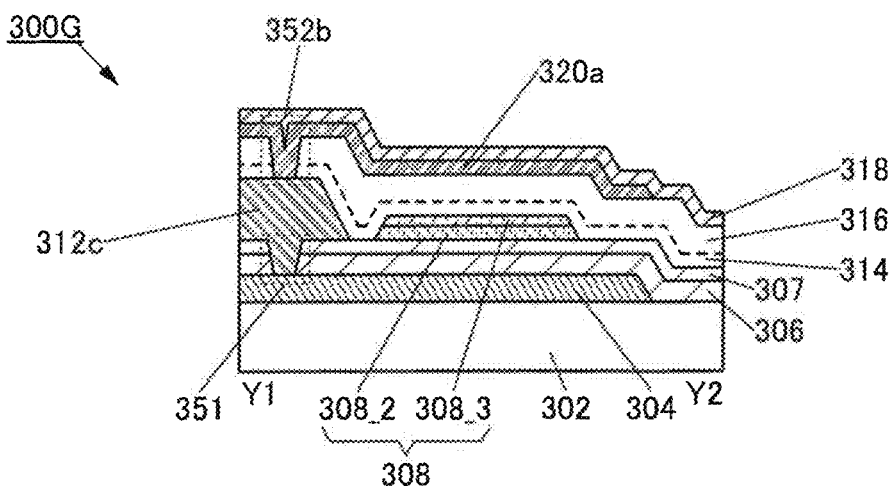

FIG. 60A is a top view of a transistor 300G; FIG. 60B corresponds to a cross-sectional view along dashed-dotted line X1-X2 in FIG. 60A; FIG. 60C corresponds to a cross-sectional view along dashed-dotted line Y1-Y2 in FIG. 60A.

The transistor 300G illustrated in FIGS. 60A to 60C includes the conductive film 304 over the substrate 302, the insulating film 306 over the substrate 302 and the conductive film 304, the insulating film 307 over the insulating film 306, the oxide semiconductor film 308 over the insulating film 307, the conductive film 312a over the oxide semiconductor film 308, the conductive film 312b over the oxide semiconductor film 308, the insulating film 314 over the oxide semiconductor film 308, the conductive film 312a, and the conductive film 312b, the insulating film 316 over the insulating film 314, the conductive film 320a over the insulating film 316, and the conductive film 320b over the insulating film 316.

In addition, the insulating film 306 and the insulating film 307 have an opening 351, and a conductive film 312c, which is electrically connected to the conductive film 304 through the opening 351, is formed over the insulating film 306 and the insulating film 307. In addition, the insulating film 314 and the insulating film 316 have an opening 352a that reaches the conductive film 312b and an opening 352b that reaches the conductive film 312c.

In addition, the oxide semiconductor film 308 includes the oxide semiconductor film 308_2 on the conductive film 304 side and the oxide semiconductor film 308_3 over the oxide semiconductor film 308_2.

In addition, the insulating film 318 is provided over the transistor 300G. The insulating film 318 is formed to cover the insulating film 316, the conductive film 320a, and the conductive film 320b.

Note that in the transistor 300G, the insulating films 306 and 307 function as a first gate insulating film of the transistor 300G, the insulating films 314 and 316 function as a second gate insulating film of the transistor 300G, and the insulating film 318 functions as a protective insulating film of the transistor 300G. In addition, in the transistor 300G, the conductive film 304 functions as a first gate electrode, the conductive film 320a functions as a second gate electrode, and the conductive film 320b functions as a pixel electrode used for a display device. In addition, in the transistor 300G, the conductive film 312a functions as a source electrode, and the conductive film 312b functions as a drain electrode. In addition, in the transistor 300G, the conductive film 312c functions as a connection electrode.

Note that the transistor 300G has the S-channel structure described above.

In addition, the structures of the transistors 300A to 300G can be freely combined with each other.

At least part of this embodiment can be implemented in combination with the other embodiments described in this specification as appropriate.

Embodiment 5

In this embodiment, a semiconductor device including a metal oxide film of one embodiment of the present invention will be described with reference to FIGS. 61 to 63.

<5-1. Structural Example 1 of Semiconductor Device>

Figure 61:
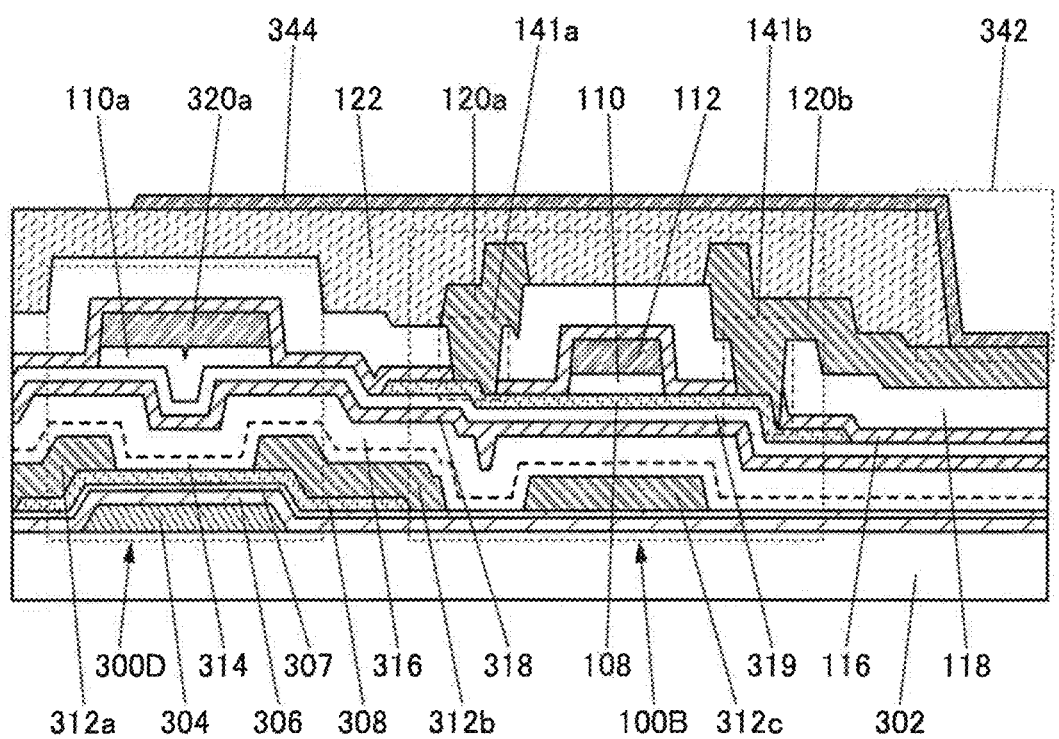
FIG. 61 illustrates a cross section of a semiconductor device.

FIG. 61 is a cross-sectional view in the channel length (L) direction of an example in the case of a stacked-layer structure of the transistor 300D described in Embodiment 3 and the transistor 100B described in Embodiment 2.

With the stacked-layer structure of the transistor 300D and the transistor 100B, the layout area of transistors can be reduced.

For example, the structure in FIG. 61 is used for a pixel portion of a display device, whereby the pixel density of the display device can be increased. The layout illustrated in FIG. 61 can increase the aperture ratio of pixels even in the case where the pixel density of the display device is greater than 1000 ppi (pixels per inch) or the pixel density of the display device is greater than 2000 ppi, for example. Note that ppi is a unit indicating the number of pixels per inch.

In addition, the stacked-layer structure of the transistor 300D and the transistor 100B is a partly different structure from the above-described structure.

For example, the structure of the transistor 300D in FIG. 61 is different from the above-described structure in the following structure.

The transistor 300D illustrated in FIG. 61 includes an insulating film 319 and an insulating film 110a between the insulating film 318 and the conductive film 320a.

The material described for the insulating film 314 or the insulating film 316 can be used for the insulating film 319. The insulating film 319 is provided so that the oxide semiconductor film 108 and the insulating film 318 are not in contact with each other. In addition, the insulating film 110a is formed by processing the same insulating film as the insulating film 110. Note that the conductive film 320a included in the transistor 300D and the conductive film 112 included in the transistor 100B are formed by processing the same conductive film.

In addition, the transistor 100B illustrated in FIG. 61 includes the conductive film 312c instead of the conductive film 106. In addition, the transistor 100B illustrated in FIG. 61 includes the insulating films 314, 316, 318, and 319 instead of the insulating film 104. When the insulating film 104 is changed to the insulating films 314, 316, 318, and 319 included in the transistor 300D, the manufacturing process of the transistor can be shortened.

In addition, in FIG. 61, a conductive film 344 is connected to the conductive film 120b of the transistor 100B. Note that the conductive film 344 is electrically connected to the conductive film 120b through an opening 342 provided in the insulating film 122. In addition, the material that can be used for the conductive film 320a can be used for the conductive film 344. Note that the conductive film 344 functions as a pixel electrode of the display device.

In addition, FIG. 61 illustrates the case of the stacked-layer structure of the transistor 300D and the transistor 100B; however, this does not impose any limitation. For example, structures illustrated in FIG. 62 and FIG. 63 may be used.

<5-2. Structural Example 2 of Semiconductor Device>

Figure 62:
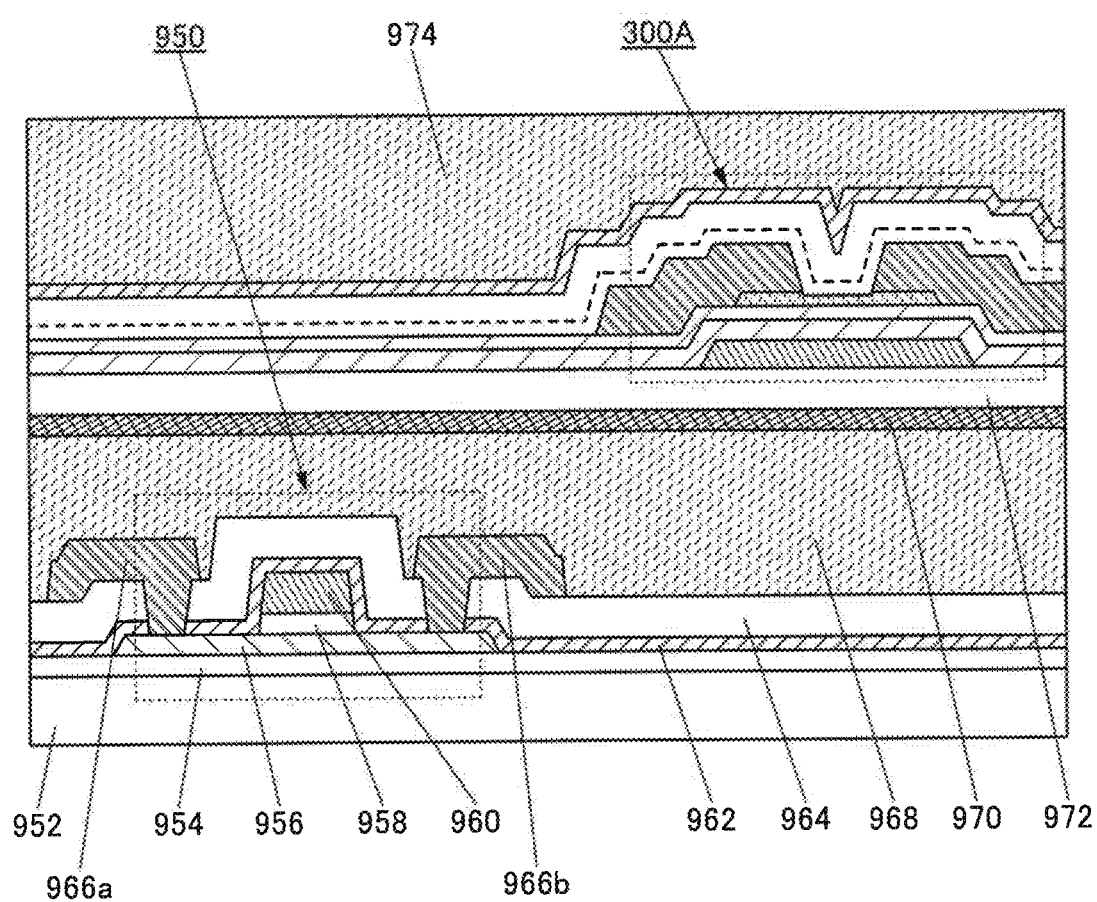
FIG. 62 illustrates a cross section of a semiconductor device.
Figure 63:
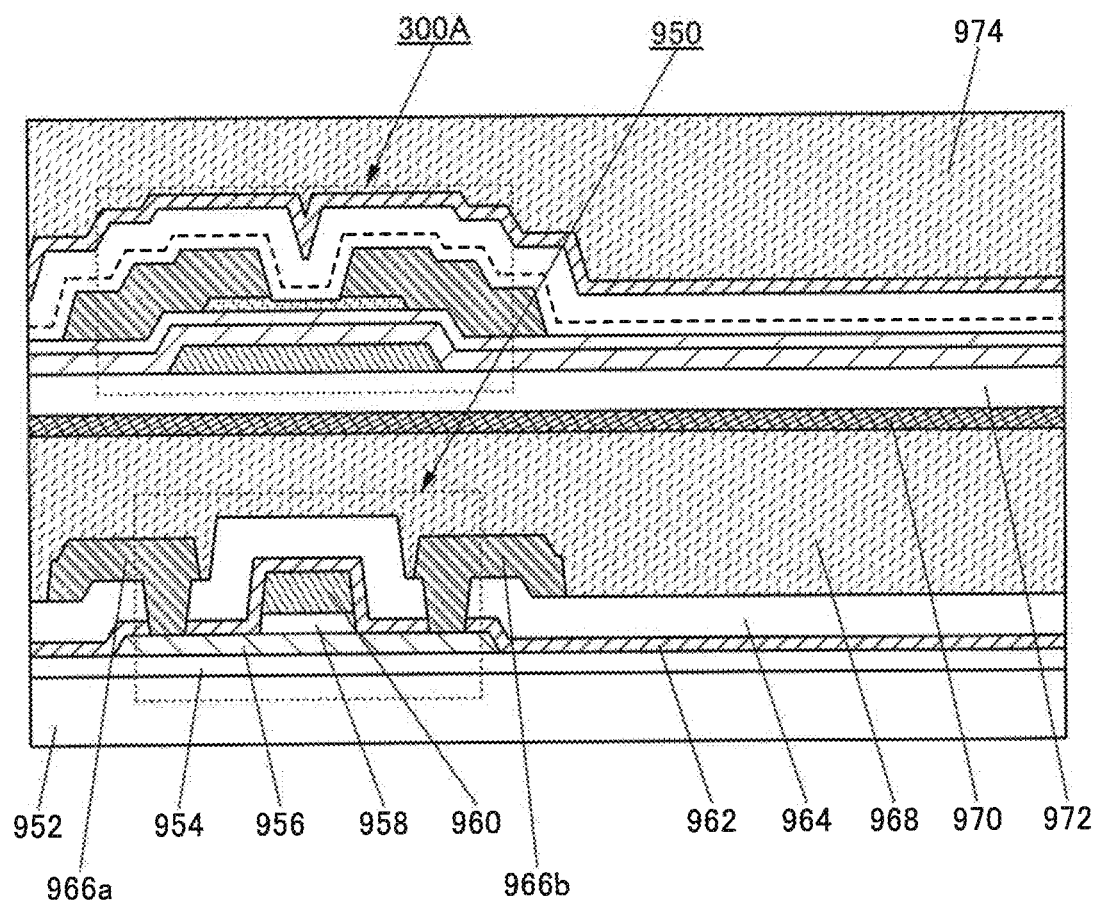
FIG. 63 illustrates a cross section of a semiconductor device.

FIG. 62 is a cross-sectional view in the channel length (L) direction of an example in the case of a stacked-layer structure of a transistor 950 and the transistor 300A described in Embodiment 3.

The transistor 950 illustrated in FIG. 62 includes a substrate 952, an insulating film 954 over the substrate 952, a semiconductor film 956 over the insulating film 954, an insulating film 958 over the semiconductor film 956, a conductive film 960 over the insulating film 958, an insulating film 962 over the insulating film 954, the semiconductor film 956, and the conductive film 960, an insulating film 964 over the insulating film 962, and conductive films 966*a* and 966*b* electrically connected to the semiconductor film 956. In addition, an insulating film 968 is provided over the transistor 950.

The semiconductor film 956 includes silicon. In particular, the semiconductor film 956 preferably includes crystalline silicon. The transistor 950 is a transistor that uses so-called low-temperature polysilicon. It is preferable to use the transistor using low-temperature polysilicon in a driver circuit portion of the display device because high field-effect mobility can be obtained. Furthermore, the transistor 300A is preferably used in a pixel portion of the display device, for example, because power consumption can be suppressed.

Furthermore, a glass substrate, a plastic substrate, or the like can be used as the substrate 952. Moreover, the insulating film 954 functions as a base insulating film of the transistor 950. For example, a silicon oxide film, a silicon nitride film, a silicon oxynitride film, a silicon nitride oxide, or the like can be used as the insulating film 954. The insulating film 958 functions as a gate insulating film of the transistor 950. The materials listed for the insulating film 954 can be used for the insulating film 958. The conductive film 960 functions as a gate electrode of the transistor 950. The same material as the conductive films 312*a*, 312*b*, 120*a*, 120*b*, and the like described in the above embodiments can be used for the conductive film 960. The insulating films 962, 964, and 968 function as a protective insulating film of the transistor 950. In addition, the conductive films 966*a* and 966*b* function as a source electrode and a drain electrode of the transistor 950. The same material as the conductive films 312*a*, 312*b*, 120*a*, 120*b*, and the like described in the above embodiments can be used for the conductive films 966*a* and 966*b*.

In addition, an insulating film 970 and an insulating film 972 are provided between the transistor 950 and the transistor 300A. In addition, an insulating film 974 is provided to cover the transistor 300A. The insulating film 970 functions as a barrier film. Specifically, the insulating film 970 is formed so that impurities such as hydrogen included in the transistor 950 do not enter the transistor 300A side. In addition, the insulating film 972 functions as a base insulating film of the transistor 300A.

For the insulating film 970, a material which releases little hydrogen and can inhibit diffusion of hydrogen is preferable. As this material, silicon nitride, aluminum oxide, or the like can be given. In addition, the insulating film 972 preferably includes excess oxygen. The materials described for the insulating films 314 and 316 can be used for the insulating film 972.

In addition, the structure in which the transistor 950 and the transistor 300A do not overlap with each other is in FIG. 62; however, this does not impose any limitation. For example, the channel region of the transistor 950 and the channel region of the transistor 300A may be positioned to overlap with each other. An example in this case is illustrated in FIG. 63. FIG. 63 is a cross-sectional view in the channel length (L) direction of an example in the case of a stacked-layer structure of the transistor 950 and the transistor 300A. With the structure illustrated in FIG. 63, the layout area of transistors can further be reduced.

Note that although not illustrated, stacked-layer structures of the transistor 950 and other transistors described in Embodiments 2 and 3 (e.g., the transistors 100A to 100K and the transistors 300B to 300G) may be used.

In this manner, the metal oxide film of one embodiment of the present invention can be favorably used for structures in which transistors of various shape are stacked.

At least part of this embodiment can be implemented in combination with the other embodiments described in this specification as appropriate.

Embodiment 6

In this embodiment, an example of a display device that includes the transistor described in the above embodiment will be described below with reference to FIGS. 64 to 71.

Figure 64:
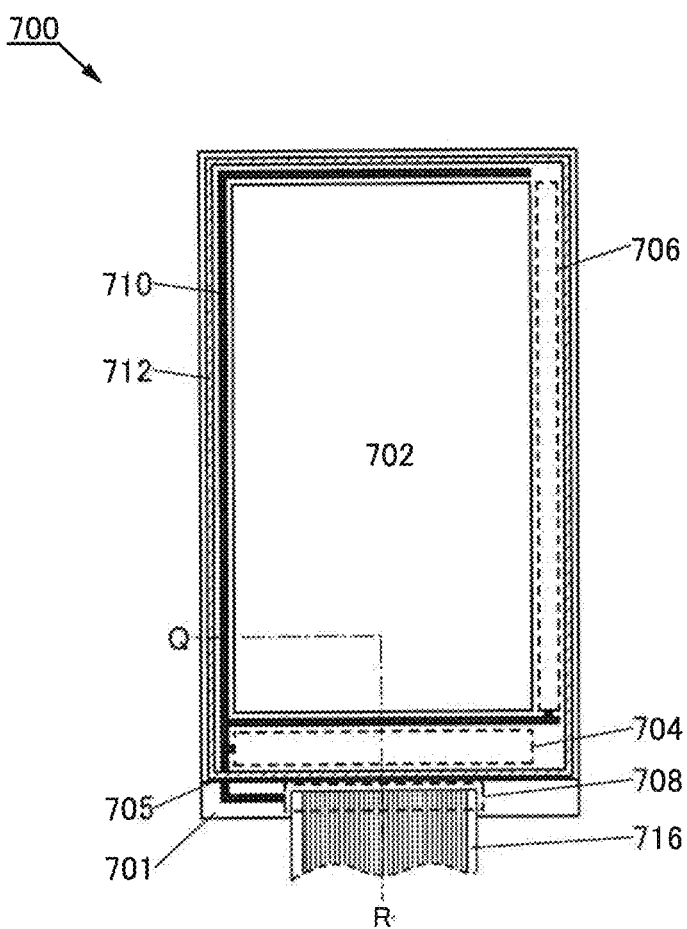
FIG. 64 is a top view illustrating one embodiment of a display device.

FIG. 64 is a top view illustrating an example of a display device. A display device 700 illustrated in FIG. 64 includes a pixel portion 702 provided over a first substrate 701, a source driver circuit portion 704 and a gate driver circuit portion 706 which are provided over the first substrate 701, a sealant 712 positioned to surround the pixel portion 702, the source driver circuit portion 704, and the gate driver circuit portion 706, and a second substrate 705 provided to face the first substrate 701. Note that the first substrate 701 and the second substrate 705 are sealed with the sealant 712. That is, the pixel portion 702, the source driver circuit portion 704, and the gate driver circuit portion 706 are enclosed by the first substrate 701, the sealant 712, and the second substrate 705. Note that although not illustrated in FIG. 64, a display element is provided between the first substrate 701 and the second substrate 705.

In addition, in the display device 700, an FPC terminal portion 708 (FPC: Flexible printed circuit) which is electrically connected to the pixel portion 702, the source driver circuit portion 704, and the gate driver circuit portion 706 is provided in a region different from the region which is over the first substrate 701 and surrounded by the sealant 712. Furthermore, an FPC 716 is connected to the FPC terminal portion 708, and a variety of signals and the like are supplied through the FPC 716 to the pixel portion 702, the source driver circuit portion 704, and the gate driver circuit portion 706. Furthermore, a signal line 710 is connected to the pixel portion 702, the source driver circuit portion 704, the gate driver circuit portion 706, and the FPC terminal portion 708. The variety of signals and the like supplied through the FPC 716 are given through the signal line 710 to the pixel portion 702, the source driver circuit portion 704, the gate driver circuit portion 706, and the FPC terminal portion 708.

In addition, a plurality of gate driver circuit portions 706 may be provided in the display device 700. In addition, the example in which the source driver circuit portion 704 and the gate driver circuit portion 706 as well as the pixel portion 702 are formed over the first substrate 701 is given here; however, the display device 700 is not limited to this structure. For example, only the gate driver circuit portion 706 may be formed over the first substrate 701, or only the source driver circuit portion 704 may be formed over the first substrate 701. In this case, a structure in which a substrate over which a source driver circuit, a gate driver circuit, or the like is formed (e.g., a driver circuit board formed using a single crystal semiconductor film or a polycrystalline semiconductor film) is formed on the first substrate 701 may be used. Note that there is no particular limitation on the method for connecting the separately formed driver circuit board, and a COG (Chip On Glass) method, a wire bonding method, or the like can be used.

In addition, the pixel portion 702, the source driver circuit portion 704, and the gate driver circuit portion 706 included in the display device 700 include a plurality of transistors.

In addition, the display device 700 can include a variety of elements. As examples of the elements, electroluminescence (EL) element (e.g., an EL element containing organic and inorganic materials, an organic EL element, an inorganic EL element, or an LED), a light-emitting transistor (a transistor which emits light depending on current), an electron emitter, a liquid crystal element, an electronic ink element, an electrophoretic element, an electrowetting element, a plasma display panel (PDP), a MEMS (micro electro mechanical systems) display (e.g., a grating light valve (GLV), a digital micromirror device (DMD), a digital micro shutter (DMS) element, or an interference modulation (IMOD) element), a piezoelectric ceramic display, and the like can be given.

In addition, an example of a display device using an EL element includes an EL display or the like. Examples of a display device using an electron emitter include a field emission display (FED), an SED-type flat panel display (SED: Surface-conduction Electron-emitter Display), or the like. An example of a display device using a liquid crystal element includes a liquid crystal display (a transmissive liquid crystal display, a transflective liquid crystal display, a reflective liquid crystal display, a direct-view liquid crystal display, or a projection liquid crystal display) or the like. An example of a display device using an electronic ink element or an electrophoretic element includes electronic paper or the like. In a transflective liquid crystal display or a reflective liquid crystal display, some or all of pixel electrodes may function as reflective electrodes. For example, some or all of pixel electrodes may include aluminum, silver, or the like. Furthermore, in this case, a memory circuit such as an SRAM can also be provided under the reflective electrodes. Accordingly, power consumption can be further reduced.

Note that as a display system of the display device 700, a progressive system, an interlace system, or the like can be used. Furthermore, color elements controlled in pixels at the time of color display are not limited to three colors of RGB (R, G, and B indicate red, green, and blue, respectively). For example, four pixels of an R pixel, a G pixel, a B pixel, and a W (white) pixel may be included. Alternatively, a structure may be employed in which a color element is composed of two colors of R, G, and B as in PenTile layout and two different colors are selected depending on the color element. Alternatively, one or more colors of yellow, cyan, magenta, and the like may be added to RGB. Note that the size of a display region may differ between dots of color elements. However, the disclosed invention is not limited to a display device for color display and can also be applied to a display device for monochrome display.

In addition, a coloring layer (also referred to as a color filter) may be used to achieve full-color display by a display device in which white light (W) is used for a backlight (e.g., an organic EL element, an inorganic EL element, an LED, or a fluorescent lamp). For example, coloring layers of red (R), green (G), blue (B), yellow (Y), and the like can be used in an appropriate combination. With the use of the coloring layer, color reproducibility can be increased as compared with the case without the coloring layer. At this time, by providing a region with a coloring layer and a region without a coloring layer, white light in the region without the coloring layer may be directly utilized for display. By partly providing the region without a coloring layer, a decrease in luminance due to the coloring layer at the time of bright display can be suppressed, and approximately 20% to 30% of power consumption can be reduced in some cases. However, in the case where full-color display is performed using a self-luminous element such as an organic EL element or an inorganic EL element, R, G, B, Y, and W may be emitted from elements having respective emission colors. By using a self-luminous element, power consumption may be further reduced in some cases as compared with the case of using a coloring layer.

In addition, as a coloring system, other than the above-described system in which part of light emission from white light emission is converted into red, green, and blue through color filters, a system (a three-color system) in which red, green, and blue light emissions are used, or a system (a color conversion system or a quantum dot system) in which part of light emission from blue light emission is converted into red or green may be employed.

Figure 65:
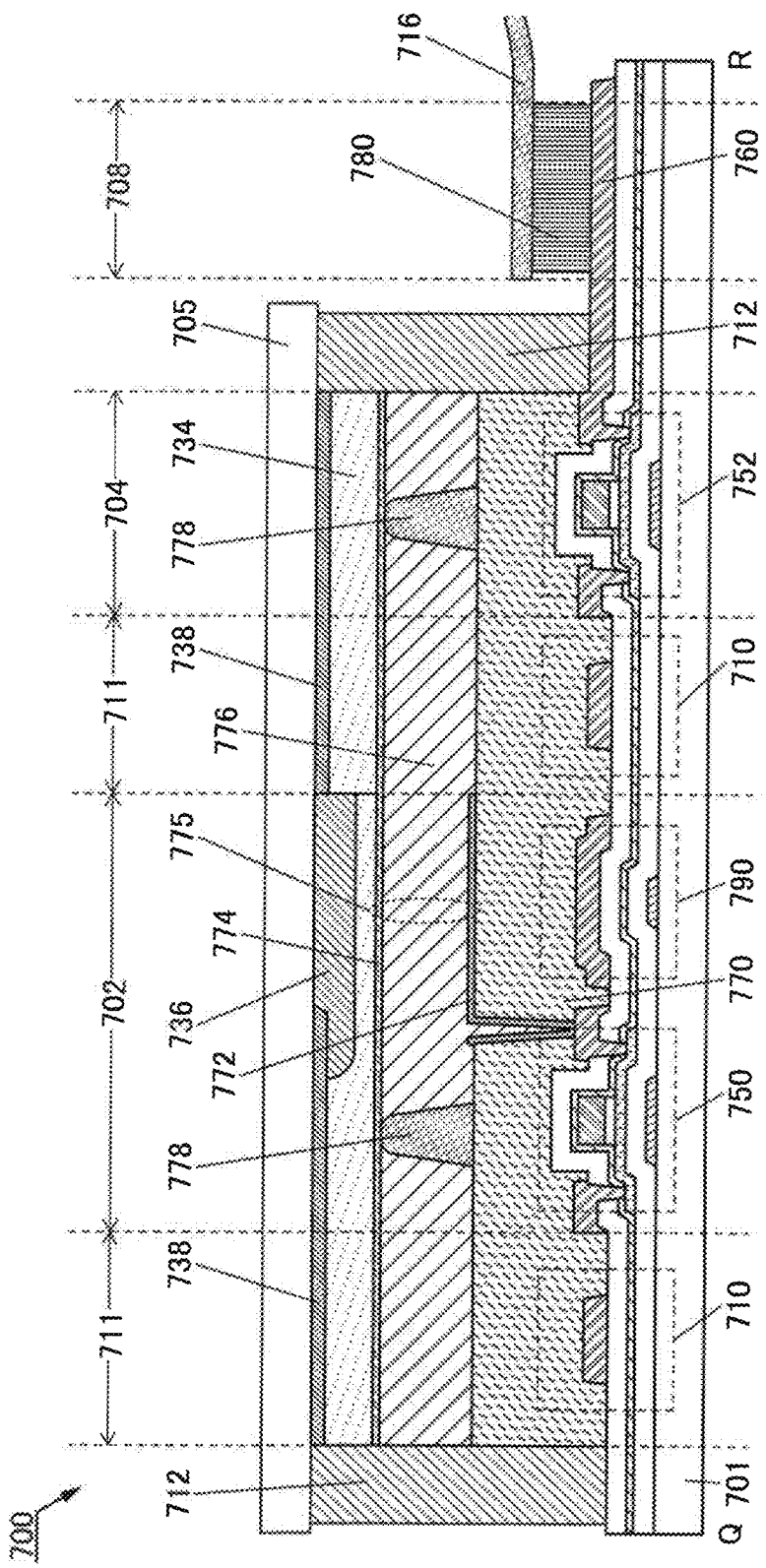
FIG. 65 is a cross-sectional view illustrating one embodiment of a display device.
Figure 66:
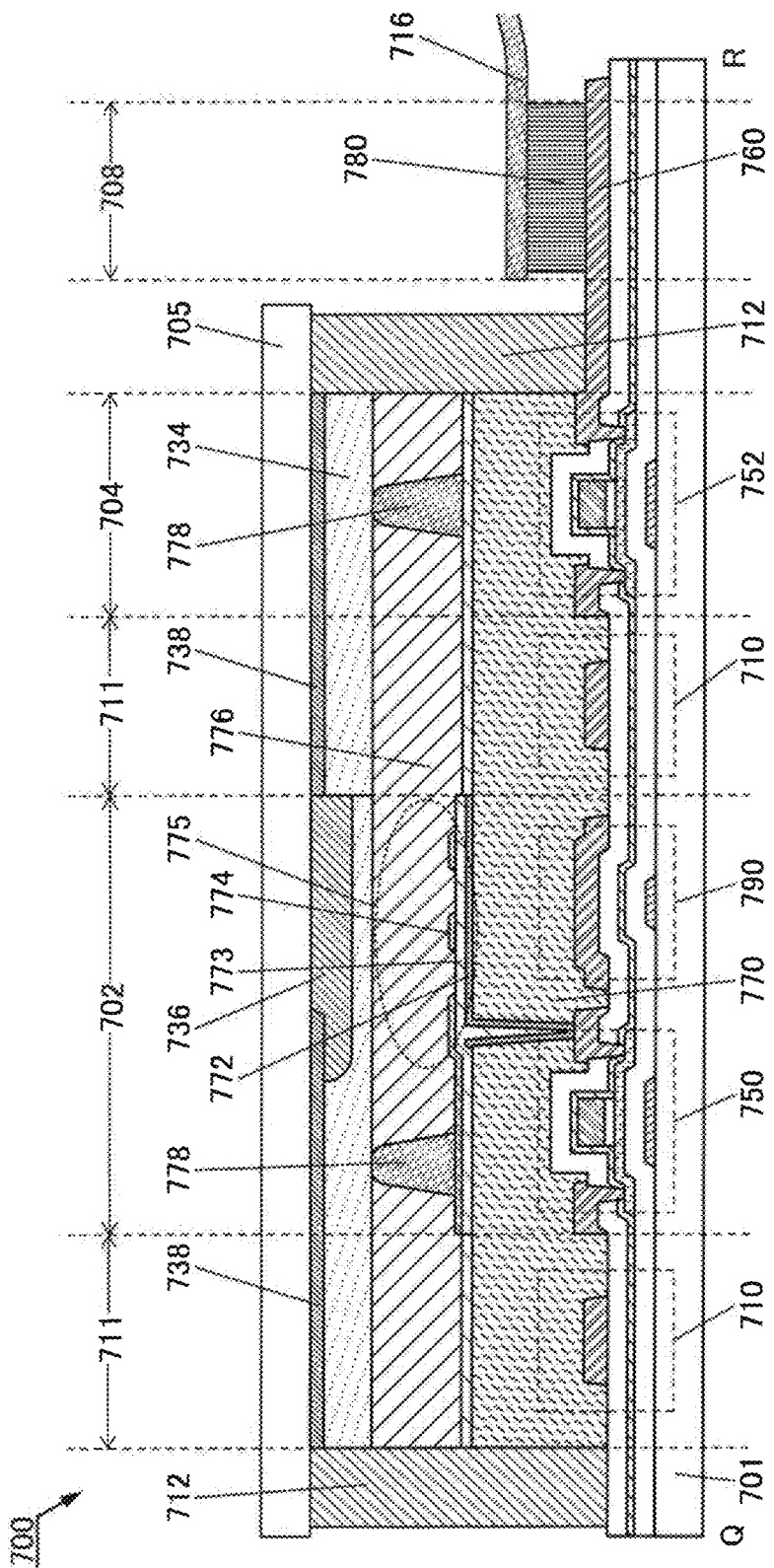
FIG. 66 is a cross-sectional view illustrating one embodiment of a display device.

In this embodiment, structures using a liquid crystal element and an EL element as display elements will be described with reference to FIGS. 65 to 67. Note that FIG. 65 and FIG. 66 are cross-sectional views along dashed-dotted line Q-R in FIG. 64 and are structures using a liquid crystal element as a display element. In addition, FIG. 67 is a cross-sectional view along dashed-dotted line Q-R in FIG. 64 and is a structure using an EL element as a display element.

Common portions illustrated in FIGS. 65 to 67 will be described first, and then, different portions will be described below.

<6-1. Description of Portions Common to Display Devices>

Figure 67:
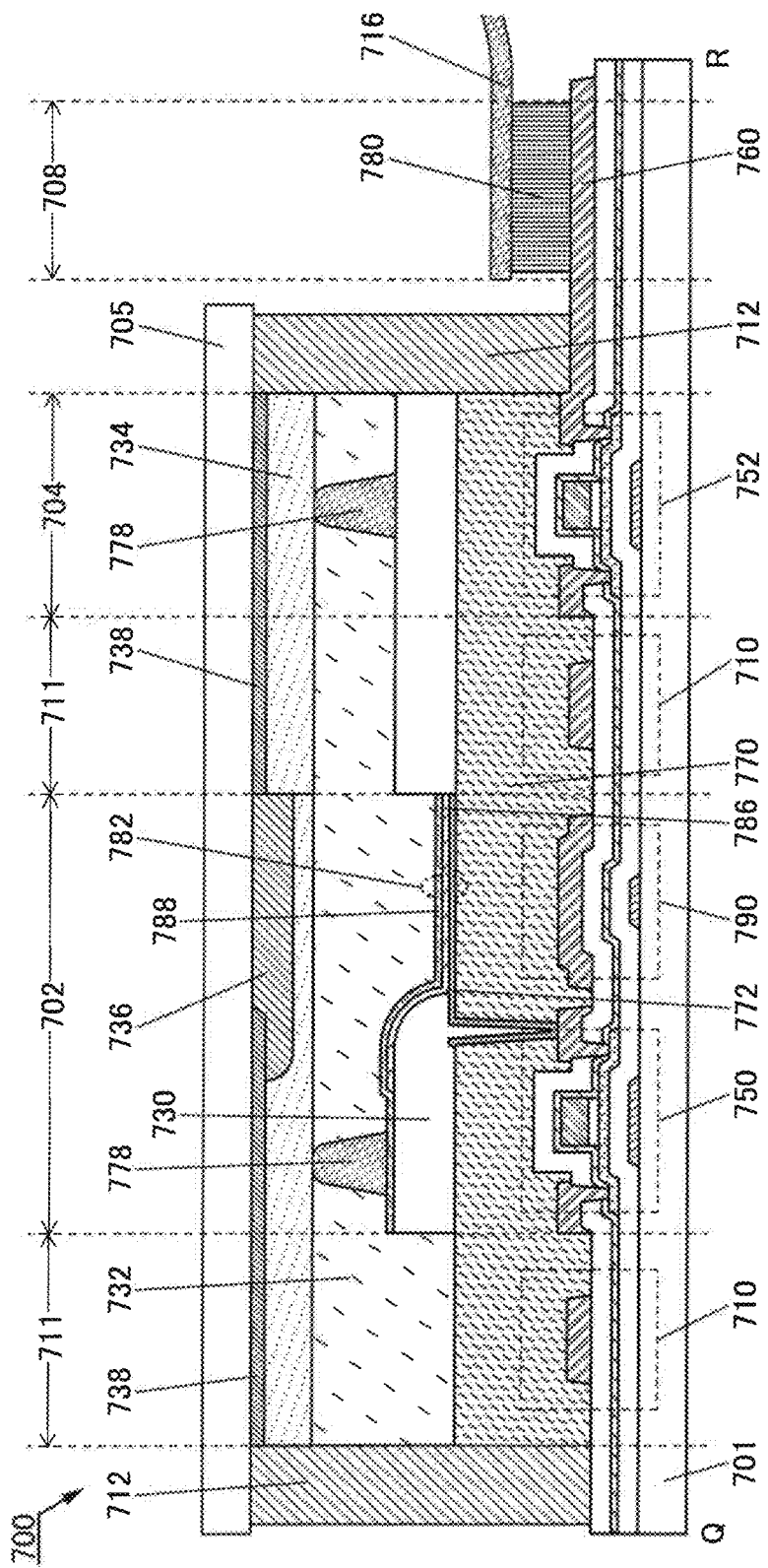
FIG. 67 is a cross-sectional view illustrating one embodiment of a display device.

The display device 700 illustrated in FIGS. 65 to 67 includes a lead wiring portion 711, the pixel portion 702, the source driver circuit portion 704, and the FPC terminal portion 708. In addition, the lead wiring portion 711 includes the signal line 710. In addition, the pixel portion 702 includes a transistor 750 and a capacitor 790. In addition, the source driver circuit portion 704 includes a transistor 752.

The transistor 750 and the transistor 752 have a structure similar to that of the transistor 100B described above. Note that the transistor 750 and the transistor 752 may have the structure of any of the other transistors described in the above embodiments.

The transistor used in this embodiment includes an oxide semiconductor film which is highly purified and in which formation of an oxygen vacancy is suppressed. The transistor can have low off-state current. Accordingly, an electrical signal such as an image signal can be held for a long time, and a long writing interval can be set in an on state. Accordingly, the frequency of refresh operation can be reduced, which suppresses power consumption.

In addition, the transistor used in this embodiment can have relatively high field-effect mobility and thus is capable of high-speed operation. For example, with the use of such a transistor capable of high-speed operation in a liquid crystal display device, a switching transistor in a pixel portion and a driver transistor used in a driver circuit portion can be formed over the same substrate. That is, a semiconductor device formed with a silicon wafer or the like does not need to be used separately as a driver circuit; therefore, the number of components of the semiconductor device can be reduced. In addition, the transistor capable of high-speed operation can also be used in the pixel portion, whereby a high-quality image can be provided.

The capacitor 790 includes a lower electrode formed through a step of processing the same conductive film as a conductive film functioning as the first gate electrode included in the transistor 750 and an upper electrode formed through a step of processing the same conductive film as a conductive film functioning as the source electrode and the drain electrode included in the transistor 750. Furthermore, between the lower electrode and the upper electrode, an insulating film that is formed through a step of forming the same insulating film as an insulating film functioning as a first gate insulating film included in the transistor 750 and an insulating film that is formed through a step of forming the same insulating film as an insulating film functioning as a protective insulating film of the transistor 750 are provided. That is, the capacitor 790 has a stacked-layer structure in which an insulating film functioning as a dielectric film is sandwiched between a pair of electrodes.

In addition, in FIGS. 65 to 67, a planarization insulating film 770 is provided over the transistor 750, the transistor 752, and the capacitor 790.

In addition, although FIGS. 65 to 67 illustrate an example of a structure in which transistors having the same structure are used as the transistor 750 included in the pixel portion 702 and the transistor 752 included in the source driver circuit portion 704, this does not impose any limitation. For example, different transistors may be used in the pixel portion 702 and the source driver circuit portion 704. Specifically, a structure in which a top-gate transistor is used in the pixel portion 702 and a bottom-gate transistor is used in the source driver circuit portion 704, a structure in which a bottom-gate transistor is used in the pixel portion 702 and a top-gate transistor is used in the source driver circuit portion 704, or the like may be employed. Note that the source driver circuit portion 704 can be read as a gate driver circuit portion.

In addition, the signal line 710 is formed through the same process as the conductive films functioning as source electrodes and drain electrodes of the transistors 750 and 752. In the case where a material containing a copper element, for example, is used for the signal line 710, signal delay or the like due to wiring resistance is reduced, which enables display on a large screen.

In addition, the FPC terminal portion 708 includes a connection electrode 760, an anisotropic conductive film 780, and the FPC 716. Note that the connection electrode 760 is formed through the same process as the conductive films functioning as source electrodes and drain electrodes of the transistors 750 and 752. In addition, the connection electrode 760 is electrically connected to a terminal included in the FPC 716 through the anisotropic conductive film 780.

In addition, for example, glass substrates can be used as the first substrate 701 and the second substrate 705. As the first substrate 701 and the second substrate 705, flexible substrates may also be used. As an example of the flexible substrate, a plastic substrate or the like can be given.

In addition, a structure body 778 is provided between the first substrate 701 and the second substrate 705. The structure body 778 is a columnar spacer obtained by selective etching of an insulating film and is provided to control the distance (cell gap) between the first substrate 701 and the second substrate 705. Note that a spherical spacer may also be used as the structure body 778.

In addition, a light-shielding film 738 functioning as a black matrix, a coloring film 736 functioning as a color filter, and an insulating film 734 in contact with the light-shielding film 738 and the coloring film 736 are provided on the second substrate 705 side.

<6-2. Structural Example of Display Device Using Liquid Crystal Element>

The display device 700 illustrated in FIG. 65 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 illustrated in FIG. 65 can display an image in such a manner that transmission or non-transmission of light is controlled by a change of the alignment state in the liquid crystal layer 776 depending on the voltage applied between the conductive film 772 and the conductive film 774.

In addition, the conductive film 772 is electrically connected to the conductive film functioning as the source electrode or the drain electrode of the transistor 750. The conductive film 772 is formed over the planarization insulating film 770 and functions as a pixel electrode, that is, one electrode of the display element.

A conductive film that transmits visible light or a conductive film that reflects visible light can be used as the conductive film 772. For example, a material containing one kind selected from indium (In), zinc (Zn), and tin (Sn) may be used for the conductive film that transmits visible light. For example, a material containing aluminum or silver may be used for the conductive film that reflects visible light.

In the case where a conductive film that reflects visible light is used as the conductive film 772, the display device 700 is a reflective liquid crystal display device. In addition, in the case where a conductive film that transmits visible light is used as the conductive film 772, the display device 700 is a transmissive liquid crystal display device.

In addition, when a structure over the conductive film 772 is changed, a driving method of a liquid crystal element can vary. FIG. 66 illustrates an example of this case. In addition, the display device 700 illustrated in FIG. 66 is an example of a structure employing a transverse electric field mode (e.g., an FFS mode) as a driving mode of the liquid crystal element. In the case of the structure illustrated in FIG. 66, an insulating film 773 is provided over the conductive film 772, and the conductive film 774 is provided over the insulating film 773. In this case, the conductive film 774 functions as a common electrode (also referred to as a common electrode), and an electric field generated between the conductive film 772 and the conductive film 774 through the insulating film 773 can control the alignment state in the liquid crystal layer 776.

In addition, although not illustrated in FIG. 65 and FIG. 66, a structure may be employed in which the conductive film 772 and/or the conductive film 774 are/is provided with an alignment film on a side in contact with the liquid crystal layer 776. In addition, although not illustrated in FIG. 65 and FIG. 66, an optical member (optical substrate) or the like, such as a polarizing member, a retardation member, or an anti-reflection member, may be provided as appropriate. For example, circular polarization by a polarizing substrate and a retardation substrate may be used. In addition, a backlight, a sidelight, or the like may be used as a light source.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

In addition, in the case where a horizontal electric field mode is employed, a liquid crystal exhibiting a blue phase for which an alignment film is not used may be used. The blue phase is one of liquid crystal phases, which is a phase generated just before a cholesteric phase changes into an isotropic phase when the temperature of a cholesteric liquid crystal is increased. Since the blue phase appears only in a narrow temperature range, a liquid crystal composition in which a several weight percent or more chiral material is mixed is used for the liquid crystal layer in order to improve the temperature range. The liquid crystal composition containing a liquid crystal exhibiting a blue phase and a chiral material has a short response speed and optical isotropy, which eliminates the need for an alignment process. Furthermore, an alignment film does not necessarily need to be provided and rubbing treatment is thus not necessary; accordingly, electrostatic discharge damage caused by the rubbing treatment can be prevented and defects and damage of the liquid crystal display device in the manufacturing process can be reduced. Moreover, the liquid crystal material which exhibits a blue phase has a small viewing angle dependence.

In addition, in the case where a liquid crystal element is used as a display element, a TN (Twisted Nematic) mode, an IPS (In-Plane Switching) mode, an FFS (Fringe Field Switching) mode, an ASM (Axially Symmetric aligned Micro-cell) mode, an OCB (Optically Compensated Birefringence) mode, an FLC (Ferroelectric Liquid Crystal) mode, an AFLC (AntiFerroelectric Liquid Crystal) mode, or the like can be used.

Furthermore, the display device 700 may be a normally black liquid crystal display device such as a transmissive liquid crystal display device employing a vertical alignment (VA) mode. Some can be given as the vertical alignment mode; for example, an MVA (Multi-Domain Vertical Alignment) mode, a PVA (Patterned Vertical Alignment) mode, an ASV mode, or the like can be used.

<6-3. Display Device Using Light-Emitting Element>

The display device 700 illustrated in FIG. 67 includes a light-emitting element 782. The light-emitting element 782 includes a conductive film 772, an EL layer 786, and a conductive film 788. The display device 700 illustrated in FIG. 67 can display an image by light emission from the EL layer 786 of the light-emitting element 782. Note that the EL layer 786 includes an organic compound or an inorganic compound such as a quantum dot.

As a material that can be used for an organic compound, a fluorescent material, a phosphorescent material, or the like can be given. In addition, as a material that can be used for a quantum dot, a colloidal quantum dot material, an alloyed quantum dot material, a core-shell quantum dot material, a core quantum dot material, or the like can be given. In addition, a material containing an element group of Group 12 and Group 16, Group 13 and Group 15, or Group 14 and Group 16 may be used. Alternatively, a quantum dot material including an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

In addition, the above-described organic compound and inorganic compound can be formed by a method such as an evaporation method (including a vacuum evaporation method), a droplet discharge method (also referred to as an ink-jet method), a coating method, or a gravure printing method, for example. In addition, the EL layer 786 may contain a low molecular material, a medium molecular material (including oligomer and dendrimer), or a high molecular material.

Here, a method for forming the EL layer 786 by a droplet discharge method is described with reference to FIGS. 68A to 68D. FIGS. 68A to 68D are cross-sectional views illustrating a method for manufacturing the EL layer 786.

Figure 68A:
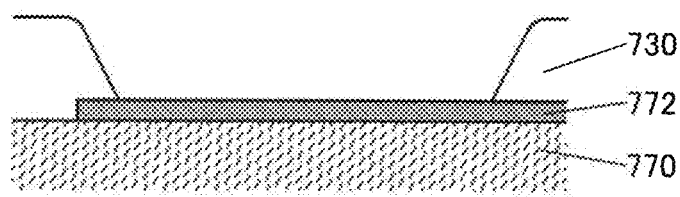
FIGS. 68A to 68D are cross-sectional views illustrating a method for manufacturing an EL layer.
Figure 68B:
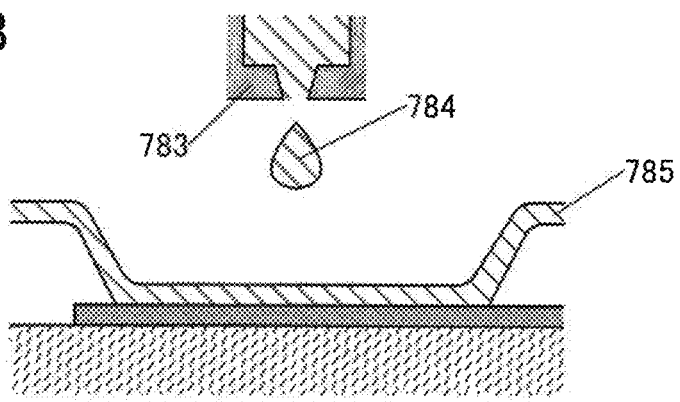

First, the conductive film 772 is formed over the planarization insulating film 770, and an insulating film 730 is formed to cover part of the conductive film 772 (see FIG. 68A).

Then, a droplet 784 is discharged to an exposed portion of the conductive film 772, which is an opening of the insulating film 730, from a droplet discharge apparatus 783, so that a layer 785 containing a composition is formed. The droplet 784 is a composition containing a solvent and is attached to the conductive film 772 (see FIG. 68B).

Note that the step of discharging the droplet 784 may be performed under reduced pressure.

Figure 68C:
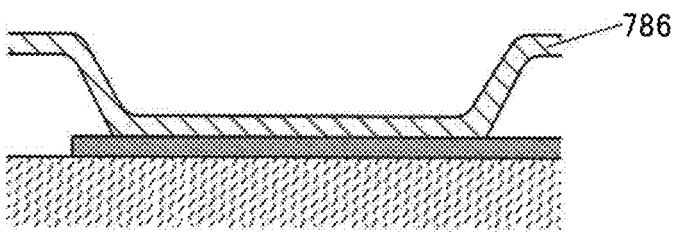

Next, the solvent is removed from the layer 785 containing a composition, which is solidified to form the EL layer 786 (see FIG. 68C).

Note that as a method for removing the solvent, a drying step or a heating step may be performed.

Figure 68D:
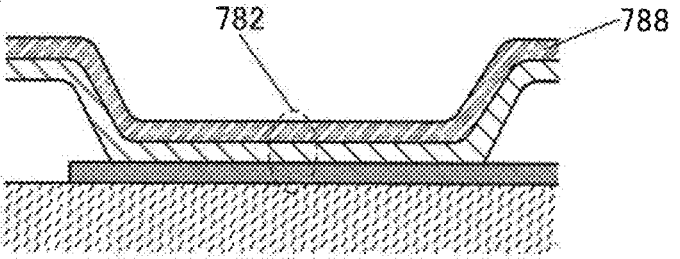

Next, the conductive film 788 is formed over the EL layer 786; thus, the light-emitting element 782 is formed (see FIG. 68D).

When the EL layer 786 is formed by a droplet discharge method as described above, the composition can be selectively discharged; accordingly, loss of material can be reduced. Furthermore, a lithography process or the like for processing the shape is not needed, and thus, the process can be simplified and cost reduction can be achieved.

Note that the droplet discharge method described above is a general term for ones having a means to discharge droplets such as a nozzle having a composition discharge outlet or a head having one or a plurality of nozzles.

Figure 69:
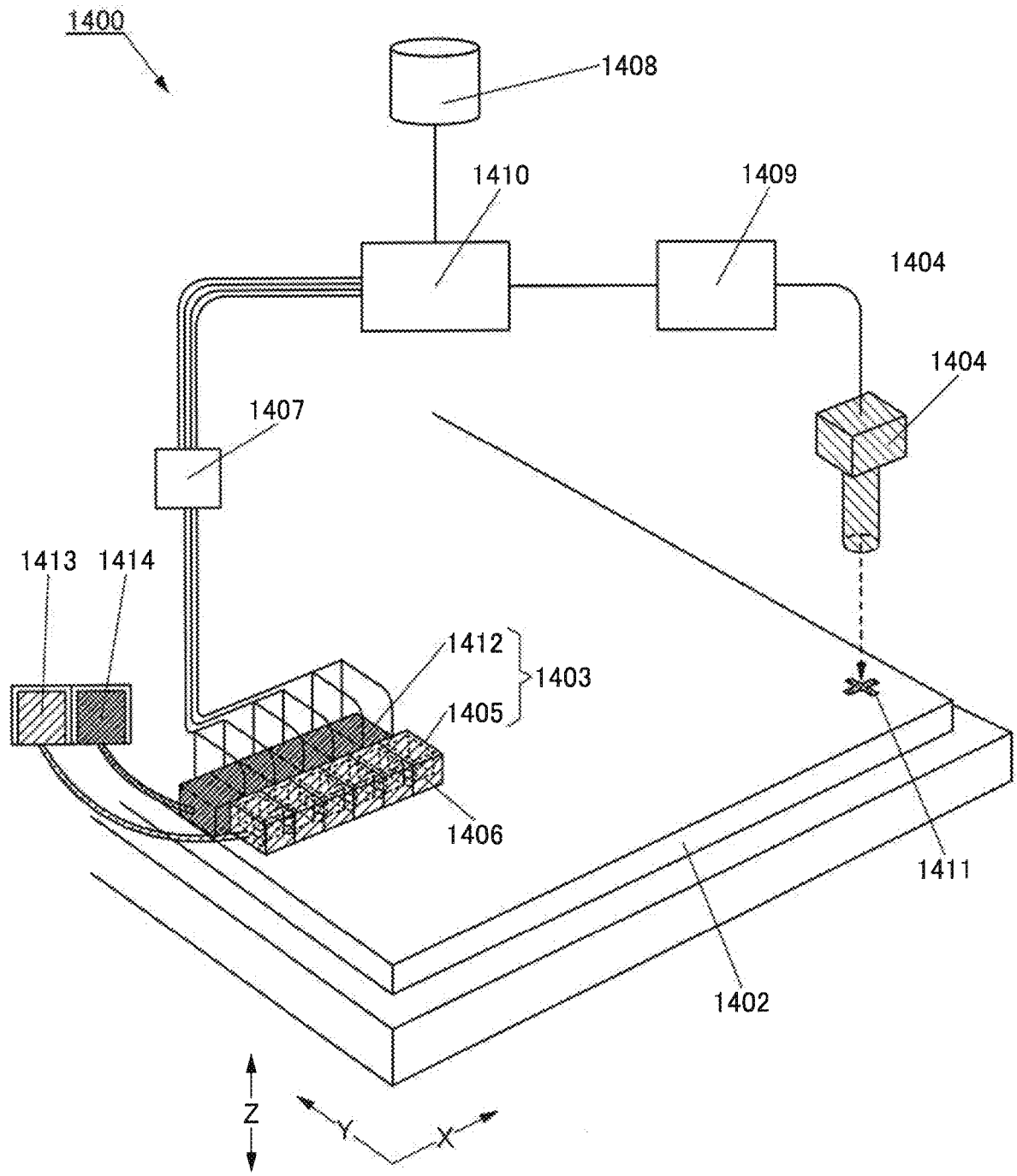
FIG. 69 is a conceptual diagram illustrating a droplet discharge apparatus.

Next, a droplet discharge apparatus used for the droplet discharge method is described with reference to FIG. 69. FIG. 69 is a conceptual diagram illustrating a droplet discharge apparatus 1400.

The droplet discharge apparatus 1400 includes a droplet discharge means 1403. In addition, the droplet discharge means 1403 includes a head 1405 and a head 1412.

The head 1405 and the head 1412 are connected to a control means 1407, which is controlled by a computer 1410; thus, a preprogrammed pattern can be drawn.

In addition, the drawing may be conducted at a timing, for example, based on a marker 1411 formed over a substrate 1402. Alternatively, the reference point may be determined on the basis of an outer edge of the substrate 1402. Here, the marker 1411 is detected by an imaging means 1404 and converted into a digital signal by an image processing means 1409, which is recognized by the computer 1410, and then, a control signal is generated and transmitted to the control means 1407.

An image sensor or the like using a charge coupled device (CCD) or a complementary metal oxide semiconductor (CMOS) can be used as the imaging means 1404. Note that information about a pattern to be formed over the substrate 1402 is stored in a storage medium 1408, and a control signal is transmitted to the control means 1407 on the basis of the information, so that the head 1405 and the head 1412 of the droplet discharge means 1403 can be each individually controlled. Materials to be discharged are supplied to the head 1405 and the head 1412 from a material supply source 1413 and a material supply source 1414, respectively, through pipes.

The head 1405 has an inside structure including a space as indicated by a dotted line 1406 to be filled with a liquid material and a nozzle which is a discharge outlet. Although not illustrated, the head 1412 also has an inside structure similar to that of the head 1405. When the nozzles of the head 1405 and the head 1412 have different sizes, different materials with different widths can be drawn simultaneously. Each head can discharge and draw a plurality of kinds of light-emitting materials, and in the case of drawing over a large area, the same material can be simultaneously discharged to be drawn from a plurality of nozzles in order to improve throughput. When a large substrate is used, the head 1405 and the head 1412 can freely scan the substrate in the directions indicated by arrows X, Y, and Z illustrated in FIG. 69, and a drawing region can be freely set. Thus, a plurality of the same patterns can be drawn over one substrate.

Furthermore, a step of discharging the composition may be performed under reduced pressure. The substrate may be heated at the time of discharging. After discharging the composition, either a drying or baking step or both is performed. Both the drying and baking steps are steps of heat treatment but different in purpose, temperature, and time. The step of drying and the step of baking are performed under normal pressure or under reduced pressure by laser light irradiation, rapid thermal annealing, a heating furnace, or the like. Note that the timing of the heat treatment and the number of times of the heat treatment are not particularly limited. In order to perform the steps of drying and baking in a favorable manner, the temperature at that time depends on the material of the substrate and the properties of the composition.

As described above, the EL layer 786 can be formed with the droplet discharge apparatus.

The description of the display device 700 illustrated in FIG. 67 is resumed.

In addition, in the display device 700 illustrated in FIG. 67, the insulating film 730 is provided over the planarization insulating film 770 and the conductive film 772. The insulating film 730 covers part of the conductive film 772. Note that the light-emitting element 782 has a top-emission structure. Thus, the conductive film 788 has a light-transmitting property and transmits light emitted from the EL layer 786. Note that the top-emission structure is described as an example in this embodiment; however, this does not impose any limitation. For example, a bottom-emission structure in which light is emitted to the conductive film 772 side or a dual-emission structure in which light is emitted to both the conductive film 772 and the conductive film 788 may also be employed.

In addition, the coloring film 736 is provided in a position overlapping with the light-emitting element 782, and the light-blocking film 738 is provided in the lead wiring portion 711 and the source driver circuit portion 704 in a position overlapping with the insulating film 730. In addition, the coloring film 736 and the light-blocking film 738 are covered with the insulating film 734. In addition, a space between the light-emitting element 782 and the insulating film 734 is filled with a sealing film 732. Note that the structure of the display device 700 illustrated in FIG. 67 in which the coloring film 736 is provided is described as an example; however, this does not impose any limitation. For example, a structure in which the coloring film 736 is not provided may also be employed in the case where the EL layer 786 is formed by separate coloring.

<6-4. Structural Example of Display Device Provided with Input/Output Device>

In addition, an input/output device may be provided in the display devices 700 illustrated in FIG. 66 and FIG. 67. As an example of the input/output device, a touch panel or the like can be given.

Figure 70:
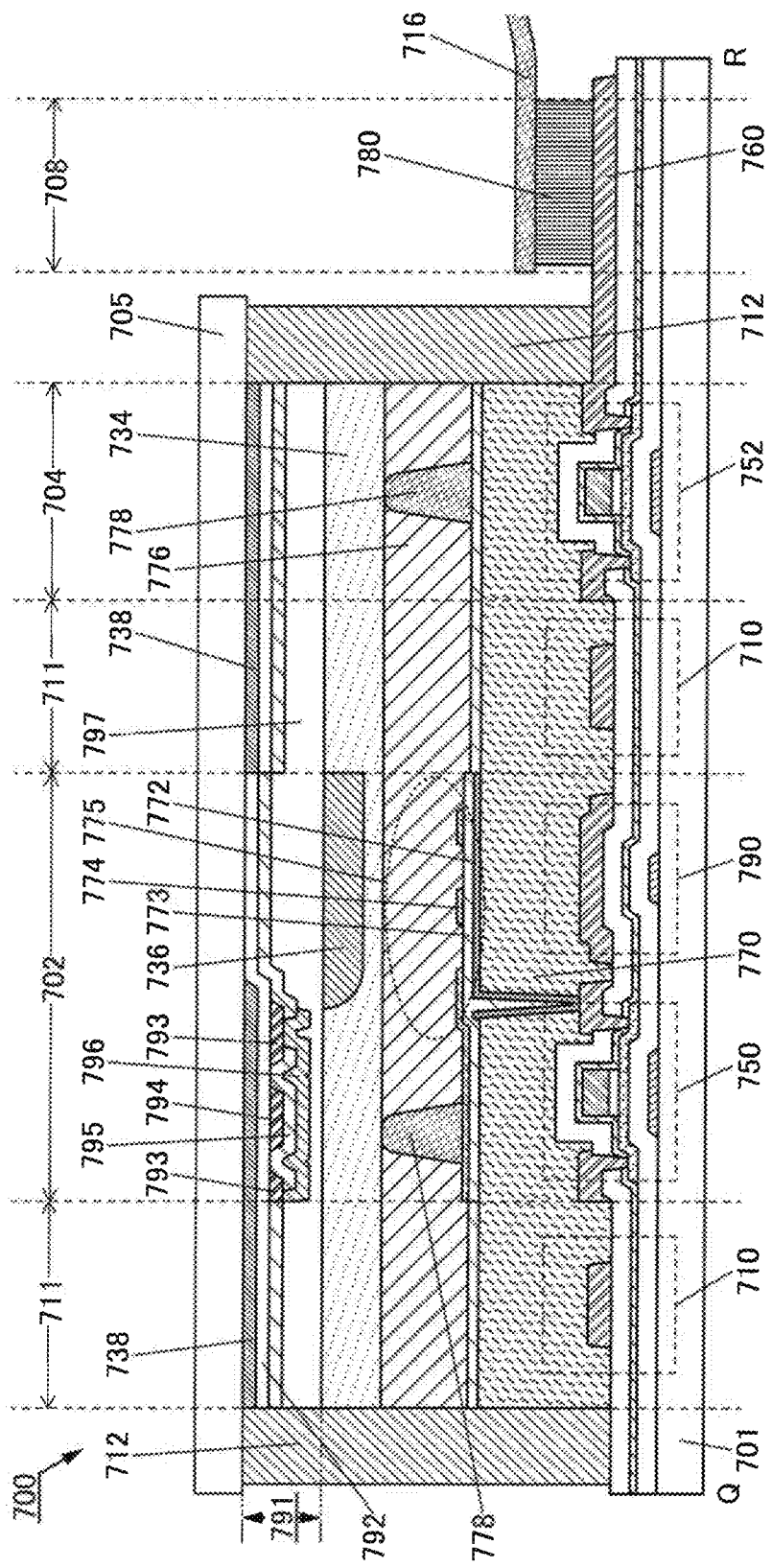
FIG. 70 is a cross-sectional view illustrating one embodiment of a display device.
Figure 71:
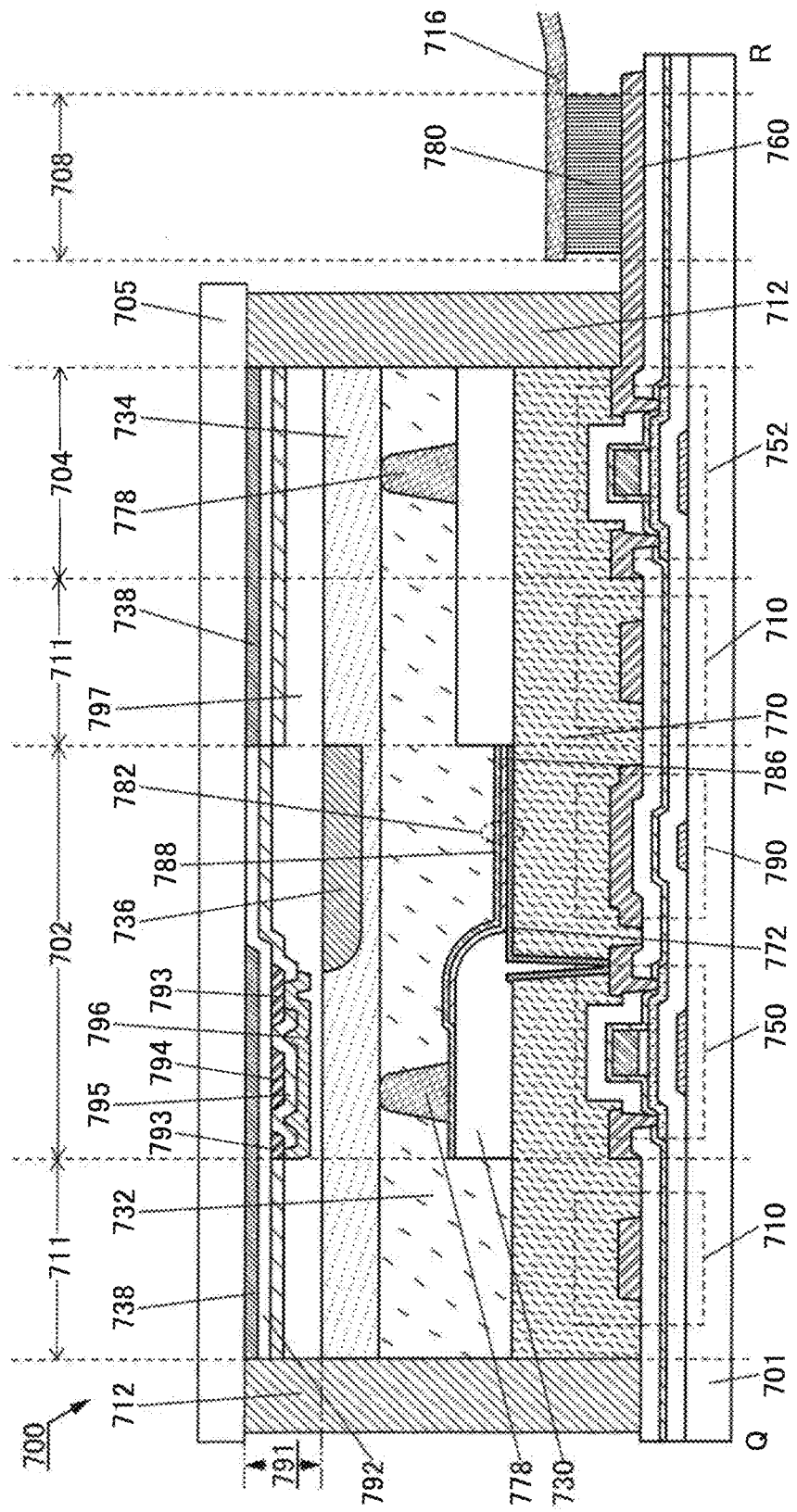
FIG. 71 is a cross-sectional view illustrating one embodiment of a display device.

FIG. 70 and FIG. 71 illustrate, respectively, a structure in which the display device 700 illustrated in FIG. 66 is provided with a touch panel 791 and a structure in which the display device 700 illustrated in FIG. 67 is provided with a touch panel 791.

FIG. 70 is a cross-sectional view of the structure in which the display device 700 illustrated in FIG. 66 is provided with the touch panel 791, and FIG. 71 is a cross-sectional view of the structure in which the display device 700 illustrated in FIG. 67 is provided with the touch panel 791.

First, the touch panel 791 illustrated in FIG. 70 and FIG. 71 is described below.

The touch panel 791 illustrated in FIG. 70 and FIG. 71 is what is called an in-cell touch panel provided between the substrate 705 and the coloring film 736. The touch panel 791 is formed on the substrate 705 side before the light-blocking film 738 and the coloring film 736 are formed.

Note that the touch panel 791 includes the light-blocking film 738, an insulating film 792, an electrode 793, an electrode 794, an insulating film 795, an electrode 796, and an insulating film 797. Changes in the mutual capacitance between the electrode 793 and the electrode 794 can be detected when an object to be detected, such as a finger or a stylus, approaches, for example.

In addition, a portion in which the electrode 793 intersects with the electrode 794 is illustrated in the upper portion of the transistor 750 illustrated in FIG. 70 and FIG. 71. The electrode 796 is electrically connected to the two electrodes 793 between which the electrode 794 is sandwiched through openings provided in the insulating film 795. Note that a structure in which a region where the electrode 796 is provided is provided in the pixel portion 702 is illustrated in FIG. 70 and FIG. 71 as an example; however, this does not impose any limitation, and for example, it may be formed in the source driver circuit portion 704.

The electrode 793 and the electrode 794 are provided in a region overlapping with the light-blocking film 738. In addition, as illustrated in FIG. 70, it is preferable that the electrode 793 not overlap with the liquid crystal element 775. In addition, as illustrated in FIG. 71, it is preferable that the electrode 793 not overlap with the light-emitting element 782. In other words, the electrode 793 has an opening in a region overlapping with the light-emitting element 782 and the liquid crystal element 775. That is, the electrode 793 has a mesh shape. With such a structure, the electrode 793 can have a structure which does not block light emitted from the light-emitting element 782. Alternatively, the electrode 793 can have a structure which does not block light transmitted through the liquid crystal element 775. Thus, since luminance is hardly reduced even when the touch panel 791 is provided, a display device with high visibility and low power consumption can be obtained. Note that the electrode 794 can have a similar structure.

In addition, since the electrode 793 and the electrode 794 do not overlap with the light-emitting element 782, a metal material having low transmittance with respect to visible light can be used for the electrode 793 and the electrode 794. Alternatively, since the electrode 793 and the electrode 794 do not overlap with the liquid crystal element 775, a metal material having low transmittance with respect to visible light can be used for the electrode 793 and the electrode 794.

Thus, as compared with an electrode using an oxide material whose transmittance of visible light is high, resistance of the electrode 793 and the electrode 794 can be reduced, whereby sensitivity of the sensor of the touch panel can be increased.

For example, a conductive nanowire may be used for the electrodes 793, 794, and 796. The nanowire may have a mean diameter of greater than or equal to 1 nm and less than or equal to 100 nm, preferably greater than or equal to 5 nm and less than or equal to 50 nm, and further preferably greater than or equal to 5 nm and less than or equal to 25 nm. As the above nanowire, a metal nanowire such as an Ag nanowire, a Cu nanowire, or an Al nanowire or a carbon nanotube may also be used. For example, in the case where an Ag nanowire is used for any one of or all of electrodes 793, 794, and 796, the light transmittance of visible light can be greater than or equal to 89% and the sheet resistance can be greater than or equal to 40Ω/□ and less than or equal to 100Ω/□.

In addition, the structure of the in-cell touch panel is illustrated in FIG. 70 and FIG. 71; however, this does not impose any limitation. For example, what is called an on-cell touch panel formed over the display device 700, or what is called an out-cell touch panel attached to the display device 700 for use may be used.

In this manner, the display device of one embodiment of the present invention can be used in combination with various types of touch panels.

At least part of this embodiment can be implemented in combination with the other embodiments described in this specification as appropriate.

Embodiment 7

In this embodiment, an example of a semiconductor device of one embodiment of the present invention will be described. A transistor described in this embodiment is a transistor suitable for miniaturization.

<7-1. Structural Example of Transistor Suitable for Miniaturization>

Figure 72A:
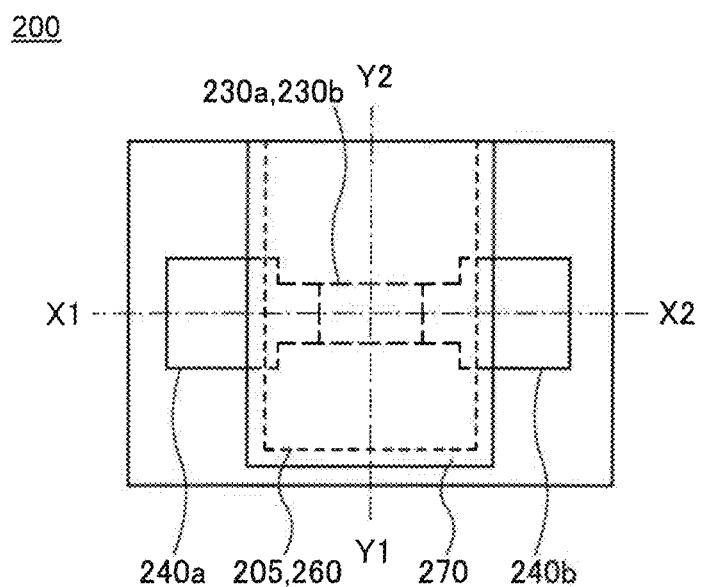
FIGS. 72A to 72C are a top view and cross-sectional views illustrating a semiconductor device.
Figure 72B:
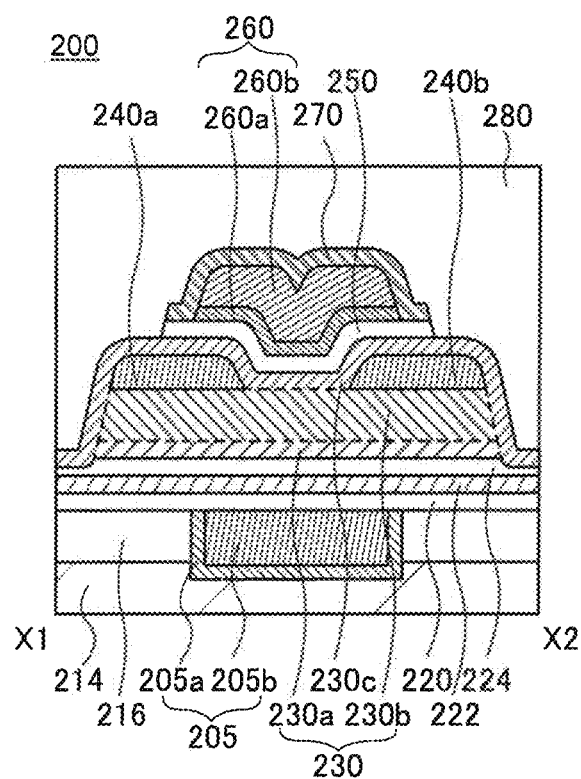
Figure 72C:
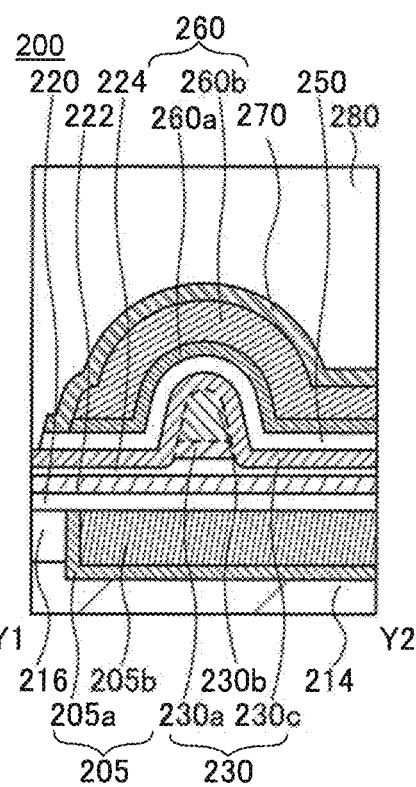

FIGS. 72A to 72C illustrate an example of a transistor 200. FIG. 72A is a top view of the transistor 200. Note that for simplification of the drawing, some films are not illustrated in FIG. 72A. In addition, FIG. 72B is a cross-sectional view corresponding to the dashed-dotted line X1-X2 illustrated in FIG. 72A, and FIG. 72C is a cross-sectional view corresponding to the dashed-dotted line Y1-Y2.

The transistor 200 includes a conductor 205 (a conductor 205a and a conductor 205b) and a conductor 260 (a conductor 260a and a conductor 260b) which function as gate electrodes, an insulator 220, an insulator 222, an insulator 224, and an insulator 250 which function as gate insulating layers, an oxide semiconductor 230 having a region where a channel is formed, a conductor 240a functioning as one of a source and a drain, a conductor 240b functioning as the other of the source and the drain, and an insulator 280 including excess oxygen.

In addition, the oxide semiconductor 230 includes an oxide semiconductor 230a, an oxide semiconductor 230b over the oxide semiconductor 230a, and an oxide semiconductor 230c over the oxide semiconductor 230b. Note that when the transistor 200 is turned on, current flows (a channel is formed) mainly in the oxide semiconductor 230b. In contrast, although in some cases, a current might flow in the oxide semiconductor 230a and the oxide semiconductor 230c in the vicinity of the interfaces (mixed regions in some cases) with the oxide semiconductor 230b, the other regions might function as insulators in some cases.

In the structure illustrated in FIGS. 72A to 72C, the conductor 260 functioning as a gate electrode has a stacked-layer structure including the conductor 260a and the conductor 260b. In addition, an insulator 270 is included over the conductor 260 functioning as a gate electrode.

The conductor 205 is a metal film containing an element selected from molybdenum, titanium, tantalum, tungsten, aluminum, copper, chromium, neodymium, and scandium; a metal nitride film containing any of the above elements as its component (a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

For example, it is preferable that tantalum nitride, which is a conductor having a barrier property against hydrogen, be used as the conductor 205a, and tungsten, which has high conductivity, be stacked thereover as the conductor 205b. The use of that combination can suppress diffusion of hydrogen into the oxide semiconductor 230 while the conductivity as a wiring is ensured. Note that a two-layer structure of the conductor 205a and the conductor 205b is illustrated in FIGS. 72A to 72C; however, this structure does not impose any limitation, and a single layer or a stacked-layer structure of three or more layers may be used.

The insulator 220 and the insulator 224 are preferably insulators containing oxygen, such as a silicon oxide film or a silicon oxynitride film. In particular, an insulator containing excess oxygen (containing oxygen in excess of that in the stoichiometric composition) is preferably used as the insulator 224. When such an insulator containing excess oxygen is provided in contact with the oxide included in the transistor 200, oxygen vacancies in the oxide can be filled. Note that the insulator 222 and the insulator 224 are not necessarily formed using the same material.

As the insulator 222, it is preferable to use a single layer or a stacked layer of an insulator containing what is called a high-k material, such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST), for example. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

Note that the insulator 222 may have a stacked-layer structure of two or more layers. In that case, there is no limitation to the stacked-layer structure formed of the same material, and a stacked-layer structure formed of different materials may be used.

Since the insulator 222 containing a high-k material is included between the insulator 220 and the insulator 224, electrons can be trapped in the insulator 222 under specific conditions, and the threshold voltage can be increased. That is, the insulator 222 is negatively charged in some cases.

For example, in the case where silicon oxide is used for the insulator 220 and the insulator 224 and a material having a lot of electron trap states such as hafnium oxide, aluminum oxide, or tantalum oxide is used for the insulator 222, the state where the potential of the conductor 205 is higher than the potential of the source electrode or the drain electrode is kept at a temperature higher than the operating temperature or the storage temperature of the semiconductor device (e.g., 125° C. or higher and 450° C. or lower, typically 150° C. or higher and 300° C. or lower) for 10 milliseconds or longer, typically one minute or longer. Thus, electrons are moved from the oxide included in the transistor 200 to the conductor 205. At this time, some of the moving electrons are trapped by the electron trap states of the insulator 222.

In the transistor in which a necessary amount of electrons is trapped by the electron trap states in the insulator 222, the threshold voltage is shifted in the positive direction. Note that by controlling the voltage of the conductor 205, the amount of electrons to be trapped can be controlled, and thus the threshold voltage can be controlled. The transistor 200 having the structure is a normally-off transistor which is in a non-conduction state (also referred to as an off state) even when the gate voltage is 0 V.

Furthermore, the treatment for trapping the electrons may be performed in the manufacturing process of the transistor. For example, it is preferably performed at any step before factory shipment, such as after the formation of a conductor connected to the source or the drain of the transistor, after pretreatment (wafer processing), after a wafer-dicing step, after packaging, or the like.

In addition, the threshold voltage can be controlled by appropriate adjustment of the thicknesses of the insulator 220, the insulator 222, and the insulator 224. Alternatively, a transistor having a low leakage current at the time of non-conduction can be provided. Alternatively, a transistor with stable electrical characteristics can be provided. Alternatively, a transistor having a high on-state current can be provided. Alternatively, a transistor with a small subthreshold swing value can be provided. Alternatively, a highly reliable transistor can be provided.

The oxide semiconductor 230a, the oxide semiconductor 230b, and the oxide semiconductor 230c are formed with a metal oxide such as In-M-Zn oxide (M is Al, Ga, Y, or Sn). In addition, an In—Ga oxide or an In—Zn oxide may be used as the oxide semiconductor 230.

As the insulator 250, it is possible to use a single layer or a stacked layer of an insulator containing what is called a high-k material, such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST), for example. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

In addition, an oxide insulator containing oxygen in excess of that in the stoichiometric composition is preferably used as the insulator 250, like the insulator 224. When such an insulator containing excess oxygen is provided in contact with the oxide semiconductor 230, oxygen vacancies in the oxide semiconductor 230 can be reduced.

In addition, as the insulator 250, it is possible to use an insulating film having a barrier property against oxygen or hydrogen, such as aluminum oxide, aluminum oxynitride, gallium oxide, gallium oxynitride, yttrium oxide, yttrium oxynitride, hafnium oxide, hafnium oxynitride, or silicon nitride. The insulator 250 formed using such a material functions as a layer which prevents release of oxygen from the oxide semiconductor 230 and entry of an impurity such as hydrogen from the outside.

Note that the insulator 250 may have a stacked-layer structure similar to that of the insulator 220, the insulator 222, and the insulator 224. When an insulator in which a necessary amount of electrons is trapped by electron trap states is included as the insulator 250, the threshold voltage of the transistor 200 can be shifted in the positive direction. The transistor 200 having the structure is a normally-off transistor which is in a non-conduction state (also referred to as an off state) even when the gate voltage is 0 V.

Furthermore, in addition to the insulator 250, a barrier film may be provided between the oxide semiconductor 230 and the conductor 260 in the semiconductor device illustrated in FIGS. 72A to 72C. Alternatively, the oxide semiconductor 230c having a barrier property may be used.

For example, an insulating film containing excess oxygen is provided in contact with the oxide semiconductor 230 and enclosed with a barrier film, whereby the oxide can be brought into a state of being substantially the same as the stoichiometric composition or into a supersaturated state of containing more oxygen than that in the stoichiometric composition. It is also possible to prevent entry of impurities such as hydrogen into the oxide semiconductor 230.

One of the conductor 240a and the conductor 240b functions as a source electrode, and the other thereof functions as a drain electrode.

A metal such as aluminum, titanium, chromium, nickel, copper, yttrium, zirconium, molybdenum, silver, tantalum, or tungsten, or an alloy containing the same as its main component can be used for the conductor 240a and the conductor 240b. In addition, although a single-layer structure is illustrated in the drawings, a stacked-layer structure of two or more layers may be used.

For example, a titanium film and an aluminum film may be stacked. In addition, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be used.

There is also a three-layer structure of stacking an aluminum film or a copper film over a titanium film or a titanium nitride film and furthermore a titanium film or a titanium nitride film thereover, a three-layer structure of stacking an aluminum film or a copper film over a molybdenum film or a molybdenum nitride film and furthermore a molybdenum film or a molybdenum nitride film thereover, or the like. Note that a transparent conductive material including indium oxide, tin oxide, or zinc oxide may be used.

In addition, the conductor 260 functioning as a gate electrode can be formed using, for example, a metal selected from aluminum, chromium, copper, tantalum, titanium, molybdenum, and tungsten, an alloy containing any of the above-described metals as its component, an alloy containing any of the above-described metals in combination, or the like. Furthermore, one or more metals selected from manganese and zirconium may be used. In addition, a semiconductor typified by polycrystalline silicon doped with an impurity element such as phosphorus, or a silicide such as nickel silicide may be used.

A two-layer structure where a titanium film is stacked over an aluminum film may be used, for example. In addition, a two-layer structure where a titanium film is stacked over a titanium nitride film, a two-layer structure where a tungsten film is stacked over a titanium nitride film, or a two-layer structure where a tungsten film is stacked over a tantalum nitride film or a tungsten nitride film.

In addition, a three-layer structure of stacking an aluminum film over a titanium film and furthermore a titanium film thereover or the like may be used. In addition, an alloy film or a nitride film that contains aluminum and one or more metals selected from titanium, tantalum, tungsten, molybdenum, chromium, neodymium, and scandium may be used.

In addition, as the conductor 260, it is possible to use a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to use a stacked-layer structure of any of the above-described light-transmitting conductive materials and any of the above-described metals.

The conductor 260a is formed by using a thermal CVD method, an MOCVD method, or an ALD method. In particular, formation by using an atomic layer deposition (ALD: Atomic Layer Deposition) method is preferable. By formation by an ALD method or the like, plasma damage to the insulator 250 can be reduced. In addition, it is preferable because coverage can be improved. Thus, the transistor 200 having high reliability can be provided.

In addition, the conductor 260b is formed using a material having high conductivity such as tantalum, tungsten, copper, or aluminum.

In addition, an insulator 270 is provided to cover the conductor 260. In the case where an oxide material from which oxygen is released is used for the insulator 280, a substance having a barrier property against oxygen is used for the insulator 270 to prevent the conductor 260 from being oxidized by the released oxygen.

For example, a metal oxide such as aluminum oxide can be used for the insulator 270. In addition, the insulator 270 is formed to a thickness with which the oxidation of the conductor 260 is prevented. For example, the thickness of the insulator 270 is set greater than or equal to 1 nm and less than or equal to 10 nm, preferably greater than or equal to 3 nm and less than or equal to 7 nm.

Thus, the oxidation of the conductor 260 can be suppressed, and oxygen released from the insulator 280 can be supplied to the oxide semiconductor 230 efficiently.

The insulator 280 is provided over the transistor 200. An insulator containing oxygen in excess of that in the stoichiometric composition is preferably used for the insulator 280. That is, in the insulator 280, a region where oxygen exists in excess of that in the stoichiometric composition (hereinafter also referred to as excess-oxygen region) is preferably formed. In particular, in the case of using an oxide semiconductor in the transistor 200, when an insulator including an oxygen-excess region is provided as an interlayer film or the like in the vicinity of the transistor 200, oxygen vacancies in the transistor 200 are reduced, whereby the reliability can be improved.

As the insulator including the excess-oxygen region, specifically, an oxide material that releases part of oxygen by heating is preferably used.

For example, as such a material, a material containing silicon oxide or silicon oxynitride is preferably used. Alternatively, a metal oxide can be used. Note that in this specification, silicon oxynitride refers to a material with an oxygen content higher than that of nitrogen, and silicon nitride oxide refers to a material with a nitrogen content higher than that of oxygen.

In addition, the insulator 280 that covers the transistor 200 may function as a planarization film that covers an uneven shape thereunder.

<7-2. Application Example of Transistor Suitable for Miniaturization>

An example in the case of using stacked transistors with different materials is described below.

Figure 73:
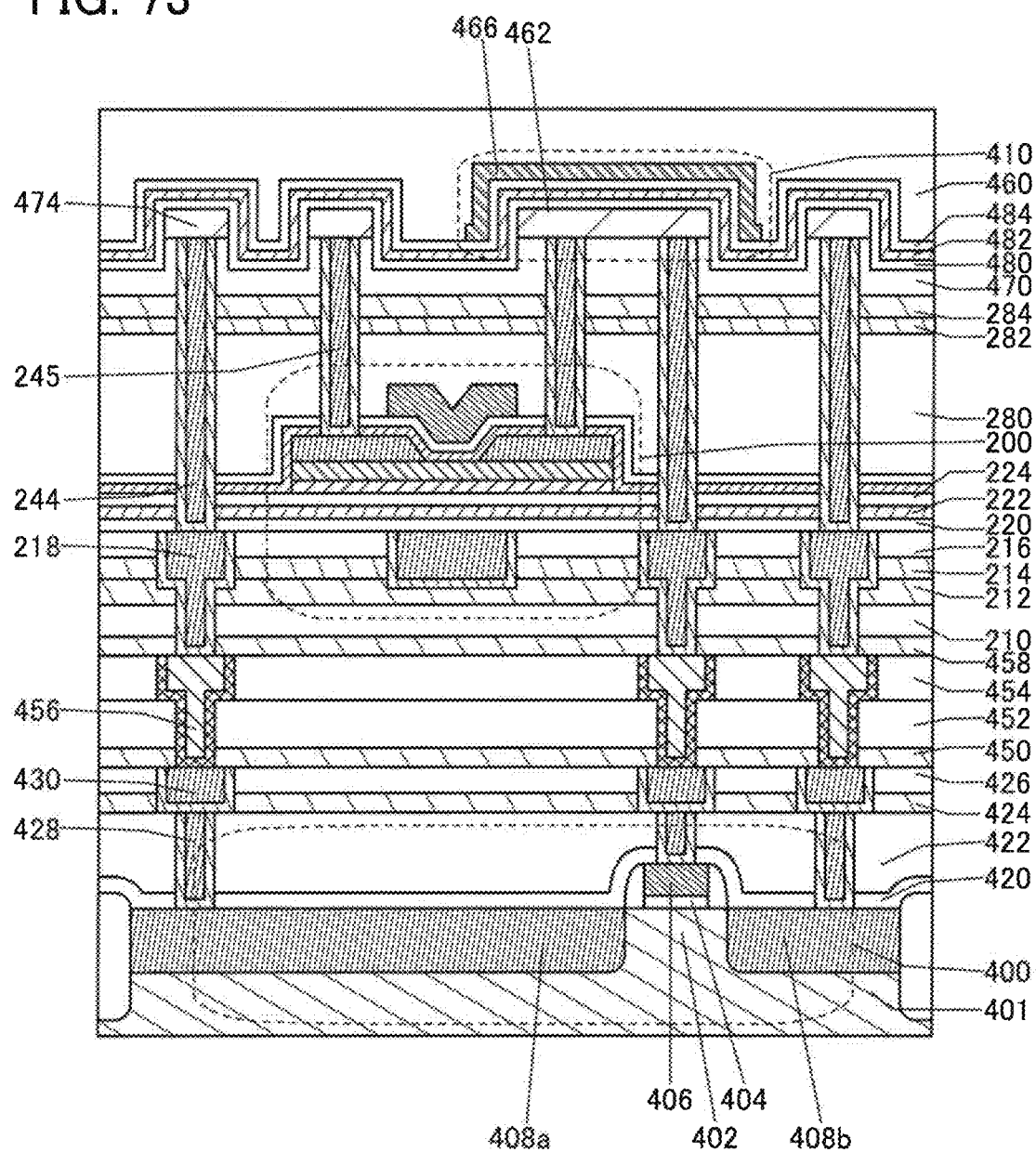
FIG. 73 illustrates a cross section of a semiconductor device.

A semiconductor device illustrated in FIG. 73 includes a transistor 400, a transistor 200, and a capacitor 410.

The transistor 200 is a transistor in which a channel is formed in a semiconductor layer including an oxide semiconductor. Since the off-state current of the transistor 200 is low, by using this in a semiconductor device (a memory device), the stored content can be retained for a long time. In other words, power consumption can be sufficiently reduced because a semiconductor device (a memory device) in which refresh operation is unnecessary or the frequency of refresh operation is extremely low can be provided.

The semiconductor device includes the transistor 400, the transistor 200, and the capacitor 410 as illustrated in FIG. 73. The transistor 200 is provided above the transistor 400, and the capacitor 410 is provided above the transistor 400 and the transistor 200.

The transistor 400 is provided over a substrate 401 and includes a conductor 406, an insulator 404, a semiconductor region 402 that is a part of the substrate 401, and a low-resistance region 408a and a low-resistance region 408b functioning as a source region and a drain region.

The transistor 400 may be a p-channel transistor or an n-channel transistor.

A region of the semiconductor region 402 where a channel is formed, a region in the vicinity thereof, the low-resistance region 408a and the low-resistance region 408b functioning as a source region and a drain region, and the like preferably contain a semiconductor such as a silicon-based semiconductor, or preferably contain single crystal silicon. Alternatively, a material including Ge (germanium), SiGe (silicon germanium), GaAs (gallium arsenide), GaAlAs (gallium aluminum arsenide), or the like may be contained. A structure using silicon whose effective mass is controlled by applying stress to the crystal lattice and thereby changing the lattice spacing may be employed. Alternatively, the transistor 400 may be an HEMT (High Electron Mobility Transistor) with GaAs and GaAlAs, or the like.

The low-resistance region 408a and the low-resistance region 408b contain an element which imparts n-type conductivity, such as arsenic or phosphorus, or an element which imparts p-type conductivity, such as boron, in addition to a semiconductor material used for the semiconductor region 402.

As the conductor 406 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that a work function is determined by a material of the conductor, whereby the threshold voltage can be adjusted. Specifically, it is preferable to use a material such as titanium nitride or tantalum nitride as the conductor. Furthermore, in order to achieve both the conductivity and embeddability, it is preferable to use a stacked layer of metal materials such as tungsten and aluminum as the conductor, and it is particularly preferable to use tungsten in terms of heat resistance.

Note that the transistor 400 illustrated in FIG. 73 is just an example and is not limited to the structure; an appropriate transistor may be used in accordance with a circuit configuration or a driving method.

An insulator 420, an insulator 422, an insulator 424, and an insulator 426 are stacked sequentially so as to cover the transistor 400.

As the insulator 420, the insulator 422, the insulator 424, and the insulator 426, for example, silicon oxide, silicon oxynitride, silicon nitride oxide, silicon nitride, aluminum oxide, aluminum oxynitride, aluminum nitride oxide, aluminum nitride, or the like may be used.

The insulator 422 functions as a planarization film for eliminating a level difference caused by the transistor 400 or the like provided thereunder. A top surface of the insulator 422 may be planarized by planarization treatment using a chemical mechanical polishing (CMP: Chemical Mechanical Polishing) method or the like to increase the planarity.

As the insulator 424, a film having a barrier property that prevents hydrogen or impurities from diffusing from the substrate 401, the transistor 400, or the like into a region where the transistor 200 is provided.

As an example of the film having a barrier property against hydrogen, silicon nitride formed by a CVD method can be used. Here, diffusion of hydrogen into a semiconductor element including an oxide semiconductor, such as the transistor 200, degrades the characteristics of the semiconductor element in some cases. Therefore, a film that suppresses hydrogen diffusion is preferably used between the transistor 200 and the transistor 400. Specifically, the film that suppresses hydrogen diffusion is a film from which a small amount of hydrogen is released.

Note that the permittivity of the insulator 426 is preferably lower than that of the insulator 424. For example, the relative permittivity of the insulator 426 is preferably lower than 4, further preferably lower than 3. In addition, for example, the relative permittivity of the insulator 424 is preferably 0.7 times or less, further preferably 0.6 times or less the relative permittivity of the insulator 426. When a material with a low permittivity is used as an interlayer film, the parasitic capacitance generated between wirings can be reduced.

In addition, a conductor 428, a conductor 430, and the like that are electrically connected to the capacitor 410 or the transistor 200 are embedded in the insulator 420, the insulator 422, the insulator 424, and the insulator 426. Note that the conductor 428 and the conductor 430 function as plugs or wirings. Furthermore, in this specification and the like, a wiring and a plug electrically connected to the wiring may be a single component. That is, there are cases where a part of a conductor functions as a wiring and a part of a conductor functions as a plug.

As a material of each of plugs and wirings (e.g., the conductor 428 and the conductor 430), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

Furthermore, the conductor 428 and the conductor 430 preferably include a conductor having a barrier property against hydrogen. The conductor having a barrier property against hydrogen is preferably formed particularly in an opening in the insulator 424 having a barrier property against hydrogen. With such a structure, the transistor 400 and the transistor 200 can be separated by a barrier layer, so that diffusion of hydrogen from the transistor 400 into the transistor 200 can be suppressed.

Note that as the conductor having a barrier property against hydrogen, tantalum nitride or the like may be used, for example. In addition, by stacking tantalum nitride and tungsten, which has high conductivity, diffusion of hydrogen from the transistor 400 can be suppressed while the conductivity as a wiring is ensured. In this case, a tantalum nitride layer having a barrier property against hydrogen is preferably in contact with the insulator 424 having a barrier property against hydrogen.

In addition, a wiring layer may be provided over the insulator 426 and the conductor 430. For example, in FIG. 73, an insulator 450, an insulator 452, and an insulator 454 are stacked sequentially. Furthermore, a conductor 456 is formed in the insulator 450, the insulator 452, and the insulator 454. The conductor 456 functions as a plug or a wiring. Note that the conductor 456 can be formed using a material similar to that of the conductor 428 and the conductor 430.

In addition, the conductor 456 is preferably formed with a low-resistance conductive material such as aluminum or copper. The use of a low-resistance conductive material can reduce wiring resistance. Note that in the case where copper is used as the conductor 456, a conductor which suppresses diffusion of copper is preferably stacked. As the conductor which suppresses diffusion of copper, for example, tantalum, an alloy containing tantalum such as tantalum nitride, ruthenium, an alloy containing ruthenium, and the like may be used.

In addition, for example, as the insulator 450, an insulator which suppresses diffusion of copper or has a barrier property against oxygen and hydrogen is preferably used. For example, silicon nitride can be used as an example of the insulator which suppresses diffusion of copper. Therefore, a material similar to that of the insulator 424 can be used.

In particular, it is preferable that the conductor which suppresses diffusion of copper be provided in contact with an opening of the insulator 450 which suppresses diffusion of copper, and copper be stacked over the conductor which suppresses diffusion of copper. With such a structure, diffusion of copper in the vicinity of the wiring can be suppressed.

An insulator 458, an insulator 210, an insulator 212, and an insulator 214 are stacked sequentially over the insulator 454. Any or all of the insulator 458, the insulator 210, the insulator 212, and the insulator 214 is preferably formed using a substance which suppresses diffusion of copper or has a barrier property against oxygen or hydrogen.

As the insulator 458 and the insulator 212, films having a barrier property are preferably used to prevent copper, hydrogen, or impurities from diffusing from the substrate 401, a region where the transistor 400 is provided, or the like into a region where the transistor 200 is provided. Therefore, a material similar to that of the insulator 424 can be used.

In addition, for the insulator 210, a material similar to that of the insulator 420 can be used. For example, a silicon oxide film, a silicon oxynitride film, or the like can be used as the insulator 210.

In addition, for example, a metal oxide such as aluminum oxide, hafnium oxide, or tantalum oxide is preferably used for the insulator 214.

In particular, aluminum oxide has a high blocking effect that prevents both oxygen and impurities such as hydrogen and moisture, which cause a change in electrical characteristics of the transistor, from permeating through the film. Accordingly, aluminum oxide can prevent entry of impurities such as hydrogen and moisture into the transistor 200 in a manufacturing process of the transistor and after the manufacturing. In addition, aluminum oxide can suppress release of oxygen from the oxide included in the transistor 200. Therefore, aluminum oxide is suitably used as a protective film for the transistor 200.

An insulator 216 is provided over the insulator 214. For the insulator 216, a material similar to that of the insulator 420 can be used. For example, a silicon oxide film, a silicon oxynitride film, or the like can be used as the insulator 216.

In addition, a conductor 218, the conductor 205 included in the transistor 200, and the like are embedded in the insulator 458, the insulator 210, the insulator 212, the insulator 214, and the insulator 216. Note that the conductor 218 functions as a plug or a wiring that is electrically connected to the capacitor 410 or the transistor 400. The conductor 218 can be formed using a material similar to that of the conductor 428 and the conductor 430.

In particular, the conductor 218 in a region in contact with the insulator 458, the insulator 212, and the insulator 214 is preferably a conductor which suppresses diffusion of copper or has a barrier property against oxygen, hydrogen, and water. With such a structure, the transistor 400 and the transistor 200 can be separated by a layer which suppresses diffusion of copper or has a barrier property against oxygen, hydrogen, and water. That is, diffusion of copper from the conductor 456 can be suppressed, and diffusion of hydrogen from the transistor 400 into the transistor 200 can be suppressed.

The transistor 200 and the insulator 280 are provided above the insulator 214. In addition, the transistor 200 illustrated in FIG. 73 is just an example and is not limited to the structure; an appropriate transistor may be used in accordance with a circuit configuration or a driving method.

An insulator 282, an insulator 284, and an insulator 470 are sequentially stacked over the insulator 280. In addition, a conductor 244 and the like are embedded in the insulator 220, the insulator 222, the insulator 224, the insulator 280, the insulator 282, the insulator 284, and the insulator 470. In addition, a conductor 245 and the like which are connected to a conductor in an upper layer are provided over conductors such as the conductor 240a and the conductor 240b of the transistor 200. Note that the conductor 244 functions as a plug or a wiring that is electrically connected to the capacitor 410, the transistor 200, or the transistor 400. The conductor 244 can be formed using a material similar to that of the conductor 428 and the conductor 430.

Note that a substance having a barrier property against oxygen or hydrogen is preferably used for either or both the insulator 282 and the insulator 284. Therefore, a material similar to that of the insulator 214 can be used for the insulator 282. In addition, a material similar to that of the insulator 212 can be used for the insulator 284.

For example, a metal oxide such as aluminum oxide, hafnium oxide, or tantalum oxide is preferably used for the insulator 282.

In particular, aluminum oxide has a high blocking effect that prevents both oxygen and impurities such as hydrogen and moisture, which cause a change in electrical characteristics of the transistor, from permeating through the film. Accordingly, aluminum oxide can prevent entry of impurities such as hydrogen and moisture into the transistor 200 in a manufacturing process of the transistor and after the manufacturing. In addition, aluminum oxide can suppress release of oxygen from the oxide included in the transistor 200. Therefore, aluminum oxide is suitably used as a protective film for the transistor 200.

For the insulator 284, a film having a barrier property is preferably used to prevent hydrogen or impurities from diffusing from a region where the capacitor 410 is provided into a region where the transistor 200 is provided. Therefore, a material similar to that of the insulator 424 can be used.

As an example of the film having a barrier property against hydrogen, silicon nitride formed by a CVD method can be used. Here, diffusion of hydrogen into a semiconductor element including an oxide semiconductor, such as the transistor 200, degrades the characteristics of the semiconductor element in some cases. Therefore, a film that suppresses hydrogen diffusion is preferably used between the transistor 200 and the transistor 400. Specifically, the film that suppresses hydrogen diffusion is a film from which a small amount of hydrogen is released.

Therefore, a structure in which the transistor 200 and the insulator 280 including the excess-oxygen region are sandwiched between a stacked-layer structure of the insulator 210, the insulator 212, and the insulator 214 and a stacked-layer structure of the insulator 282 and the insulator 284 can be employed. In addition, the insulator 210, the insulator 212, the insulator 214, the insulator 282, and the insulator 284 have a barrier property that suppresses diffusion of oxygen or impurities such as hydrogen and water.

Note that the insulator 282 and the insulator 284 can suppress diffusion of oxygen released from the insulator 280 and the transistor 200 into the layer where the capacitor 410 or the transistor 400 is formed. Alternatively, diffusion of impurities such as hydrogen and water from a layer above the insulator 282 and a layer below the insulator 214 into the transistor 200 can be suppressed.

That is, oxygen from the excess-oxygen region of the insulator 280 can be efficiently supplied to the oxide where the channel is formed in the transistor 200, so that oxygen vacancies can be reduced. Moreover, oxygen vacancies can be prevented from being formed by impurities in the oxide where the channel is formed in the transistor 200. Thus, the oxide where the channel is formed in the transistor 200 can be an oxide semiconductor with a low density of defect states and stable characteristics. That is, a change in electrical characteristics of the transistor 200 can be suppressed and the reliability can be improved.

The capacitor 410 and a conductor 474 are provided above the insulator 470. The capacitor 410 is provided over the insulator 470 and includes a conductor 462, an insulator 480, an insulator 482, an insulator 484, and a conductor 466. Note that the conductor 474 functions as a plug or a wiring that is electrically connected to the capacitor 410, the transistor 200, or the transistor 400.

For the conductor 462, a conductive material such as a metal material, an alloy material, or a metal oxide material can be used. It is preferable to use a high-melting-point material that has both heat resistance and conductivity, such as tungsten or molybdenum, and it is particularly preferable to use tungsten. In addition, in the case of formation at the same time as another structure such as a conductor, copper, aluminum, or the like which is a low-resistance metal material may be used.

Note that the conductor 474 can be formed using a material similar to that of the conductor 462 functioning as an electrode of the capacitor.

The insulator 480, the insulator 482, and the insulator 484 are provided over the conductor 474 and the conductor 462. For example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like may be used for the insulator 480, the insulator 482, and the insulator 484. Note that the three-layer structure is shown in the drawing, a single layer or a stacked-layer structure of two layers or four or more layers may be employed.

For example, it is preferable to use a material with high dielectric strength, such as silicon oxynitride, for the insulator 480 and the insulator 482, and use a stacked layer structure of a high dielectric constant (high-k) material, such as aluminum oxide, and a material with high dielectric strength, such as silicon oxynitride, for the insulator 484. With such a structure, the capacitor 410 includes the high dielectric constant (high-k) insulator, so that a sufficient capacitance can be ensured, and includes the insulator with high dielectric strength, so that the dielectric strength can be increased and the electrostatic breakdown of the capacitor 410 can be suppressed.

The conductor 466 is provided over the conductor 462 with the insulator 480, the insulator 482, and the insulator 484 positioned therebetween. Note that a conductive material such as a metal material, an alloy material, or a metal oxide material can be used for the conductor 466. It is preferable to use a high-melting-point material that has both heat resistance and conductivity, such as tungsten or molybdenum, and it is particularly preferable to use tungsten. In addition, in the case of formation at the same time as another structure such as a conductor, copper, aluminum, or the like which is a low-resistance metal material may be used.

For example, as illustrated in FIG. 73, the insulator 480, the insulator 482, and the insulator 484 are provided to cover a top surface and side surfaces of the conductor 462. Furthermore, the conductor 466 is provided to cover a top surface and side surfaces of the conductor 462 with the insulator 480, the insulator 482, and the insulator 484 positioned therebetween.

That is, a capacitor is formed also on the side surfaces of the conductor 462, so that a capacitance per projected area of the capacitor can be increased. Thus, the semiconductor device can be reduced in area, highly integrated, and miniaturized.

An insulator 460 is provided over the conductor 466 and the insulator 484. The insulator 460 can be formed using a material similar to that of the insulator 420. In addition, the insulator 460 that covers the capacitor 410 may function as a planarization film that covers an uneven shape thereunder.

The above is the description of the application example.

At least part of this embodiment can be implemented in combination with the other embodiments described in this specification as appropriate.

Embodiment 8

In this embodiment, a display device including a semiconductor device of one embodiment of the present invention will be described with reference to FIGS. 74A to 74C.
<8. Circuit Configuration of Display Device>

A display device illustrated in FIG. 74A includes a region including pixels (hereinafter referred to as a pixel portion 502), a circuit portion which is positioned outside the pixel portion 502 and includes a circuit for driving the pixels (hereinafter referred to as a driver circuit portion 504), circuits having a function of protecting elements (hereinafter referred to as protection circuits 506), and a terminal portion 507. Note that a structure in which the protection circuits 506 are not provided may be employed.

Part or the whole of the driver circuit portion 504 is preferably formed over the same substrate as the pixel portion 502. Thus, the number of components and the number of terminals can be reduced. In the case where part or the whole of the driver circuit portion 504 is not formed over the same substrate as the pixel portion 502, the part or the whole of the driver circuit portion 504 can be mounted by COG or TAB (Tape Automated Bonding).

The pixel portion 502 includes a plurality of circuits for driving display elements arranged in X rows (X is a natural number of 2 or more) and Y columns (Y is a natural number of 2 or more) (hereinafter referred to as pixel circuits 501), and the driver circuit portion 504 includes driver circuits such as a circuit for outputting a signal (scan signal) to select a pixel (hereinafter referred to as a gate driver 504a) and a circuit for supplying a signal (data signal) to drive a display element in a pixel (hereinafter, a source driver 504b).

The gate driver 504a includes a shift register or the like. The gate driver 504a, to which a signal for driving the shift register is input through the terminal portion 507, outputs a signal. For example, the gate driver 504a, to which a start pulse signal, a clock signal, or the like is input, outputs a pulse signal. The gate driver 504a has a function of controlling the potentials of wirings supplied with scan signals (hereinafter referred to as scan lines GL_1 to GL_X). Note that a plurality of gate drivers 504a may be provided and the plurality of gate drivers 504a may control the scan lines GL_1 to GL_X in a divided manner. Alternatively, the gate driver 504a has a function of being capable of supplying an initialization signal. However, this does not impose any limitation, and the gate driver 504a can also supply another signal.

The source driver 504b includes a shift register or the like. To the source driver 504b, a signal (image signal) which is the basis of a data signal, as well as a signal for driving the shift register, is input through the terminal portion 507. The source driver 504b has a function of generating a data signal to be written to the pixel circuit 501 which is based on the image signal. In addition, the source driver 504b has a function of controlling the output of a data signal in accordance with a pulse signal obtained by input of a start pulse, a clock signal, or the like. Furthermore, the source driver 504b has a function of controlling the potentials of wirings supplied with data signals (hereinafter referred to as data lines DL_1 to DL_Y). Alternatively, the source driver 504b has a function of being capable of supplying an initialization signal. Without being limited thereto, the source driver 504b can also supply another signal.

The source driver 504b is configured using a plurality of analog switches, for example. The source driver 504b can output, as data signals, signals obtained by time-dividing the image signal by sequentially turning on the plurality of analog switches. In addition, the source driver 504b may be configured using a shift register or the like.

A pulse signal and a data signal are input to each of the plurality of pixel circuits 501 through one of the plurality of scan lines GL supplied with scan signals and one of the plurality of data lines DL supplied with data signals, respectively. In addition, writing and holding of data of the data signal in each of the plurality of pixel circuits 501 are controlled by the gate driver 504a. For example, to the pixel circuit 501 in the m-th row and the n-th column, a pulse signal is input from the gate driver 504a through the scan line GL_m (m is a natural number of X or less), and a data signal is input from the source driver 504b through the data line DL_n (n is a natural number of Y or less) in accordance with the potential of the scan line GL_m.

Figure 74A:
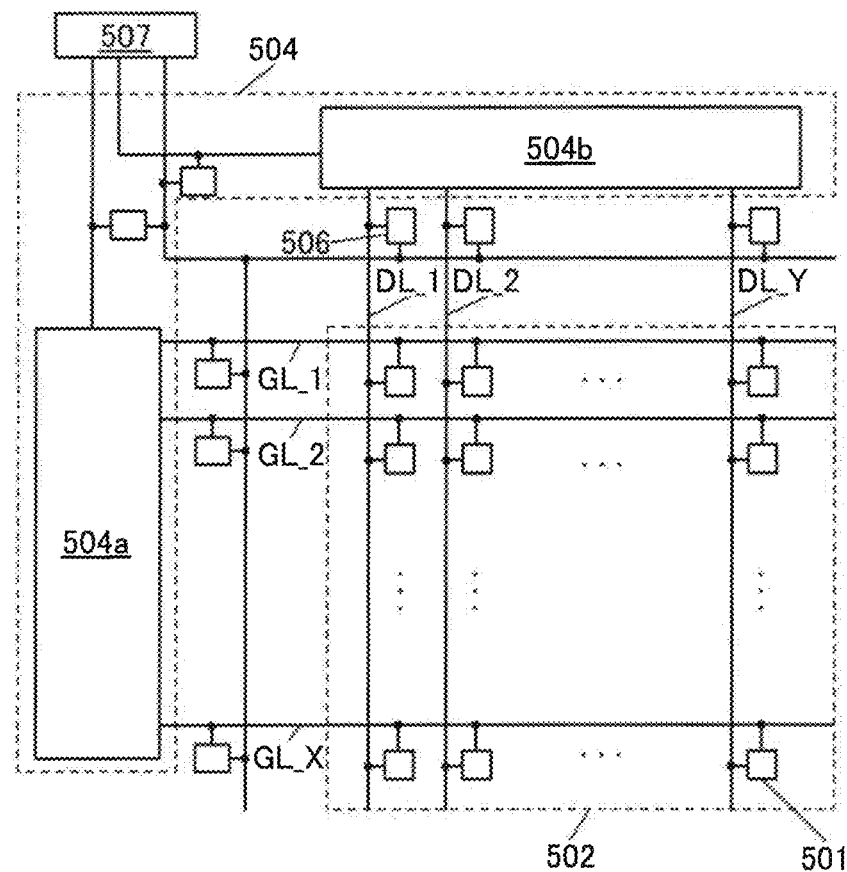
FIGS. 74A to 74C are a block diagram and circuit diagrams illustrating a display device.

The protection circuit 506 illustrated in FIG. 74A is connected to, for example, the scan line GL that is a wiring between the gate driver 504a and the pixel circuit 501. Alternatively, the protection circuit 506 is connected to the data line DL that is a wiring between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 refers to a portion provided with terminals for inputting power, control signals, and image signals from external circuits to the display device.

The protection circuit 506 is a circuit that brings a wiring connected to the protection circuit and another wiring into a conductive state when a potential out of a certain range is supplied to the wiring connected to the protection circuit.

As illustrated in FIG. 74A, the protection circuits 506 provided for the pixel portion 502 and the driver circuit portion 504 can improve the resistance of the display device to overcurrent generated by ESD (Electro Static Discharge) or the like. Note that the configuration of the protection circuits 506 is not limited thereto; for example, a configuration in which the protection circuit 506 is connected to the gate driver 504a or a configuration in which the protection circuit 506 is connected to the source driver 504b can be employed. Alternatively, a configuration in which the protection circuit 506 is connected to the terminal portion 507 can be employed.

In addition, FIG. 74A illustrates the example in which the driver circuit portion 504 is formed by the gate driver 504a and the source driver 504b; however, this configuration does not impose any limitation. For example, a configuration may be employed in which only the gate driver 504a is formed and a separately prepared substrate on which a source driver circuit is formed (e.g., a driver circuit board formed with a single-crystal semiconductor film or a polycrystalline semiconductor film) is mounted.

Figure 74B:
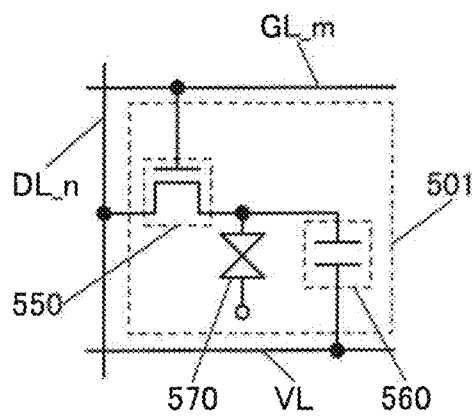

In addition, the plurality of pixel circuits 501 illustrated in FIG. 74A can have the configuration illustrated in FIG. 74B, for example.

The pixel circuit 501 illustrated in FIG. 74B includes a liquid crystal element 570, a transistor 550, and a capacitor 560. As the transistor 550, the transistor described in the above embodiment can be used.

The potential of one of a pair of electrodes of the liquid crystal element 570 is set as appropriate in accordance with the specifications of the pixel circuit 501. The alignment state of the liquid crystal element 570 is set by data written thereto. Note that a common potential may be supplied to the one of the pair of electrodes of the liquid crystal element 570 included in each of the plurality of pixel circuits 501. In addition, the one of the pair of electrodes of the liquid crystal element 570 in the pixel circuit 501 in each row may be supplied with a different potential.

For example, as a method for driving the display device including the liquid crystal element 570, a TN mode, an STN mode, a VA mode, an ASM (Axially Symmetric aligned Micro-cell) mode, an OCB (Optically Compensated Birefringence) mode, an FLC (Ferroelectric Liquid Crystal) mode, an AFLC (AntiFerroelectric Liquid Crystal) mode, an MVA mode, a PVA (Patterned Vertical Alignment) mode, an IPS mode, an FFS mode, a TBA (Transverse Bend Alignment) mode, or the like may be used. In addition, as a method for driving the display device other than the above driving method, there is an ECB (Electrically Controlled Birefringence) mode, a PDLC (Polymer Dispersed Liquid Crystal) mode, a PNLC (Polymer Network Liquid Crystal) mode, a guest-host mode, or the like. However, this does not impose any limitation, and various liquid crystal elements and driving methods thereof can be used.

In the pixel circuit 501 in the m-th row and the n-th column, one of a source electrode and a drain electrode of the transistor 550 is electrically connected to the data line DL_n, and the other thereof is electrically connected to the other of the pair of electrodes of the liquid crystal element 570. In addition, a gate electrode of the transistor 550 is electrically connected to the scan line GL_m. The transistor 550 has a function of controlling writing of data of a data signal by being turned on or off.

One of a pair of electrodes of the capacitor 560 is electrically connected to a wiring through which a potential is supplied (hereinafter, a potential supply line VL), and the other thereof is electrically connected to the other of the pair of electrodes of the liquid crystal element 570. Note that the value of the potential of the potential supply line VL is set as appropriate in accordance with the specifications of the pixel circuit 501. The capacitor 560 functions as a storage capacitor for storing written data.

For example, in the display device including the pixel circuits 501 in FIG. 74B, the gate driver 504a illustrated in FIG. 74A sequentially selects the pixel circuits 501 row by row to turn on the transistors 550, and data of data signals are written.

When the transistor 550 is turned off, the pixel circuit 501 to which the data has been written is brought into a holding state. This is sequentially performed row by row; thus, an image can be displayed.

Figure 74C:
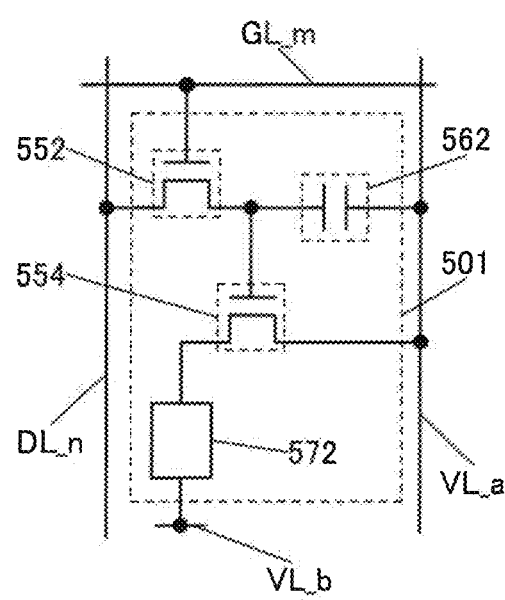

In addition, the plurality of pixel circuits 501 illustrated in FIG. 74A can have the configuration illustrated in FIG. 74C, for example.

In addition, the pixel circuit 501 illustrated in FIG. 74C includes transistors 552 and 554, a capacitor 562, and a light-emitting element 572. The transistors described in the above embodiments can be used as the transistor 552 and/or the transistor 554.

One of a source electrode and a drain electrode of the transistor 552 is electrically connected to a wiring through which a data signal is supplied (hereinafter referred to as a data line DL_n). Furthermore, a gate electrode of the transistor 552 is electrically connected to a wiring through which a gate signal is supplied (hereinafter referred to as a scan line GL_m).

The transistor 552 has a function of controlling writing of data of a data signal by being turned on or off.

One of a pair of electrodes of the capacitor 562 is electrically connected to a wiring through which a potential is supplied (hereinafter referred to as a potential supply line VL_a), and the other thereof is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. Furthermore, a gate electrode of the transistor 554 is electrically connected to the other of the source electrode and the drain electrode of the transistor 552.

One of an anode and a cathode of the light-emitting element 572 is electrically connected to a potential supply line VL_b, and the other thereof is electrically connected to the other of the source electrode and the drain electrode of the transistor 554.

As the light-emitting element 572, an organic electroluminescence element (also referred to as an organic EL element) or the like can be used, for example. Note that the light-emitting element 572 is not limited thereto, and an inorganic EL element formed of an inorganic material may be used.

Note that a high power supply potential VDD is supplied to one of the potential supply line VL_a and the potential supply line VL_b, and a low power supply potential VSS is supplied to the other thereof.

For example, in the display device including the pixel circuits 501 in FIG. 74C, the gate driver 504a illustrated in FIG. 74A sequentially selects the pixel circuits 501 row by row to turn on the transistors 552, and data of data signals are written.

When the transistor 552 is turned off, the pixel circuit 501 to which the data has been written is brought into a holding state. Furthermore, the amount of current flowing between the source electrode and the drain electrode of the transistor 554 is controlled in accordance with the potential of the written data signal, and the light-emitting element 572 emits light with a luminance corresponding to the amount of flowing current. This is sequentially performed row by row; thus, an image can be displayed.

At least part of this embodiment can be implemented in combination with the other embodiments described in this specification as appropriate.

Embodiment 9

In this embodiment, circuit configuration examples to which the transistors described in the above embodiments can be applied will be described with reference to FIGS. 75A to 78B.

<9. Configuration Example of Inverter Circuit>

Figure 75A:
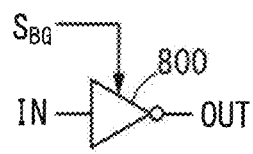
FIGS. 75A to 75C are circuit diagrams and a timing chart for illustrating one embodiment of the present invention.

FIG. 75A illustrates a circuit diagram of an inverter which can be used for a shift register, a buffer, or the like included in a driver circuit. An inverter 800 outputs a signal obtained by inverting the logic of an input terminal IN to an output terminal OUT. The inverter 800 includes a plurality of OS transistors. A signal Sao is a signal that can switch electrical characteristics of the OS transistors.

Figure 75B:
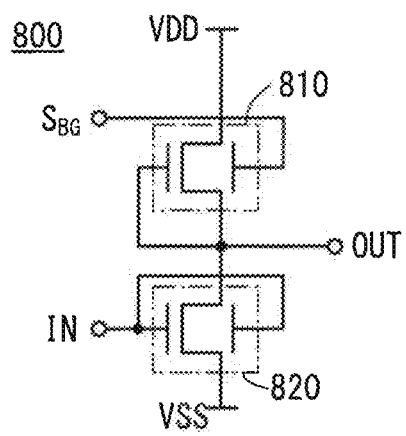

FIG. 75B shows an example of the inverter 800. The inverter 800 includes an OS transistor 810 and an OS transistor 820. The inverter 800 can be manufactured with only n-channel transistors, and thus can be formed at lower cost than in the case of manufacturing an inverter with a CMOS (Complementary Metal Oxide Semiconductor) (a CMOS inverter).

Note that the inverter 800 including the OS transistors can be positioned over a CMOS including Si transistors. Since the inverter 800 can be positioned to overlap with the CMOS circuit, an increase in circuit area for adding the inverter 800 can be suppressed.

The OS transistors 810 and 820 include a first gate functioning as a front gate, a second gate functioning as a back gate, a first terminal functioning as one of a source and a drain, and a second terminal functioning as the other of the source and the drain.

The first gate of the OS transistor 810 is connected to its second terminal. The second gate of the OS transistor 810 is connected to a wiring that supplies the signal $S_{BG}$. The first terminal of the OS transistor 810 is connected to a wiring that supplies a voltage VDD. The second terminal of the OS transistor 810 is connected to the output terminal OUT.

The first gate of the OS transistor 820 is connected to the input terminal IN. The second gate of the OS transistor 820 is connected to the input terminal IN. The first terminal of the OS transistor 820 is connected to the output terminal OUT. The second terminal of the OS transistor 820 is connected to a wiring that supplies a voltage VSS.

Figure 75C:
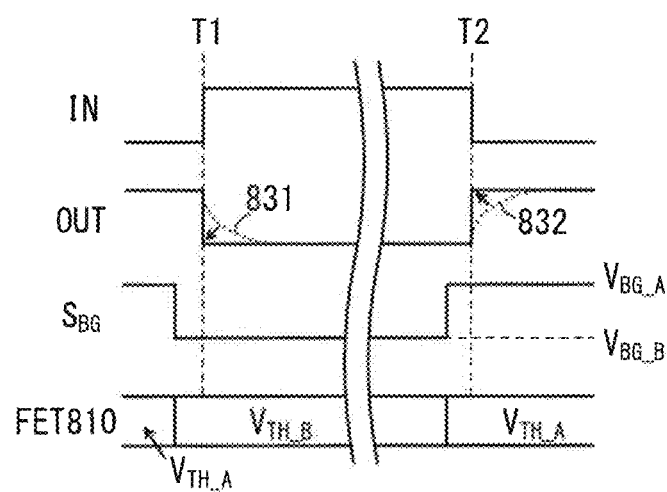

FIG. 75C is a timing chart for illustrating the operation of the inverter 800. The timing chart in FIG. 75C shows changes of a signal waveform of the input terminal IN, a signal waveform of the output terminal OUT, a signal waveform of the signal Sao, and the threshold voltage of the OS transistor 810.

The signal $S_{BG}$ can be supplied to the second gate of the OS transistor 810 to control the threshold voltage of the OS transistor 810.

The signal $S_{BG}$ includes a voltage $V_{BG\_A}$ for shifting the threshold voltage in the negative direction and a voltage $V_{BG\_B}$ for shifting the threshold voltage in the positive direction. The threshold voltage of the OS transistor 810 can be shifted in the negative direction to be a threshold voltage $V_{TH\_A}$ when the voltage $V_{BG\_A}$ is applied to the second gate. In addition, the threshold voltage of the OS transistor 810 can be shifted in the positive direction to be a threshold voltage $V_{TH\_B}$ when the voltage $V_{BG\_B}$ is applied to the second gate.

Figure 76A:
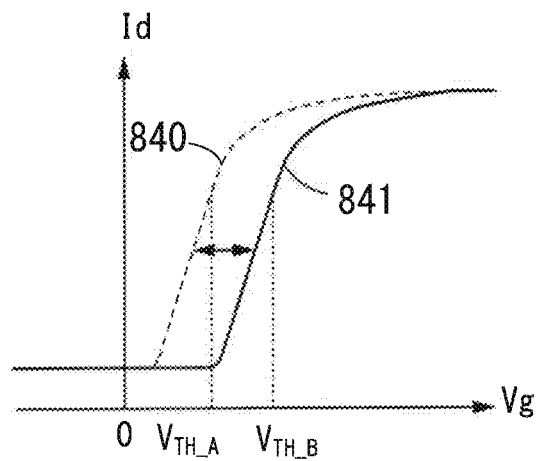
FIGS. 76A to 76C are a graph and circuit diagrams for illustrating one embodiment of the present invention.

To visualize the above description, FIG. 76A shows an Id-Vg curve, which is one of the electrical characteristics of a transistor.

When the voltage of the second gate is high like the voltage $V_{BG\_A}$, the electrical characteristics of the above OS transistor 810 can be shifted to a curve represented by a dashed line 840 in FIG. 76A. Furthermore, when the voltage of the second gate is low like the voltage $V_{BG\_B}$, the electrical characteristics of the above OS transistor 810 can be shifted to a curve represented by a solid line 841 in FIG. 76A. As illustrated in FIG. 76A, switching the signal $S_{BG}$ to the voltage $V_{BG\_A}$ or the voltage $V_{BG\_B}$ enables the threshold voltage of the OS transistor 810 to be shifted in the positive direction or the negative direction.

Figure 76B:
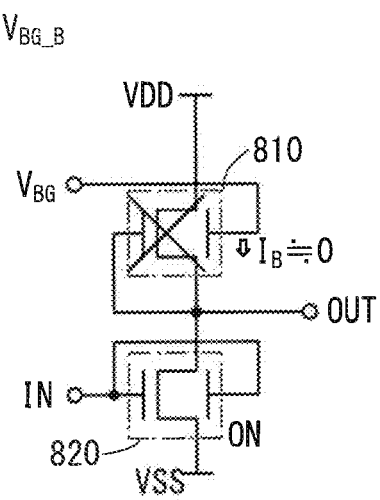

The shift of the threshold voltage in the positive direction toward the threshold voltage $V_{TH\_B}$ can make current less likely to flow in the OS transistor 810. FIG. 76B visualizes the state.

As illustrated in FIG. 76B, a current $I_B$ that flows in the OS transistor 810 can be extremely low. Thus, when a signal supplied to the input terminal IN is at a high level and the OS transistor 820 is turned on (ON), the voltage of the output terminal OUT can drop sharply.

Since a state in which current is less likely to flow in the OS transistor 810 as illustrated in FIG. 76B can be obtained, a signal waveform 831 of the output terminal in the timing chart illustrated in FIG. 75C can be changed to be steep. Shoot-through current flowing between the wiring that supplies the voltage VDD and the wiring that supplies the voltage VSS can be decreased, leading to operation with low power consumption.

Figure 76C:
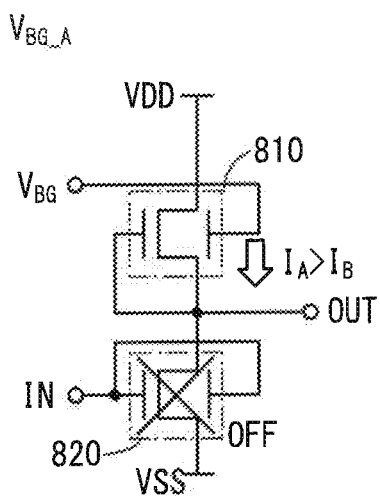

In addition, the shift of the threshold voltage in the negative direction toward the threshold voltage $V_{TH\_A}$ can make current flow easily in the OS transistor 810. FIG. 76C visualizes the state. As illustrated in FIG. 76C, a current $I_A$ flowing at this time can be higher than at least the current $I_B$. Thus, when a signal supplied to the input terminal IN is at a low level and the OS transistor 820 is turned off (OFF), the voltage of the output terminal OUT can be increased sharply. Since a state in which current is likely to flow in the OS transistor 810 as illustrated in FIG. 76C can be obtained, a signal waveform 832 of the output terminal in the timing chart illustrated in FIG. 75C can be changed to be steep.

Note that the threshold voltage of the OS transistor 810 is preferably controlled by the signal Sao before the state of the OS transistor 820 is switched, i.e., before time T1 or T2. For example, as illustrated in FIG. 75C, it is preferable that the threshold voltage of the OS transistor 810 be switched from the threshold voltage $V_{TH\_A}$ to the threshold voltage $V_{TH\_B}$ before time T1 at which the signal supplied to the input terminal IN is switched to a high level. Moreover, as illustrated in FIG. 75C, it is preferable that the threshold voltage of the OS transistor 810 be switched from the threshold voltage $V_{TH\_B}$ to the threshold voltage $V_{TH\_A}$ before time T2 at which the signal supplied to the input terminal IN is switched to a low level.

Figure 77A:
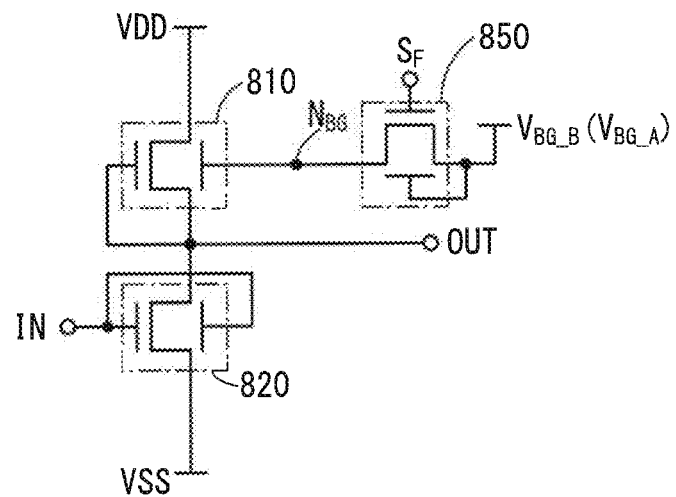
FIGS. 77A and 77B are a circuit diagram and a timing chart for illustrating one embodiment of the present invention.

Note that the timing chart in FIG. 75C shows the structure in which the signal $S_{BG}$ is switched in accordance with the signal supplied to the input terminal IN; however, a different structure may be employed. For example, a structure in which voltage for controlling the threshold voltage is held by the second gate of the OS transistor 810 in a floating state may be employed. FIG. 77A shows an example of a circuit configuration that makes the structure feasible.

In FIG. 77A, in addition to the circuit configuration illustrated in FIG. 75B, an OS transistor 850 is included. A first terminal of the OS transistor 850 is connected to the second gate of the OS transistor 810. In addition, a second terminal of the OS transistor 850 is connected to a wiring that supplies the voltage $V_{BG\_B}$ (or the voltage $V_{BG\_A}$). A first gate of the OS transistor 850 is connected to a wiring that supplies a signal $S_F$. A second gate of the OS transistor 850 is connected to the wiring that supplies the voltage $V_{BG\_B}$ (or the voltage $V_{BG\_A}$).

Figure 77B:
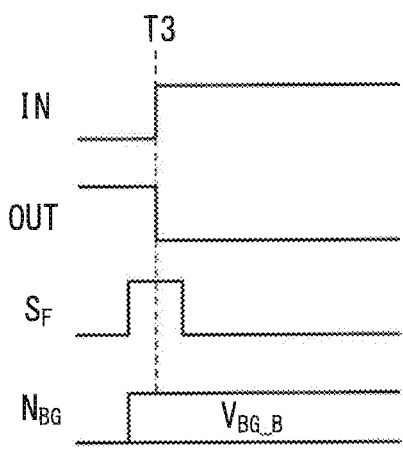

The operation in FIG. 77A will be described with reference to a timing chart in FIG. 77B.

In this structure, the voltage for controlling the threshold voltage of the OS transistor 810 is supplied to the second gate of the OS transistor 810 before time T3 at which the signal supplied to the input terminal IN is switched to a high level. The signal $S_F$ is set to a high level and the OS transistor 850 is turned on, so that the voltage $V_{BG\_B}$ for controlling the threshold voltage is supplied to a node $N_{BG}$.

The OS transistor 850 is turned off after the node $N_BG$ becomes the voltage $V_{BG\_B}$. Since the off-state current of the OS transistor 850 is extremely low, the voltage $V_{BG\_B}$ temporarily held by the node $N_{BG}$ can be retained while it remains off. Therefore, the number of times the voltage $V_{BG\_B}$ is supplied to the second gate of the OS transistor 850 can be reduced and accordingly, the power consumption needed to rewrite the voltage $V_{BG\_B}$ can be reduced.

Figure 78A:
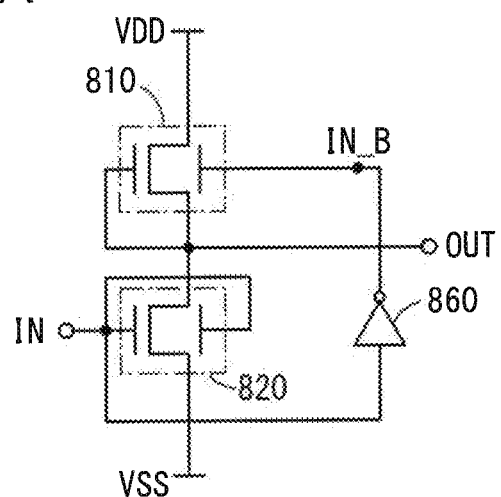
FIGS. 78A and 78B are a circuit diagram and a timing chart for illustrating one embodiment of the present invention.

Note that the circuit configurations in FIG. 75B and FIG. 77A show the structure in which the voltage supplied to the second gate of the OS transistor 810 is supplied by control from the outside; however, a different structure may be employed. For example, a structure in which voltage for controlling the threshold voltage is generated on the basis of the signal supplied to the input terminal IN and supplied to the second gate of the OS transistor 810 may be employed. FIG. 78A shows an example of a circuit configuration that makes the structure feasible.

In FIG. 78A, in the circuit configuration illustrated in FIG. 75B, a CMOS inverter 860 is included between the input terminal IN and the second gate of the OS transistor 810. An input terminal of the CMOS inverter 860 is connected to the input terminal IN. An output terminal of the CMOS inverter 860 is connected to the second gate of the OS transistor 810.

The operation in FIG. 78A will be described with reference to a timing chart in FIG. 78B. The timing chart in FIG. 78B shows changes of a signal waveform of the input terminal IN, a signal waveform of the output terminal OUT, an output waveform IN_B of the CMOS inverter 860, and the threshold voltage of the OS transistor 810.

The output waveform IN_B which corresponds to a signal obtained by inverting the logic of the signal supplied to the input terminal IN can be used as a signal that controls the threshold voltage of the OS transistor 810. Thus, the threshold voltage of the OS transistor 810 can be controlled as described with reference to FIGS. 76A to 76C. For example, the signal supplied to the input terminal IN is at a high level and the OS transistor 820 is turned on at time T4 in FIG. 78B. At this time, the output waveform IN_B is at a low level. Accordingly, current can be made less likely to flow in the OS transistor 810; thus, an increase in the voltage of the output terminal OUT can be sharply decreased.

Figure 78B:
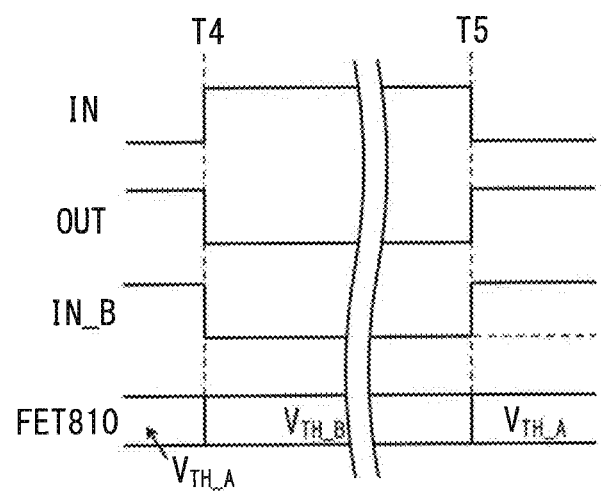

Moreover, the signal supplied to the input terminal IN is at a low level and the OS transistor 820 is turned off at time T5 in FIG. 78B. At this time, the output waveform IN_B is at a high level. Accordingly, current can be made to easily flow in the OS transistor 810; thus, the voltage of the output terminal OUT can be sharply increased.

As described above, in the configuration in this embodiment, the voltage of the back gate in the inverter including the OS transistor is switched in accordance with the logic of the signal of the input terminal IN. In such a configuration, the threshold voltage of the OS transistor can be controlled. The control of the threshold voltage of the OS transistor by the signal supplied to the input terminal IN can cause a steep change in the voltage of the output terminal OUT. Moreover, shoot-though current between the wirings that supply power supply voltages can be reduced. Thus, power consumption can be reduced.

At least part of this embodiment can be implemented in combination with the other embodiments described in this specification as appropriate.

Embodiment 10

In this embodiment, examples of a semiconductor device in which the transistors including an oxide semiconductor (OS transistors) described in the above embodiments are used in a plurality of circuits will be described with reference to FIGS. 79A to 82C.

<10. Circuit Configuration Example of Semiconductor Device>

Figure 79A:
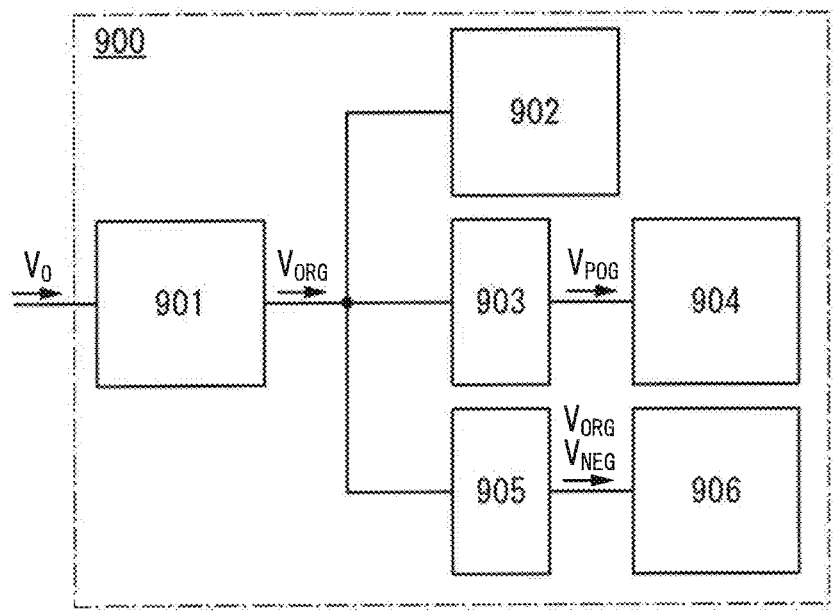
FIGS. 79A to 79E are a block diagram, circuit diagrams, and waveform diagrams for illustrating one embodiment of the present invention.

FIG. 79A is a block diagram of a semiconductor device 900. The semiconductor device 900 includes a power supply circuit 901, a circuit 902, a voltage generation circuit 903, a circuit 904, a voltage generation circuit 905, and a circuit 906.

The power supply circuit 901 is a circuit that generates a voltage $V_{ORG}$ used as a reference. The voltage $V_{ORG}$ is not necessarily one voltage and can be a plurality of voltages. The voltage $V_{ORG}$ can be generated on the basis of a voltage $V_0$ supplied from the outside of the semiconductor device 900. The semiconductor device 900 can generate the voltage $V_{ORG}$ on the basis of one power supply voltage supplied from the outside. Thus, the semiconductor device 900 can operate without supply of a plurality of power supply voltages from the outside.

The circuits 902, 904, and 906 are circuits that operate with different power supply voltages. For example, the power supply voltage of the circuit 902 is applied on the basis of the voltage $V_{ORG}$ and the voltage $V_{SS}$ ($V_{ORG}$>$V_{SS}$). In addition, for example, the power supply voltage of the circuit 904 is applied on the basis of a voltage $V_{POG}$ and the voltage $V_{SS}$ ($V_{POG}$>$V_{ORG}$). In addition, for example, the power supply voltages of the circuit 906 are applied on the basis of the voltage $V_{ORG}$ and a voltage $V_{NEG}$ ($V_{ORG}$>$V_{SS}$>$V_{NEG}$). Note that when the voltage $V_{SS}$ is equal to a ground potential (GND), the kinds of voltages generated by the power supply circuit 901 can be reduced.

The voltage generation circuit 903 is a circuit that generates the voltage $V_{POG}$. The voltage generation circuit 903 can generate the voltage $V_{POG}$ on the basis of the voltage $V_{ORG}$ supplied from the power supply circuit 901. Thus, the semiconductor device 900 including the circuit 904 can operate on the basis of one power supply voltage supplied from the outside.

The voltage generation circuit 905 is a circuit that generates the voltage $V_{NEG}$. The voltage generation circuit 905 can generate the voltage $V_{NEG}$ on the basis of the voltage $V_{ORG}$ supplied from the power supply circuit 901. Thus, the semiconductor device 900 including the circuit 906 can operate on the basis of one power supply voltage supplied from the outside.

Figure 79B:
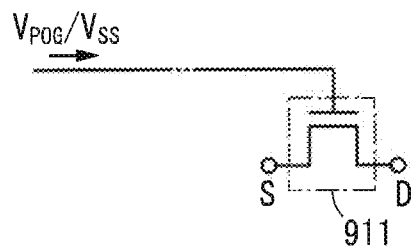
Figure 79C:
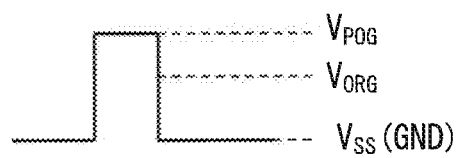

FIG. 79B shows an example of the circuit 904 that operates with the voltage $V_{POG}$ and FIG. 79C shows an example of a waveform of a signal for operating the circuit 904.

FIG. 79B illustrates a transistor 911. A signal supplied to a gate of the transistor 911 is generated on the basis of, for example, the voltage $V_{POG}$ and the voltage $V_{SS}$. The signal is set to the voltage $V_{POG}$ at the time of operation to bring the transistor 911 into a conductive state and the voltage $V_{SS}$ at the time of operation to bring it into a non-conductive state. As illustrated in FIG. 79C, the voltage $V_{POG}$ is higher than the voltage $V_{ORG}$. Thus, the operation to bring a portion between a source (S) and a drain (D) of the transistor 911 into a conductive state can be performed more reliably. As a result, the circuit 904 can be a circuit with reduced malfunction.

Figure 79D:
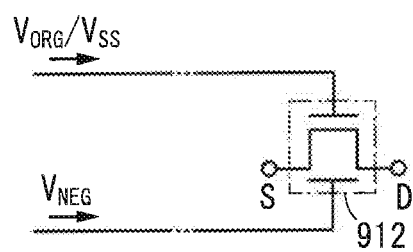
Figure 79E:
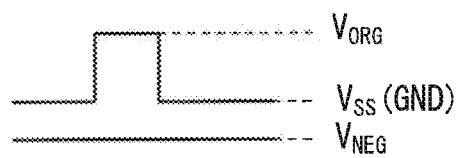

FIG. 79D shows an example of the circuit 906 that operates with the voltage $V_{NEG}$ and FIG. 79E shows an example of a waveform of a signal for operating the circuit 906.

FIG. 79D illustrates a transistor 912 having a back gate. A signal supplied to a gate of the transistor 912 is generated on the basis of, for example, the voltage $V_{ORG}$ and the voltage $V_{SS}$. The signal is generated on the basis of the voltage $V_{ORG}$ at the time of operation to bring the transistor 911 into a conductive state and the voltage $V_{SS}$ at the time of operation to bring it into a non-conductive state. In addition, a signal supplied to the back gate of the transistor 912 is generated on the basis of the voltage $V_{NEG}$. As illustrated in FIG. 79E, the voltage $V_{NEG}$ is lower than the voltage $V_{SS}$ (GND). Thus, the threshold voltage of the transistor 912 can be controlled to shift in the positive direction. Thus, the transistor 912 can be reliably brought into a non-conductive state and a current flowing between a source (S) and a drain (D) can be reduced. As a result, the circuit 906 can be a circuit with reduced malfunction and reduced power consumption.

Note that a structure in which the voltage $V_{NEG}$ is directly supplied to the back gate of the transistor 912 may be employed. Alternatively, a structure may be employed, in which a signal supplied to the gate of the transistor 912 is generated on the basis of the voltage $V_{ORG}$ and the voltage $V_{NEG}$ and the signal is supplied to the back gate of the transistor 912.

Figure 80A:
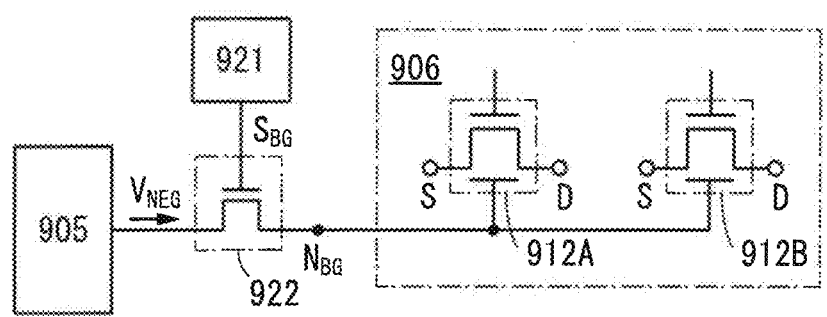
FIGS. 80A and 80B are a circuit diagram and a timing chart illustrating one embodiment of the present invention.
Figure 80B:
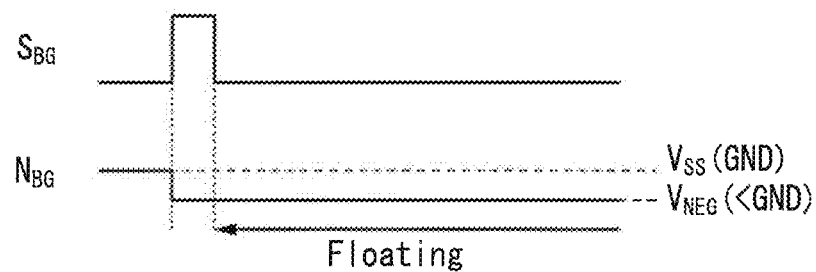

In addition, FIGS. 80A and 80B show a modification example of FIGS. 79D and 79E.

In a circuit diagram illustrated in FIG. 80A, a transistor 922 whose conductive state can be controlled by a control circuit 921 is shown between the voltage generation circuit 905 and the circuit 906. The transistor 922 is an n-channel OS transistor. The control signal $S_{BG}$ output from the control circuit 921 is a signal for controlling the conductive state of the transistor 922. In addition, transistors 912A and 912B included in the circuit 906 are OS transistors like the transistor 922.

A timing chart in FIG. 80B illustrates the control signal $S_{BG}$ and the states of potentials of back gates of the transistors 912A and 912B as changes in a potential of the node $N_{BG}$. When the control signal $S_{BG}$ is at a high level, the transistor 922 is turned on and the node $N_{BG}$ becomes the voltage $V_{NEG}$. Then, when the control signal $S_{BG}$ is at a low level, the node $N_{BG}$ becomes electrically floating. Since the transistor 922 is an OS transistor, its off-state current is low. Accordingly, even when the node $N_{BG}$ is electrically floating, the voltage $V_{NEG}$ which has been supplied can be held.

Figure 81A:
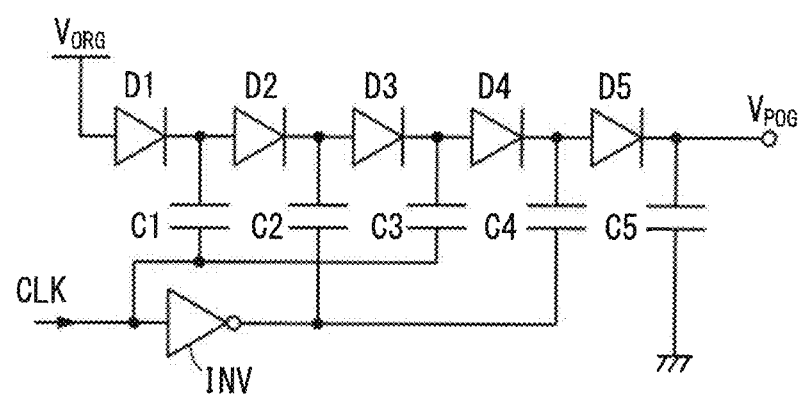
FIGS. 81A and 81B are circuit diagrams for illustrating one embodiment of the present invention.

In addition, FIG. 81A illustrates an example of a circuit configuration applicable to the above-described voltage generation circuit 903. The voltage generation circuit 903 illustrated in FIG. 81A is a five-stage charge pump including diodes D1 to D5, capacitors C1 to C5, and an inverter INV. A clock signal CLK is supplied to the capacitors C1 to C5 directly or through the inverter INV. When a power supply voltage of the inverter INV is applied on the basis of the voltage $V_{ORG}$ and the voltage $V_{SS}$, the voltage $V_{POG}$, which has been increased to a positive voltage having a positively quintupled value of the voltage $V_{ORG}$ by the clock signal CLK, can be obtained. Note that the forward voltage of the diodes D1 to D5 is 0 V. In addition, the number of stages of the charge pump can be changed to obtain a desired voltage $V_{POG}$.

Figure 81B:
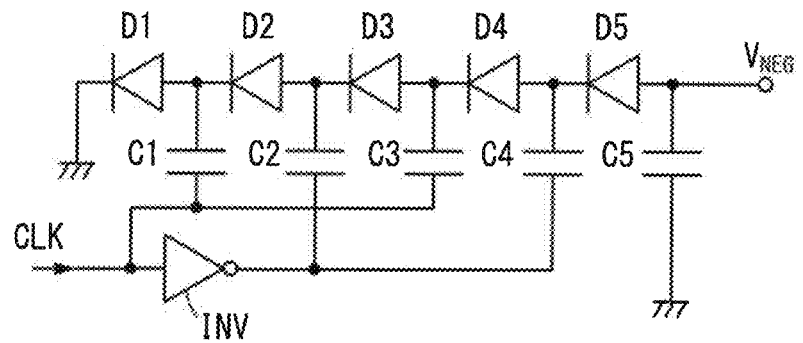

In addition, FIG. 81B illustrates an example of a circuit configuration applicable to the above-described voltage generation circuit 905. The voltage generation circuit 905 illustrated in FIG. 81B is a four-stage charge pump including diodes D1 to D5, capacitors C1 to C5, and an inverter INV. A clock signal CLK is supplied to the capacitors C1 to C5 directly or through the inverter INV. When a power supply voltage of the inverter INV is applied on the basis of the voltage $V_{ORG}$ and the voltage $V_{SS}$, the voltage $V_{NEG}$, which has been decreased from the ground, i.e., the voltage $V_{SS}$, to a negative voltage having a negatively quadrupled value of the voltage $V_{ORG}$ by the clock signal CLK, can be obtained. Note that the forward voltage of the diodes D1 to D5 is 0 V. In addition, the number of stages of the charge pump can be changed to obtain a desired voltage $V_{NEG}$.

Figure 82A:
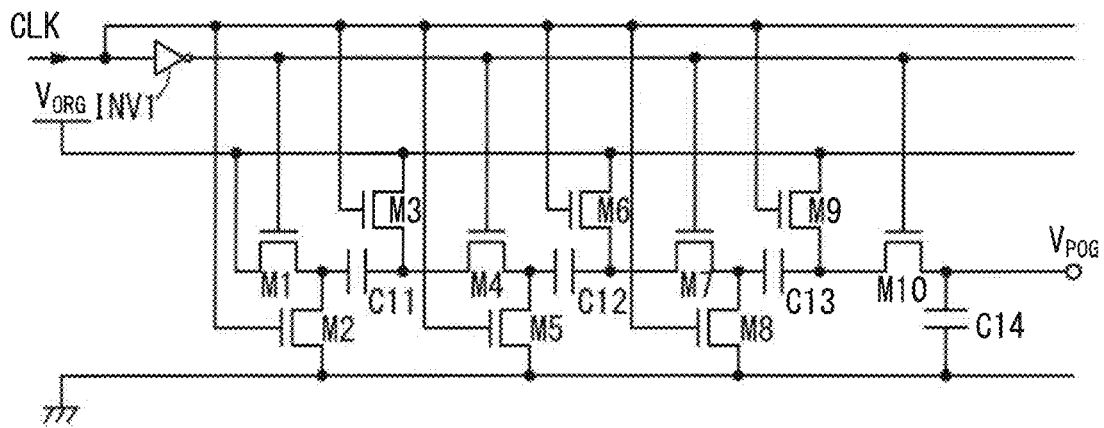
FIGS. 82A to 82C are circuit diagrams for illustrating one embodiment of the present invention.
Figure 82B:
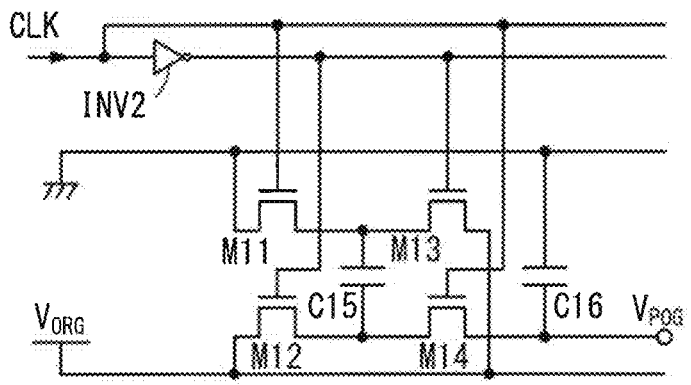
Figure 82C:
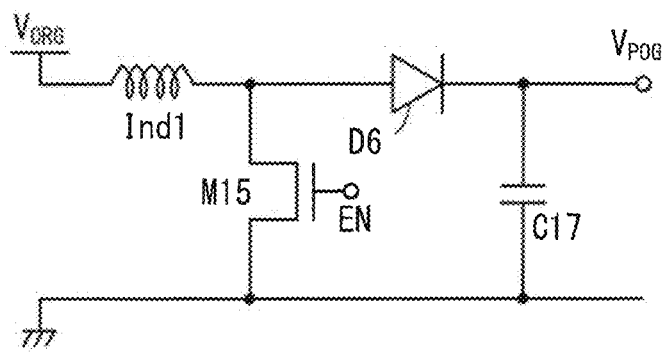

Note that the circuit configuration of the voltage generation circuit 903 described above is not limited to the configuration in the circuit diagram illustrated in FIG. 81A. For example, modification examples of the voltage generation circuit 903 are illustrated in FIGS. 82A to 82C. Note that the modification examples of the voltage generation circuit 903 are made feasible by changing voltages supplied to the wirings or changing the arrangement of elements in voltage generation circuits 903A to 903C illustrated in FIGS. 82A to 82C.

The voltage generation circuit 903A illustrated in FIG. 82A includes transistors M1 to M10, capacitors C11 to C14, and an inverter INV1. The clock signal CLK is supplied to gates of the transistors M1 to M10 directly or through the inverter INV1. By the clock signal CLK, the voltage $V_{POG}$, which has been increased to a positive voltage having a positively quadrupled value of the voltage $V_{ORG}$, can be obtained. Note that the number of stages can be changed to obtain a desired voltage $V_{POG}$. In the voltage generation circuit 903A illustrated in FIG. 82A, off-state current can be low when the transistors M1 to M10 are OS transistors, and leakage of charge held in the capacitors C11 to C14 can be suppressed. Accordingly, the voltage $V_{ORG}$ can be efficiently increased to the voltage $V_{POG}$.

In addition, the voltage generation circuit 903B illustrated in FIG. 82B includes transistors M11 to M14, capacitors C15 and C16, and an inverter INV2. The clock signal CLK is supplied to gates of the transistors M11 to M14 directly or through the inverter INV2. By the clock signal CLK, the voltage $V_{POG}$, which has been increased to a positive voltage having a positively doubled value of the voltage $V_{ORG}$, can be obtained. In the voltage generation circuit 903B illustrated in FIG. 82B, off-state current can be low when the transistors M11 to M14 are OS transistors, and leakage of charge held in the capacitors C15 and C16 can be suppressed. Accordingly, the voltage $V_{ORG}$ can be efficiently increased to the voltage $V_{POG}$.

In addition, a voltage generation circuit 903C illustrated in FIG. 82C includes an inductor Ind1, a transistor M15, a diode D6, and a capacitor C17. The conductive state of the transistor M15 is controlled by a control signal EN. Owing to the control signal EN, the voltage $V_{POG}$ increased from the voltage $V_{ORG}$ can be obtained. Since the voltage generation circuit 903C illustrated in FIG. 82C increases the voltage using the inductor Ind1, the voltage can be increased with high conversion efficiency.

As described above, in the configurations of this embodiment, voltage required for circuits included in the semiconductor device can be internally generated. Thus, in the semiconductor device, the number of power supply voltages supplied from the outside can be reduced.

At least part of this embodiment can be implemented in combination with the other embodiments described in this specification as appropriate.

Embodiment 11

In this embodiment, a display module and electronic devices which include a semiconductor device of one embodiment of the present invention will be described with reference to FIGS. 83 to 86B.

<11-1. Display Module>

Figure 83:
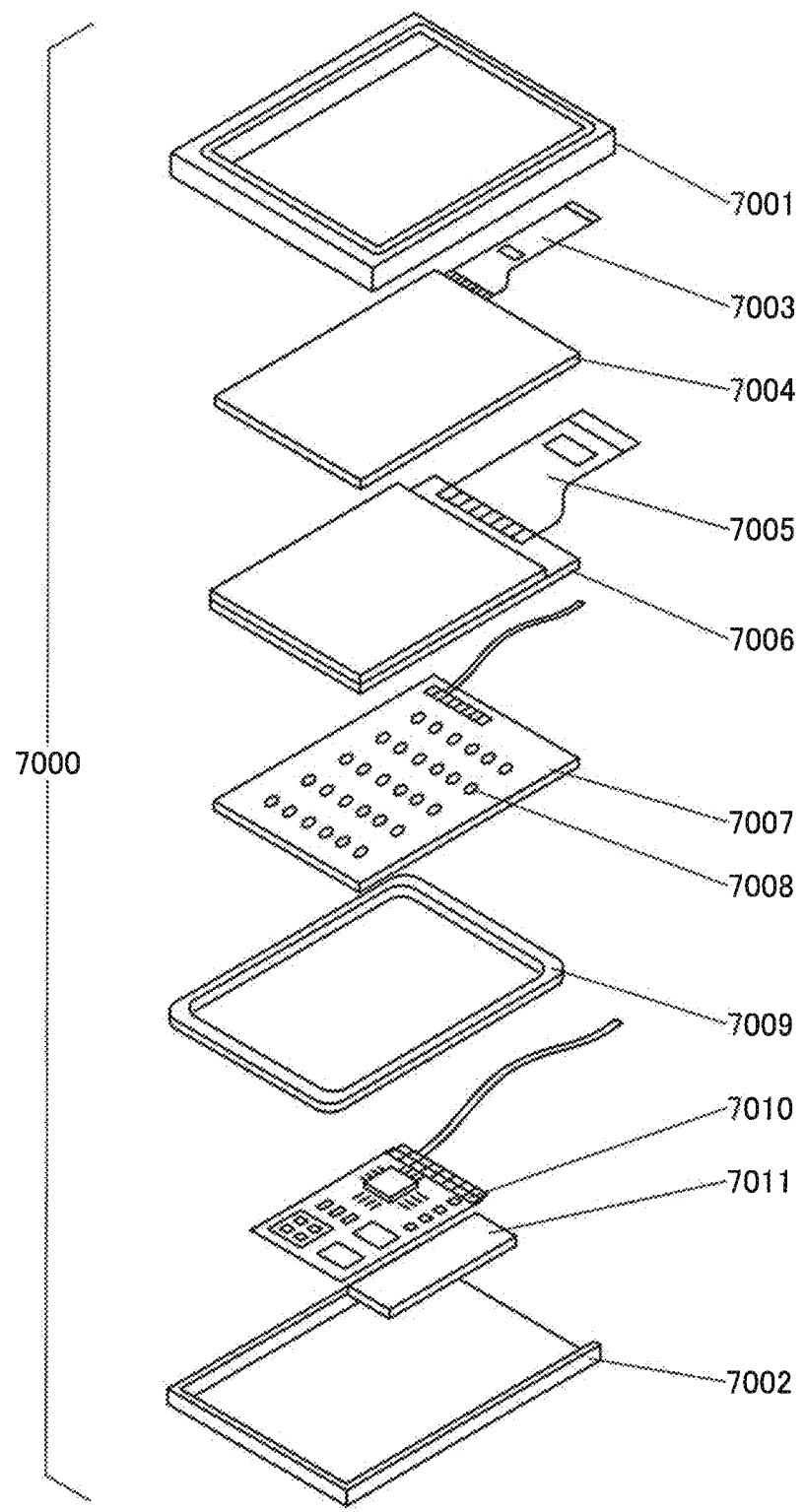
FIG. 83 illustrates a display module.

In a display module 7000 illustrated in FIG. 83, a touch panel 7004 connected to an FPC 7003, a display panel 7006 connected to an FPC 7005, a backlight 7007, a frame 7009, a printed board 7010, and a battery 7011 are included between an upper cover 7001 and a lower cover 7002.

The semiconductor device of one embodiment of the present invention can be used for the display panel 7006, for example.

The shapes and sizes of the upper cover 7001 and the lower cover 7002 can be changed as appropriate in accordance with the sizes of the touch panel 7004 and the display panel 7006.

As the touch panel 7004, a resistive or capacitive touch panel overlapping with the display panel 7006 can be used. In addition, a counter substrate (a sealing substrate) of the display panel 7006 can have a touch panel function. In addition, a photosensor can be provided in each pixel of the display panel 7006 to form an optical touch panel.

The backlight 7007 includes a light source 7008. Note that FIG. 83 illustrates as an example the structure in which the light source 7008 is positioned over the backlight 7007; however, this does not impose any limitation. For example, a structure in which the light source 7008 is positioned at an end portion of the backlight 7007 and a light diffusion plate is further used may be employed. Note that a structure in which the backlight 7007 is not provided may be employed in the case of using a self-luminous light-emitting element such as an organic EL element or in the case of a reflective panel or the like.

The frame 7009 has a function of protecting the display panel 7006 and a function as an electromagnetic shield for blocking electromagnetic waves generated by the operation of the printed board 7010. In addition, the frame 7009 may have a function as a radiator plate.

The printed board 7010 includes a power supply circuit and a signal processing circuit for outputting a video signal and a clock signal. A power source for supplying power to the power supply circuit may be an external commercial power source or may be the battery 7011 provided separately. The battery 7011 can be omitted in the case where a commercial power source is used.

In addition, the display module 7000 may be additionally provided with a member such as a polarizing plate, a retardation plate, or a prism sheet.

<11-2. Electronic Device 1>

Next, FIGS. 84A to 84E illustrate examples of electronic devices.

Figure 84A:
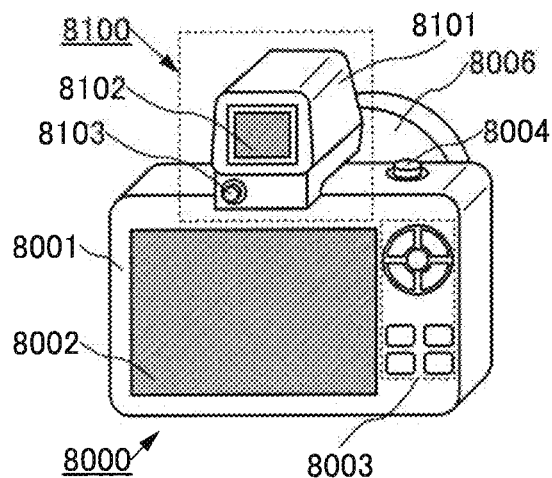
FIGS. 84A to 84E illustrate electronic devices.

FIG. 84A is a diagram illustrating an external view of a camera 8000 to which a finder 8100 is attached.

The camera 8000 includes a housing 8001, a display portion 8002, operation buttons 8003, a shutter button 8004, and the like. In addition, a detachable lens 8006 is attached to the camera 8000.

Although the structure in which the lens 8006 is detachable from the housing 8001 for replacement is described as the camera 8000 here, the lens 8006 may be integrated with the housing.

Images can be taken with the camera 8000 by pushing the shutter button 8004. In addition, the display portion 8002 has a function as a touch panel, and images can be taken when the display portion 8002 is touched.

The housing 8001 of the camera 8000 includes a mount including an electrode, so that the finder 8100, a stroboscope, or the like can be connected.

The finder 8100 includes a housing 8101, a display portion 8102, a button 8103, and the like.

The housing 8101 includes a mount for engagement with the mount of the camera 8000 so that the finder 8100 can be attached to the camera 8000. In addition, the mount includes an electrode, and an image or the like received from the camera 8000 through the electrode can be displayed on the display portion 8102.

The button 8103 has a function as a power button. The on/off of display by the display portion 8102 can be switched with the button 8103.

A display device of one embodiment of the present invention can be used in the display portion 8002 of the camera 8000 and the display portion 8102 of the finder 8100.

Note that FIG. 84A illustrates the structure in which the camera 8000 and the finder 8100 are separate electronic devices and these are detachable; however, the housing 8001 of the camera 8000 may incorporate a finder having a display device.

Figure 84B:
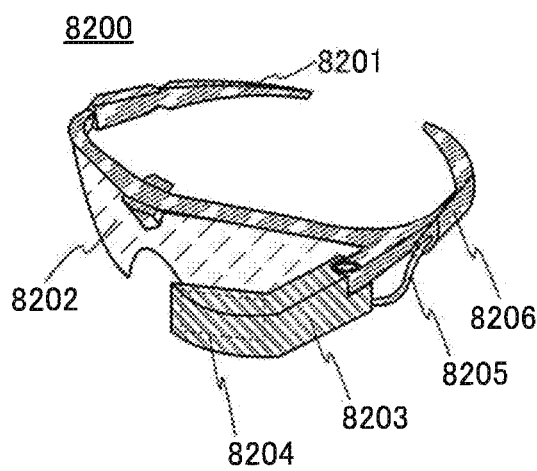

FIG. 84B is a diagram illustrating an external view of a head-mounted display 8200.

The head-mounted display 8200 includes a mounting portion 8201, a lens 8202, a main body 8203, a display portion 8204, a cable 8205, and the like. In addition, the mounting portion 8201 incorporates a battery 8206.

The cable 8205 supplies power from the battery 8206 to the main body 8203. The main body 8203 includes a wireless receiver or the like, so that received video data, such as image data, can be displayed on the display portion

8204. In addition, the movement of the eyeball and the eyelid of a user is captured by a camera provided in the main body 8203 and then coordinates of the view point of the user are calculated on the basis of the captured data to utilize the view point of the user as an input means.

In addition, the mounting portion 8201 may be provided with a plurality of electrodes in a position in contact with the user. The main body 8203 may have a function of sensing current flowing through the electrodes with the movement of the user's eyeball to recognize the view point of the user. In addition, it may have a function of sensing current flowing through the electrodes to monitor the user's pulse. In addition, the mounting portion 8201 may include sensors, such as a temperature sensor, a pressure sensor, or an acceleration sensor and may have a function of allowing the user's biological information to be displayed on the display portion 8204. In addition, the movement of the user's head or the like may be sensed to change an image displayed on the display portion 8204 in synchronization with the movement.

The display device of one embodiment of the present invention can be used in the display portion 8204.

Figure 84C:
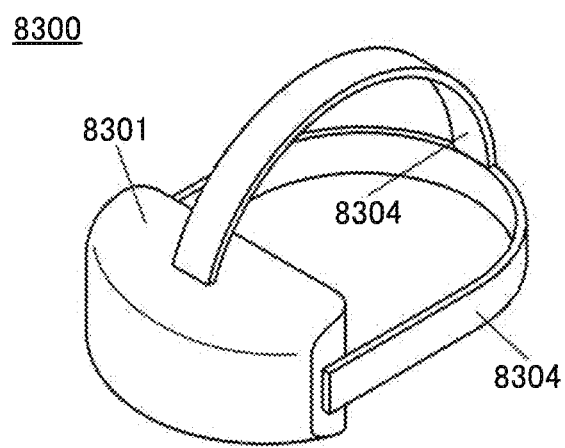
Figure 84D:
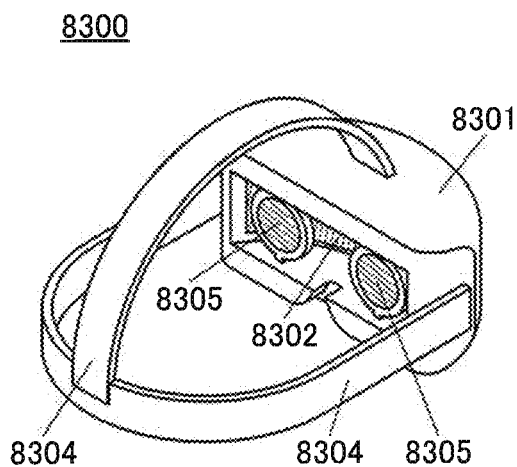
Figure 84E:
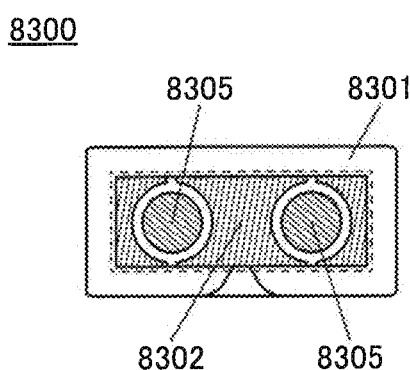

FIGS. 84C, 84D, and 84E are diagrams illustrating external views of a head-mounted display 8300. The head-mounted display 8300 includes a housing 8301, a display portion 8302, a band-like fastening device 8304, and a pair of lenses 8305.

A user can see display on the display portion 8302 through the lenses 8305. Note that it is favorable that the display portion 8302 be curved. When the display portion 8302 is curved and positioned, a user can feel a high sense of presence. Note that the structure in which one display portion 8302 is provided is described in this embodiment as an example; however, this does not impose any limitation, and a structure in which two display portions 8302 are provided may be employed. In this case, with a structure in which one display portion is provided for each eye of the user, three-dimensional display using parallax or the like can be performed.

Note that the display device of one embodiment of the present invention can be used in the display portion 8302. The display device including the semiconductor device of one embodiment of the present invention has an extremely high resolution; thus, even when an image displayed on the display portion 8302 is magnified using the lenses 8305 as in FIG. 84E, the user does not see pixels, and thus a more realistic image can be displayed.

<11-3. Electronic Device 2>

Next, FIGS. 85A to 85G illustrate examples of electronic devices that are different from the electronic devices illustrated in FIGS. 84A to 84E.

The electronic devices illustrated in FIGS. 85A to 85G include a housing 9000, a display portion 9001, a speaker 9003, an operation key 9005 (including a power switch or an operation switch), a connection terminal 9006, a sensor 9007 (having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIGS. 85A to 85G have a variety of functions. For example, they can have a function of displaying a variety of information (e.g., a still image, a moving image, and a text image) on the display portion, a touch panel function, a function of displaying a calendar, date, time, or the like, a function of controlling processing with a variety of software (programs), a wireless communication function, a function of being connected to a variety of computer networks with a wireless communication function, a function of transmitting or receiving a variety of data with a wireless communication function, a function of reading out a program or data stored in a recording medium and displaying it on the display portion, and the like. Note that functions that the electronic devices illustrated in FIGS. 85A to 85G can have are not limited thereto, and they can have a variety of functions. In addition, although not illustrated in FIGS. 85A to 85G, a structure in which the electronic devices have a plurality of display portions may be employed. Furthermore, the electronic devices may be provided with a camera and the like to have a function of taking a still image, a function of taking a moving image, a function of storing the taken image in a recording medium (outside or incorporated in the camera), a function of displaying the taken image on the display portion, or the like.

The details of the electronic devices illustrated in FIGS. 85A to 85G will be described below.

Figure 85A:
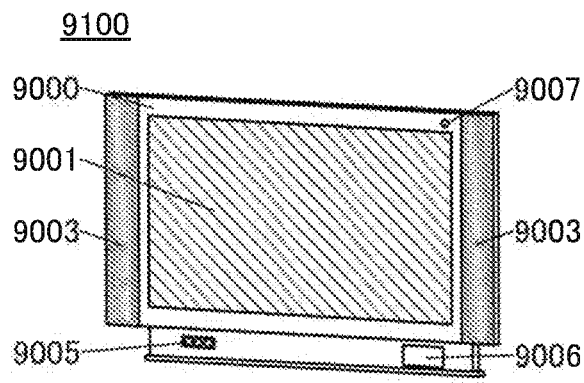
FIGS. 85A to 85G illustrate electronic devices.

FIG. 85A is a perspective view illustrating a television device 9100. The television device 9100 can include the display portion 9001 having a large screen of, for example, 50 inches or more, or 100 inches or more.

Figure 85D:
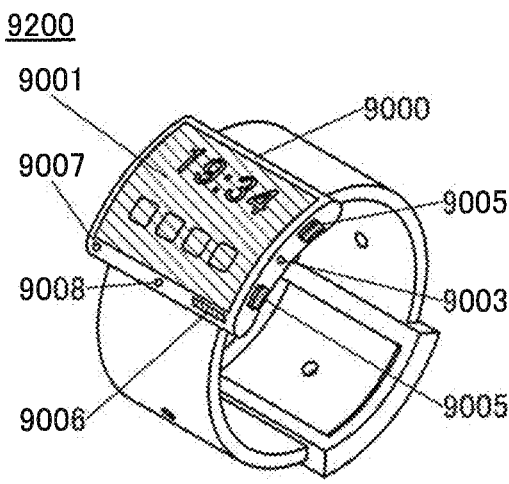
Figure 85B:
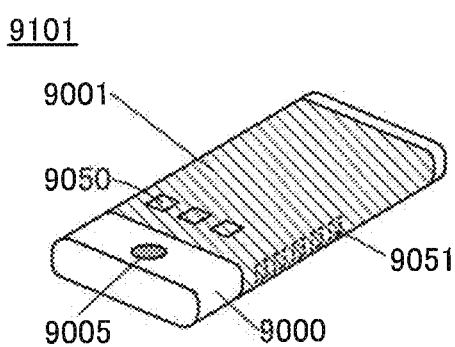

FIG. 85B is a perspective view illustrating a portable information terminal 9101. The portable information terminal 9101 has one or more functions selected from, for example, a telephone set, a notebook, an information browsing device, and the like. Specifically, it can be used as a smartphone. Note that the portable information terminal 9101 may be provided with a speaker, a connection terminal, a sensor, or the like. In addition, the portable information terminal 9101 can display text and image information on its plurality of surfaces. For example, three operation buttons 9050 (also referred to as operation icons or simply icons) can be displayed on one surface of the display portion 9001. Furthermore, information 9051 indicated by dashed rectangles can be displayed on another surface of the display portion 9001. Note that examples of the information 9051 include display indicating reception of an e-mail, an SNS (social networking service), or a telephone call, the subject of an e-mail, an SNS, or the like, the sender of an e-mail, an SNS, or the like, date, time, remaining battery, reception strength of an antenna, and the like. Alternatively, instead of the information 9051, the operation buttons 9050 or the like may be displayed at the position where the information 9051 is displayed.

Figure 85E:
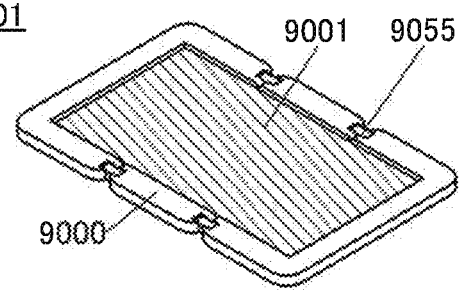
Figure 85C:
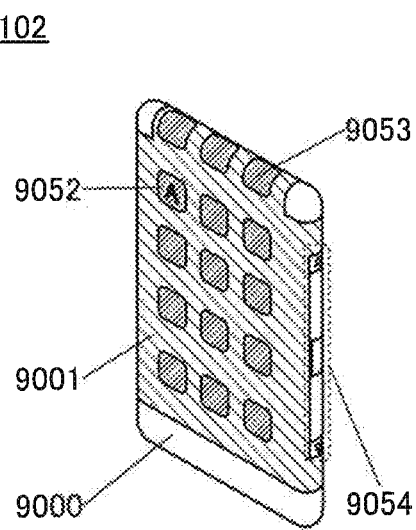

FIG. 85C is a perspective view illustrating a portable information terminal 9102. The portable information terminal 9102 has a function of displaying information on three or more surfaces of the display portion 9001. Here, an example is illustrated in which information 9052, information 9053, and information 9054 are displayed on different surfaces. For example, a user of the portable information terminal 9102 can check the display (here, the information 9053) in a state where the portable information terminal 9102 is put in a breast pocket of his/her clothes. Specifically, a caller's phone number, name, or the like of an incoming call is displayed in a position that can be observed from above the portable information terminal 9102. The user can check the display without taking out the portable information terminal 9102 from the pocket and decide whether to answer the call.

FIG. 85D is a perspective view illustrating a wrist-watch-type portable information terminal 9200. The portable information terminal 9200 is capable of executing a variety of applications such as mobile phone calls, e-mailing, text reading and editing, music reproduction, Internet communication, and a computer game. In addition, the display surface of the display portion 9001 is provided so as to be curved, and display can be performed on the curved display surface. In addition, the portable information terminal 9200 can perform near field communication that is a communication standard. For example, it enables hands-free calling by mutual communication with a headset capable of wireless communication. Moreover, the portable information terminal 9200 includes the connection terminal 9006 and can perform direct data exchange with another information terminal via a connector. In addition, charging can also be performed through the connection terminal 9006. Note that the charging operation may be performed by wireless power feeding without using the connection terminal 9006.

Figure 85F:
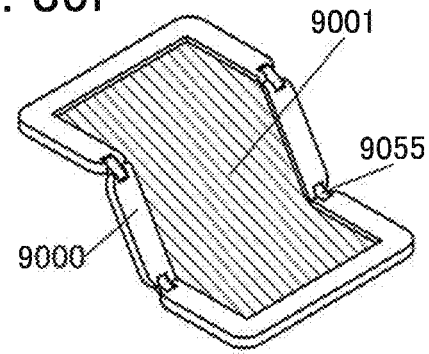
Figure 85G:
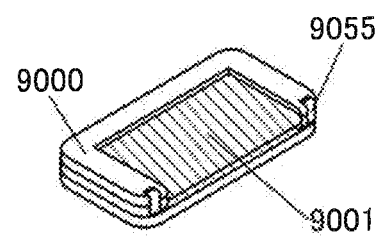

FIGS. 85E, 85F, and 85G are perspective views illustrating a foldable portable information terminal 9201. In addition, FIG. 85E is a perspective view of the portable information terminal 9201 that is opened; FIG. 85F is a perspective view of the portable information terminal 9201 that is being shifted from one of the opened state and the folded state to the other thereof; and FIG. 85G is a perspective view of the portable information terminal 9201 that is folded. The portable information terminal 9201 is highly portable in the folded state, and is highly browsable owing to a seamless large display region in the opened state. The display portion 9001 of the portable information terminal 9201 is supported by three housings 9000 joined by hinges 9055. By being folded at the hinges 9055 between the two housings 9000, the portable information terminal 9201 can be reversibly changed in shape from the opened state to the folded state. For example, the portable information terminal 9201 can be bent with a radius of curvature greater than or equal to 1 mm and less than or equal to 150 mm.

Figure 86A:
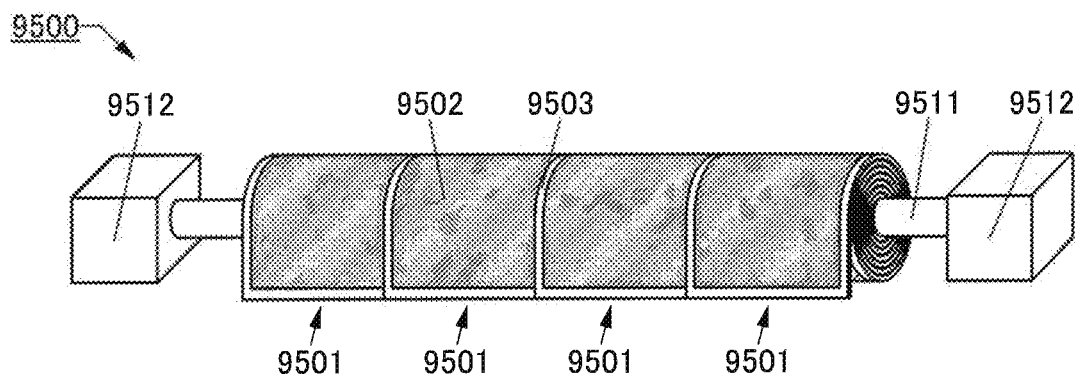
FIGS. 86A and 86B are perspective views illustrating a display device.
Figure 86B:
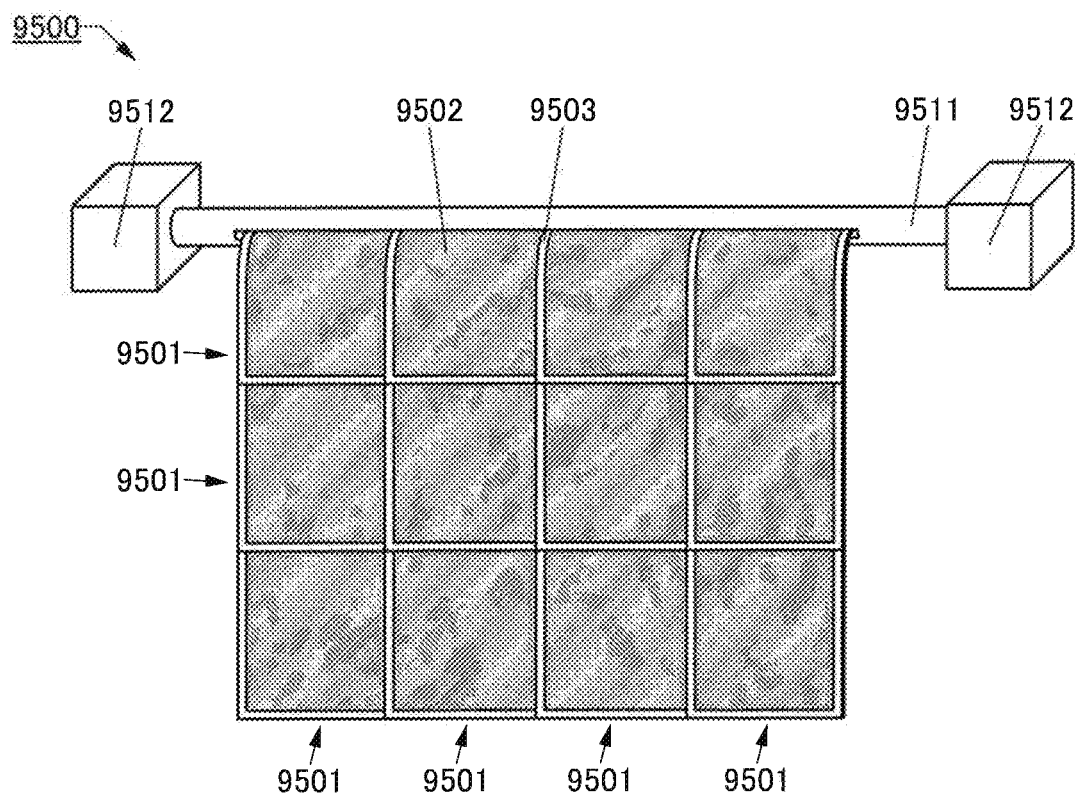

Next, an example of an electronic device that is different from the electronic devices illustrated in FIGS. 84A to 84E and the electronic devices illustrated in FIGS. 85A to 85G is illustrated in FIGS. 86A and 86B. FIGS. 86A and 86B are perspective views of a display device including a plurality of display panels. Note that FIG. 86A is a perspective view of a mode where the plurality of display panels are wound, and FIG. 86B is a perspective view in a state where the plurality of display panels are unwound.

A display device 9500 illustrated in FIGS. 86A and 86B includes a plurality of display panels 9501, a shaft portion 9511, and bearing portions 9512. In addition, the plurality of display panels 9501 include display regions 9502 and light-transmitting regions 9503.

In addition, the plurality of display panels 9501 have flexibility. In addition, two adjacent display panels 9501 are provided so as to partly overlap with each other. For example, the light-transmitting regions 9503 of the two adjacent display panels 9501 can overlap with each other. A large-screen display device can be obtained by using the plurality of display panels 9501. In addition, the display device can be highly versatile because the display panels 9501 can be wound depending on its use condition.

In addition, although FIGS. 86A and 86B illustrate the state in which the display regions 9502 are separated from each other between the adjacent display panels 9501, this does not impose any limitation, and for example, the display regions 9502 of the adjacent display panels 9501 may overlap with each other without any space so that a continuous display region 9502 is obtained.

The electronic devices described in this embodiment are characterized by having a display portion for displaying some sort of information. Note that the semiconductor device of one embodiment of the present invention can also be used for an electronic device that does not have a display portion.

At least part of this embodiment can be implemented in combination with the other embodiments described in this specification as appropriate.

Example

In this example, a metal oxide film corresponding to the sample A3 described in Embodiment 1 was used as a semiconductor film of a transistor, and a display device including the transistor was fabricated. Table 2 shows specifications of the display device fabricated in this example.

TABLE 2

| | |
|---|---|
| Panel Size | 5.46 inches (portrait) |
| Effective Pixel Count | 2160 × RGB (H) × 3840 (V): Quad Full-HD (4K) |
| Pixel Size | 10.5 μm (H) × 31.5 μm (V) |
| Panel External Dimension | 69.39 mm (H) × 127.36 mm (V) |
| Display Region | 6804 mm (H) × 120.96 mm (V) |
| Resolution | 806 ppi |
| LCD | Transmissive FFS mode |
| Coloring Method | CF method |
| Aperture Ratio | 45.0% |
| Driving Frequency | 60 Hz |
| Video Signal Format | Analog dot sequential (half division) |
| Gate Driver | Integrated |
| Source Driver | 4K-LTPS IC + DeMUX half division |

Figure 87:
FIG. 87 shows a display example of a display device in an example.

FIG. 87 shows a display example of the display device having the specifications shown in Table 2. As shown in FIG. 87, the display device fabricated in this example was confirmed to have favorable display quality.

Note that the structure described in this example can be combined with the structures described in the other embodiments as appropriate.

EXPLANATION OF REFERENCE NUMERALS 100 transistor
100A transistor
100B transistor
100C transistor
100D transistor
100E transistor
100F transistor
100G transistor
100H transistor
100J transistor
100K transistor
102 substrate
104 insulating film
106 conductive film
108 oxide semiconductor film
108_1 oxide semiconductor film
108_2 oxide semiconductor film
108_3 oxide semiconductor film
108d drain region
108f region
108i channel region
108s source region
110 insulating film
110a insulating film
112 conductive film
112_1 conductive film 112_2 conductive film
114 insulating film
116 insulating film
118 insulating film
120a conductive film
120b conductive film
122 insulating film
141a opening
141b opening
143 opening
200 transistor
205 conductor
205a conductor
205b conductor
210 insulator
212 insulator
214 insulator
216 insulator
218 conductor
220 insulator
222 insulator
224 insulator
230 oxide semiconductor
230a oxide semiconductor
230b oxide semiconductor
230c oxide semiconductor
240a conductor
240b conductor
244 conductor
245 conductor
250 insulator
260 conductor
260a conductor
260b conductor
270 insulator
280 insulator
282 insulator
284 insulator
300A transistor
300B transistor
300C transistor
300D transistor
300E transistor
300F transistor
300G transistor
302 substrate
304 conductive film
306 insulating film
307 insulating film
308 oxide semiconductor film
308_1 oxide semiconductor film
308_2 oxide semiconductor film
308_3 oxide semiconductor film
312a conductive film
312b conductive film
312c conductive film
314 insulating film
316 insulating film
318 insulating film
319 insulating film
320a conductive film
320b conductive film
341a opening
341b opening
342 opening
342a opening
342b opening
342c opening
344 conductive film
351 opening
352a opening
352b opening
400 transistor
401 substrate
402 semiconductor region
404 insulator
406 conductor
408a low-resistance region
408b low-resistance region
410 capacitor
420 insulator
422 insulator
424 insulator
426 insulator
428 conductor
430 conductor
450 insulator
452 insulator
454 insulator
456 conductor
458 insulator
460 insulator
462 conductor
466 conductor
470 insulator
474 conductor
480 insulator
482 insulator
484 insulator
501 pixel circuit
502 pixel portion
504 driver circuit portion
504a gate driver
504b source driver
506 protective circuit
507 terminal portion
550 transistor
552 transistor
554 transistor
560 capacitor
562 capacitor
570 liquid crystal element
572 light-emitting element
700 display device
701 substrate
702 pixel portion
704 source driver circuit portion
705 substrate
706 gate driver circuit portion
708 FPC terminal portion
710 signal line
711 wiring portion
712 sealant
716 FPC
730 insulating film
732 sealing film
734 insulating film
736 coloring film
738 light-blocking film
750 transistor
752 transistor
760 connection electrode
770 planarization insulating film
772 conductive film 773 insulating film
774 conductive film
775 liquid crystal element
776 liquid crystal layer
778 structure body
780 anisotropic conductive film
782 light-emitting element
783 droplet discharge apparatus
784 droplet
785 layer
786 EL layer
788 conductive film
790 capacitor
791 touch panel
792 insulating film
793 electrode
794 electrode
795 insulating film
796 electrode
797 insulating film
800 inverter
810 OS transistor
820 OS transistor
831 signal waveform
832 signal waveform
840 dashed line
841 solid line
850 OS transistor
860 CMOS inverter
900 semiconductor device
901 power supply circuit
902 circuit
903 voltage generation circuit
903A voltage generation circuit
903B voltage generation circuit
903C voltage generation circuit
904 circuit
905 voltage generation circuit
906 circuit
911 transistor
912 transistor
912A transistor
912B transistor
921 control circuit
922 transistor
950 transistor
952 substrate
954 insulating film
956 semiconductor film
958 insulating film
960 conductive film
962 insulating film
964 insulating film
966a conductive film
966b conductive film
968 insulating film
970 insulating film
972 insulating film
974 insulating film
1400 droplet discharge apparatus
1402 substrate
1403 droplet discharge means
1404 imaging means
1405 head
1406 dotted line
1407 control means
1408 storage medium
1409 image processing means
1410 computer
1411 marker
1412 head
1413 material supply source
1414 material supply source
7000 display module
7001 upper cover
7002 lower cover
7003 FPC
7004 touch panel
7005 FPC
7006 display panel
7007 backlight
7008 light source
7009 frame
7010 printed board
7011 battery
8000 camera
8001 housing
8002 display portion
8003 operation button
8004 shutter button
8006 lens
8100 finder
8101 housing
8102 display portion
8103 button
8200 head-mounted display
8201 mounting portion
8202 lens
8203 main body
8204 display portion
8205 cable
8206 battery
8300 head-mounted display
8301 housing
8302 display portion
8304 fastening device
8305 lens
9000 housing
9001 display portion
9003 speaker
9005 operation key
9006 connection terminal
9007 sensor
9008 microphone
9050 operation button
9051 information
9052 information
9053 information
9054 information
9055 hinge
9100 television device
9101 portable information terminal
9102 portable information terminal
9200 portable information terminal
9201 portable information terminal
9500 display device
9501 display panel
9502 display region
9503 region
9511 shaft portion
9512 bearing portion

The invention claimed is:

1. A metal oxide film comprising In, M (M is Al, Ga, Y, or Sn), and Zn, wherein:
the metal oxide film comprises a first crystal part and a second crystal part;
the first crystal part has c-axis alignment;
the second crystal part has no c-axis alignment; and
an existing proportion of the second crystal part is higher than an existing proportion of the first crystal part.

2. A metal oxide film comprising In, M (M is Al, Ga, Y, or Sn), and Zn, wherein:
the metal oxide film comprises a first crystal part and a second crystal part;
the first crystal part has c-axis alignment;
the second crystal part has no c-axis alignment;
in the case where an electron diffraction pattern of the metal oxide film is observed by performing electron diffraction measurement on a cross section,
the electron diffraction pattern comprises:
a first region comprising a diffraction spot derived from the first crystal part; and
a second region comprising a diffraction spot derived from the second crystal part; and
an integrated intensity of luminance in the first region is higher than an integrated intensity of luminance in the second region.

3. The metal oxide film according to claim 2,
wherein the integrated intensity of luminance in the first region is more than one time and less than or equal to 40 times the integrated intensity of luminance in the second region.

4. The metal oxide film according to claim 2,
the integrated intensity of luminance in the first region is more than one time and less than or equal to 10 times the integrated intensity of luminance in the second region.

5. The metal oxide film according to claim 2,
wherein the integrated intensity of luminance in the first region is more than one time and less than or equal to three times the integrated intensity of luminance in the second region.

6. The metal oxide film according to claim 2,
wherein the metal oxide film comprises a region where a peak value of a density of shallow defect states is less than $5\times10^{12}$ cm$^{-2}$eV$^{-1}$.

7. The metal oxide film according to claim 2, wherein:
an atomic ratio of the In to the M and the Zn in the metal oxide film is in a neighborhood of In:M:Zn=4:2:3; and
in the case where a ratio of the number of atoms of the In to a total number of atoms of the In, M, and Zn is 4, a ratio of the number of atoms of the M is greater than or equal to 1.5 and less than or equal to 2.5 and a ratio of the number of atoms of the Zn is greater than or equal to 2 and less than or equal to 4.

8. A semiconductor device comprising a semiconductor film, a gate insulating film, and a gate electrode,
wherein the semiconductor film comprises the metal oxide film according to claim 2.

9. A display device comprising the metal oxide film according to claim 2.

10. A metal oxide film,
wherein a first crystal part and a second crystal part are mixed in the metal oxide film,
wherein the first crystal part has c-axis alignment in a direction perpendicular to a surface of the metal oxide film,
wherein the second crystal part has no c-axis alignment in a direction perpendicular to a surface of the metal oxide film,
wherein a third region and a fourth region are mixed in the metal oxide film,
wherein the third region includes In, element M, Zn, and O,
wherein the fourth region includes In, element M, Zn, and O,
wherein element M in the third region and element M in the fourth region are Al, Ga, Y, or Sn,
wherein atomic ratio of In to element M in the third region is higher than atomic ratio of In to element M in the fourth region
wherein, in the case where an electron diffraction pattern of the metal oxide film is observed by performing electron diffraction measurement on a cross section, the electron diffraction pattern includes a first region including a diffraction spot derived from the first crystal part and a second region including a diffraction spot derived from the second crystal part, and
wherein the integrated intensity of the luminance in the first region is more than one time and less than or equal to 40 times the integrated intensity of the luminance in the second region.

11. The metal oxide film according to claim 10,
wherein, in the case where an electron diffraction pattern of the metal oxide film is observed by performing electron diffraction measurement on a cross section, the electron diffraction pattern includes a first region including a diffraction spot derived from the first crystal part and a second region including a diffraction spot derived from the second crystal part, and
wherein the integrated intensity of the luminance in the first region is more than one time and less than or equal to 10 times the integrated intensity of the luminance in the second region.

12. The metal oxide film according to claim 10,
wherein, in the case where an electron diffraction pattern of the metal oxide film is observed by performing electron diffraction measurement on a cross section, the electron diffraction pattern includes a first region including a diffraction spot derived from the first crystal part and a second region including a diffraction spot derived from the second crystal part, and
wherein the integrated intensity of the luminance in the first region is more than one time and less than or equal to 3 times the integrated intensity of the luminance in the second region.

13. The metal oxide film according to claim 10, wherein a ring-like pattern is observed in an electron diffraction pattern of the metal oxide film under a condition where a diameter of an electron beam is greater than or equal to 25 nmΦ and less than or equal to 100 nmΦ.

14. The metal oxide film according to claim 10, wherein a plurality of spots distributed in a circumferential direction is observed in an electron diffraction pattern of the metal oxide film under a condition where a diameter of an electron beam is greater than or equal to 1 nmΦ and less than or equal to 10 nmΦ.

15. A semiconductor device comprising a semiconductor film, a gate insulating film, and a gate electrode, wherein the semiconductor film includes the metal oxide film according to claim 10.

16. A metal oxide film,
wherein a first crystal part and a second crystal part are mixed in the metal oxide film, wherein the first crystal part has c-axis alignment in a direction perpendicular to a surface of the metal oxide film, wherein the second crystal part has no c-axis alignment in a direction perpendicular to a surface of the metal oxide film, wherein existing proportion of the second crystal part is higher than existing proportion of the first crystal part, wherein, in the case where an electron diffraction pattern of the metal oxide film is observed by performing electron diffraction measurement on a cross section, the electron diffraction pattern includes a first region including a diffraction spot derived from the first crystal part and a second region including a diffraction spot derived from the second crystal part, wherein a third region and a fourth region are mixed in the metal oxide film, wherein the third region includes In, element M, Zn, and O, wherein the fourth region includes In, element M, Zn, and O, wherein element M in the third region and element M in the fourth region are Al, Ga, Y, or Sn, wherein atomic ratio of In to element M in the third region is higher than atomic ratio of In to element M in the fourth region.

17. The metal oxide film according to claim 16, wherein the integrated intensity of the luminance in the first region is more than one time and less than or equal to 40 times the integrated intensity of the luminance in the second region.

18. The metal oxide film according to claim 16, wherein the integrated intensity of the luminance in the first region is more than one time and less than or equal to 10 times the integrated intensity of the luminance in the second region.

19. The metal oxide film according to claim 16, wherein the integrated intensity of the luminance in the first region is more than one time and less than or equal to 3 times the integrated intensity of the luminance in the second region.

20. The metal oxide film according to claim 16, wherein a ring-like pattern is observed in an electron diffraction pattern of the metal oxide film under a condition where a diameter of an electron beam is greater than or equal to 25 nmΦ and less than or equal to 100 nmΦ.

21. The metal oxide film according to claim 16, wherein a plurality of spots distributed in a circumferential direction is observed in an electron diffraction pattern of the metal oxide film under a condition where a diameter of an electron beam is greater than or equal to 1 nmΦ and less than or equal to 10 nmΦ.

22. A semiconductor device comprising a semiconductor film, a gate insulating film, and a gate electrode, wherein the semiconductor film includes the metal oxide film according to claim 16.

23. A metal oxide film,
wherein a first crystal part and a second crystal part are mixed in the metal oxide film, wherein the first crystal part has c-axis alignment in a direction perpendicular to a surface of the metal oxide film, wherein the second crystal part has no c-axis alignment in a direction perpendicular to a surface of the metal oxide film, wherein existing proportion of the second crystal part is higher than existing proportion of the first crystal part, wherein, in the case where an electron diffraction pattern of the metal oxide film is observed by performing electron diffraction measurement on a cross section, the electron diffraction pattern includes a first region including a diffraction spot derived from the first crystal part and a second region including a diffraction spot derived from the second crystal part, and integrated intensity of luminance in the first region is higher than integrated intensity of luminance in the second region, wherein a third region and a fourth region are mixed in the metal oxide film, wherein the third region includes In, element M, Zn, and O, wherein the fourth region includes In, element M, Zn, and O, wherein element M in the third region and element M in the fourth region are Al, Ga, Y, or Sn, wherein atomic ratio of In to element M in the third region is higher than atomic ratio of In to element M in the fourth region.

24. The metal oxide film according to claim 23, wherein the integrated intensity of the luminance in the first region is more than one time and less than or equal to 40 times the integrated intensity of the luminance in the second region.

25. The metal oxide film according to claim 23, wherein the integrated intensity of the luminance in the first region is more than one time and less than or equal to 10 times the integrated intensity of the luminance in the second region.

26. The metal oxide film according to claim 23, wherein the integrated intensity of the luminance in the first region is more than one time and less than or equal to 3 times the integrated intensity of the luminance in the second region.

27. The metal oxide film according to claim 23, wherein a ring-like pattern is observed in an electron diffraction pattern of the metal oxide film under a condition where a diameter of an electron beam is greater than or equal to 25 nmΦ and less than or equal to 100 nmΦ.

28. The metal oxide film according to claim 23, wherein a plurality of spots distributed in a circumferential direction is observed in an electron diffraction pattern of the metal oxide film under a condition where a diameter of an electron beam is greater than or equal to 1 nmΦ and less than or equal to 10 nmΦ.

29. A semiconductor device comprising a semiconductor film, a gate insulating film, and a gate electrode, wherein the semiconductor film includes the metal oxide film according to claim 23.

* * * * *